(12) United States Patent
Flynn et al.

(10) Patent No.: US 9,563,555 B2
(45) Date of Patent: Feb. 7, 2017

(54) SYSTEMS AND METHODS FOR STORAGE ALLOCATION

(71) Applicant: Fusion-io, Inc., Salt Lake City, UT (US)

(72) Inventors: David Flynn, Sandy, UT (US); Nick Piggin, Yarralumla (AU); Nisha Talagala, Livermore, CA (US)

(73) Assignee: SanDisk Technologies LLC, Plano, TX (US)

( * ) Notice: Subject to any disclaimer, the term of this patent is extended or adjusted under 35 U.S.C. 154(b) by 546 days.

(21) Appl. No.: 13/865,153

(22) Filed: Apr. 17, 2013

(65) Prior Publication Data

US 2013/0227236 A1    Aug. 29, 2013

Related U.S. Application Data

(63) Continuation-in-part of application No. 13/424,333, filed on Mar. 19, 2012, now Pat. No. 8,966,191.
(Continued)

(51) Int. Cl.
*G06F 13/10* (2006.01)
*G06F 12/02* (2006.01)
(Continued)

(52) U.S. Cl.
CPC ........... *G06F 12/0292* (2013.01); *G06F 3/061* (2013.01); *G06F 3/0631* (2013.01); *G06F 3/0643* (2013.01);
(Continued)

(58) Field of Classification Search
CPC .............. G06F 12/0292; G06F 12/0246; G06F 17/30091
(Continued)

(56) References Cited

U.S. PATENT DOCUMENTS 4,571,674 A    2/1986    Hartung
5,193,184 A    3/1993    Belsan et al.
(Continued)

FOREIGN PATENT DOCUMENTS

CN    1771495    5/2006
EP    1418502    5/2004
(Continued)

OTHER PUBLICATIONS

Actel, "Actel Fusion FPGAs Supporting Intelligent Peripheral Management Interface (IPMI) Applications," http://www.actel.com/documents/Fusion_IPMI_AN.pdf, Oct. 1, 2006, visited Mar. 11, 2010.
(Continued)

*Primary Examiner* — Jae Yu
(74) *Attorney, Agent, or Firm* — Stoel Rives LLP

(57) ABSTRACT

Resources of an address space are managed in dynamically sized ranges, extents, sets, and/or blocks. The address space may be divided into regions, each corresponding to a different, respective allocation granularity. Allocating a block within a first region of the address space may comprise allocating a particular number of logical addresses (e.g., a particular range, set, and/or block of addresses), and allocating a block within a different region may comprise allocating a different number of logical addresses. The regions may be configured to reduce the metadata overhead needed to identify free address blocks (and/or maintain address block allocations), while facilitating efficient use of the address space for differently sized data structures.

25 Claims, 59 Drawing Sheets

Related U.S. Application Data

(60) Provisional application No. 61/454,235, filed on Mar. 18, 2011, provisional application No. 61/625,647, filed on Apr. 17, 2012, provisional application No. 61/637,165, filed on Apr. 23, 2012.

(51) Int. Cl.
| | |
|---|---|
| *G06F 3/06* | (2006.01) |
| *G11C 16/06* | (2006.01) |
| *G11C 16/26* | (2006.01) |
| *G11C 16/34* | (2006.01) |
| *G06F 17/30* | (2006.01) |

(52) U.S. Cl.
CPC ............ *G06F 3/0688* (2013.01); *G06F 12/02* (2013.01); *G06F 17/30091* (2013.01); *G06F 17/30233* (2013.01); *G11C 16/06* (2013.01); *G11C 16/26* (2013.01); *G11C 16/349* (2013.01)

(58) Field of Classification Search
USPC ............................................................ 711/103
See application file for complete search history.

(56) References Cited

U.S. PATENT DOCUMENTS

| | | |
|---|---|---|
| 5,261,068 A | 11/1993 | Gaskins et al. |
| 5,307,497 A | 4/1994 | Feigenbaum et al. |
| 5,325,509 A | 6/1994 | Lautzenheiser |
| 5,392,427 A | 2/1995 | Barrett et al. |
| 5,404,485 A | 4/1995 | Ban |
| 5,438,671 A | 8/1995 | Miles |
| 5,469,555 A | 11/1995 | Ghosh et al. |
| 5,499,354 A | 3/1996 | Aschoff et al. |
| 5,504,882 A | 4/1996 | Chai |
| 5,535,399 A | 7/1996 | Blitz et al. |
| 5,553,261 A | 9/1996 | Hasbun et al. |
| 5,586,291 A | 12/1996 | Lasker et al. |
| 5,594,883 A | 1/1997 | Pricer |
| 5,596,736 A | 1/1997 | Kerns |
| 5,598,370 A | 1/1997 | Nijima et al. |
| 5,651,133 A | 7/1997 | Burkes |
| 5,680,579 A | 10/1997 | Young et al. |
| 5,682,499 A | 10/1997 | Bakke et al. |
| 5,701,434 A | 12/1997 | Nakagawa |
| 5,745,792 A | 4/1998 | Jost |
| 5,754,563 A | 5/1998 | White |
| 5,757,567 A | 5/1998 | Hetzler et al. |
| 5,787,486 A | 7/1998 | Chin et al. |
| 5,802,602 A | 9/1998 | Rahman et al. |
| 5,809,527 A | 9/1998 | Cooper et al. |
| 5,809,543 A | 9/1998 | Byers et al. |
| 5,845,329 A | 12/1998 | Onishi et al. |
| 5,930,815 A | 7/1999 | Estakhri et al. |
| 5,957,158 A | 9/1999 | Volz et al. |
| 5,960,462 A | 9/1999 | Solomon et al. |
| 6,000,019 A | 12/1999 | Dykstal et al. |
| 6,014,724 A | 1/2000 | Jennett |
| 6,073,232 A | 6/2000 | Kroeker et al. |
| 6,101,601 A | 8/2000 | Matthews et al. |
| 6,170,039 B1 | 1/2001 | Kishida |
| 6,170,047 B1 | 1/2001 | Dye |
| 6,173,381 B1 | 1/2001 | Dye |
| 6,185,654 B1 | 2/2001 | Van Doren |
| 6,209,088 B1 | 3/2001 | Reneris |
| 6,236,593 B1 | 5/2001 | Hong et al. |
| 6,256,642 B1 | 7/2001 | Krueger et al. |
| 6,279,069 B1 | 8/2001 | Robinson et al. |
| 6,289,413 B1 | 9/2001 | Rogers et al. |
| 6,330,426 B2 | 12/2001 | Brown |
| 6,336,174 B1 | 1/2002 | Li et al. |
| 6,356,986 B1 | 3/2002 | Solomon et al. |
| 6,370,631 B1 | 4/2002 | Dye |
| 6,385,710 B1 | 5/2002 | Goldman et al. |
| 6,404,647 B1 | 6/2002 | Minne |
| 6,412,080 B1 | 6/2002 | Fleming et al. |
| 6,418,478 B1 | 7/2002 | Ignatius et al. |
| 6,477,612 B1 * | 11/2002 | Wang ................. G06F 12/1009 711/2 |
| 6,507,911 B1 | 1/2003 | Langford |
| 6,523,102 B1 | 2/2003 | Dye et al. |
| 6,564,285 B1 | 5/2003 | Mills et al. |
| 6,587,915 B1 | 7/2003 | Kim |
| 6,601,211 B1 | 7/2003 | Norman |
| 6,625,685 B1 | 9/2003 | Cho et al. |
| 6,629,112 B1 | 9/2003 | Shank |
| 6,658,438 B1 | 12/2003 | Moore et al. |
| 6,671,757 B1 | 12/2003 | Multer et al. |
| 6,715,027 B2 | 3/2004 | Kim et al. |
| 6,751,155 B2 | 6/2004 | Gorobets |
| 6,754,774 B2 | 6/2004 | Gruner et al. |
| 6,775,185 B2 | 8/2004 | Fujisawa et al. |
| 6,779,088 B1 | 8/2004 | Benveniste et al. |
| 6,785,776 B2 | 8/2004 | Arimilli et al. |
| 6,785,785 B2 | 8/2004 | Piccirillo et al. |
| 6,877,076 B1 | 4/2005 | Cho et al. |
| 6,880,049 B2 | 4/2005 | Gruner et al. |
| 6,883,069 B2 | 4/2005 | Yoshida |
| 6,883,079 B1 | 4/2005 | Priborsky |
| 6,938,133 B2 | 8/2005 | Johnson et al. |
| 6,957,158 B1 | 10/2005 | Hancock et al. |
| 6,959,369 B1 | 10/2005 | Ashton et al. |
| 6,981,070 B1 | 12/2005 | Luk et al. |
| 6,996,676 B2 | 2/2006 | Megiddo |
| 7,010,652 B2 | 3/2006 | Piccirillo et al. |
| 7,010,662 B2 | 3/2006 | Aasheim et al. |
| 7,013,376 B2 | 3/2006 | Hooper, III |
| 7,013,379 B1 | 3/2006 | Testardi |
| 7,035,974 B2 | 4/2006 | Shang |
| 7,043,599 B1 | 5/2006 | Ware et al. |
| 7,047,366 B1 | 5/2006 | Ezra |
| 7,050,337 B2 | 5/2006 | Iwase et al. |
| 7,058,769 B1 | 6/2006 | Danilak |
| 7,076,599 B2 | 7/2006 | Aasheim et al. |
| 7,082,495 B2 | 7/2006 | DeWhitt et al. |
| 7,082,512 B2 | 7/2006 | Aasheim et al. |
| 7,085,879 B2 | 8/2006 | Aasheim et al. |
| 7,089,391 B2 | 8/2006 | Geiger et al. |
| 7,093,101 B2 | 8/2006 | Aasheim et al. |
| 7,096,321 B2 | 8/2006 | Modha |
| 7,130,956 B2 | 10/2006 | Rao |
| 7,130,957 B2 | 10/2006 | Rao |
| 7,167,953 B2 | 1/2007 | Megiddo et al. |
| 7,171,536 B2 | 1/2007 | Chang et al. |
| 7,173,852 B2 | 2/2007 | Gorobets et al. |
| 7,181,572 B2 | 2/2007 | Walmsley |
| 7,194,577 B2 | 3/2007 | Johnson et al. |
| 7,194,740 B1 | 3/2007 | Frank et al. |
| 7,203,815 B2 | 4/2007 | Haswell |
| 7,215,580 B2 | 5/2007 | Gorobets |
| 7,219,238 B2 | 5/2007 | Saito et al. |
| 7,243,203 B2 | 7/2007 | Scheuerlein |
| 7,246,179 B2 | 7/2007 | Camara et al. |
| 7,254,686 B2 | 8/2007 | Islam |
| 7,275,135 B2 | 9/2007 | Coulson |
| 7,278,008 B1 * | 10/2007 | Case ................. G06F 12/1036 710/26 |
| 7,280,536 B2 | 10/2007 | Testardi |
| 7,293,183 B2 | 11/2007 | Lee et al. |
| 7,305,520 B2 | 12/2007 | Voight et al. |
| 7,328,307 B2 | 2/2008 | Hoogterp |
| 7,340,558 B2 | 3/2008 | Lee et al. |
| 7,340,566 B2 | 3/2008 | Voth et al. |
| 7,356,651 B2 | 4/2008 | Liu et al. |
| 7,360,015 B2 | 4/2008 | Matthews et al. |
| 7,366,808 B2 | 4/2008 | Kano et al. |
| 7,395,384 B2 | 7/2008 | Sinclair et al. |
| 7,398,348 B2 | 7/2008 | Moore et al. |
| 7,437,510 B2 | 10/2008 | Rosenbluth et al. |
| 7,447,847 B2 | 11/2008 | Louie et al. |
| 7,450,420 B2 | 11/2008 | Sinclair et al. |
| 7,464,221 B2 | 12/2008 | Nakamura et al. |
| 7,487,235 B2 | 2/2009 | Andrews et al. |

(56) References Cited

U.S. PATENT DOCUMENTS

| | | |
|---|---|---|
| 7,487,320 B2 | 2/2009 | Bansal et al. |
| 7,516,267 B2 | 4/2009 | Coulson et al. |
| 7,526,614 B2 | 4/2009 | van Riel |
| 7,529,905 B2 | 5/2009 | Sinclair |
| 7,536,491 B2 | 5/2009 | Kano et al. |
| 7,552,271 B2 | 6/2009 | Sinclair et al. |
| 7,580,287 B2 | 8/2009 | Aritome |
| 7,603,532 B2 | 10/2009 | Rajan et al. |
| 7,610,348 B2 | 10/2009 | Kisley et al. |
| 7,620,773 B2 | 11/2009 | Nicholson et al. |
| 7,640,390 B2 | 12/2009 | Iwamura et al. |
| 7,644,239 B2 | 1/2010 | Ergan et al. |
| 7,660,911 B2 | 2/2010 | McDaniel |
| 7,660,941 B2 | 2/2010 | Lee et al. |
| 7,664,239 B2 | 2/2010 | Groff et al. |
| 7,669,019 B2 | 2/2010 | Fujibayashi et al. |
| 7,676,628 B1 | 3/2010 | Compton et al. |
| 7,702,873 B2 | 4/2010 | Griess et al. |
| 7,721,059 B2 | 5/2010 | Mylly et al. |
| 7,725,628 B1 | 5/2010 | Phan et al. |
| 7,769,978 B2 | 8/2010 | Gorobets et al. |
| 7,831,783 B2 | 11/2010 | Pandit et al. |
| 7,853,772 B2 | 12/2010 | Chang et al. |
| 7,873,782 B2 | 1/2011 | Terry |
| 7,873,803 B2 | 1/2011 | Cheng |
| 7,882,305 B2 | 2/2011 | Moritoki |
| 7,904,647 B2 | 3/2011 | El-Batal et al. |
| 7,913,051 B1 | 3/2011 | Todd et al. |
| 7,917,803 B2 | 3/2011 | Stefanus et al. |
| 7,941,591 B2 | 5/2011 | Aviles |
| 7,984,230 B2 | 7/2011 | Nasu et al. |
| 8,046,526 B2 | 10/2011 | Yeh |
| 8,055,820 B2 | 11/2011 | Sebire |
| 8,127,103 B2 | 2/2012 | Kano et al. |
| 8,135,900 B2 | 3/2012 | Kunimatsu et al. |
| 8,151,082 B2 | 4/2012 | Flynn et al. |
| 8,171,204 B2 | 5/2012 | Chow et al. |
| 2002/0069318 A1 | 6/2002 | Chow et al. |
| 2002/0103819 A1 | 8/2002 | Duvillier et al. |
| 2002/0161855 A1 | 10/2002 | Manczak et al. |
| 2002/0181134 A1 | 12/2002 | Bunker et al. |
| 2003/0061296 A1 | 3/2003 | Craddock et al. |
| 2003/0140051 A1 | 7/2003 | Fujiwara et al. |
| 2003/0145230 A1 | 7/2003 | Chiu et al. |
| 2003/0149753 A1 | 8/2003 | Lamb |
| 2003/0198084 A1 | 10/2003 | Fujisawa et al. |
| 2004/0003002 A1 | 1/2004 | Adelmann |
| 2004/0093463 A1 | 5/2004 | Shang |
| 2004/0117586 A1 | 6/2004 | Estakhri et al. |
| 2004/0148360 A1 | 7/2004 | Mehra et al. |
| 2004/0186946 A1 | 9/2004 | Lee |
| 2004/0268359 A1 | 12/2004 | Hanes |
| 2005/0002263 A1 | 1/2005 | Iwase et al. |
| 2005/0015539 A1 | 1/2005 | Horii et al. |
| 2005/0027951 A1 | 2/2005 | Piccirillo et al. |
| 2005/0120177 A1 | 6/2005 | Black |
| 2005/0141313 A1 | 6/2005 | Gorobets et al. |
| 2005/0177672 A1 | 8/2005 | Rao |
| 2005/0177687 A1 | 8/2005 | Rao |
| 2005/0193166 A1 | 9/2005 | Johnson et al. |
| 2005/0216653 A1 | 9/2005 | Aasheim et al. |
| 2005/0240713 A1 | 10/2005 | Wu et al. |
| 2005/0246510 A1 | 11/2005 | Retnamma et al. |
| 2005/0257017 A1 | 11/2005 | Yagi |
| 2005/0273476 A1 | 12/2005 | Wertheimer et al. |
| 2006/0004955 A1 | 1/2006 | Ware et al. |
| 2006/0020744 A1 | 1/2006 | Sinclair et al. |
| 2006/0026339 A1 | 2/2006 | Rostampour |
| 2006/0059326 A1 | 3/2006 | Aasheim et al. |
| 2006/0075057 A1 | 4/2006 | Gildea et al. |
| 2006/0085626 A1 | 4/2006 | Roberson et al. |
| 2006/0129778 A1 | 6/2006 | Clark et al. |
| 2006/0136657 A1 | 6/2006 | Rudelic et al. |
| 2006/0143396 A1 | 6/2006 | Cabot |
| 2006/0149893 A1 | 7/2006 | Barfuss et al. |
| 2006/0179263 A1 | 8/2006 | Song et al. |
| 2006/0184722 A1 | 8/2006 | Sinclair |
| 2006/0190552 A1 | 8/2006 | Henze et al. |
| 2006/0224849 A1 | 10/2006 | Rezaul Islam et al. |
| 2006/0236061 A1 | 10/2006 | Koclanes |
| 2006/0248387 A1 | 11/2006 | Nicholson et al. |
| 2006/0265636 A1 | 11/2006 | Hummler |
| 2007/0016699 A1 | 1/2007 | Minami |
| 2007/0033325 A1 | 2/2007 | Sinclair |
| 2007/0033326 A1 | 2/2007 | Sinclair |
| 2007/0033327 A1 | 2/2007 | Sinclair |
| 2007/0033362 A1 | 2/2007 | Sinclair |
| 2007/0043900 A1 | 2/2007 | Yun |
| 2007/0050571 A1 | 3/2007 | Nakamura et al. |
| 2007/0061508 A1 | 3/2007 | Zweighaft |
| 2007/0088666 A1 | 4/2007 | Saito |
| 2007/0118676 A1 | 5/2007 | Kano et al. |
| 2007/0118713 A1 | 5/2007 | Guterman et al. |
| 2007/0124540 A1 | 5/2007 | van Riel |
| 2007/0136555 A1 | 6/2007 | Sinclair |
| 2007/0143532 A1 | 6/2007 | Gorobets et al. |
| 2007/0143560 A1 | 6/2007 | Gorobets |
| 2007/0143566 A1 | 6/2007 | Gorobets |
| 2007/0143567 A1 | 6/2007 | Gorobets et al. |
| 2007/0150689 A1 | 6/2007 | Pandit et al. |
| 2007/0156998 A1 | 7/2007 | Gorobets |
| 2007/0168698 A1 | 7/2007 | Coulson et al. |
| 2007/0198770 A1 | 8/2007 | Horii et al. |
| 2007/0204128 A1 | 8/2007 | Lee et al. |
| 2007/0208790 A1 | 9/2007 | Reuter et al. |
| 2007/0233937 A1 | 10/2007 | Coulson et al. |
| 2007/0260608 A1 | 11/2007 | Hertzberg et al. |
| 2007/0261030 A1 | 11/2007 | Wadhwa |
| 2007/0263514 A1 | 11/2007 | Iwata et al. |
| 2007/0266037 A1 | 11/2007 | Terry et al. |
| 2007/0274150 A1 | 11/2007 | Gorobets |
| 2007/0300008 A1 | 12/2007 | Rogers et al. |
| 2008/0010395 A1 | 1/2008 | Mylly et al. |
| 2008/0052377 A1 | 2/2008 | Light |
| 2008/0091876 A1 | 4/2008 | Fujibayashi et al. |
| 2008/0120469 A1 | 5/2008 | Kornegay |
| 2008/0126507 A1 | 5/2008 | Wilkinson |
| 2008/0126700 A1 | 5/2008 | El-Batal et al. |
| 2008/0140737 A1 | 6/2008 | Garst et al. |
| 2008/0209090 A1 | 8/2008 | Kano et al. |
| 2008/0229045 A1 | 9/2008 | Qi |
| 2008/0235443 A1 | 9/2008 | Chow et al. |
| 2008/0243966 A1 | 10/2008 | Croisettier et al. |
| 2008/0263259 A1 | 10/2008 | Sadovsky et al. |
| 2008/0263305 A1 | 10/2008 | Shu et al. |
| 2008/0263569 A1 | 10/2008 | Shu et al. |
| 2008/0276040 A1 | 11/2008 | Moritoki |
| 2008/0294847 A1 | 11/2008 | Maruyama et al. |
| 2009/0070526 A1 | 3/2009 | Tetrick |
| 2009/0083478 A1 | 3/2009 | Kunimatsu et al. |
| 2009/0083485 A1 | 3/2009 | Cheng |
| 2009/0089485 A1 | 4/2009 | Yeh |
| 2009/0125650 A1 | 5/2009 | Sebire |
| 2009/0125700 A1 | 5/2009 | Kisel |
| 2009/0150599 A1 | 6/2009 | Bennett |
| 2009/0150605 A1 | 6/2009 | Flynn et al. |
| 2009/0150641 A1 | 6/2009 | Flynn et al. |
| 2009/0228637 A1 | 9/2009 | Moon |
| 2009/0248763 A1 | 10/2009 | Rajan et al. |
| 2009/0276588 A1 | 11/2009 | Murase |
| 2009/0276654 A1 | 11/2009 | Butterworth |
| 2009/0287887 A1 | 11/2009 | Matsuki et al. |
| 2009/0292861 A1 | 11/2009 | Kanevsky et al. |
| 2009/0300277 A1 | 12/2009 | Jeddeloh |
| 2009/0307424 A1 | 12/2009 | Galloway et al. |
| 2009/0313453 A1 | 12/2009 | Stefanus et al. |
| 2009/0327602 A1 | 12/2009 | Moore et al. |
| 2009/0327804 A1 | 12/2009 | Moshayedi |
| 2010/0005228 A1 | 1/2010 | Fukutomi et al. |
| 2010/0017556 A1 | 1/2010 | Chin |
| 2010/0023674 A1 | 1/2010 | Aviles |
| 2010/0023676 A1 | 1/2010 | Moon |
| 2010/0030946 A1 | 2/2010 | Kano et al. |
| 2010/0076936 A1 | 3/2010 | Rajan |

(56) References Cited

U.S. PATENT DOCUMENTS

| | | | |
|---|---|---|---|
| 2010/0095059 A1 | 4/2010 | Kisley et al. | |
| 2010/0169542 A1 | 7/2010 | Sinclair | |
| 2010/0205231 A1 | 8/2010 | Cousins | |
| 2010/0205335 A1 | 8/2010 | Phan et al. | |
| 2010/0211737 A1 | 8/2010 | Flynn et al. | |
| 2010/0235597 A1 | 9/2010 | Arakawa | |
| 2010/0262738 A1 | 10/2010 | Swing et al. | |
| 2010/0262740 A1 | 10/2010 | Borchers et al. | |
| 2010/0262757 A1 | 10/2010 | Sprinkle et al. | |
| 2010/0262758 A1 | 10/2010 | Swing et al. | |
| 2010/0262759 A1 | 10/2010 | Borchers et al. | |
| 2010/0262760 A1 | 10/2010 | Swing et al. | |
| 2010/0262761 A1 | 10/2010 | Borchers et al. | |
| 2010/0262762 A1 | 10/2010 | Borchers et al. | |
| 2010/0262766 A1 | 10/2010 | Sprinkle et al. | |
| 2010/0262767 A1 | 10/2010 | Borchers et al. | |
| 2010/0262773 A1 | 10/2010 | Borchers et al. | |
| 2010/0262894 A1 | 10/2010 | Swing et al. | |
| 2010/0262979 A1 | 10/2010 | Borchers et al. | |
| 2011/0022819 A1 | 1/2011 | Post et al. | |
| 2012/0159040 A1 | 6/2012 | Parikh et al. | |

FOREIGN PATENT DOCUMENTS

| | | |
|---|---|---|
| EP | 1814039 | 3/2009 |
| GB | 0123416 | 9/2001 |
| JP | 4242848 | 8/1992 |
| JP | 8153014 | 6/1996 |
| JP | 200259525 | 9/2000 |
| JP | 2009122850 | 6/2009 |
| WO | WO94/19746 | 9/1994 |
| WO | WO95/18407 | 7/1995 |
| WO | WO96/12225 | 4/1996 |
| WO | WO02/01365 | 1/2002 |
| WO | WO2004/099989 | 11/2004 |
| WO | WO2005/103878 | 11/2005 |
| WO | WO2006/062511 | 6/2006 |
| WO | WO2006/065626 | 6/2006 |
| WO | WO2008/130799 | 3/2008 |
| WO | WO2008/070173 | 6/2008 |
| WO | WO2008/073421 | 6/2008 |
| WO | WO2011/106394 | 9/2011 |

OTHER PUBLICATIONS

Anonymous, "Method for Fault Tolerance in Nonvolatile Storage", http://ip.com, IP.com No. IPCOM000042269D, 2005.
Ari, "Performance Boosting and Workload Isolation in Storage Area Networks with SanCache," Hewlett Packard Laboratories, Proceedings of the 23rd IEEE / 14th NASA Goddard Conference on Mass Storage Systems and Technologies (MSST 2006), May 2006, pp. 263-27.
Asine, "ASPMC-660 Rugged IDE Flash Drive PMC Module," http://www.asinegroup.com/ products/aspmc660.html, copyright 2002, visited Nov. 8, 2009.
Barrall et al., U.S. Appl. No. 60/625,495, "Dynamically EXpandable and Contractible Fault-Tolerant Storage System Permitting Variously Sized Storage Devices and Method," filed Nov. 5, 2004.
Barrall et al., U.S. Appl. No. 60/718,768, "Dynamically Adaptable Fault-Tolerant Storage System," filed Sep. 20, 2005.
Bitmicro, "BiTMicro Introduces E-Disk PMC Flash Disk Module at Military & Aerospace Electronics East 2004," http://www.bitmicro.com/press.sub, published May 18, 2004, visited Mar. 8, 2011.
Brandon, Jr., "Sparse Matrices in CS Education," Journal of Computing Sciences in Colleges, vol. 24 Issue 5, May 2009, pp. 93-98.
Coburn, "NV-Heaps: Making Persistent Objects Fast and Safe with NeXt-Generation, Non-Volatile Memories", ACM 978-1-4503-0266-1/11/0, published Mar. 5, 2011.
EEEL-6892, Lecture 18, "Virtual Computers," Mar. 2010.
ELNEC, "NAND Flash Memories and Programming NAND Flash Memories Using ELNEC Device Programmers, Application Note," published Mar. 1, 2007.

European Patent Office, Office Action, EP Application No. 07865345.8, issued Nov. 17, 2010.
Gal, "A Transactional Flash File System for Microcontrollers," 2005 USENIX Annual Technical Conference, published Apr. 10, 2009.
Garfinkel, "One Big File is Not Enough: A Critical Evaluation of the Dominant Free-Space Sanitization Technique," 6th Workshop on Privacy Enhancing Technologies. Cambridge, United Kingdom, published Jun. 1, 2006.
Gutmann, "Secure Deletion of Data from Magnetic and Solid-State Memory", UseniX, 14 pages, San Jose, CA, published Jul. 1, 1996.
Huffman, "Non-Volatile Memory Host Controller Interface," Apr. 14, 2008, 65 pgs.
Hynix Semiconductor, Intel Corporation, Micron Technology, Inc. Phison Electronics Corp., Sony Corporation, Spansion, Stmicroelectronics, "Open NAND Flash Interface Specification," Revision 2.0, Feb. 27, 2008.
Information Technology, "SCSI Object-Based Storage Device Commands," 2 (OSD-2), Project T10/1729-D, Revision 4, published Jul. 30, 2004, printed Jul. 24, 2008.
Intel, "Non-Volatile Memory Host Controller Interface (NVMHCI) 1.0," Apr. 14, 2008.
Johnson, "An Introduction to Block Device Drivers," Jan. 1, 1995.
Kawaguchi, "A Flash-Memory Based File System," TCON'95 Proceedings of the USENIX 1995 Technical Conference Proceedings, p. 13.
Mesnier, "Object-Based Storage," IEEE Communications Magazine, Aug. 2003, pp. 84-90.
Micron, "TN-29-17: NAND Flash Design and Use Considerations," Mar. 10, 2010.
Morgenstern, David, "Is There a Flash Memory RAID in your Future?", http://www.eweek.com—eWeek, Ziff Davis Enterprise Holdings Inc., Nov. 8, 2006, visited Mar. 18, 2010.
Novell, "File System Primer", http://wiki.novell.com/indeX.php/File_System_Primer, 2006, visited Oct. 18, 2006.
Plank, "A Tutorial on Reed-Solomon Coding for Fault Tolerance in RAID-like System," Department of Computer Science, University of Tennessee, pp. 995-1012, Sep. 1997.
Porter, "Operating System Transactions," ACM 978-1-60558-752-3/09/10, published Oct. 1, 2009.
Probert, "Windows Kernel Internals Cache Manager," Microsoft Corporation, http://www.i.u.-tokyo.co.jp/edu/training/ss/lecture/new-documents/Lectures/15- CacheManager/CacheManager.pdf, printed May 15, 2010.
Ranaweera, 05-270RO, SAT: Write Same (10) command (41h), T10/05, Jul. 7, 2005, www.t10.org/ftp/t10/document.05/05-270r0.pdf, last visited Apr. 11, 2013.
Rosenblum, "The Design and Implementation of a Log-Structured File System," ACM Transactions on Computer Systems, vol. 10 Issue 1, Feb. 1992.
Samsung Electronics, "Introduction to Samsung's LinuX Flash File System—RFS Application Note", Version 1.0, Nov. 2006.
Sears, "Stasis: FleXible Transactional Storage," OSDI '06: 7th USENIX Symposium on Operating Systems Design and Implementation, published Nov. 6, 2006.
Seltzer, "File System Performance and Transaction Support", University of California at Berkeley, published Jan. 1, 1992.
Seltzer, "Transaction Support in a Log-Structured File System", Harvard University Division of Applied Sciences, published Jan. 1, 1993 (Chapter 5, pp. 52-69).
Seltzer, "Transaction Support in Read Optimized and Write Optimized File Systems," Proceedings of the 16th VLDB Conference, Brisbane, Australia, published Jan. 1, 1990.
Shimpi, Anand, The SSD Anthology: Understanding SSDs and New Drives from OCZ, Mar. 18, 2009, 69 pgs.
Shu, "Data Set Management Commands Proposals for ATA8-ACS2," Dec. 12, 2007, http://www.t13.org.Documents/Uploaded-Documents/docs2008/e07154r6-Data_Set_Management_Proposal_for_ATA-ACS2.pdf, printed Apr. 5, 2010
Singer, "Implementing MLC NAND Flash for Cost-Effective, High Capacity Memory," M-Systems, White Paper, 91-SR014-02-8L, Rev. 1.1, Sep. 2003.

(56) References Cited

OTHER PUBLICATIONS

Spansion, "Data Management Software (DMS) for AMD Simultaneous Read/Write Flash Memory Devices", published Jul. 7, 2003.
Spillane "Enabling Transactional File Access via Lightweight Kernel EXtensions", Stony Brook University, IBM T. J. Watson Research Center, published Feb. 25, 2009.
State Intellectual Property Office, Office Action, CN Application No. 200780050970.0, issued Oct. 28, 2010.
State Intellectual Property Office, Office Action, CN Application No. 200780051020.X, issued Nov. 11, 2010.
State Intellectual Property Office, Office Action, CN Application No. 200780050983.8, issued May 18, 2011.
State Intellectual Property Office, Office Action, CN Application No. 200780051020.X, issued Jul. 6, 2011.
State Intellectual Property Office, Office Action, CN Application No. 200780051020.X, issued Nov. 7, 2011.
State Intellectual Property Office, Office Action, CN Application No. 200780050970.0, issued Jan. 5, 2012.
Tal, "NAND vs. NOR Flash Technology," M-Systems, www2.electronicproducts.com/PrintArticle.aspX?ArticleURL=FEBMSY1.feb2002.html, visited Nov. 22, 2010.
Terry et al., U.S. Appl. No. 60/797,127, "Filesystem-aware Block Storage System, Apparatus, and Method," filed May 3, 2006.
USPTO, Notice of Allowance for U.S. Appl. No. 12/986,117, Mailed Apr. 4, 2013.
USPTO, Notice of Allowance for U.S. Appl. No. 12/986,117 Mailed Jun. 5, 2013.
USPTO, Office Action for U.S. Appl. No. 12/879,004 mailed Feb. 25, 2013.
USPTO, Office Action for U.S. Appl. No. 13/607,486 mailed Jan. 10, 2013.
USPTO, Office Action for U.S. Appl. No. 11/952,113, mailed Dec. 15, 2010.
USPTO, Office Action for U.S. Appl. No. 12/711,113, mailed Jun. 6, 2012.
USPTO, Office Action for U.S. Appl. No. 12/711,113, mailed Nov. 23, 2012.
USPTO, Office Action for U.S. Appl. No. 13/607,486 mailed May 2, 2013.
USPTO, Office Action for U.S. Appl. No. 13/118,237 mailed Apr. 22, 2013.
USPTO, Notice of Allowance, U.S. Appl. No. 11/952,109, issued May 1, 2013.
USPTO, Office Action, U.S. Appl. No. 11/952,109, mailed Nov. 29, 2011.
Van Hensbergen, "Dynamic Policy Disk Caching for Storage Networking," IBM Research Division, RC24123 (W0611-189), Nov. 2006.
Volos, "Mnemosyne: Lightweight Persistent Memory", ACM 978-1-4503-0266—Jan. 11, 2003, published Mar. 5, 2011.
Wacha, "Improving RAID-Based Storage Systems with Flash Memory," First Annual ISSDM/SRL Research Symposium, Oct. 20-21, 2009.
Walp, "System Integrated Flash Storage," Microsoft Corporation, 2008, http://download.microsoft.com/download/5/E/6/5E66827B-988B-4F50-AF3A-C2FF1E62180F/COR-T559-WHO8.pptx, Printed Apr. 6, 2010, 8 pgs.
WIPO, International Preliminary Report of Patentability for PCT/US2007/086691, mailed Feb. 16, 2009.
WIPO, International Preliminary Report on Patentability for PCT/US2007/086688, mailed Mar. 16, 2009.
WIPO, International Preliminary Report on Patentability for PCT/US2007/086701, mailed Mar. 16, 2009.
WIPO, International Preliminary Report on Patentability for PCT/US2007/086687, mailed Mar. 18, 2009.
WIPO, International Preliminary Report on Patentability for PCT/US2007/025048, mailed Jun. 10, 2009.
WIPO, International Preliminary Report on Patentability for PCT/US2010/048325, mailed Mar. 13, 2012.
WIPO, International Search Report and Written Opinion for PCT/US2007/025048, mailed May 27, 2008.
WIPO, International Search Report and Written Opinion for PCT/US2007/086701, mailed Jun. 5, 2008.
WIPO, International Search Report and Written Opinion for PCT/US2007/086687, mailed Sep. 5, 2008.
WIPO, International Search Report and Written Opinion for PCT/US2010/048325, mailed Jun. 1, 2011.
WIPO, International Search Report and Written Opinion for PCT/US2011/025885, mailed Sep. 28, 2011.
Wright, "EXtending ACID Semantics to the File System", ACM Transactions on Storage, vol. 3, No. 2, published May 1, 2011, pp. 1-40.
Wu, "eNVy: A Non-Volatile, Main Memory Storage System," ACM 0-89791-660-3/94/0010, ASPLOS-VI Proceedings of the siXth international conference on Architectural support for programming languages and operating systems, pp. 86-97, 1994.
Zhang et al., "De-indirection for Flash-Based SSDs with Nameless Writes, " UseniX InFast 2012 (Feb. 14 2012).
Final Office Action for U.S. Appl. No. 14/030,717, filed Sep. 18, 2013, and mailed from the USPTO Oct. 6, 2014, 10 pgs.
Non-Final Office Action for U.S. Appl. No. 14/030,717, filed Sep. 18,2013, and mailed from the USPTO Apr. 11, 2014, 10 pgs.
Non-Final Office Action for U.S. Appl. No. 14/627,869, filed Feb. 20, 2015, and mailed from the USPTO May 22, 2015, 10 pgs.
Notice of Allowance and Fee(s) Due for U.S. Appl. No. 14/030,717, filed Sep. 18, 2013, and mailed from the USPTO Aug. 24, 2015, 25 pgs.
Final Office Action for U.S. Appl. No. 14/030,717, filed Sep. 18, 2013, and mailed from the USPTO Feb. 27, 2015, 8 pgs.

* cited by examiner

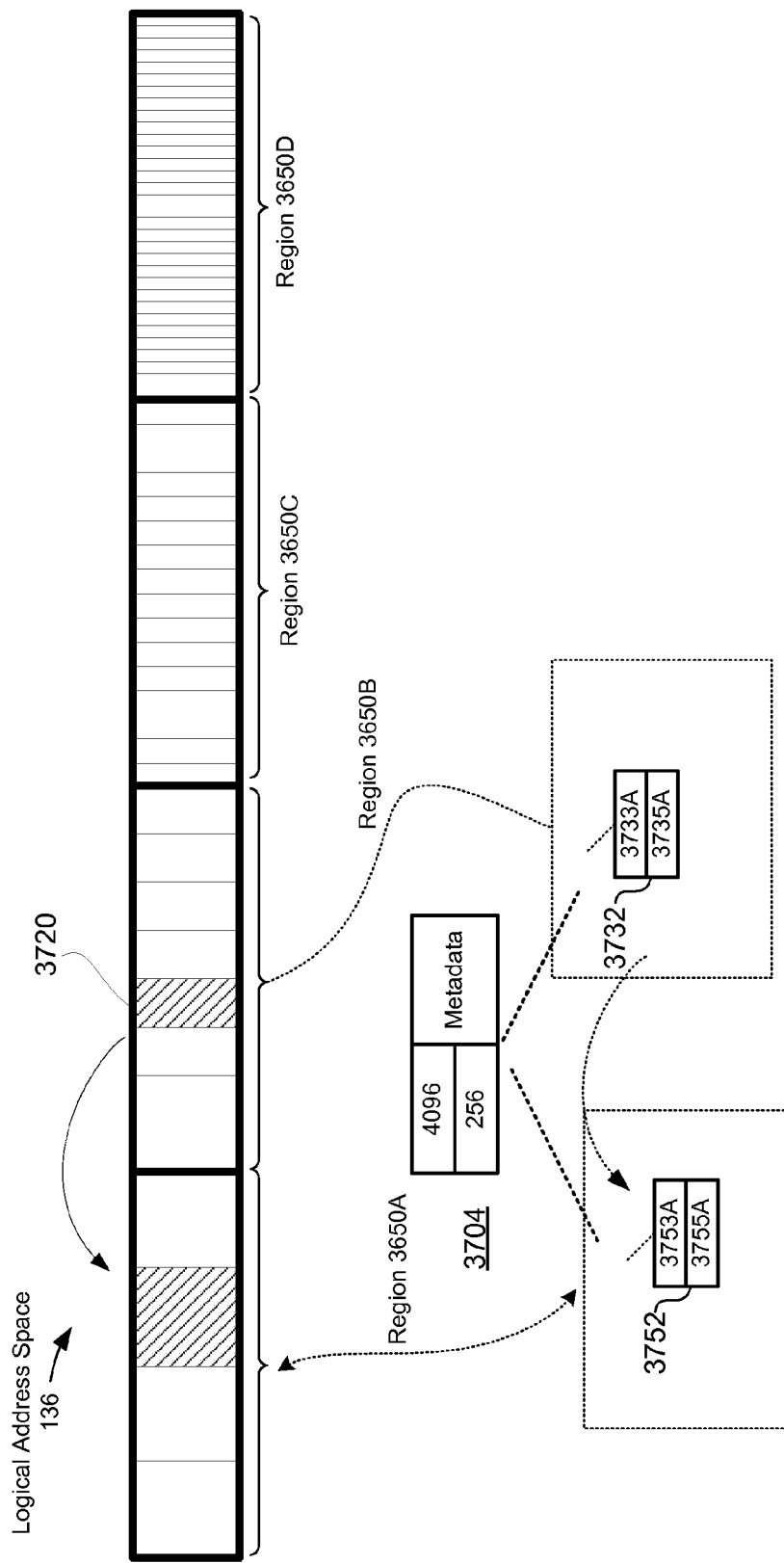

SYSTEMS AND METHODS FOR STORAGE ALLOCATION

CROSS REFERENCE TO RELATED APPLICATIONS

This application is a continuation in part of, and claims priority to, U.S. patent application Ser. No. 13/424,333, entitled, "Logical Interfaces for Contextual Storage," filed Mar. 19, 2012 for David Flynn et al., and which claims priority to U.S. Provisional Patent Application No. 61/454, 235, entitled, "Virtual Storage Layer Supporting Operations Ordering, a Virtual Address Space, Atomic Operations, and Metadata Discovery," filed Mar. 18, 2011, this application also claims priority to U.S. Provisional Patent Application No. 61/625,647, entitled, "Systems, Methods, and Interfaces for Managing a Logical Address Space," filed Apr. 17, 2012, for David Flynn et al., and to U.S. Provisional Patent Application No. 61/637,165, entitled, "Systems, Methods, and Interfaces for Managing a Logical Address Space," filed Apr. 23, 2012, for David Flynn et al., each of which is incorporated by reference.

TECHNICAL FIELD

This disclosure relates to storage systems and, in particular, to managing an address space of a storage system.

A computing system may provide a logical address space of a storage device and/or system. The logical address space may comprise identifiers used by storage clients to reference storage resources. The computing system may further comprise a logical-to-physical translation layer configured to map identifiers of the logical address space with the storage location of data associated with the identifiers. The translation layer may comprise any-to-any mappings between identifiers and physical addresses. The logical address space may be independent of the underlying physical storage resources, and may exceed the capacity of the physical storage resources. Storage clients may allocate portions of the logical address space to perform storage operations. Maintaining allocation metadata pertaining to the logical address space may, however, impose significant overhead.

SUMMARY

Disclosed herein are embodiments of methods of managing storage allocation. The disclosed methods may comprise one or more machine-executable operations and/or steps. The disclosed operations and/or steps may be embodied as program code stored on a computer readable storage medium. Accordingly, embodiments of the methods disclosed herein may be embodied as a computer program product comprising a computer readable storage medium storing computer usable program code executable to cause a computing device to perform one or more method operations and/or steps.

Embodiments of the disclosed method may comprise a computing device providing an address space of a storage device, the address space configured such that at least two or more addresses of the address space are associated with a different physical storage capacity, and allocating one of the at least two or more addresses to a storage client in response to a storage request. The allocation granularity may pertain to allocation of logical addresses within the address space. Alternatively, or in addition, the allocation granularity may pertain to data segment size corresponding to one or more logical address of the address space.

The method may further comprise allocating a logical identifier within a first section of the address space corresponding to a first sector size on the storage device and allocating a logical identifier within a different section of the address space corresponding to a different sector size on the storage device.

In some embodiments, the method includes allocating storage resources within a selected section of the address space in response to a request from a storage client, and selecting the section based on one or more of: a size of data associated with the request, a size of a data structure associated with the request, a size of a storage entity associated with the request, a file associated with the request, an application associated with the request, a parameter of the request, a storage client associated with the request, an input/output (I/O) control (ioctrl) parameter, an fadvise parameter, and availability of unallocated logical addresses within the sections. Dividing the address space may comprise partitioning logical addresses within the address space into an identifier portion and an offset portion, wherein relative sizes of the identifier portions to the offset portions vary between the sections.

Some embodiments of the method may further comprise moving data stored on the storage device to a different section of the address space. Moving the data may comprise associating the data with a different logical address than a logical address stored with the data on the storage device and/or updating persistent metadata of the data to reference the different logical address in response to relocating the data on the storage device.

Disclosed herein are embodiments of an apparatus, comprising a translation module configured to manage a logical address space of a storage device, a partitioning module configured to segment the logical address space into a plurality of different regions, the individual regions having a different respective allocation granularity, and an allocation module configured to allocate logical identifiers within the regions in accordance with the allocation granularities of the regions. The apparatus may further include an interface module configured to provide for specifying a region of the logical address space in which to perform one or more of an allocation operation and a storage operation. The interface module may be configured to provide information pertaining to the allocation granularities of one or more of the regions to a storage client. The different respective allocation granularities of the regions may pertain to one or more of: a logical identifier block size for allocation operations performed within the respective regions and a data sector size associated with the logical identifiers of the respective regions. The allocation module may be configured to associate logical identifiers within the logical address space with one of a plurality of data sector sizes. In some embodiments, the apparatus includes a data read module configured to read a data segment associated with a logical identifier on the storage device, wherein a size of the data segment corresponds to a data sector size associated with the logical identifier.

In some embodiments, the disclosed apparatus also includes a reallocation module configured to reallocate a set of logical identifiers corresponding to data stored on the storage device to a different set of logical identifiers. The reallocation module may be configured to modify a size of a block of logical identifiers associated with the data, and the reallocation module may be configured to move one or more of the logical identifiers to another region of the logical address space. Each region may comprise one or more blocks of logical identifiers within the logical address space.

The reallocation module may be configured to combine a plurality of blocks allocated within a first region of the logical address space into a single, larger block of logical identifiers within a different region of the logical address space. Alternatively, or in addition, the reallocation module may be configured to reallocate a block of logical identifiers within a first region of the logical address space as one or more smaller blocks of logical identifiers within a different region of the logical address space.

The apparatus may further include a log storage module configured to store data on the storage device in association with respective logical identifiers corresponding to the data. The reallocation module may be configured to modify the logical identifier associated with a data segment such that the logical identifier associated with the data segment on the storage device is inconsistent with the modified logical identifier. The apparatus may include a translation module configured to reference the data segment associated with the inconsistent logical identifier on the storage device by use of the modified logical identifier. The log storage module may be configured to store the data segment in association with the modified logical identifier on the storage device in response to grooming a storage division comprising the data segment.

Disclosed herein are embodiments of a method comprising associating logical addresses of an address space with respective sector sizes, wherein the sector size associated with a logical address corresponds to a physical storage capacity on a storage device corresponding to the logical address, determining a sector size of one of the logical addresses in response to a request, and performing a storage operation on the storage device in accordance with the determined sector size. The method may further include selecting a sector size for the logical address based on one or more of a file associated with the logical address, an application associated with the logical address, the storage client associated with the logical address, an input/output (I/O) control parameter, and an fadvise parameter. In some embodiments, the method further includes determining an available physical storage capacity of the storage device based on sector sizes of logical addresses of the address space that are associated with valid data on the storage device and/or assigning a different respective sector size to each of a plurality of segments of the address space, wherein determining the sector size of the logical address comprises associating the logical address with one of the segments.

BRIEF DESCRIPTION OF THE DRAWINGS

FIG. 29M depicts one embodiment of a deduplication operation;

FIG. 37C depicts another example of an allocation operation within a segmented logical address space.

DETAILED DESCRIPTION

Figure 1:
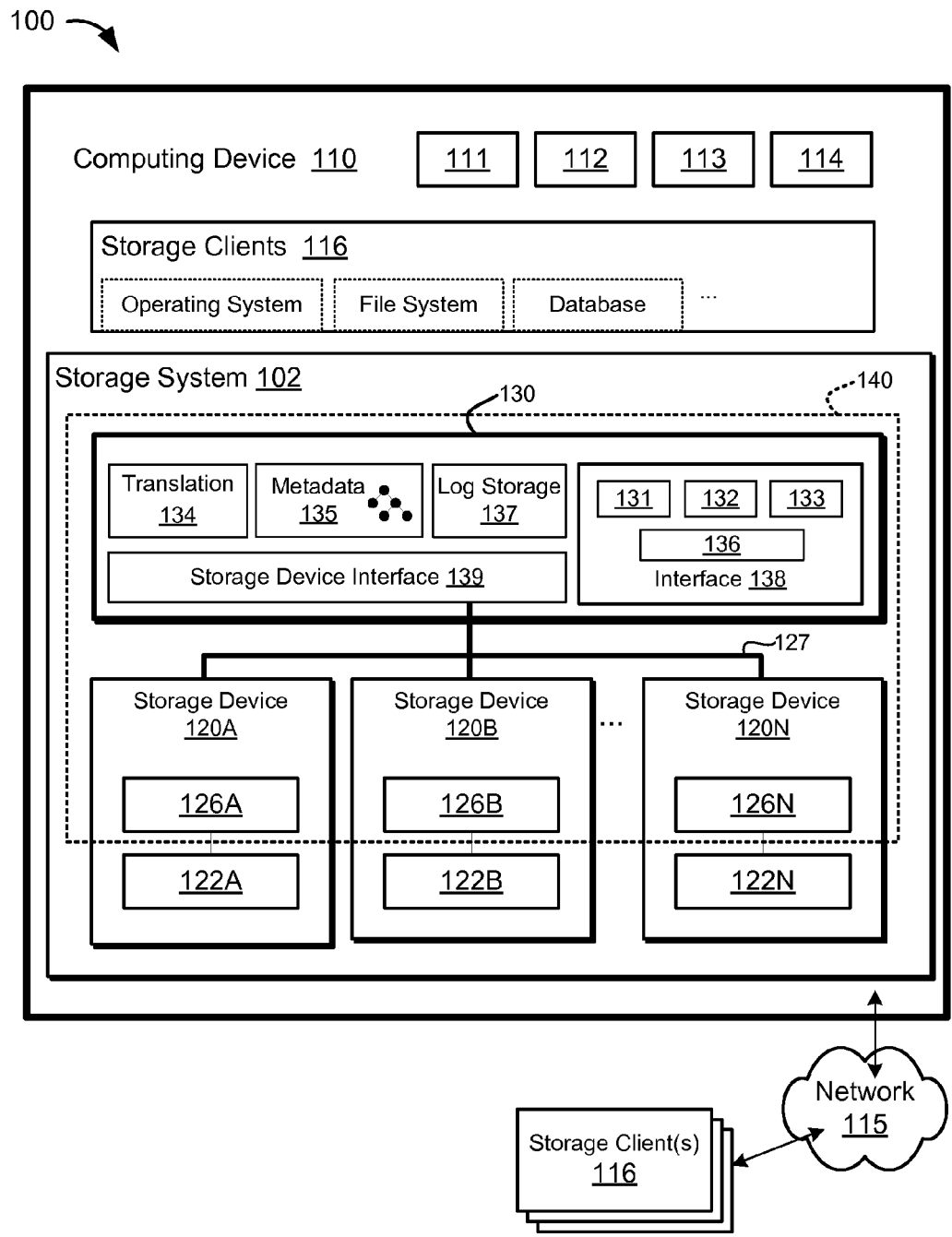
FIG. 1 is a block diagram of one embodiment of a storage system.

According to various embodiments, a storage layer manages one or more storage devices. The storage device(s) may comprise non-volatile storage devices, such as solid-state storage device(s), that are arranged and/or partitioned into a plurality of addressable, media storage locations. As used herein, a media storage location refers to any physical unit of storage (e.g., any physical storage media quantity on a storage device). Media storage units may include, but are not limited to: pages, storage divisions, erase blocks, sectors, blocks, collections or sets of physical storage locations (e.g., logical pages, logical erase blocks, etc., described below), or the like.

The storage layer may be configured to present a logical address space to one or more storage clients. As used herein, a logical address space refers to a logical representation of storage resources. The logical address space may comprise a plurality (e.g., range) of logical identifiers. As used herein, a logical identifier (LID) refers to any identifier for referencing a storage resource (e.g., data), including, but not limited to: a logical block address ("LBA"), a cylinder/head/sector ("CHS") address, a file name, an object identifier, an inode, a Universally Unique Identifier ("UUID"), a Globally Unique Identifier ("GUID"), a hash code, a signature, an index entry, a range, an extent, or the like. The logical address space, LIDs, and relationships between LIDs and storage resources define a "logical interface" through which storage clients access storage resources. As used herein, a logical interface refers to a handle, identifier, path, process, or other mechanism for referencing and/or interfacing with a storage resource. A logical interface may include, but is not limited to: a LID, a range or extent of LIDs, a reference to a LID (e.g., a link between LIDs, a pointer to a LID, etc.), a reference to a virtual storage unit, or the like. A logical interface may be used to reference data through a storage interface and/or application programming interface ("API").

The storage layer may maintain storage metadata, such as a forward index, to map LIDs of the logical address space to media storage locations on the storage device(s). The storage layer may provide for arbitrary, "any-to-any" mappings to physical storage resources. Accordingly, there may be no pre-defined and/or pre-set mappings between LIDs and particular media storage locations and/or media addresses. As used herein, a media address refers to an address of a storage resource that uniquely identifies one storage resource from another to a controller that manages a plurality of storage resources, by way of example, a media address includes, but is not limited to: the address of a media storage location, a physical storage unit, a collection of physical storage units (e.g., a logical storage unit), a portion of a media storage unit (e.g., a logical storage unit address and offset, range, and/or extent), or the like. Accordingly, the storage layer may map LIDs to physical data resources of any size and/or granularity, which may or may not correspond to the underlying data partitioning scheme of the storage device(s). For example, in some embodiments, the storage controller is configured to store data within logical storage units that are formed by logically combining a plurality of physical storage units, which may allow the storage controller to support many different virtual storage unit sizes and/or granularities.

As used herein, a logical storage element refers to a set of two or more non-volatile storage elements that are or are capable of being managed in parallel (e.g., via an I/O and/or control bus). A logical storage element may comprise a plurality of logical storage units, such as logical pages, logical storage divisions (e.g., logical erase blocks), and so on. Each logical storage unit may be comprised of storage units on the non-volatile storage elements in the respective logical storage element. As used herein, a logical storage unit refers to logical construct combining two or more physical storage units, each physical storage unit on a respective solid-state storage element in the respective logical storage element (each solid-state storage element being accessible in parallel). As used herein, a logical storage division refers to a set of two or more physical storage divisions, each physical storage division on a respective solid-state storage element in the respective logical storage element.

The logical address space presented by the storage layer may have a logical capacity, which may comprise a finite set or range of LIDs. The logical capacity of the logical address space may correspond to the number of available LIDs in the logical address space and/or the size and/or granularity of the data referenced by the LIDs. For example, the logical capacity of a logical address space comprising $2^{32}$ unique LIDs, each referencing 2048 bytes (2 kb) of data may be $2^{43}$ bytes. In some embodiments, the logical address space may be "thinly provisioned." As used herein, a thinly provisioned logical address space refers to a logical address space having a logical capacity that exceeds the physical storage capacity of the underlying storage device(s). For example, the storage layer may present a 64-bit logical address space to the storage clients (e.g., a logical address space referenced by 64-bit LIDs), which exceeds the physical storage capacity of the underlying storage devices. The large logical address space may allow storage clients to allocate and/or reference contiguous ranges of LIDs, while reducing the chance of naming conflicts. The storage layer may leverage the "any-to-any" mappings between LIDs and physical storage resources to manage the logical address space independently of the underlying physical storage devices. For example, the storage layer may add and/or remove physical storage resources seamlessly, as needed, and without changing the logical interfaces used by the storage clients.

The storage layer may be configured to store data in a contextual format. As used herein, a contextual format refers to a "self-describing" data format in which persistent metadata is associated with the data on the physical storage media (e.g., stored with the data in a packet, or other data structure). The persistent metadata provides context for the data with which it is stored. In certain embodiments, the persistent metadata uniquely identifies the data with which the persistent metadata is stored. For example, the persistent metadata may uniquely identify a sector of data owned by a storage client from other sectors of data owned by the storage client. In a further embodiment, the persistent metadata identifies an operation that is performed on the data. In a further embodiment, the persistent metadata identifies an order of a sequence of operations performed on the data. In a further embodiment, the persistent metadata identifies security controls, a data type, or other attributes of the data. In certain embodiment, the persistent metadata identifies at least one of a plurality of aspects, including data type, a unique data identifier, an operation, and an order of a sequence of operations performed on the data. The persistent metadata may include, but is not limited to: a logical interface of the data, an identifier of the data (e.g., a LID, file name, object id, label, unique identifier, or the like), reference(s) to other data (e.g., an indicator that the data is associated with other data), a relative position or offset of the data with respect to other data (e.g., file offset, etc.), data size and/or range, and the like. The contextual data format may comprise a packet format comprising a data segment and one or more headers. Alternatively, a contextual data format may associate data with context information in other ways (e.g., in a dedicated index on the non-volatile storage media, a storage division index, or the like). Accordingly, a contextual data format refers to a data format that associates the data with a logical interface of the data (e.g., the "context" of the data). A contextual data format is self-describing in that the contextual data format includes the logical interface of the data.

In some embodiments, the contextual data format may allow data context to be determined (and/or reconstructed) based upon the contents of the non-volatile storage media, and independently of other storage metadata, such as the arbitrary, "any-to-any" mappings discussed above. Since the media storage location of data is independent of the logical interface of the data, it may be inefficient (or impossible) to determine the context of data based solely upon the media storage location or media address of the data. Storing data in a contextual format on the non-volatile storage media may allow data context to be determined without reference to other storage metadata. For example, the contextual data format may allow the logical interface of data to be reconstructed based only upon the contents of the non-volatile storage media (e.g., reconstruct the "any-to-any" mappings between LID and media storage location).

In some embodiments, the storage controller may be configured to store data on an asymmetric, write-once storage media, such as solid-state storage media. As used herein, a "write once" storage media refers to a storage media that is reinitialized (e.g., erased) each time new data is written or programmed thereon. As used herein, "asymmetric" storage media refers to storage media having different latencies for different storage operations. Many types of solid-state storage media are asymmetric; for example, a read operation may be much faster than a write/program operation, and a write/program operation may be much faster than an erase operation (e.g., reading the media may be hundreds of times faster than erasing, and tens of times faster than programming the media). The storage media may be partitioned into storage divisions that can be erased as a group (e.g., erase blocks) in order to, inter alia, account for the asymmetric properties of the media. As such, modifying a single data segment "in-place" may require erasing the entire erase block comprising the data, and rewriting the modified data to the erase block, along with the original, unchanged data. This may result in inefficient "write amplification," which may excessively wear the media. Therefore, in some embodiments, the storage controller may be configured to write data "out-of-place." As used herein, writing data "out-of-place" refers to writing data to different media storage location(s) rather than overwriting the data "in-place" (e.g., overwriting the original physical location of the data). Modifying data "out-of-place" may avoid write amplification, since existing, valid data on the erase block with the data to be modified need not be erased and recopied. Moreover, writing data "out-of-place" may remove erasure from the latency path of many storage operations (the erasure latency is no longer part of the "critical path" of a write operation).

The storage controller may comprise one or more processes that operate outside of the regular path for servicing of storage operations (the "path" for performing a storage operation and/or servicing a storage request). As used herein, the "regular path for servicing a storage request" or "path for servicing a storage operation" (also referred to as a "critical path") refers to a series of processing operations needed to service the storage operation or request, such as a read, write, modify, or the like. The path for servicing a storage request may comprise receiving the request from a storage client, identifying the logical interface of the request (e.g., LIDs pertaining to the request), performing one or more storage operations on a non-volatile storage media, and returning a result, such as acknowledgement or data. Processes that occur outside of the path for servicing storage requests may include, but are not limited to: a groomer, deduplication, and so on. These processes may be implemented autonomously, and in the background from servicing storage requests, such that they do not interfere with or impact the performance of other storage operations and/or requests. Accordingly, these processes may operate independent of servicing storage requests.

In some embodiments, the storage controller comprises a groomer, which is configured to reclaim storage divisions (erase blocks) for reuse. The write out-of-place paradigm implemented by the storage controller may result in obsolete or invalid data (data that has been erased, modified, and/or overwritten) remaining on the storage device. For example, overwriting data X with data Y may result in storing Y on a new storage division (rather than overwriting X in place), and updating the "any-to-any" mappings of the storage metadata to identify Y as the valid, up-to-date version of the data. The obsolete version of the data X may be marked as "invalid," but may not be immediately removed (e.g., erased), since, as discussed above, erasing X may involve erasing an entire storage division, which is a time-consuming operation and may result in write amplification. Similarly, data that is no longer is use (e.g., deleted or trimmed data) may not be immediately removed. The non-volatile storage media may accumulate a significant amount of "invalid" data. A groomer process may operate outside of the "critical path" for servicing storage operations. The groomer process may reclaim storage divisions so that they can be reused for other storage operations. As used herein, reclaiming a storage division refers to erasing the storage division so that new data may be stored/programmed thereon. Reclaiming a storage division may comprise relocating valid data on the storage division to a new storage location. The groomer may identify storage divisions for reclamation based upon one or more factors, which may include, but are not limited to: the amount of invalid data in the storage division, the amount of valid data in the storage division, wear on the storage division (e.g., number of erase cycles), time since the storage division was programmed or refreshed, and so on.

The storage controller may be further configured to store data in a log format. As described above, a log format refers to a data format that defines an ordered sequence of storage operations performed on a non-volatile storage media. In some embodiments, the log format comprises storing data in a pre-determined sequence within the media address space of the non-volatile storage media (e.g., sequentially within pages and/or erase blocks of the media). The log format may further comprise associating data (e.g., each packet or data segment) with respective sequence indicators. The sequence indicators may be applied to data individually (e.g., applied to each data packet) and/or to data groupings (e.g., packets stored sequentially on a storage division, such as an erase block). In some embodiments, sequence indicators may be applied to storage divisions when the storage divisions are reclaimed (e.g., erased), as described above, and/or when the storage divisions are first used to store data.

In some embodiments the log format may comprise storing data in an "append only" paradigm. The storage controller may maintain a current append point within a media address space of the storage device. The append point may be a current storage division and/or offset within a storage division. Data may then be sequentially appended from the append point. The sequential ordering of the data, therefore, may be determined based upon the sequence indicator of the storage division of the data in combination with the sequence of the data within the storage division. Upon reaching the end of a storage division, the storage controller may identify the "next" available storage division (the next storage division that is initialized and ready to store data). The groomer may reclaim storage divisions comprising invalid, stale, and/or deleted data, to ensure that data may continue to be appended to the media log.

The log format described herein may allow valid data to be distinguished from invalid data based upon the contents of the non-volatile storage media, and independently of the storage metadata. As discussed above, invalid data may not be removed from the storage media until the storage division comprising the data is reclaimed. Therefore, multiple "versions" of data having the same context may exist on the non-volatile storage media (e.g., multiple versions of data having the same logical interface and/or same LID). The sequence indicators associated with the data may be used to distinguish "invalid" versions of data from the current, up-to-date version of the data; the data that is the most recent in the log is the current version, and all previous versions may be identified as invalid.

According to various embodiments, a logical interface of data stored in a contextual format is modified. The contextual format of the data may be inconsistent with the modified logical interface. As used herein, an inconsistent contextual data format refers to a contextual data format that defines a logical interface to data on storage media that is inconsistent with the logical interface of the data. The logical interface of the data may be maintained by a storage layer, storage controller, or other module. The inconsistency may include, but is not limited to: the contextual data format associating the data with a different LID than the logical interface; the contextual data format associating the data with a different set of LIDs than the logical interface; the contextual data format associating the data with a different LID reference than the logical interface; or the like. The storage controller may provide access to the data in the inconsistent contextual format and may update the contextual format of the data of the non-volatile storage media to be consistent with the modified logical interface. The update may require rewriting the data out-of-place and, as such, may be deferred. As used herein, a consistent contextual data format refers to a contextual data format that defines the same (or an equivalent) logical interface as the logical interface of the data, which may include, but is not limited to: the contextual data format associating the data with the same LID(s) (or equivalent LID(s)) as the logical interface; the contextual data format associating the LID with the same set of LIDs as the logical interface; the contextual data format associating the data with the same reference LID as the logical interface; or the like.

According to various embodiments, a storage controller and/or storage layer performs a method for managing a logical address space, comprising: modifying a logical interface of data stored in a contextual format on a non-volatile storage media, wherein the contextual format of the data on the non-volatile storage media is inconsistent with the modified logical interface of the data; accessing the data in the inconsistent contextual format through the modified logical interface; and updating the contextual format of the data on the non-volatile storage media to be consistent with the modified logical interface. The logical interface of the data may be modified in response to a request (e.g., a request from a storage client). The request may comprise a move, clone (e.g., copy), deduplication, or the like. The request may "return" (e.g., be acknowledged by the storage layer) before the contextual format of the data is updated on the non-volatile storage media. Modifying the logical interface may further comprise storing a persistent note on the non-volatile storage media indicative of the modification to the logical interface (e.g., associate the data with the modified logical interface). The contextual format of the data may be updated out-of-place, at other media storage locations on the non-volatile storage media. Updates to the contextual format may be deferred and/or made outside of the path of other storage operations (e.g., independent of servicing other storage operations and/or requests). For example, the contextual format of the data may be updated as part of a grooming process. When reclaiming a storage division, data that is in an inconsistent contextual format may be identified and updated as the data is relocated to new media storage locations. Providing access to the data through the modified logical interface may comprise referencing the data in the inconsistent contextual format through one or more reference entry and/or indirect entries in an index.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description.

FIG. 1 is a block diagram of one embodiment of a system 100 for allocating storage resources. The storage system 102 comprises a storage controller 140 and storage layer 130, which may be configured for operation on a computing device 110. The computing device 110 may comprise a processor 111, volatile memory 112, a communication interface 113, and the like. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 (and/or storage layer 130) to a communication network, such as an Internet Protocol network, a Storage Area Network, or the like. The computing device 110 may further comprise machine-readable storage media 114. The machine-readable storage media 114 may comprise machine-executable instructions configured to cause the computing device 110 (e.g., processor 111) to perform steps of one or more of the methods disclosed herein. Alternatively, or in addition, the storage layer 130 and/or one or more modules thereof may be embodied as one or more machine-readable instructions stored on the non-transitory storage media 114. The machine-readable storage medium 114 may comprise one or more persistent, non-transitory storage devices.

The storage layer 130 may be configured to provide storage services to one or more storage clients 116. The storage clients 116 may include local storage clients 116 operating on the computing device 110 and/or remote, storage clients 116 accessible via the network 115 (and communication interface 113). The storage clients 116 may include, but are not limited to: operating systems, file systems, database applications, server applications, kernel-level processes, user-level processes, applications, and the like.

The storage layer 130 comprises and/or is communicatively coupled to one or more storage devices 120A-N. The storage devices 120A-N may include different types of storage devices including, but not limited to: solid-state storage devices, hard drives, SAN storage resources, or the like. The storage devices 120A-N may comprise respective controllers 126A-N and non-volatile storage media 122A-N. The storage layer 130 may comprise an interface 138 configured to provide access to storage services and/or metadata 135 maintained by the storage layer 130. The interface 138 may be comprise, but is not limited to: a block I/O interface 131, a virtual storage interface 132, a cache interface 133, and the like. Storage metadata 135 may be used to manage and/or track storage operations performed through any of the block I/O interface 131, virtual storage interface 132, cache interface 133, or other, related interfaces.

The cache interface 133 may expose cache-specific features accessible through the storage layer 130. In some embodiments, the virtual storage interface 132 presented to the storage clients 116 provides access to data transformations implemented by the non-volatile storage device 120 and/or the non-volatile storage media controller 126.

The storage layer 130 may provide storage services through one or more interfaces, which may include, but are not limited to: a block I/O interface, an extended virtual storage interface, a cache interface, and the like. The storage layer 130 may present a logical address space 136 to the storage clients 116 through one or more interfaces. As discussed above, the logical address space 136 may comprise a plurality of LIDs, each corresponding to respective media storage locations on one or more of the storage devices 120A-N. The storage layer 130 may maintain storage metadata 135 comprising "any-to-any" mappings between LIDs and media storage locations, as described above. The logical address space 136 and storage metadata 135 may, therefore, define a logical interface of data stored on the storage devices 120A-N.

The storage layer 130 may further comprise a log storage module 137 that is configured to store data in a contextual, log format. The contextual, log data format may comprise associating data with persistent metadata, such as the logical interface of the data (e.g., LID), or the like. The contextual, log format may further comprise associating data with respective sequence identifiers on the non-volatile storage media 122A-N, which define an ordered sequence of storage operations performed on the storage devices 120A-N, as described above.

The storage layer 130 may further comprise a storage device interface 139 configured to transfer data, commands, and/or queries to the storage devices 120A-N over a bus 127, which may include, but is not limited to: a peripheral component interconnect express ("PCI Express" or "PCIe") bus, a serial Advanced Technology Attachment ("ATA") bus, a parallel ATA bus, a small computer system interface ("SCSI"), FireWire, Fibre Channel, a Universal Serial Bus ("USB"), a PCIe Advanced Switching ("PCIe-AS") bus, a network, Infiniband, SCSI RDMA, or the like. The storage device interface 139 may communicate with the storage devices 120A-N using input-output control ("IO-CTL") command(s), IO-CTL command extension(s), remote direct memory access, or the like.

The non-volatile storage devices 120A-N may comprise non-volatile storage media 122A-N, which may include but is not limited to: NAND flash memory, NOR flash memory, nano random access memory ("nano RAM" or "NRAM"), magneto-resistive RAM ("MRAM"), dynamic RAM ("DRAM"), phase change RAM ("PRAM"), magnetic storage media (e.g., hard disk, tape), optical storage media, or the like.

Portions of the storage layer 130 may be implemented by use of one or more drivers, kernel-level applications, user-level applications, and the like, which may be configured to operate within an operating system, guest operating system (e.g., in a virtualized computing environment), or the like. Other portions of the storage layer 130 may be implemented by use of hardware components, such as one or more controllers, Field-Programmable Gate Arrays ("FPGAs"), Application-Specific Integrated Circuits ("ASICs"), and/or the like.

The storage layer 130 may present a logical address space 136 to the storage clients 116 (through one or more of the interfaces 131, 132, and/or 133 of the interface 138). The storage layer 130 may maintain storage metadata 135 comprising "any-to-any" mappings between LIDs in the logical address space 136 and media storage locations on one or more non-volatile storage devices 120A-N. The storage layer 130 may further comprise a log storage module 137 configured to store data on the storage device(s) 120A-N in a contextual, log format. The contextual, log data format may comprise storing data in association with persistent metadata, such as the logical interface of the data. The contextual, log format may further comprise associating data with respective sequence identifiers that define an ordered sequence of storage operations performed through the storage layer 130.

Figure 2:
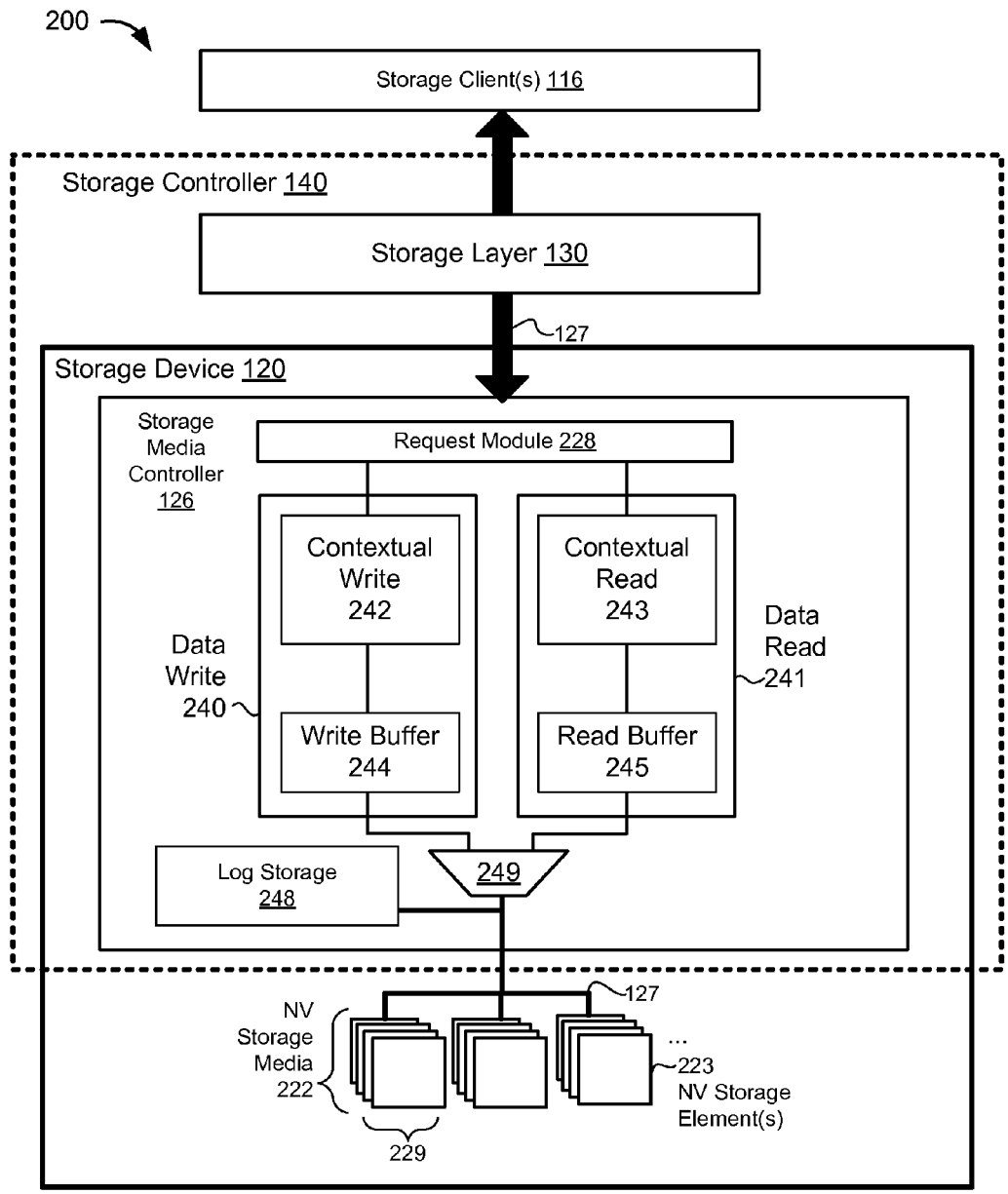
FIG. 2 is a block diagram of another embodiment of a storage system.

FIG. 2 depicts another embodiment of a system 200 comprising a storage controller 140 configured to write and/or read data in a contextual, log-based format. The system 200 may comprise a non-volatile storage device 120 comprising non-volatile storage media 222. The non-volatile storage media 222 may comprise a plurality of non-volatile storage elements 223, which may be communicatively coupled to the storage media controller 126 via a bus 127. The storage media controller 126 may manage groups of non-volatile storage elements 223 (logical storage elements 229).

The storage media controller 126 may comprise a storage request receiver module 228 configured to receive storage requests from the storage layer 130 via a bus 127. The storage request receiver 228 may be further configured to transfer data to/from the storage layer 130 and/or storage clients 116 via the bus 127. Accordingly, the storage request receiver module 228 may comprise one or more direct memory access ("DMA") modules, remote DMA modules, bus controllers, bridges, buffers, and so on.

The storage media controller 126 may comprise a data write module 240 that is configured to store data on the non-volatile storage media 222 in a contextual format. The requests may include and/or reference data to be stored on the non-volatile storage media 222, may include logical interface of the data (e.g., LID(s) of the data), and so on. The data write module 240 may comprise a contextual write module 242 and a write buffer 244. As described above, the contextual format may comprise storing a logical interface of the data (e.g., LID of the data) in association with the data on the non-volatile storage media 222. In some embodiments, the contextual write module 242 is configured to format data into packets, and may include the logical interface of the data in a packet header (or other packet field). The write buffer 244 may be configured to buffer data for storage on the non-volatile storage media 222. The data packets may comprise an arbitrary amount data. In some embodiments, the write buffer 244 may comprise one or more synchronization buffers to synchronize a clock domain of the storage media controller 126 with a clock domain of the non-volatile storage media 222 (and/or bus 127). The data write module 240 may be configured to store data in arbitrarily-sized structures (packets) on the non-volatile storage media 222.

The log storage module 248 may be configured to select media storage location(s) for the data and may provide addressing and/or control information to the non-volatile storage elements 223 via the bus 127. In some embodiments, the log storage module 248 is configured to store data sequentially in a log format within the media address space of the non-volatile storage media. The log storage module 248 may be further configured to groom the non-volatile storage media, as disclosed above.

Upon writing data to the non-volatile storage media, the storage media controller 126 may be configured to update storage metadata 135 (e.g., a forward index) to associate the logical interface of the data (e.g., the LIDs of the data) with the media address(es) of the data on the non-volatile storage media 222. In some embodiments, the storage metadata 135 may be maintained on the storage media controller 126; for example, the storage metadata 135 may be stored on the non-volatile storage media 222, on a volatile memory (not shown), or the like. Alternatively, or in addition, the storage metadata 135 may be maintained within the storage layer 130 (e.g., on a volatile memory 112 of the computing device 110 of FIG. 1). In some embodiments, the storage metadata 135 may be maintained in a volatile memory by the storage layer 130, and may be periodically stored on the non-volatile storage media 222.

The storage media controller 126 may further comprise a data read module 241 that is configured to read contextual data from the non-volatile storage media 222 in response to requests received via the storage request receiver module 228. The requests may comprise a LID of the requested data, a media address of the requested data, and so on. The contextual read module 243 may be configured to read data stored in a contextual format from the non-volatile storage media 222 and to provide the data to the storage layer 130 and/or a storage client 116. The contextual read module 243 may be configured to determine the media address of the data using a logical interface of the data and the storage metadata 135. Alternatively, or in addition, the storage layer 130 may determine the media address of the data and may include the media address in the request. The log storage module 248 may provide the media address to the non-volatile storage elements 223, and the data may stream into the data read module 241 via the read buffer 245. The read buffer 245 may comprise one or more read synchronization buffers for clock domain synchronization, as described above.

The storage media controller 126 may further comprise a multiplexer 249 that is configured to selectively route data and/or commands to/from the data write module 240 and the data read module 241. In some embodiments, storage media controller 126 may be configured to read data while filling the write buffer 244 and/or may interleave one or more storage operations on one or more banks of non-volatile storage elements 223 (not shown).

Figure 3A:
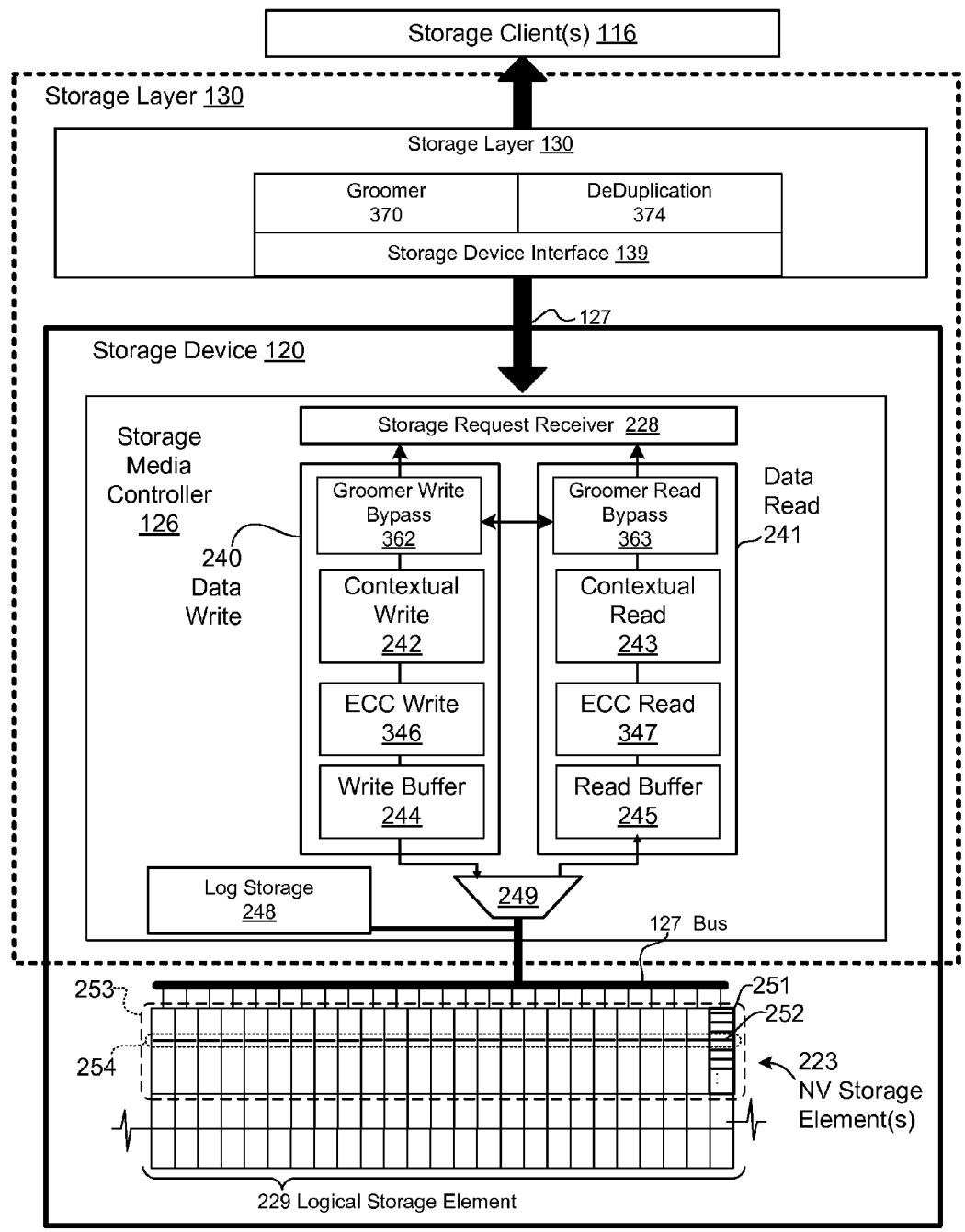
FIG. 3A is a block diagram of another embodiment of a storage system.

FIG. 3A is a block diagram depicting another embodiment of a storage layer 130. As illustrated in FIG. 3A, the non-volatile storage elements 223 may be partitioned into storage divisions (e.g., erase blocks) 251, and each storage division 251 may be partitioned into a physical storage units (e.g., pages) 252. An exemplary physical storage unit (page) 251 may be capable of storing 2048 bytes ("2 kb"). Each non-volatile storage element 223 may further comprise one or more registers for buffering data to be written to a page 251 and/or data read from a page 251. In some embodiments, the non-volatile storage elements 223 may be further arranged into a plurality of independent banks (not shown).

The storage media controller 126 may manage the non-volatile storage elements 223 as a logical storage element 229. The logical storage element 229 may be formed by coupling the non-volatile storage elements 223 in parallel using the bus 127. Accordingly, storage operations may be performed on the non-volatile storage elements 223 concurrently, and in parallel (e.g., data may be written to and/or read from the non-volatile storage elements 223 in parallel). The logical storage element 229 may comprise a plurality of logical storage divisions (e.g., logical erase blocks) 253; each comprising a respective storage division of the non-volatile storage elements 223. The logical storage divisions 253 may comprise a plurality of logical storage units (e.g., logical pages) 254; each comprising a respective physical storage unit of the non-volatile storage elements 223. The storage capacity of a logical storage unit 253 may be a multiple of the number of parallel non-volatile storage elements 223 comprising the logical storage unit 253; for example, the capacity of a logical storage element comprised of 2 kb pages on 25 non-volatile storage elements 223 is 50 kb. In other embodiments, comprising 25 non-volatile storage elements 223 having a 8 kb page size, the logical page may have a storage capacity of 200 kb.

As disclosed herein, the storage controller 140 may be configured to store data within large constructs, such as logical storage divisions 253 and/or logical storage units 254, formed from plurality non-volatile storage elements 123. The storage controller 140 may, therefore, be capable of handling data storage operations of different sizes, independent of the underlying physical partitioning and/or arrangement of the non-volatile storage elements 123. In some embodiments, for example, the storage layer 130 may be configured to store data in 16 kb segments (sectors) within logical pages 254, despite the fact that the page size of the underlying non-volatile storage elements is only 2 kb.

Although FIG. 3A depicts a particular embodiment of a logical storage element 229, the disclosure is not limited in this regard and could be adapted to differently sized logical storage elements 229 comprising any number of non-volatile storage elements 223. The size and number of erase blocks, pages, planes, or other logical and physical divisions within the non-volatile storage elements 223 are expected to change over time with advancements in technology; it is to be expected that many embodiments consistent with new configurations are possible and are consistent with the embodiments disclosed herein.

Figure 3B:
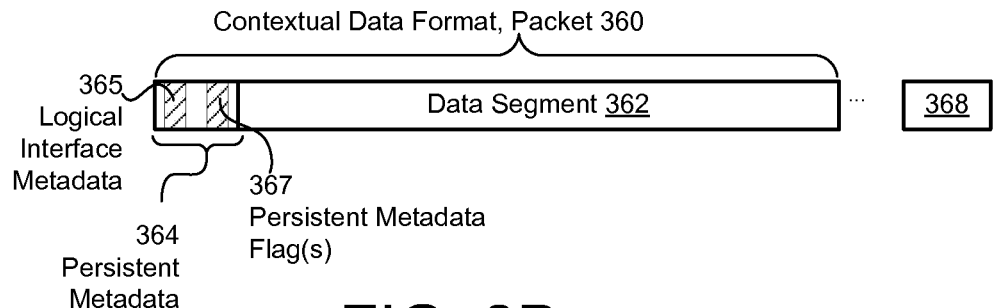
FIG. 3B depicts one example of a contextual data format.

As described above, the contextual write module 242 may be configured to store data in a contextual format. In some embodiments, the contextual format comprises a packet format. FIG. 3B depicts one example of a contextual data format (packet format 360). A packet 360 includes data (e.g., a data segment 362) that is associated with one or more LIDs. In some embodiments, the data segment 362 comprises compressed, encrypted, and/or whitened data. The data segment 362 may be a predetermined size (e.g., a fixed data "block" or "segment" size) or a variable size. The packet 360 may comprise persistent metadata 364 that is stored on the non-volatile storage media 222 with the data segment 362 (e.g., in a header of the packet format 360 as depicted in FIG. 3B). The persistent metadata 364 may include logical interface metadata 365 that defines the logical interface of the data segment 362. The logical interface metadata 365 may associate the data segment 362 with one or more LIDs, LID references (e.g., reference entries), a range, a size, and so on. The logical interface metadata 365 may be used to determine the context of the data independently of the storage metadata 135 and/or may be used to reconstruct the storage metadata 135 (e.g., reconstruct the "any-to-any" mappings, described above). The persistent metadata 364 may comprise other metadata, which may include, but are not limited to: data attributes (e.g., an access control list), data segment delimiters, signatures, links, metadata flags 367 (described below), and the like.

In some embodiments, the packet 360 may be associated with log sequence indicator 368. The log sequence indicator 368 may be persisted on the non-volatile storage media (e.g., page) with the data packet 360 and/or on the storage division (e.g., erase block) of the data packet 360. Alternatively, the sequence indicator 368 may be persisted in a separate storage division. In some embodiments, a sequence indicator 368 is applied when a storage division reclaimed (e.g., erased, when the first or last storage unit is programmed, etc.). The log sequence indicator 368 may be used to determine an order of the packet 360 in a sequence of storage operations performed on the non-volatile storage media 222, as described above.

Referring back to FIG. 3A, the contextual write module 242 may be configured to generate data packets of any suitable size. Data packets may be of a fixed size or a variable size. Due to the independence between the logical interface of data and the underlying media storage location of the data, the size of the packets generated by the contextual write module 242 may be independent of the underlying structure and/or partitioning of the non-volatile storage media 222.

The data write module 240 may further comprise an ECC write module 346, which may be configured to encode the contextual data (e.g., data packets) into respective error-correcting code ("ECC") words or chunks. The ECC encoding may be configured to detect and/or correct errors introduced through transmission and storage of data on the non-volatile storage media 222. In some embodiments, data packets stream to the ECC write module 346 as un-encoded blocks of length N ("ECC blocks"). An ECC block may comprise a single packet, multiple packets, or a portion of one or more packets. The ECC write module 346 may calculate a syndrome of length S for the ECC block, which may be appended and streamed as an ECC chunk of length N+S. The values of N and S may be selected according to testing and experience and may be based upon the characteristics of the non-volatile storage media 222 (e.g., error rate of the media 222) and/or performance, efficiency, and robustness constraints. The relative size of N and S may determine the number of bit errors that can be detected and/or corrected in an ECC chunk.

In some embodiments, there is no fixed relationship between the ECC input blocks and the packets; a packet may comprise more than one ECC block; the ECC block may comprise more than one packet; a first packet may end anywhere within the ECC block, and a second packet may begin after the end of the first packet within the same ECC block. The ECC algorithm implemented by the ECC write module 346 and/or ECC read module 347 may be dynamically modified and/or may be selected according to a preference (e.g., communicated via the bus 127), in a firmware update, a configuration setting, or the like.

The ECC read module 347 may be configured to decode ECC chunks read from the non-volatile storage medium 222. Decoding an ECC chunk may comprise detecting and/or correcting errors therein. The contextual read module 243 may be configured to depacketize data packets read from the non-volatile storage media 222. Depacketizing may comprise removing and/or validating contextual metadata of the packet, such as the logical interface metadata 365, described above. In some embodiments, the contextual read module 243 may be configured to verify that the logical interface information in the packet matches a LID in the storage request.

In some embodiments, the log storage module 248 is configured to store contextual formatted data, sequentially, in a log format. As described above, log storage refers to storing data in a format that defines an ordered sequence of storage operation, which may comprise storing data at sequential media addresses within the media address space of the non-volatile storage media (e.g., sequentially within one logical storage units 254). Alternatively, or in addition, sequential storage may refer to storing data in association with a sequence indicator, such as a sequence number, timestamp, or the like, such as the sequence indicator 368, described above.

The log storage module 248 may store data sequentially at an append point. An append point may be located where data from the write buffer 244 will next be written. Once data is written at an append point, the append point moves to the end of the data. This process typically continues until a logical erase block 253 is full. The append point is then advanced to the next available logical erase block 253. The sequence of writing to logical erase blocks is maintained (e.g., using sequence indicators) so that if the storage metadata 135 is corrupted or lost, the log sequence of storage operations data be replayed to rebuild the storage metadata 135 (e.g., rebuild the "any-to-any" mappings of the storage metadata 135).

Figure 3C:
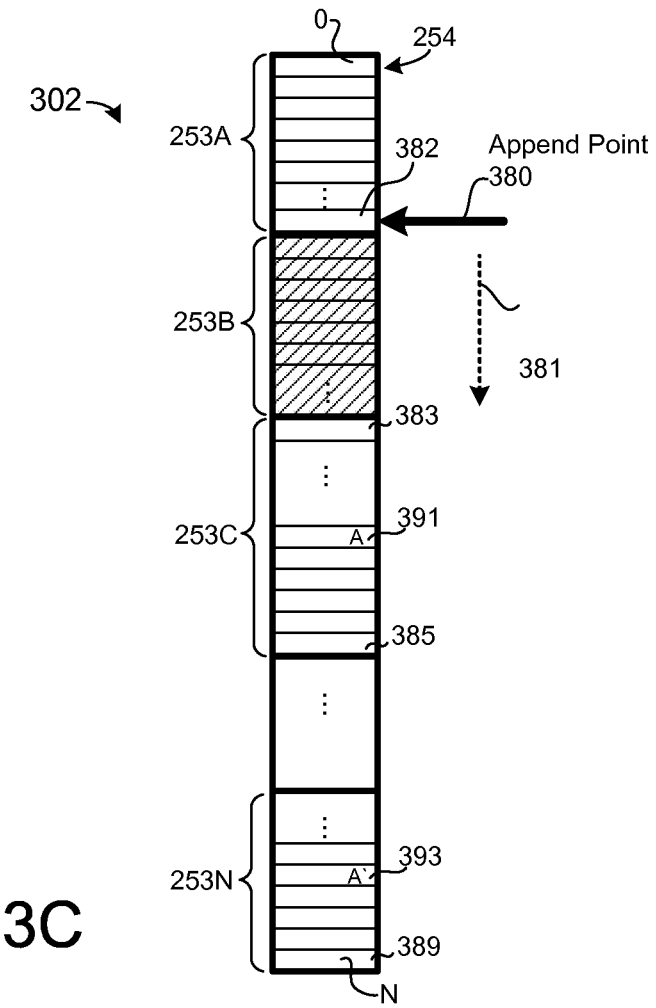
FIG. 3C is a block diagram of an exemplary log storage format.

FIG. 3C depicts one example of sequential, log-based data storage. FIG. 3C depicts a physical storage space 302 of a non-volatile storage media, such as the non-volatile storage media 222 of FIG. 3A. The physical storage space 302 is arranged into storage divisions (e.g., logical erase blocks 253A-N), each of which can be initialized (e.g., erased) in a single operation. As described above, each logical erase block 253A-N may comprise an erase block 251 of a respective non-volatile storage element 223, and each logical erase block 253A-N may comprise a plurality of logical storage units (e.g., logical pages) 254. As described above, each logical page 254 may comprise a page of a respective non-volatile storage element 223. Storage element delimiters are omitted from FIG. 3C to avoid obscuring the details of the embodiment.

The logical storage units 254 may be assigned respective media addresses; in the FIG. 3C example, the media addresses range from zero (0) to N. The log storage module 248 may store data sequentially, at the append point 380; data may be stored sequentially within the logical page 382 and, when the logical page 382 is full, the append point 380 advances 381 to the next available logical page in the logical erase block, where the sequential storage continues. Each logical erase block 253A-N may comprise a respective sequence indicator. Accordingly, the sequential storage operations may be determined based upon the sequence indicators of the logical erase blocks 253A-N, and the sequential order of data within each logical erase block 253A-N.

As used herein, an "available" logical page refers to a logical page that has been initialized (e.g., erased) and has not yet been programmed. Some non-volatile storage media 222 can only be reliably programmed once after erasure. Accordingly, an available logical erase block may refer to a logical erase block that is in an initialized (or erased) state. The logical erase blocks 253A-N may be reclaimed by a groomer (or other process), which may comprise erasing the logical erase block 253A-N and moving valid data thereon (if any) to other storage locations. Reclaiming logical erase block 253A-N may further comprise marking the logical erase block 253A-N with a sequence indicator, as described above.

The logical erase block 253B may be unavailable for storage due to, inter alia: not being in an erased state (e.g., comprising valid data), being out-of service due to high error rates or the like, and so on. In the FIG. 3C example, after storing data on the physical storage unit 382, the append point 380 may skip the unavailable logical erase block 253B, and continue at the next available logical erase block 253C. The log storage module 248 may store data sequentially starting at logical page 383, and continuing through logical page 385, at which point the append point 380 continues at a next available logical erase block, as described above.

After storing data on the "last" storage unit (e.g., storage unit N 389 of storage division 253N), the append point 380 wraps back to the first division 253A (or the next available storage division, if storage division 253A is unavailable). Accordingly, the append point 380 may treat the media address space 302 as a loop or cycle.

As disclosed above, the storage controller 140 may be configured to modify and/or overwrite data out-of-place. Accordingly, a storage request to overwrite data A stored at physical storage location 391 with data A' may be stored out-of-place on a different location (media address 393) within the physical address space 302. Storing the data A' may comprise updating the storage metadata 150 to associate A' with the new media address 393 and/or to invalidate the data A at media address 391. The groomer module 370 may be configured to scan the physical address space 370 to reclaim storage resources comprising invalidated data that no longer needs to be preserved on the storage device 120, such as the obsolete version of data A at media address 391. The storage metadata 135 may be reconstructed based on contextual, log-based storage format disclosed herein. In the FIG. 3C embodiment, the current version of data A' may be distinguished from the obsolete data A based on log ordering information on the storage device 120. Accordingly, the reconstructed index may identify the data A' at media address 393 as the current, valid version of the data, and determine that the data A at media address 391 is obsolete and can be removed from the device.

Referring back to FIG. 3A, the storage controller 324 may comprise a groomer module 380 that is configured to reclaim logical erase blocks, as described above. The groomer module 380 may monitor the non-volatile storage media and/or storage metadata 135 to identify logical erase blocks 253 for reclamation. The groomer module 370 may reclaim logical erase blocks in response to detecting one or more conditions, which may include, but are not limited to: a lack of available storage capacity, detecting a percentage of data marked as invalid within a particular logical erase block 253 reaching a threshold, a consolidation of valid data, an error detection rate reaching a threshold, improving data distribution, data refresh, or the like.

The groomer module 370 may operate outside of the path for servicing storage operations and/or requests. Therefore, the groomer module 370 may operate as an autonomous, background process, which may be suspended and/or deferred while other storage operations are in process. The groomer 370 may manage the non-volatile storage media 222 so that data is systematically spread throughout the logical erase blocks 253, which may improve performance and data reliability and to avoid overuse and underuse of any particular storage locations, thereby lengthening the useful life of the solid-state storage media 222 (e.g., wear-leveling, etc.). Although the groomer module 370 is depicted in the storage layer 130, the disclosure is not limited in this regard. In some embodiments, the groomer module 370 may operate on the storage media controller 126, may comprise a separate hardware component, or the like.

In some embodiments, the groomer 370 may interleave grooming operations with other storage operations and/or requests. For example, reclaiming a logical erase block 253 may comprise relocating valid data thereon to another storage location. The groomer read and groomer write bypass modules 363 and 362 may be configured to allow data packets to be read into the data read module 241 and then be transferred directly to the data write module 240 without being routed out of the storage media controller 126.

The groomer read bypass module 363 may coordinate reading data to be relocated from a reclaimed logical erase block 253. The groomer module 370 may be configured to interleave relocation data with other data being written to the non-volatile storage media 222 via the groomer write bypass 362. Accordingly, data may be relocated without leaving the storage media controller 126. In some embodiments, the groomer module 370 may be configured to fill the remainder of a logical page (or other data storage primitive) with relocation data, which may improve groomer efficiency, while minimizing the performance impact of grooming operations.

The storage layer 130 may further comprise a deduplication module 374, which may be configured to identify duplicated data on the storage device 120. The deduplication module 374 may be configured to identify duplicated data and to modify a logical interface of the data, such that one or more LIDs reference the same set of data on the storage device 120 as opposed to referencing separate copies of the data. The deduplication module 374 may operate outside of the path for servicing storage operations and/or requests, as described above.

Figure 3D:
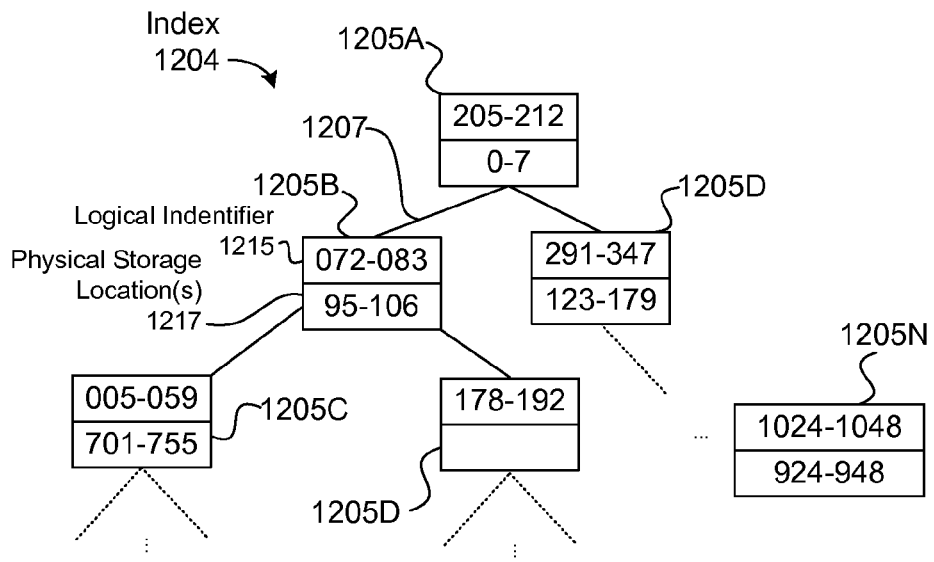
FIG. 3D depicts one embodiment of an index.

As described above, the storage controller may maintain an index corresponding to the logical address space 136. FIG. 3D depicts one example of such an index 1204. The index 1204 may comprise a one or more entries 1205A-N. Each entry 1205A may correspond to a LID (or LID range or extent) 1217 in the logical address space 136. The entries 1205A-N may represent LIDs that have been allocated for use by one or more storage clients 116. The index 1204 may comprise "any-to-any" mappings between LIDs and media storage locations on one or more storage devices 120. For example, the entry 1205B binds LIDs 072-083 to media storage locations 95-106. An entry 1205D may represent a LID that has been allocated, but has not yet been used to store data, and as such, the LIDs may not be bound to any particular media storage locations (e.g., the LIDs 178-192 are "unbound"). As described above, deferring the allocation of physical storage resources may allow the storage controller 140 to more efficiently manage storage resources (e.g., prevent premature reservation of physical storage resources, so that the storage resources are available to other storage clients 116). One or more of the entries 1205A-N may comprise additional metadata 1219, which may include, but is not limited to: access control metadata (e.g., identify the storage client(s) authorized to access the entry), reference metadata, logical interface metadata, and so on. The index 1204 may be maintained by the storage layer 130 (e.g., translation module 134), and may be embodied as storage metadata 135 on a volatile memory 112 and/or a non-transitory machine-readable storage media 114 and/or 120.

The index 1204 may be configured to provide for fast and efficient entry lookup. The index 1204 may be implemented using one or more datastructures, including, but not limited to: a B-tree, a content addressable memory ("CAM"), a binary tree, a hash table, or other datastructure that facilitates quickly searching a sparsely populated logical address space. The datastructure may be indexed by LID, such that, given a LID, the entry 1205A-N corresponding to the LID (if any) can be identified in a computationally efficient manner.

Figure 14:
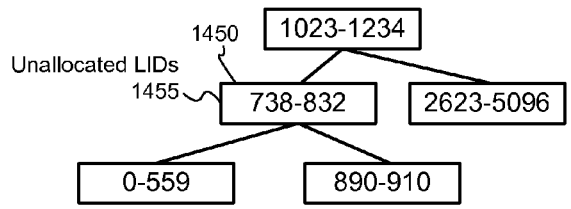
FIG. 14 depicts an example of an index for maintaining unallocated logical capacity.

In some embodiments, the index 1204 comprises one or more entries (not shown) to represent unallocated LIDs (e.g., LIDs that are available for allocation by one or more storage clients 116). The unallocated LIDs may be maintained in the index 1204 and/or in a separate index 1444 as depicted in FIG. 14. In some embodiments, the index 1204 may comprise one or more sub-indexes, such as a "reference index." As described below, the reference index 1222 may comprise data that is being referenced by one or more other entries 1205A-N in the index (e.g., indirect references). Although particular examples and datastructures of storage metadata 135 are described herein, the disclosure is not limited in this regard; the storage layer 130 may be configured to incorporate any type of storage metadata embodied using any suitable datastructure.

Figure 4:
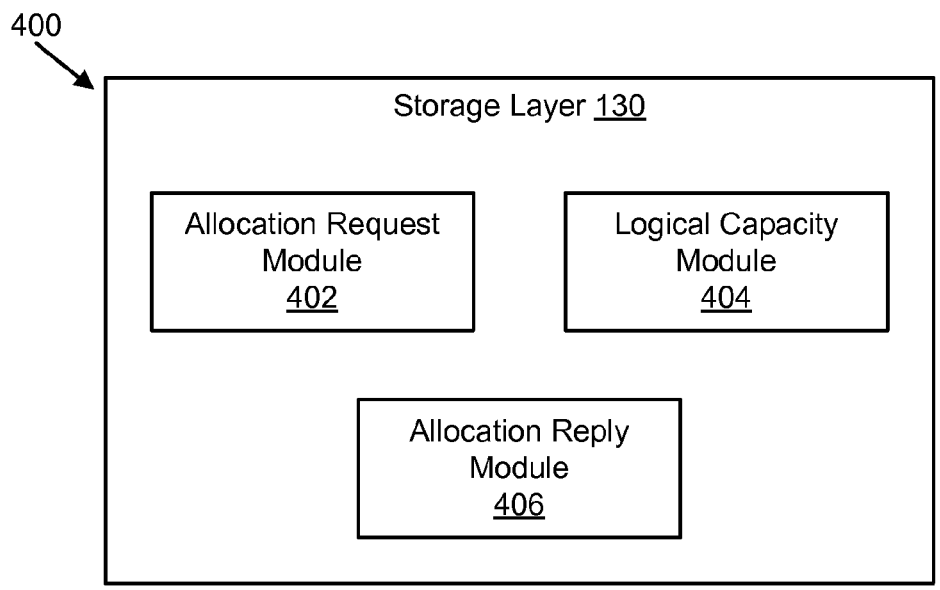
FIG. 4 is a block diagram of one embodiment of an apparatus to allocate data storage space.

FIG. 4 is a schematic block diagram illustrating an embodiment of an apparatus 400 to allocate data storage space. The apparatus 400 includes an allocation request module 402, a logical capacity module 404, and an allocation reply module 406, which are described below. The allocation request module 402, the logical capacity module 404, and the allocation reply module 406 are depicted in the storage layer 130 in general, but all or part of the allocation request module 402, the logical capacity module 404, and the allocation reply module 406 may be in a storage layer 130, storage media controller 126, or the like.

The apparatus 400 includes an allocation request module 402 that receives from a requesting device an allocation request to allocate logical capacity. The requesting device may be storage client 116, or any other device or component capable of sending an allocation request. The storage layer 130 may comprise and/or be communicatively coupled to one or more storage devices 120 (as depicted in FIG. 1). The logical capacity associated with the allocation request may refer to storing data on a particular storage device 120 or on any of a plurality of storage devices 120A-N.

The allocation request may include a logical allocation request or may include a request to store data. A logical allocation request may comprise a request to allocate LIDs to a storage client 116. A data storage request may comprise a request to store data corresponding to one or more LIDs that are allocated to the storage client 116, which are then bound to media storage locations. As described above, binding the LIDs may comprise associating the LIDs with media storage locations comprising the data in an index maintained in the storage metadata 135 (e.g., the index 1204). The LIDs may be bound to media storage locations at the time of allocation (e.g., the allocation request may comprise a request to store data). Alternatively, where the allocation request is separate from a request to store data, allocating LIDs to the data may be in a separate step from binding the LIDs to the media storage locations. In some embodiments, the request comes from a plurality of storage clients 116, consequently a client identifier may be associated with the request, the apparatus 400 may use the client identifier to implement an access control with respect to allocations for that storage client 116 and/or with respect to the LIDs available to allocate to the storage client 116. In addition, the client identifier may be used to manage how much physical capacity is allocated to a particular storage client 116 or set of storage clients 116.

The apparatus 400 includes a logical capacity module 404 that determines if a logical address space 136 of the data storage device includes sufficient unallocated logical capacity to satisfy the allocation request. The logical capacity module 404 may determine if the logical address space 136 has sufficient unbound and/or unallocated logical capacity using an index (or other datastructure) maintaining LID bindings and/or LID allocations. In some embodiments, the logical capacity module 404 may search a logical-to-physical map or index maintained in the storage metadata 135 and/or an unallocated index 1444 described below.

As described above, unbound LIDs may refer to LIDs that do not correspond to valid data stored on a media storage location. An unbound LID may be allocated to a client 116 or may be unallocated. In some embodiments, the logical-to-physical map is configured such that there are no other logical-to-logical mappings between the LIDs in the map and media addresses associated with the LIDs.

In some embodiments, the logical capacity module 404 searches the logical-to-physical index 1204 (or other datastructure) to identify unbound LIDs and identifies unallocated logical space therein. For example, if a logical address space 136 includes a range of logical addresses from 0000 to FFFF and the logical-to-physical map indicates that the logical addresses 0000 to F000 are allocated and bound, the logical capacity module 404 may determine that LIDs F001 to FFFF are not allocated. If the LIDs F001 to FFFF are not allocated to another storage client 116, they may be available for allocation to satisfy the allocation request.

In some embodiments, the translation module 134 may maintain a plurality of different logical address spaces, such as a separate logical address space each storage client 116. Accordingly, each storage client 116 may operate in its own, separate logical storage space 136. The storage layer 130 may, therefore, comprise separate storage metadata 135 (e.g., indexes, capacity indicators, and so on), for each storage client 116 (or group of storage clients 116). Storage clients 116 may be distinguished by an identifier, which may include, but is not limited to: an address (e.g., network address), credential, name, context, or other identifier. The identifiers may be provided in storage requests and/or may be associated with a communication channel or protocol used by the storage client 116 to access the storage layer 130.

In some embodiments, the index 1204 (or other datastructure) may comprise an allocation index or allocation entries configured to track logical capacity allocations that have not yet been bound to media storage locations. For example, a LID (or other portion of logical capacity) may be allocated to a client, but may not be associated with data stored on a storage device 120. Accordingly, although the logical capacity maybe allocated, it may be "unbound," and as such, may not be included in the logical-to-physical index. Accordingly, when determining the unallocated logical address space 136, the logical capacity module 404 may consult additional datastructures (e.g., allocation index, allocation entries, and/or an unallocated index 1444). Alternatively, the allocation entry may be included in the logical-to-physical index (e.g., entry 1205D), and may comprise an indicator showing that the entry is not bound to any particular media storage locations.

An allocation request may include a request for a certain number of LIDs. The logical capacity module 404 may determine if the available logical capacity (e.g., unbound and/or unallocated logical capacity) is sufficient to meet or exceed the requested amount of logical addresses. In another example, if the allocation request specifies a list or range of LIDs to allocate, the logical capacity module 404 can determine if the LIDs for all or a portion of the LIDs requested are unallocated or unbound.

The apparatus 400 may further comprise an allocation reply module 406 that communicates a reply to the requesting device indicating whether the request can be satisfied. For example, if the logical capacity module 404 determines that the unallocated logical space is insufficient to satisfy the allocation request, the allocation reply module 406 may include in the reply that the allocation request failed, and if the logical capacity module 404 determines that the unallocated logical space is sufficient to satisfy the allocation request (and/or the specified LIDs are unallocated), the allocation reply module 406 may include in the reply an affirmative response. An affirmative response may comprise a list of allocated LIDs, a range of LIDs, or the like.

In some embodiments, the allocation request is for a specific group of LIDs and the allocation reply module 406 may reply with the requested LIDs. In another embodiment, the allocation request is part of a write request. In one case the write request includes specific LIDs and the allocation reply module 406 may reply with the requested LIDs. In another case the write request only includes data or an indication of an amount of data and the allocation reply module 406 may reply by allocating LIDS sufficient for the write request and returning the allocated LIDS. Alternatively, if an indication of an amount of data is provided the reply may include LIDs that are unallocated. The allocation reply module 406 may reply before or after the data is written. If the allocation reply module 406 sends a reply after the data is written, the reply may be part of a confirmation of writing the data. One of skill in the art will recognize other ways that the allocation reply module 406 may reply in response to the logical capacity module 404 determining if the logical space of the data storage device has sufficient unallocated logical space to satisfy an allocation request.

The storage layer 130 may expose portions of the logical address space maintained by the translation module 134 (e.g., index 1204) directly to storage clients 116 via the virtual storage interface 132 (or other interface). The storage clients 116 may use the virtual storage interface 132 to perform various functions including, but not limited to: identifying available logical capacity (e.g., particular LIDs or general LID ranges), determining available physical capacity, querying the health of the storage media 122, identifying allocated LIDs, identifying LIDs that are bound to media storage locations, etc. The interface 138 can expose all or a subset of the features and functionality of the apparatus 400 directly to clients which may leverage the virtual storage interface 132 to delegate management of the logical address space 136 and/or LIDs to the storage layer 130.

Figure 5:
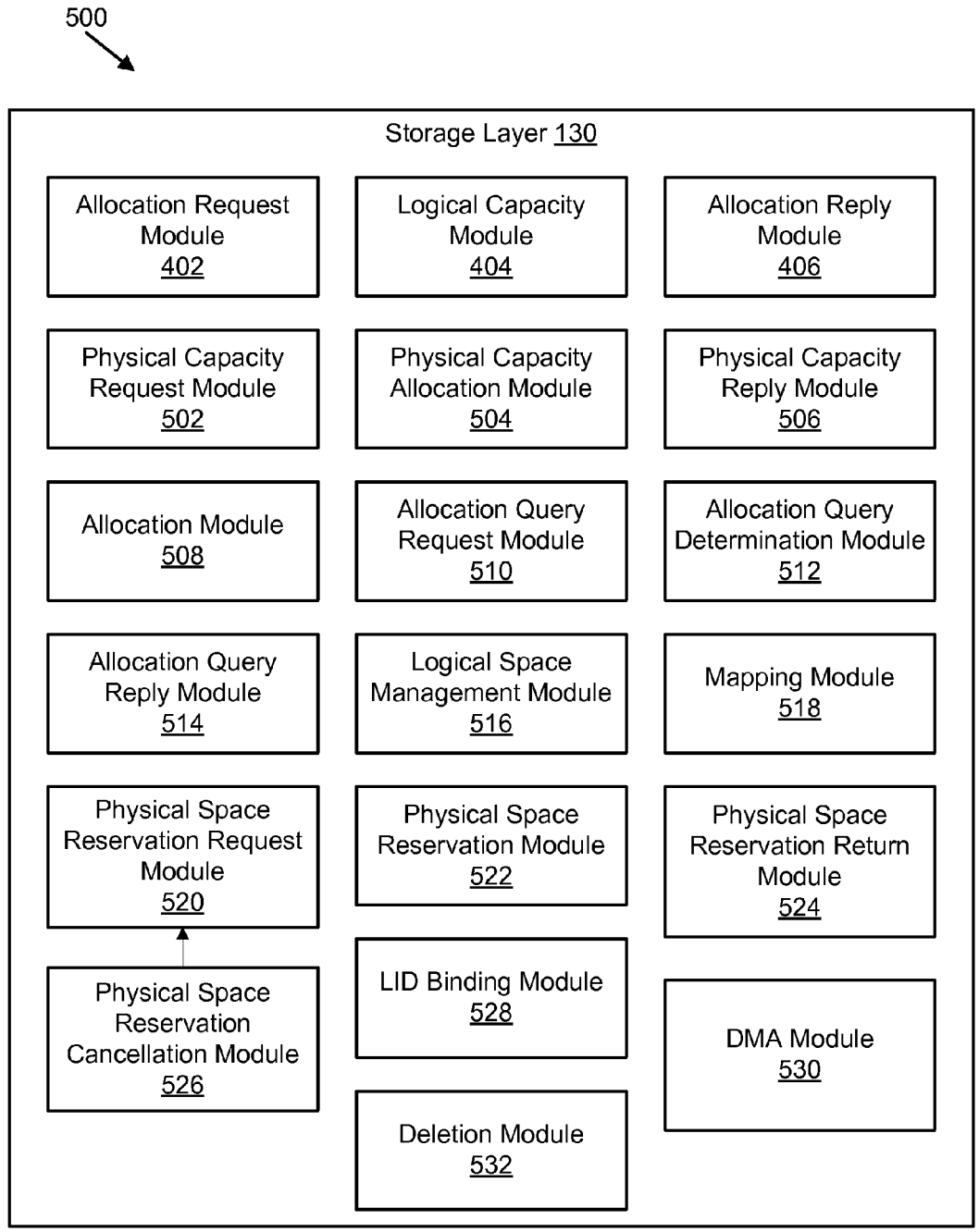
FIG. 5 is a block diagram of another embodiment of an apparatus to allocate data storage space.

FIG. 5 is a schematic block diagram illustrating another embodiment of an apparatus 500 to allocate data storage space. The apparatus 500 includes an allocation request module 402, a logical capacity module 404, and an allocation reply module 406, which are substantially similar to those described above in relation to the apparatus 400 of FIG. 4. In addition, the apparatus 500 includes a physical capacity request module 502, a physical capacity allocation module 504, a physical capacity reply module 506, an allocation module 508, an allocation query request module 510, an allocation query determination module 512, an allocation query reply module 514, a logical space management module 516, a mapping module 518, a physical space reservation request module 520, a physical space reservation module 522, a physical space reservation return module 524, a physical space reservation cancellation module 526, a LID binding module 528, a DMA module 530, and a deletion module 532, which are described below. The modules 402-406 and 502-532 of the apparatus 500 of FIG. 5 may be included in the storage layer 130, a storage media controller 126, or any other appropriate location known to one of skill in the art.

The apparatus 500 includes, in one embodiment, a physical capacity request module 502, a physical capacity allocation module 504, and a physical capacity reply module 506. The physical capacity request module 502 receives from a requesting device a physical capacity request. The physical capacity request is received at the data storage device and includes a request of an amount of available physical storage capacity in the data storage device (and/or physical storage capacity allocated to the requesting device). The physical capacity request may include a quantity of physical capacity or may indirectly request physical storage capacity, for example by indicating a size of a data unit to be stored. Another indirect physical storage capacity request may include logical addresses of data to be stored which may correlate to a data size. One of skill in the art will recognize other forms of a physical capacity request.

The physical capacity allocation module 504 determines the amount of available physical storage capacity on one or more storage devices 120 and/or 120A-N. The amount of available physical storage capacity includes a physical storage capacity of unbound media storage locations. In some embodiments, the amount of available physical storage capacity may be "budgeted," for example, only a portion of the physical storage capacity of a storage device 120 may be available to the requesting device. The amount of available physical storage capacity may be budgeted based on a quota associated with each storage client 116 or group of storage clients 116. The apparatus 500 may enforce these quotas. The allocation of available physical storage device may be determined by configuration parameter(s), may be dynamically adjusted according to performance and/or quality of service policies, or the like.

The physical capacity allocation module 504 may determine the amount of available physical storage capacity using an index (or other datastructure), such as the index 1204 described above. Index 1204 may identify the media storage locations that comprise valid data (e.g., entries 1205A-N that comprise bound media storage locations). The available storage capacity may be a total (or budgeted) physical capacity minus the capacity of the bound media storage locations. Alternatively, or in addition, an allocation index (or other datastructure) may maintain an indicator of the available physical storage capacity. The indicator may be updated responsive to storage operations performed on the storage device including, but not limited to: grooming operations, deallocations (e.g., TRIM), writing additional data, physical storage capacity reservations, physical storage capacity reservation cancellations, and so on. Accordingly, the module 504 may maintain a "running total" of available physical storage capacity that is available on request.

The physical capacity reply module 506 that communicates a reply to the requesting device in response to the physical capacity allocation module 504 determining the amount of available physical storage capacity on the data storage device.

The physical capacity allocation module 504, in one embodiment, tracks bound media storage locations, unbound media storage locations, reserved physical storage capacity, unreserved physical storage capacity, and the like. The physical capacity allocation module 504 may track these parameters using a logical-to-physical map, a validity map, a free media address pool, a used media address pool, a physical-to-logical map, or other means known to one of skill in the art.

The reply may take many forms. In one embodiment where the physical capacity request includes a request for available physical capacity, the reply may include an amount of available physical storage capacity. In another embodiment where the physical capacity request includes a specific amount of physical capacity, the reply may include an acknowledgement that the data storage device has the requested available physical storage capacity. One of skill in the art will recognize other forms of a reply in response to a physical capacity request.

The apparatus 500 with a physical capacity request module 502, a physical capacity allocation module 504, and a physical capacity reply module 506 is advantageous for storage devices 120 where a logical-to-physical mapping is not a one-to-one mapping. In a typical random access device where read and write requests include one or more LBAs, a file server storage client 116 may track physical storage capacity of a storage device 120 by tracking the LBAs that are bound to media storage locations.

For a log storage system where multiple media storage locations can be mapped to a single LID (e.g., multiple versions of data mapped to a LID) or vice versa (e.g., multiple LIDs to a the same media storage locations) tracking LIDs may not provide any indication of physical storage capacity. These many-to-one relationships may be used to support snap shots, cloning (e.g., logical copies), deduplication and/or backup. Examples of systems and methods for managing many-to-one LID to media storage location logical interfaces are disclosed in further detail below. The apparatus 500 may track available physical storage space and may communicate the amount of available physical storage space to storage clients 116, which may allow the storage clients 116 to offload allocation management and physical capacity management to the storage layer 130.

In some embodiments, media storage locations are bound to corresponding LIDs. When data is stored in response to a write request, LIDs associated with the data are bound to the media storage location where the data is stored. For a log-structured file system where data is stored sequentially, the location where the data is stored is not apparent from the LID, even if the LID is an LBA. Instead, the data is stored at an append point and the address where the data is stored is mapped to the LID. If the data is a modification of data stored previously, the LID may be mapped to the current data as well as to a location where the old data is stored. There may be several versions of the data mapped to the same LID.

The apparatus 500, in one embodiment, includes an allocation module 508 that allocates the unallocated logical space sufficient to satisfy the allocation request of the requesting device. The allocation module 508 may allocate the unallocated logical space in response to the logical capacity module 404 determining that the logical space has sufficient unallocated logical space to satisfy the allocation request.

In one embodiment, the allocation request is part of a pre-allocation where logical space is not associated with a specific request to store data. For example, a storage client 116 may request, using an allocation request, logical space and then may proceed to store data over time to the allocated logical space. The allocation module 508 allocates LIDs to the storage client 116 in response to an allocation request and to the logical capacity module 404 determining that the logical space has sufficient unallocated logical space to satisfy the allocation request.

The allocation module 508 may also allocate LIDs based on an allocation request associated with a specific storage request. For example, if a storage request includes specific LIDs and the logical capacity module 404 determines that the LIDs are available, the allocation module 508 may allocate the LIDs in conjunction with storing the data of the storage request. In another example, if the storage request does not include LIDs and the logical capacity module 404 determines that there are sufficient LIDs to for the storage request, the allocation module 508 may select and allocate LIDs for the data and the allocation reply module 406 may communicate the allocated LIDs.

The allocation module 508 may be configured to locate unallocated LIDs to satisfy an allocation request. In some embodiments, the allocation module 508 may identify unallocated LIDs by receiving a list of requested LIDs to allocate from the storage client 116 and verify that these LIDs are available for allocation. In another example, the allocation module 508 may identify unallocated LIDs by searching for unallocated LIDs that meet criteria received in conjunction with the request. The criteria may be LIDs that are associated with a particular storage device 120A-N, that are available in a RAID, that have some assigned metadata characteristic, etc.

In another example, the allocation module 508 may identify unallocated LIDs by creating a subset of LIDs that meet criteria received in conjunction with the request identified in a pool of available LIDs. In one instance, the LIDs may be a subset of LIDs that have already been allocated to the client 116. For example, if a set or group of LIDs is allocated to a particular user, group, employer, etc., a subset of the LIDs may be allocated. A specific example is if a set of LIDs is allocated to an organization and then a subset of the allocated LIDs is further allocated to a particular user in the organization. One of skill in the art will recognize other ways that the allocation module 508 can identify one or more unallocated LIDs.

The allocation module 508, in one embodiment, can expand the LIDs allocated to a storage client 116 by allocating LIDs in addition to LIDs already allocated to the storage client 116. In addition, LIDs allocated to a storage client 116 may be decreased by deallocating certain LIDs so that they return to a pool of unallocated LIDs. In other embodiments, subsets of allocated LIDs may be allocated, deallocated, increased, decreased, etc. For example, LIDs allocated to a user in an organization may be deallocated so that the LIDs allocated to the user are still allocated to the organization but not to the user.

The apparatus 500, in one embodiment, includes an allocation query request module 510, an allocation query determination module 512, and an allocation query reply module 514. The allocation query request module 510 receives an allocation query from some requesting device, such as a storage client 116, etc. An allocation query may include a request for information about allocating logical space or associated management of the allocated logical space. For example, an allocation query may be a request to identify allocated LIDs, identify bound LIDs, identify allocated LIDs that are not bound to media storage locations, unallocated LIDs or a range of LIDs, and the like.

The allocation query may include information about logical allocation, logical capacity, physical capacity, or other information meeting criteria in the allocation query. The information may include metadata, status, logical associations, historical usage, flags, control, etc. One of skill in the art will recognize other allocation queries and the type of information returned in response to the allocation query.

The allocation query includes some type of criteria that allows the allocation query determination module 512 to service the allocation request. The allocation query determination module 512, in one embodiment, identifies one or more LIDs that meet the criteria specified in the allocation query. The identified LIDs include allocated LIDs that are bound to media storage locations, allocated LIDs that are unbound, unallocated LIDs, and the like.

The allocation query reply module 514 communicates to the client 110 the results of the query to the requesting device or to another device as directed in the allocation query. The results of the allocation query may include a list of the identified LIDs, an acknowledgement that LIDs meeting the criteria were found, an acknowledgement that LIDs meeting the criteria in the allocation query were not found, bound/unbound status of LIDs, logical storage capacity, or the like. Typically the allocation query reply module 514 returns status information and the information returned may include any information related to managing and allocating LIDs known to those of skill in the art.

The apparatus 500, in another embodiment, includes a logical space management module 516 that manages the logical space of the data storage device from within the data storage device. For example, the logical space management module 516 may manage the logical space from a storage layer 130 or driver associated with a storage device 120 of the data storage device. The logical space management module 516 may track unbound LIDs and bound LIDs, for example, in the logical-to-physical map, in an index, or in another datastructure. As described above, a bound LID refers to a LID corresponding to data; a bound LID is a LID associated with valid data stored on a media storage location of the storage device 120.

The logical space management module 516, in various embodiments, may service allocation requests and allocation queries as described above, and other functions related to allocation. The logical space management module 516 can also include receiving a deallocation request from a requesting device. The deallocation request typically includes a request to return one or more allocated LIDs to an unallocated state and then communicating to the requesting device, or other designated device, the successful deallocation. The deallocation request may include a request to return one or more storage locations associated with the LIDs allocated, and then communicating to the requesting device, or other designated device, the successful deallocation. This might be transparent, or might require that the deallocation request be extended to include an indication that a logical/physical deallocation should accompany the request. Deallocation requests may be asynchronous and tied to the groomer. Thus, the deallocation request may be virtual (in time) until completed. The management of the allocations (logical and physical) may diverge from the actual available space at any point in time. The management module 516 is configured to deal with these differences.

The logical space management module 516 may also receive a LID group command request from a requesting device and may communicate to the requesting device a reply indicating a response to the LID group command request. The LID group command request may include an action to take on, for example, two or more LIDs ("LID group"), metadata associated with the LID group, the data associated with the LID group, and the like. For example, if several users are each allocated LIDs and the users are part of a group, a LID group command may be to deallocate the LIDs for several of the users, allocate additional LIDs to each user, return usage information for each user, etc. The action taken in response to the LID group command may also include modifying the metadata, backing up the data, backing up the metadata, changing control parameters, changing access parameters, deleting data, copying the data, encrypting the data, deduplicating the data, compressing the data, decompressing the data, etc. One of skill in the art will recognize other logical space management functions that the logical space management module 516 may also perform.

The apparatus 500, in one embodiment, includes a mapping module 518 that binds, in a logical-to-physical map (e.g., the index 1204), bound LIDs to media storage locations. The logical capacity module 404 determines if the logical space has sufficient unallocated logical space using the logical-to-physical map mapped by the mapping module 518. The index 1204 may be used to track allocation of the bound LIDs, the unbound LIDs, the allocated LIDs, the unallocated LIDs, the allocated LID capacity, the unallocated LID capacity, and the like. In one embodiment, the mapping module 518 binds LIDs to corresponding media addresses in multiple indexes and/or maps.

In addition, a reverse map may be used to quickly access information related to a media address and to link to a LID associated with the media address. The reverse map may be used to identify a LID from a media address. A reverse map may be used to map addresses in a data storage device 120 into erase regions, such as erase blocks, such that a portion of the reverse map spans an erase region of the storage device 120 erased together during a storage space recovery operation. Organizing a reverse map by erase regions facilitates tracking information useful during grooming operations. For example, the reverse map may include which media addresses in an erase region have valid data and which have invalid data. When valid data is copied from an erase region and the erase region erased, the reverse map can easily be changed to indicate that the erase region does not include data and is ready for sequential storage of data.

A more detailed discussion of forward and reverse mapping is included in U.S. patent application Ser. No. 12/098, 434, titled "Apparatus, System, and Method for Efficient Mapping of Virtual and Media addresses, Non-Volatile Storage," to David Flynn, et al., filed Apr. 8, 2008, which is incorporated herein by reference. By including any-to-any mappings between LIDs and media addresses, the storage layer 130 efficiently consolidates functions such as thin provisioning, allocation functions, etc. that have traditionally been handled by other entities. The mapping module 518 may, therefore, provide an efficient way to eliminate layers of mapping used in traditional systems.

In a thinly provisioned storage system, one potential problem is that a storage client 116 may attempt to write data to a storage device only to have the write request fail because the storage device is out of available physical storage capacity. For random access devices where the file server/file system tracks available physical storage capacity relying on the one-to-one mapping of LBAs to PBAs, the likelihood of a storage device running out of storage space is very low. The apparatus 500 includes a physical space reservation request module 520, located in the storage layer 130, that receives a request from a storage client 116 to reserve available physical storage capacity on the data storage device (i.e. the storage device 120 that is part of the data storage device) [hereinafter a "physical space reservation request"]. In one embodiment, the physical space reservation request includes an indication of an amount of physical storage capacity requested by the storage client 116.

The indication of an amount of physical storage capacity requested may be expressed in terms of physical capacity. The request to reserve physical storage capacity may also include a request to allocate the reserved physical storage capacity to a logical entity. The indication of an amount of physical storage capacity may be expressed indirectly as well. For example, a storage client 116 may indicate a number of logical blocks and the data storage device may determine a particular fixed size for each logical block and then translate the number of logical blocks to a physical storage capacity. One of skill in the art will recognize other indicators of an amount of physical storage capacity in a physical space reservation request.

The physical space reservation request, in one embodiment, is associated with a write request. In one embodiment, the write request is a two-step process, and the physical space reservation request and the write request are separate. In another embodiment, the physical space reservation request is part of the write request or the write request is recognized as having an implicit physical space reservation request. In another embodiment, the physical space reservation request is not associated with a specific write request, but may instead be associated with planned storage, reserving storage space for a critical operation, etc., where mere allocation of storage space is insufficient.

In certain embodiments, the data may be organized into atomic data units. For example, the atomic data unit may be a packet, a page, a logical page, a logical packet, a block, a logical block, a set of data associated with one or more logical block addresses (the logical block addresses may be contiguous or noncontiguous), a file, a document, or other grouping of related data.

In one embodiment, an atomic data unit is associated with a plurality of noncontiguous and/or out of order logical block addresses or other identifiers that the data write module 240 handles as a single atomic data unit. As used herein, writing noncontiguous and/or out of order logical blocks in a single write operation is referred to as an atomic write. In one embodiment, a hardware controller processes operations in the order received and a software driver of the client sends the operations to the hardware controller for a single atomic write together so that the data write module 240 can process the atomic write operation as normal. Because the hardware processes operations in order, this guarantees that the different logical block addresses or other identifiers for a given atomic write travel through the data write module 240 together to the nonvolatile memory. The client, in one embodiment, can back out, reprocess, or otherwise handle failed atomic writes and/or other failed or terminated operations upon recovery once power has been restored.

In one embodiment, apparatus 500 may mark blocks of an atomic write with a metadata flag indicating whether a particular block is part of an atomic write. One example of metadata marking is to rely on the log write/append only protocol of the nonvolatile memory together with a metadata flag, or the like. The use of an append only log for storing data and prevention of any interleaving blocks enables the atomic write membership metadata to be a single bit. In one embodiment, the flag bit may be a 0, unless the block is a member of an atomic write, and then the bit may be a 1, or vice versa. If the block is a member of an atomic write and is the last block of the atomic write, in one embodiment, the metadata flag may be a 0 to indicate that the block is the last block of the atomic write. In another embodiment, different hardware commands may be sent to mark different headers for an atomic write, such as the first block in an atomic write, middle member blocks of an atomic write, tail of an atomic write, or the like.

On recovery from a power loss or other failure of the client or of the storage device, in one embodiment, the apparatus 500 scans the log on the nonvolatile storage in a deterministic direction (for example, in one embodiment the start of the log is the tail and the end of the log is the head and data is always added at the head). In one embodiment, the power management apparatus scans from the head of the log toward the tail of the log. For atomic write recovery, in one embodiment, when scanning head to tail, if the metadata flag bit is a 0, then the block is either a single block atomic write or a non-atomic write block. In one embodiment, once the metadata flag bit changes from 0 to 1, the previous block scanned and potentially the current block scanned are members of an atomic write. The power management apparatus, in one embodiment, continues scanning the log until the metadata flag changes back to a 0; at that point in the log, the previous block scanned is the last member of the atomic write and the first block stored for the atomic write.

In one embodiment, the nonvolatile memory uses a sequential, append only write structured writing system where new writes are appended on the front of the log (i.e. at the head of the log). In a further embodiment, the storage controller reclaims deleted, stale, and/or invalid blocks of the log using a garbage collection system, a groomer, a cleaner agent, or the like. The storage controller, in a further embodiment, uses a forward map to map logical block addresses to media addresses to facilitate use of the append only write structure and garbage collection.

The apparatus 500, in one embodiment, includes a physical space reservation module 522 that determines if the data storage device (i.e. storage device 120) has an amount of available physical storage capacity to satisfy the physical storage space request. If the physical space reservation module 522 determines that the amount of available physical storage capacity is adequate to satisfy the physical space reservation request, the physical space reservation module 522 reserves an amount of available physical storage capacity on the storage device 120 to satisfy the physical storage space request. The amount of available physical storage capacity reserved to satisfy the physical storage space request is the reserved physical capacity.

The amount of reserved physical capacity may or may not be equal to the amount of storage space requested in the physical space reservation request. For example, the storage layer 130 may need to store additional information with data written to a storage device 120, such as metadata, index information, error correcting code, etc. In addition, the storage layer 130 may encrypt and/or compress data, which may affect storage size.

In one embodiment, the physical space reservation request includes an amount of logical space and the indication of an amount of physical storage capacity requested is derived from the requested logical space. In another embodiment, the physical space reservation request includes one or more LIDs and the indication of an amount of physical storage capacity requested is derived from an amount of data associated with the LIDs. In one example, the data associated with the LIDs is data that has been bound to the LIDs, such as in a write request. In another example, the data associated with the LIDs is a data capacity allocated to each LID, such as would be the case if a LID is an LBA and a logical block size could be used to derive the amount of requested physical storage capacity.

In another embodiment, the physical space reservation request is a request to store data. In this embodiment the physical space reservation request may be implied and the indication of an amount of physical storage capacity requested may be derived from the data and/or metadata associated with the data. In another embodiment, the physical space reservation request is associated with a request to store data. In this embodiment, the indication of an amount of physical storage capacity requested is indicated in the physical space reservation request and may be correlated to the data of the request to store data.

The physical space reservation module 522 may also then factor metadata, compression, encryption, etc. to determine an amount of required physical capacity to satisfy the physical space reservation request. The amount of physical capacity required to satisfy the physical space reservation request may be equal to, larger than, or smaller than an amount indicated in the physical space reservation request.

Once the physical space reservation module 522 determines an amount of physical capacity required to satisfy the physical space reservation request, the physical space reservation module 522 determines if one or more storage devices 120A-N, either individually or combined, have enough available physical storage capacity to satisfy the physical space reservation request. The request may be for space on a particular storage device (e.g. 120A), a combination of storage devices 120A-N, such as would be the case if some of the storage devices 120A-N are in a RAID configuration, or for available space generally. The physical space reservation module 522 may tailor a determination of available capacity to specifics of the physical space reservation request.

Where the physical space reservation request is for space on more than one storage device, the physical space reservation module 522 will typically retrieve available physical storage capacity information from each logical-to-physical map of each storage device 120 or a combined logical-to-physical map of a group of storage devices 120A-N. The physical space reservation module 522 typically surveys bound media addresses. Note that the physical space reservation module 522 may not have enough information to determine available physical capacity by looking at bound LIDs, because there is typically not a one-to-one relationship between LIDs and media storage locations.

The physical space reservation module 522 reserves physical storage capacity, in one embodiment, by maintaining enough available storage capacity to satisfy the amount of requested capacity in the physical space reservation request. Typically, in a log structured file system or other sequential storage device, the physical space reservation module 522 would not reserve a specific media region or media address range in the storage device 120, but would instead reserve physical storage capacity.

For example, a storage device 120 may have 500 gigabytes ("GB") of available physical storage capacity. The storage device 120 may be receiving data and storing the data at one or more append points, thus reducing the storage capacity. Meanwhile, a garbage collection or storage space recovery operation may be running in the background that would return recovered erase blocks to storage pool, thus increasing storage space. The locations where data is stored and freed are constantly changing so the physical space reservation module 522, in one embodiment, monitors storage capacity without reserving fixed media storage locations.

The physical space reservation module 522 may reserve storage space in a number of ways. For example, the physical space reservation module 522 may halt storage of new data if the available physical storage capacity on the storage device 120 decreased to the reserved storage capacity, may send an alert if the physical storage capacity on the storage device 120 was reduced to some level above the reserved physical storage capacity, or some other action or combination of actions that would preserve an available storage capacity above the reserved physical storage capacity.

In another embodiment, the physical space reservation module 522 reserves a media region, range of media addresses, etc. on the data storage device. For example, if the physical space reservation module 522 reserved a certain quantity of erase blocks, data associated with the physical space reservation request may be stored in the reserved region or address range. The data may be stored sequentially in the reserved storage region or range. For example, it may be desirable to store certain data at a particular location. One of skill in the art will recognize reasons to reserve a particular region, address range, etc. in response to a physical space reservation request.

In one embodiment, the apparatus 500 includes a physical space reservation return module 524 that transmits to the storage client 116 an indication of availability or unavailability of the requested amount of physical storage capacity in response to the physical space reservation module 522 determining if the data storage device has an amount of available physical storage space that satisfies the physical space reservation request. For example, if the physical space reservation module 522 determines that the available storage space is adequate to satisfy the physical space reservation request, the physical space reservation return module 524 may transmit a notice that the physical space reservation module 522 has reserved the requested storage capacity or other appropriate notice.

If, on the other hand, the physical space reservation module 522 determines that the storage device 120 does not have enough available physical storage capacity to satisfy the physical space reservation request, the physical space reservation return module 524 may transmit a failure notification or other indicator that the requested physical storage space was not reserved. The indication of availability or unavailability of the requested storage space, for example, may be used prior to writing data to reduce a likelihood of failure of a write operation.

The apparatus 500, in another embodiment, includes a physical space reservation cancellation module 526 that cancels all or a portion of reserved physical storage space in response to a cancellation triggering event. The cancellation triggering event may come in many different forms. For example, the cancellation triggering event may include determining that data to be written to the storage device 120 and associated with available space reserved by the physical space reservation module 522 has been previously stored by the storage layer 130.

For example, if a deduplication process (deduplication module 374) determines that the data has already been stored, the data may not need to be stored again since the previously stored data could be mapped to two or more LIDs. In a more basic example, if reserved physical storage space is associated with a write request and the write request is executed, the cancellation triggering event could be completion of storing data of the write request. In this example, the physical space reservation cancellation module 526 may reduce or cancel the reserved physical storage capacity.

If the data written is less than the reserved space, the physical space reservation cancellation module 526 may merely reduce the reserved amount, or may completely cancel the reserved physical storage capacity associated with the write request. Writing to less than the reserved physical space may be due to writing a portion of a data unit where the data unit is the basis of the request, where data associated with a physical space reservation request is written incrementally, etc. In one embodiment, physical storage space is reserved by the physical storage space reservation module 522 to match a request and then due to compression or similar procedure, the storage space of the data stored is less than the associated reserved physical storage capacity.

In another embodiment, the cancellation triggering event is a timeout. For example, if a physical space reservation request is associated with a write request and the physical space reservation module 522 reserves physical storage capacity, if the data associated with the write request is not written before the expiration of a certain amount of time the physical space reservation cancellation module 526 may cancel the reservation of physical storage space. One of skill in the art will recognize other reasons to cancel all or a portion of reserved physical capacity.

The physical space reservation module 522, in one embodiment, may increase or otherwise change the amount of reserved physical storage capacity. For example, the physical space reservation request module 520 may receive another physical space reservation request, which may or may not be associated with another physical space reservation request. Where the physical space reservation request is associated with previously reserved physical storage capacity, the physical space reservation module 522 may increase the reserved physical storage capacity. Where the physical space reservation request is not associated with previously reserved physical storage capacity, the physical space reservation module 522 may separately reserve physical storage capacity and track the additional storage capacity separately. One of skill in the art will recognize other ways to request and reserve available physical storage capacity and to change or cancel reserved capacity. Standard management should include some kind of thresholds, triggers, alarms and the like for managing the physical storage capacity, providing indicators to the user that action needs to be taken. Typically, this would be done in the management system. But, either the management system would have to pool the devices under management or said devices would have to be configured/programmed to interrupt the manger when a criteria was met (preferred).

The apparatus 500, in another embodiment, includes a LID binding module 528 that, in response to a request from a storage client 116 to write data, binds one or more unbound LIDs to media storage locations comprising the data and transmits the LIDs to the storage client 116. The LID assignment module 528, in one embodiment, allows on-the-fly allocation and binding of LIDs. The request to write data, in another embodiment, may be a two step process. The LID binding module 528 may allocate LIDs in a first step for data to be written and then in a second step the data may be written along with the allocated LIDs.

In one embodiment, the LID allocation module 402 allocates LIDs in a contiguous range. The LID binding module 528 may also allocate LIDs in a consecutive range. Where a logical space is large, the LID allocation module 402 may not need to fragment allocated LIDs but may be able to choose a range of LIDs that are consecutive. In another embodiment, the LID allocation module 402 binds LIDs that may not be contiguous and may use logical spaces that are interspersed with other allocated logical spaces.

The apparatus 500, in another embodiment, includes a DMA module 530 that pulls data from a client 110 in a direct memory access ("DMA") and/or a remote DMA ("RDMA") operation. The data is first identified in a request to store data, such as a write request, and then the storage layer 130 executes a DMA and/or RDMA to pull data from the storage client 116 to a storage device 120. In another embodiment, the write request does not use a DMA or RDMA, but instead the write request includes the data. Again the media storage locations of the data are bound to the corresponding LIDs.

In one embodiment, the apparatus 500 includes a deletion module 532. In response to a request to delete data from the data storage device, in one embodiment, the deletion module 532 removes the mapping between storage space where the deleted data was stored and the corresponding LID. The deletion module 532 may also unbind the one or more media storage locations of the deleted data and also may deallocate the one or more logical addresses associated with the deleted data.

Figure 6:
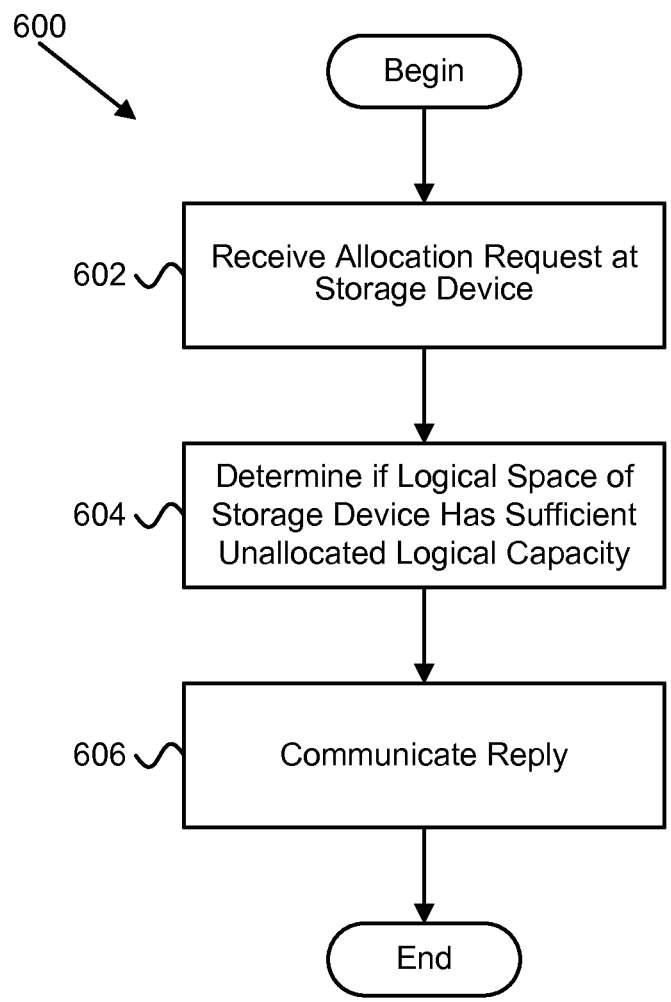
FIG. 6 is a flow diagram of one embodiment of a method for allocating data storage space.

FIG. 6 is a flow diagram of one embodiment of a method 600 for allocating data storage space. In some embodiments, the method 600, and the other methods and/or processes disclosed herein, may be embodied as instructions stored on a computer-readable storage medium. The instructions may be configured for execution by a computing device, and may be configured to cause the computing device to perform one or more of the disclosed method steps and/or operations. Alternatively, or in addition, one or more of the disclosed method steps and/or operations may be implemented by use of hardware components, such as special-purpose circuitry, logic elements, processors, ASICs, FPGAs, and/or the like.

Step 602 may comprise receiving an allocation request from a storage client 116. The allocation request may be received through the interface 138 of the storage layer 130. The logical capacity module 404 determines 604 if a logical address space 136 includes sufficient unallocated logical capacity to satisfy the allocation request where the determination includes a search of a logical-to-physical map (e.g., index 1204, or other datastructure). The logical-to-physical map includes bindings between LIDs of the logical space and corresponding media storage locations comprising data of the bound LIDs, wherein a bound LID differs from the one or more media storage locations addresses bound to the LID. The allocation reply module 406 communicates 606 a reply to the requesting device and the method 600 ends.

Figure 7:
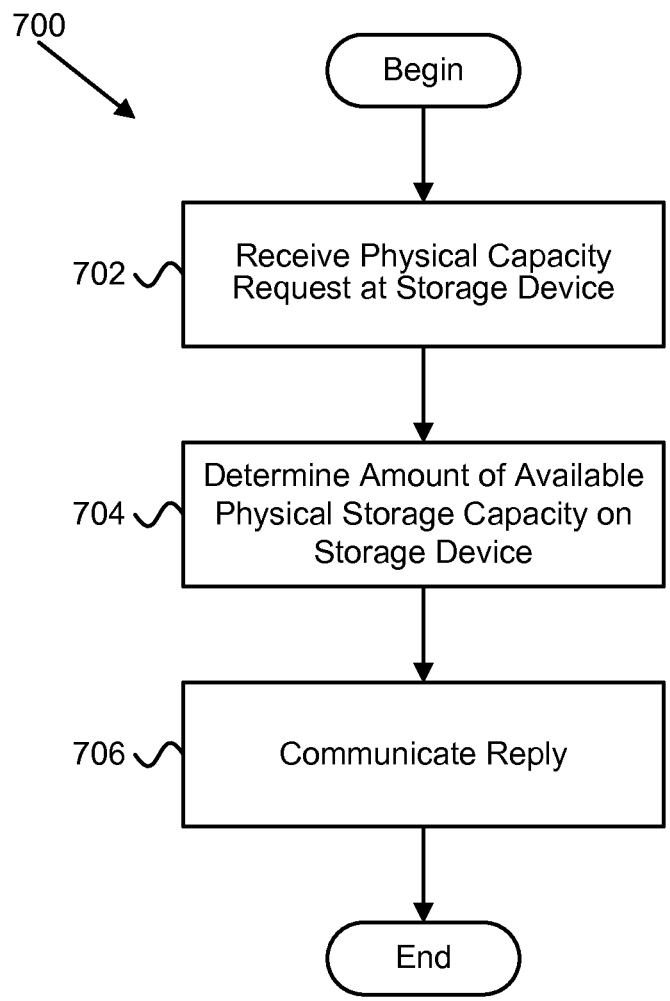
FIG. 7 is a flow diagram of one embodiment of a method for servicing a physical capacity request.

FIG. 7 is a schematic flow chart diagram illustrating one embodiment of a method 700 for allocating data storage space. The method 700 begins and the physical capacity request module 502 receives 702 from a requesting device a physical capacity request. The physical capacity request is received at the data storage device. The physical capacity request includes a request of an amount of available physical storage capacity in the data storage device. The physical capacity request, for example, may be a specific amount of physical capacity, may be derived from a request to store data, etc.

The physical capacity allocation module 504 determines 704 the amount of available physical storage capacity on the data storage device where the amount of available physical storage capacity includes a physical storage capacity of unbound storage locations in the data storage device. The physical capacity reply module 506 communicates 706 a reply to the requesting device in response to the physical capacity allocation module 504 determines the amount of available physical storage capacity on the data storage device, and the method 700 ends.

Figure 8:
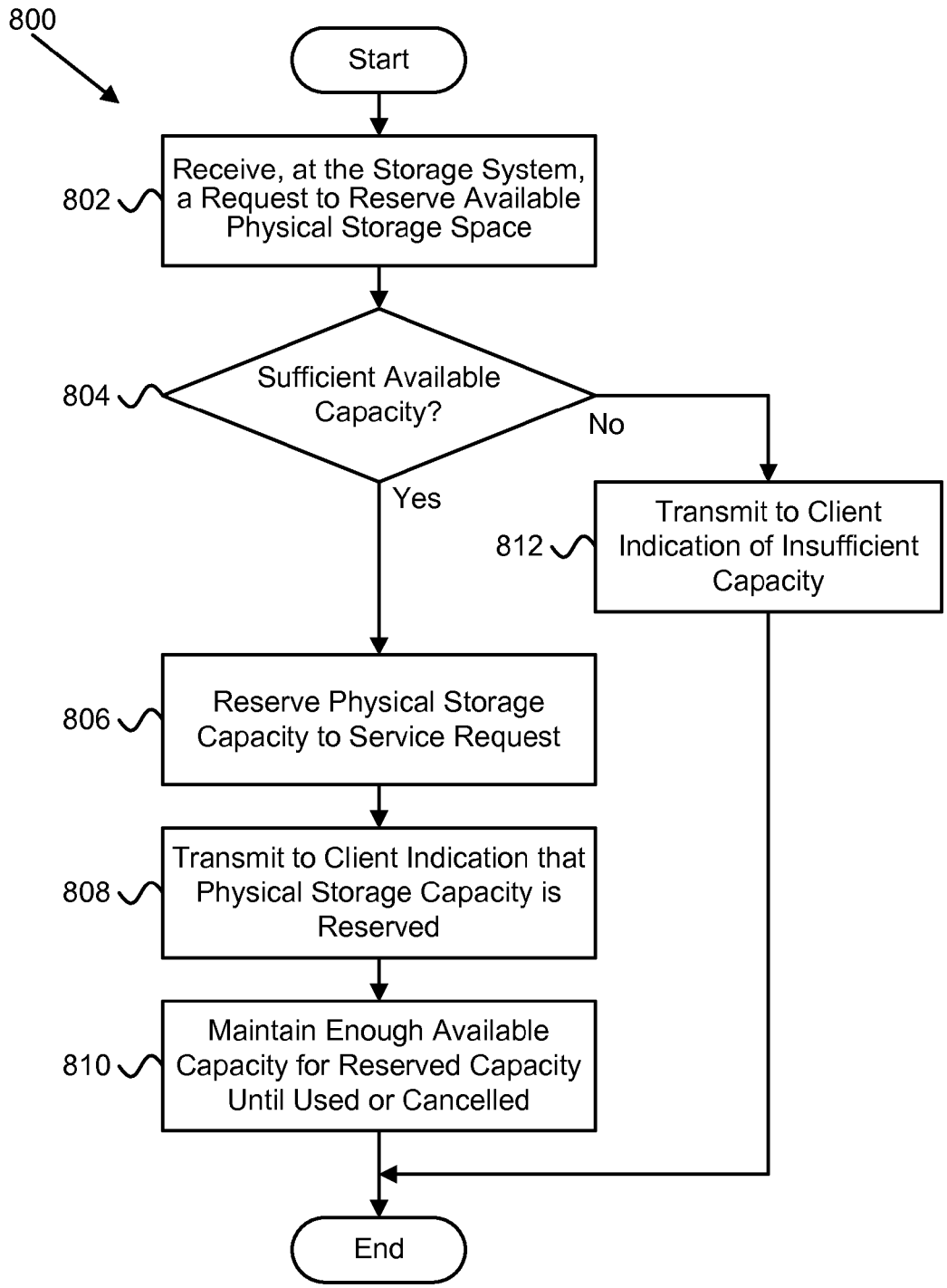
FIG. 8 is a flow diagram of one embodiment of a method for reserving physical storage space.

FIG. 8 is a schematic flow chart diagram illustrating one embodiment of a method 800 for reserving physical storage space. The method 800 begins and the physical space reservation request module 520 receives 802 a physical space reservation request to reserve available physical storage space. The physical space reservation request includes an indication of an amount of physical storage capacity requested. The indication of an amount of physical storage capacity could take many forms, such as a number of bytes or a number of logical blocks, a request to store specific data, or other indirect indication where the indication of an amount of physical storage is derived from the request.

The physical space reservation module 522 determines 804 if the data storage device has available physical storage capacity to satisfy the physical storage space request. If the physical space reservation module 522 determines 804 that the data storage device has available physical storage capacity to satisfy the physical storage space request, the physical space reservation module 522 reserves 806 physical storage capacity adequate to service the physical space reservation request and the physical space reservation return module 524 transmits 808 to the requesting storage client 116 an indication that the requested physical storage space is reserved.

The physical allocation module 404 maintains 810 enough available physical storage capacity to maintain the reservation of physical storage capacity until the reservation is used by storing data associated with the reservation or until the reservation is cancelled, and the method 800 ends. If the physical space reservation module 522 determines 804 that the data storage device does not have available physical storage capacity to satisfy the physical storage space request, the physical space reservation return module 524 transmits 812 to the requesting storage client 116 an indication that the requested physical storage space is not reserved or an indication of insufficient capacity, and the method 800 ends.

Figure 9:
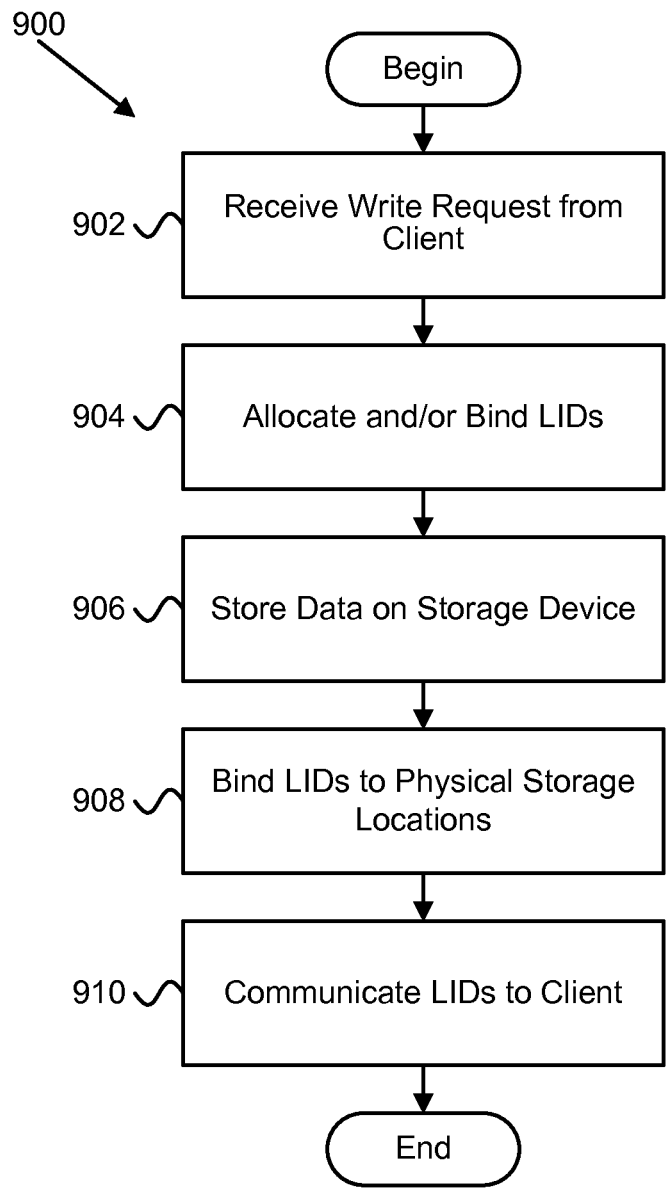
FIG. 9 is a flow chart diagram of one embodiment of a method for binding allocated logical identifiers to media storage locations.

FIG. 9 is a schematic flow chart diagram illustrating one embodiment of a method 900 for binding LIDs to media storage locations. The method 900 begins and the LID binding module 528 receives 902 a write request from a storage client 116. The write request is a request to write data to one or more storage devices 120. For 902 may comprise determining whether the request is associated with any LIDs (e.g., determining whether LIDs have been allocated for the request).

Step 904 may comprise allocating LIDs to the storage client to service the write request (if necessary), as disclosed above. Step 904 may further comprise identifying LIDs allocated to the storage client for use in referencing the data of the write request. Step 904 may comprising indicating that the identified LIDs are allocated by the storage client and are currently being used to reference valid data on a storage device. Step 904 may further comprise allocating and/or reserving physical storage capacity for the write request (by use of the physical capacity allocation module 504, as disclosed above.

Step 906 may comprise servicing the write request by, inter alia, storing data of the write request onto one or more storage device(s) 120. The data may be stored in a contextual, log-based format, as disclosed herein. The data may be stored at one or more physical storage locations, which may be referenced by respective media addresses. Step 908 may comprise binding the LIDs identified at step 904 to the media addresses of step 906. Step 908 may, therefore, comprise the mapping module 518 binding the media addresses to the LIDs identified at step 904 (e.g., binding the LIDs to the media addresses in one or more entries 1205A-N of an index). In some embodiments, the media addresses may be determined concurrently with (or after) the data is stored at step 906.

In some embodiments, step 910 further comprises providing an indication of the LIDs used to satisfy the write request (the LIDs identified at step 904) to the storage client 116. The LIDs may be communicated in an acknowledgement message, a return value, a callback, or other suitable mechanism.

Figure 10:
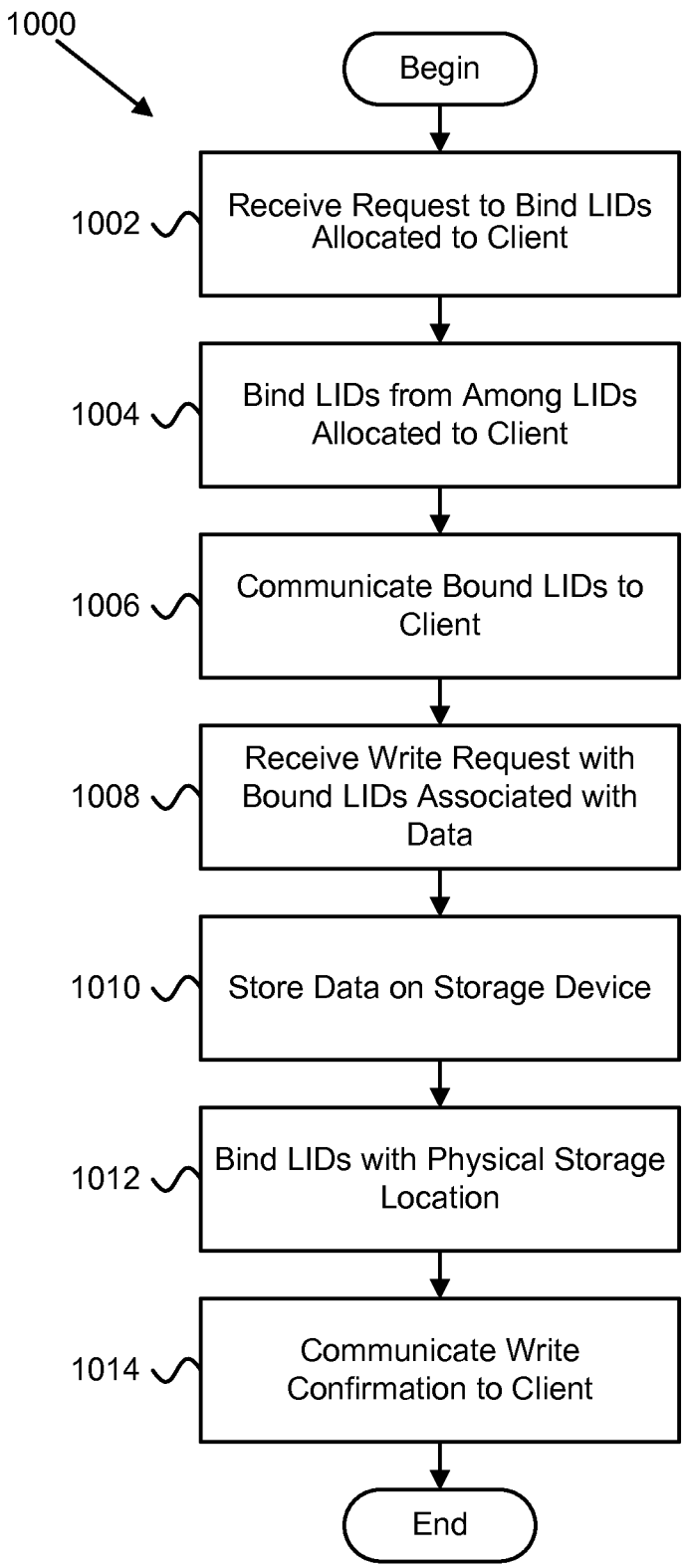
FIG. 10 is a flow diagram of another embodiment of a method for binding allocated logical identifiers to media storage locations.

FIG. 10 is a schematic flow chart diagram illustrating another embodiment of a method 1000 for binding allocated LIDs in data storage device 120. The method 1000 begins and the LID binding module 528 receives 1002 a request to bind LIDs to data where the LIDs are allocated to the storage client 116 making the request. The LID binding module 528 binds 1004 LIDs to media storage locations comprising the data. The LID binding module 528 communicates 1006 the bound LIDs to the storage client 116.

The storage layer 130 receives 1006 a write request to write data to a storage device 120 where the data is already associated with bound LIDs. In other embodiments, the write request is to store the data on more than one storage device 120 in the storage system 102, such as would be the case if the storage devices 120 are RAIDed or if the data is written to a primary storage device 120 and to a mirror storage device 120. The storage controller 140 stores 1010 the data on the storage device 120 and the mapping module 518 maps 1012 one or more media storage locations where the data is stored to the bound LIDs (e.g., updates the binding between the LIDs and media storage locations in the index 1204). Step 1014 may further comprise communicating an indication that the request of step 1002 was successfully completed.

Figure 11:
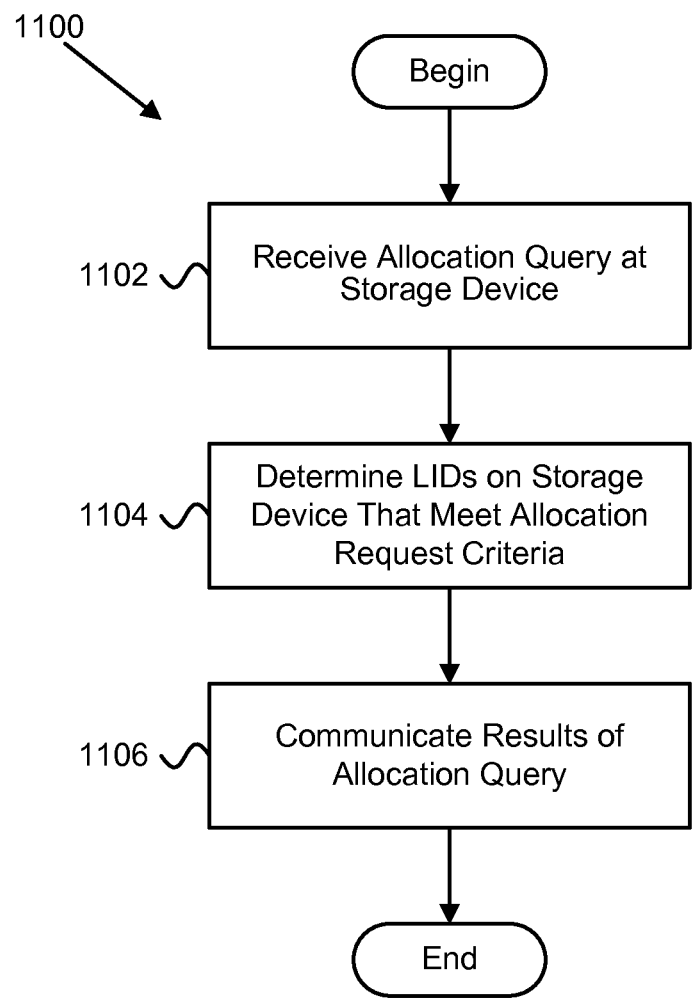
FIG. 11 is a flow diagram of one embodiment of a method for servicing an allocation query at a storage device.

FIG. 11 is a schematic flow chart diagram illustrating an embodiment of a method 1100 for servicing an allocation query at a storage device. The allocation query request module 510 receives 1102 an allocation query at the data storage device. The allocation query determination module 512 identifies 1104 one or more LIDs that meet a criteria specified in the allocation query. The identified LIDs include allocated LIDs that are bound, allocated LIDs that are unbound, and/or unallocated LIDs. The allocation query reply module 514 communicates 1106 the results of the allocation query to a requesting device or other designated device and the method 1100 ends. The results may include a list of the identified LIDs, an acknowledgement that LIDs meeting the criteria were found, an acknowledgement that LIDs meeting the criteria in the allocation query were not found, etc.

Figure 12:
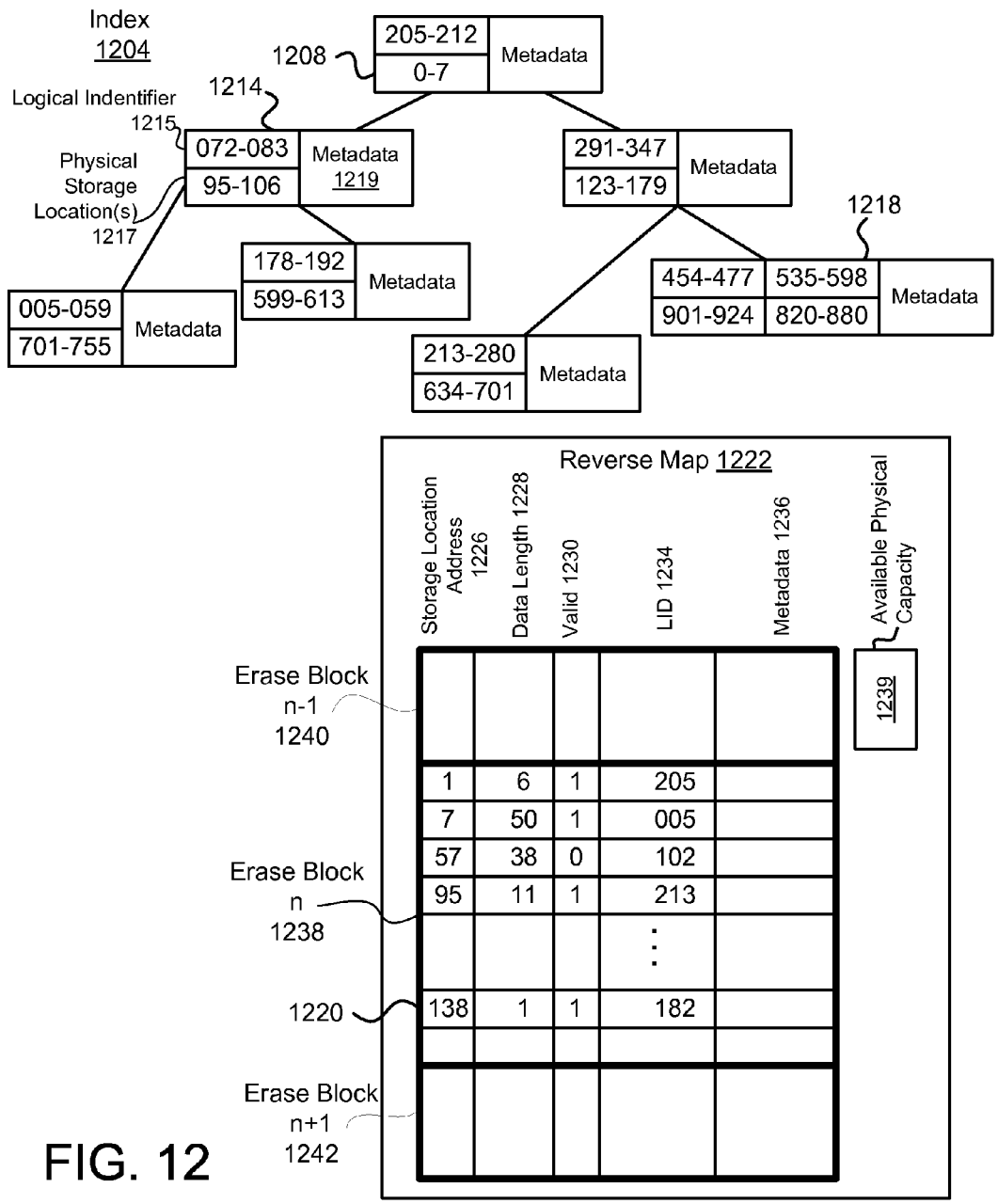
FIG. 12 is a schematic diagram of exemplary embodiments of indexes to associate logical identifiers with storage locations of a storage device.

FIG. 12 depicts another example of an index 1204 for associating LIDs with storage locations on a non-volatile storage device. The index 1204 may comprise a tree (or other datastructure) comprising a plurality of entries (e.g., entries 1208, 1214, 1218 and so on). Each entry in the index 1204 may associate a LID (or LID range, extent, or set) with one or more media storage locations, as described above. The LIDs may be contiguous (e.g. 072-083). Other entries, such as 1218, may comprise a discontiguous set of LIDs (e.g., LID 454-477 and 535-598). Accordingly, the index 1204 may be used to represent variable sized storage entries (e.g., storage entries corresponding to one or more storage locations of the—volatile storage device 120 comprising data of an arbitrary set or range of LIDs).

The storage entries may further comprise and/or reference metadata 1219, which may comprise metadata pertaining to the LIDs, such as age, size, LID attributes (e.g., client identifier, data identifier, file name, group identifier), and so on. Since the metadata 1219 is associated with the storage entries, which are indexed by LID (e.g., address 1215), the metadata 1219 may remain associated with the storage entry 1214 regardless of changes to the location of the underlying storage locations on the non-volatile storage device 120 (e.g., changes to the storage locations 1217).

The index 1204 may be used to efficiently determine whether the non-volatile storage device 120 comprises a storage entry referenced in a client request and/or to identify a storage location of data on the device 120. For example, the non-volatile storage device 120 may receive a request to allocate a particular LID. The request may specify a particular LID, a LID and a length or offset (e.g., request 3 units of data starting from LID 074), a set of LIDs or the like. Alternatively, or in addition, the client request may comprise a set of LIDs, LID ranges (continuous or discontinuous), or the like.

The non-volatile storage device 120 may determine whether a storage entry corresponding to the requested LIDs is in the index 1204 using a search operation. If a storage entry comprising the requested LIDs is found in the index 1204, the LID(s) associated with the request may be identified as being allocated and bound. Accordingly, data corresponding to the LID(s) may be stored on the non-volatile storage device 120. If the LID(s) are not found in the index 1204, the LID(s) may be identified as unbound (but may be allocated). Since the storage entries may represent sets of LIDS and/or LID ranges, a client request may result in partial allocation. For example, a request to allocate 068-073 may successfully allocate LIDs 068 to 071, but may fail to allocate 072 and 073 since these are included in the storage entry 1214. In the event of a partial allocation, the entire allocation request may fail, the available LIDs may be allocated and other LIDs may be substituted for the failed LIDs, or the like.

In the example depicted in FIG. 12, the storage entry corresponding to the storage request is in the index 1204 (storage entry 1214), and, as such, the LIDs associated with the request are identified as allocated and bound. Therefore, if the client request is to read data at the specified LIDs, data may be read from the storage locations 1217 identified in the storage entry 1214 and returned to the originator of the request. If the request is to allocate the identified LIDs, the allocation request may fail (and/or substitute LIDs may be allocated as described above).

When new storage entries are added to the index 1204, a merge operation may occur. In a merge operation, an existing storage entry may be "merged" with one or more other storage entries. For instance, a new storage entry for LIDs 084-088 may be merged with entry 1214. The merge may comprise modifying the LID 1215 of the storage entry to include the new addresses (e.g., 072-088) and/or to reference the storage locations 1217 to include the storage location on which the data was stored.

Although the storage entries in the index 1204 are shown as comprising references to storage locations (e.g., addresses 1217), the disclosure is not limited in this regard. In other embodiments, the storage entries comprise reference or indirect links to the storage locations. For example, the storage entries may include a storage location identifier (or reference to the reverse map 1222).

FIG. 12 depicts another example of an index comprising a reverse map 1222, which may associate storage locations of the non-volatile storage device 120 with LIDs in the logical address space 136. The reverse map 1222 may also associate a storage location with metadata, such as a validity indicator 1230, and/or other metadata 1236. In some embodiments, the storage location address 1226 and/or length 1228 may be explicitly included in the reverse map 1222. Alternatively, the storage location address 1226 and/or data length 1228 may be inferred from a location and/or arrangement of an entry in the reverse map 1222 and, as such, the address 1226 and/or data length 1228 may be omitted. In some embodiments, the reverse map 1222 may include references to LIDs 1234.

As discussed above, the reverse map 1222 may comprise metadata 1236, which may include metadata pertaining to sequential storage operations performed on the storage locations, such as sequence indicators (e.g., timestamp) to indicate an ordered sequence of storage operations performed on the storage device (e.g., as well as an "age" of the storage locations and so on). The metadata 1236 may further include metadata pertaining to the storage media, such as wear level, reliability, error rate, disturb status, and so on. The metadata 1236 may be used to identify unreliable and/or unusable storage locations, which may reduce the physical storage capacity of the non-volatile storage device 120.

The reverse map 1222 may be organized according to storage divisions (e.g., erase blocks) of the non-volatile storage device 120. In this example, the entry 1220 that corresponds to storage entry 1218 is located in erase block n 1238. Erase block n 1238 is preceded by erase block n−1 1240 and followed by erase block n+1 1242 (the contents of erase blocks n−1 and n+1 are not shown). An erase block may comprise a predetermined number of storage locations. An erase block may refer to an area in the non-volatile storage device 120 that is erased together in a storage recovery operation.

The validity indicator 1230 may be used to selectively "invalidate" data. Data marked as invalid in the reverse index 1222 may correspond to obsolete versions of data (e.g., data that has been overwritten and/or modified in a subsequent storage operation). Similarly, data that does not have a corresponding entry in the index 1204 may be marked as invalid (e.g., data that is no longer being referenced by a storage client 116). Therefore, as used herein, "invalidating" data may comprise marking the data as invalid in the storage metadata 135, which may include removing a reference to the media storage location in the index 1204 and/or marking a validity indicator 1230 of the data in the reverse map.

In some embodiments, the groomer module 370, described above, uses the validity indicators 1230 to identify storage divisions (e.g., erase blocks) for recovery. When recovering (or reclaiming) an erase block, the erase block may be erased and valid data thereon (if any) may be relocated to new storage locations on the non-volatile storage media. The groomer module 370 may identify the data to relocate using the validity indicator(s) 1230. Data that is invalid may not be relocated (may be deleted), whereas data that is still valid (e.g., still being referenced within the index 1204) may be relocated. After the relocation, the groomer module 370 (or other process) may update the index 1204 to reference the new media storage location(s) of the valid data. Accordingly, marking data as "invalid" in the storage metadata 135 may cause data to be removed from the non-volatile storage media 122. The removal of the data, however, may not occur immediately (when the data is marked "invalid"), but may occur in response to a grooming operation or other processes that is outside of the path for servicing storage operations and/or requests. Moreover, when relocating data the groomer module 370 may be configured to determine whether the contextual format of the data should be updated by referencing the storage metadata 135 (e.g., the reverse map 1222 and/or index 1204).

The validity metadata 1230 may be used to determine an available physical storage capacity of the non-volatile storage device 120 (e.g., a difference between physical capacity (or budgeted capacity) and the storage locations comprising valid data). The reverse map 1222 may be arranged by storage division (e.g. erase blocks) or erase region to enable efficient traversal of the physical storage space (e.g., to perform grooming operations, determine physical storage capacity, and so on). Accordingly, in some embodiments, the available physical capacity may be determined by traversing the storage locations and/or erase blocks in the reverse map 1222 to identify the available physical storage capacity (and/or is being used to store valid data).

Alternatively, or in addition, the reverse map 1222 (or other datastructure) may comprise an indicator 1239 to track the available physical capacity of the non-volatile storage device 120. The available physical capacity indicator 1239 may be initialized to the physical storage capacity (or budgeted capacity) of the non-volatile storage device 120, and may be updated as storage operations are performed. The storage operations resulting in an update to the available physical storage capacity indicator 1239 may include, but are not limited to: storing data on the storage device 120, reserving physical capacity on the storage device 120, canceling a physical capacity reservation, storing data associated with a reservation where the size of the stored data differs from the reservation, detecting unreliable and/or unusable storage locations and/or storage division (e.g., taking storage locations out of service), and so on.

In some embodiments, the metadata 1204 and/or 1222 may be configured to reflect reservations of physical storage capacity. As described above in conjunction with FIG. 8, a storage client may reserve physical storage capacity for an operation that is to take place over time. Without a reservation, the storage client may begin the operation, but other clients may exhaust the physical capacity before the operation is complete. In some embodiments, the storage client 116 issues a request to reserve physical capacity before beginning the storage operation. The storage layer 130 may update storage metadata 135 (e.g., the indexes 1204 and/or 1222, disclosed herein), to indicate that the requested portion has been reserved. The reserved portion may not be associated with any particular media storage locations; rather, the reservation may indicate that the storage layer 130 is to maintain at least enough physical storage capacity to satisfy the reservation. For example, the indicator 1239 of remaining physical storage capacity may be reduced by the amount of reserved physical storage capacity. Requests subsequent to the reservation may be denied if satisfying the requests would exhaust the remaining physical storage capacity in the updated indicator 1239. In some embodiments, a reservation of physical storage capacity may be valid for a pre-determined time, until released by the storage client, until another, higher-priority request is received, or the like. The reservation may expire once the storage client that reserved the physical capacity consumes the reserved physical storage capacity in one or more subsequent storage operations. If the storage operations occur over a series of storage operations (as opposed to a single operation), the reservation may be incrementally reduced accordingly.

Figure 13:
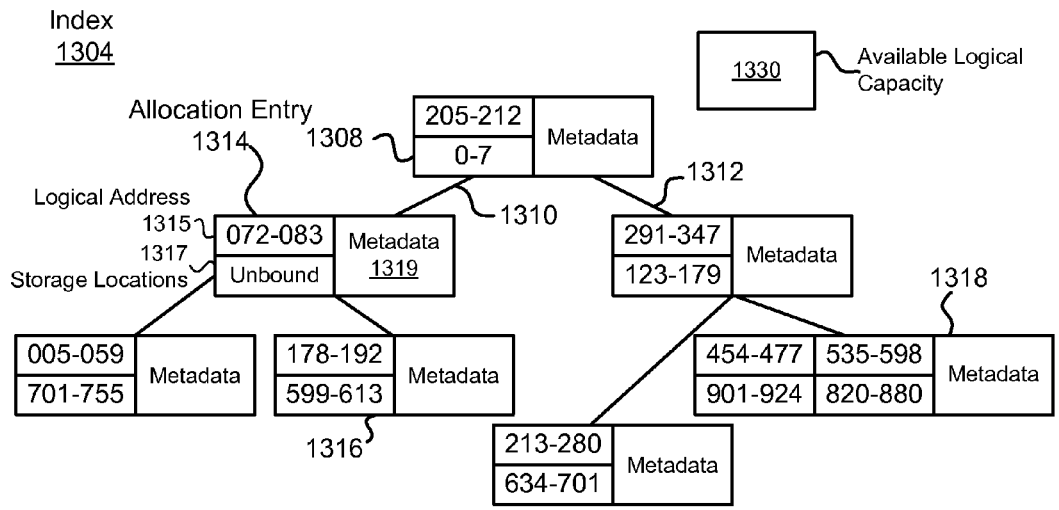
FIG. 13 is a schematic diagram of exemplary embodiments of indexes to associate logical identifiers with storage locations of a storage device.

FIG. 13 depicts another example of an index 1304 for managing storage allocation of a non-volatile storage device. In the FIG. 13 example, the index 1304 may be modified to include one or more allocation entries (e.g., allocated entry 1314). An allocation entry may be used to track LIDs that are allocated to a client, but are not yet bound (e.g., are not associated with data stored on the non-volatile storage device 120). Therefore, unlike the storage entries (e.g., entries 1308, 1316, and 1318), an allocation entry 1314 may not include references to storage locations 1317; these references may be set to "unbound," NULL, or may be omitted. Similarly, metadata 1319 associated with the allocation entry 1314 may indicate that the entry is not bound and/or associated with data.

The index 1304 may be used to determine an available logical capacity of the logical address space 136 (e.g., by traversing the index 1304). The available logical capacity may consider LIDs that are bound (using the storage entries), as well as LIDs that are allocated, but not yet bound (using the allocation entries, such as 1314).

As shown in FIG. 13, in some embodiments, the allocation entries 1314 may be maintained in the index 1304 with the storage entries. Alternatively, allocation entries may be maintained in a separate index (or other datastructure). When an allocation entry becomes associated with data on the non-volatile storage device 120 (e.g., as associated with storage locations), the allocation entry may be modified and/or replaced by a storage entry.

In some embodiments, the index 1304 (or index 1204) may comprise an indicator 1330 to track the available logical capacity of the logical address space 136. The available logical capacity may be initialized according to the logical address space 136 presented by the storage device 120. Changes to the index 1304 may cause the available logical capacity indicator 1330 to be updated. The changes may include, but are not limited to: addition of new allocation entries, removal of allocation entries, addition of storage entries, removal of allocation entries, or the like.

FIG. 14 depicts an example of an unallocated index 1444, which may be used to allocate storage in a non-volatile storage device. The index 1444 may comprise entries 1450, which may correspond to "holes" in the LIDs indexes 1204 and/or 1304 described above. Accordingly an entry 1450 in the available index 1444 may correspond to a LID (and/or LID range, set, or the like) that is available (e.g., is not allocated nor bound). The index 1444 may be used to quickly determine the logical storage capacity of a logical storage space and/or to identify LIDs to allocate in response to client requests. In the FIG. 14 example, the entries in the index 1444 are shown as being indexed by LID. In some embodiments, however, the index 1444 may be indexed in other (or additional) ways. For example, the unallocated index 1444 may be indexed by LID range (e.g., by the size of the LID range) as well as LID. This indexing may be used to identify unallocated LIDs sized according to client requests (e.g., to efficiently fill "holes" in the logical address space 136).

Figure 15:
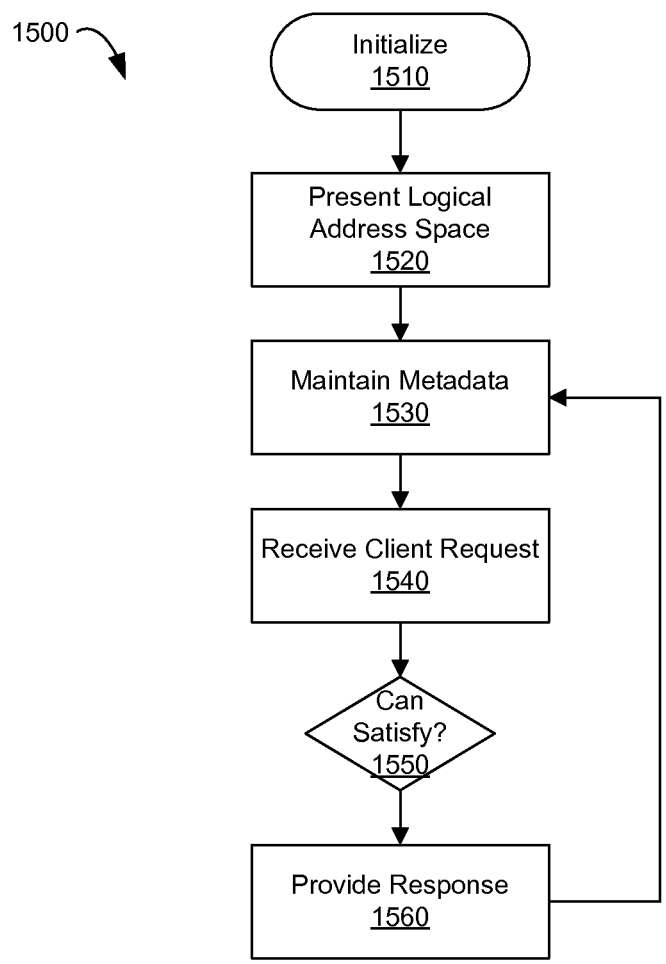
FIG. 15 is a flow diagram of one embodiment of a method for allocating a storage device.

FIG. 15 is a flow diagram of one embodiment of a method 1500 for allocating storage. As described above, steps of the method 1500 may be tied to particular machine components and/or may be implemented using machine-readable instructions stored on a non-transitory machine-readable storage medium.

At step 1510, a non-volatile storage device may be initialized for use. The initialization may comprise allocating resources for the non-volatile storage device (e.g., solid-state storage device 120), such as communications interfaces (e.g., bus, network, and so on), allocating volatile memory, accessing solid-state storage media, and so on. The initialization may further comprise presenting a logical address space 136 to storage clients 116, initializing one or more indexes (e.g., the indexes described above in conjunction with FIGS. 12-14), and so on.

At step 1520, the non-volatile storage device may present a logical space to one or more clients. Step 1520 may comprise implementing and/or providing an interface (e.g., API) accessible to one or more clients, or the like.

At step 1530, the non-volatile storage device may maintain metadata pertaining to logical allocation operations performed by the method 1500. The logical allocation operations may pertain to operations in the logical address space 136 presented at step 1520, and may include, but are not limited to: allocating logical capacity, binding logical capacity to media storage locations, and so on. The metadata may include, but is not limited to: indexes associating LIDs in the logical address space 136 with media storage locations on the non-volatile storage device; indexes associating storage locations with LIDs (e.g., index 1204 of FIG. 12), allocation entries indicating allocated LIDs having no associated storage location (e.g., index 1304 of FIG. 13), an unallocated index (e.g. index 1444 of FIG. 14), maintaining an indicator of unallocated logical capacity (e.g., indicator 1330 of FIG. 13), and so on.

At step 1540, a client request pertaining to a LID in the logical address space 136 may be received. The client request may comprise a query to determine if a particular LID and/or logical capacity can be allocated, a request to allocate a LID and/or logical capacity, a request to store data on the non-volatile storage device, or the like.

At step 1550, the metadata maintained at step 1530 may be referenced to determine whether the client request can be satisfied. Step 1550 may comprise referencing the metadata (e.g., indexes and/or indicators) maintained at step 1530 to determine an available logical capacity of the logical address space 136 and/or to identify available LIDs (or LID range) as described above.

At step 1560, the method 1500 may provide a response to the client request, which if the request cannot be satisfied may comprise providing a response to indicate such. Providing the response may comprise one or more of: an indicator that the allocation can be satisfied, allocating LIDs satisfying the request, providing allocated LIDs satisfying the request, providing one or more requested LIDs and/or one or more additional LIDs, (e.g., if a portion of a requested set of LIDs can be allocated), or the like.

Following step 1560, the flow may return to step 1530, where the method 1500 may update the metadata (e.g., indexes, indicators, and so on) according to the allocation operation (if any) performed at step 1560.

Figure 16:
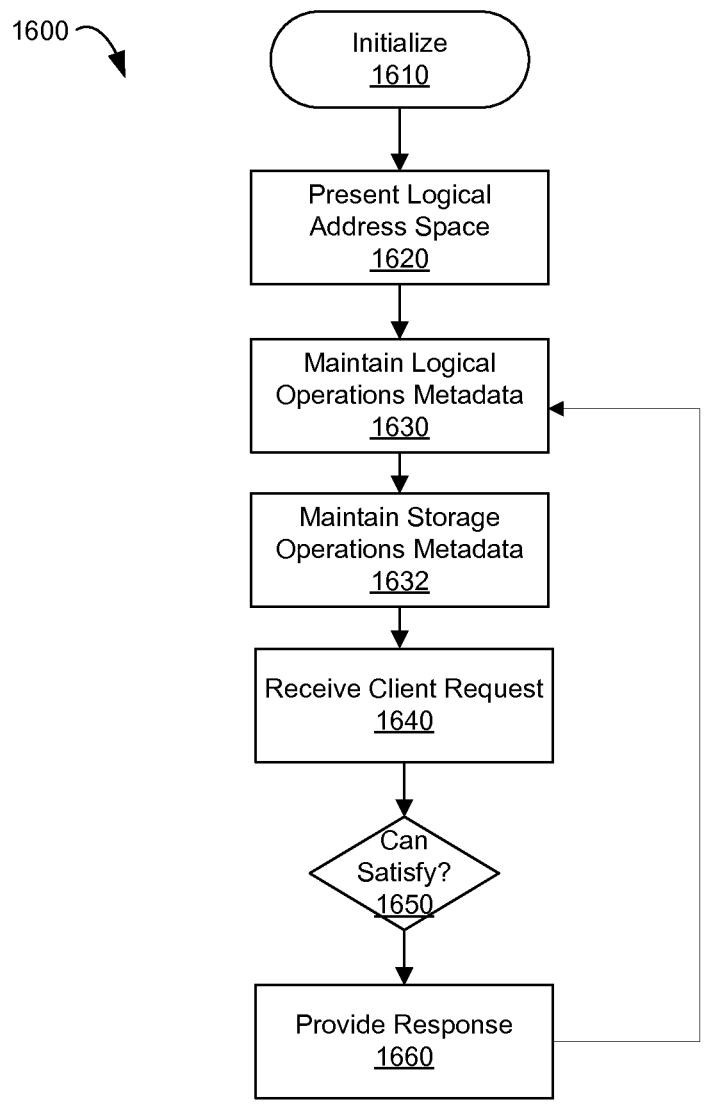
FIG. 16 is a flow diagram of one embodiment of a method for allocating a storage device.

FIG. 16 is a flow diagram depicting an embodiment of a method 1600 for allocating storage. As described above, steps of the method 1600 may be tied to particular machine components and/or may be implemented using machine-readable instructions stored on a non-transitory machine-readable storage medium.

At steps 1610, 1620, and 1630, the method 1600 may be initialized, present a logical storage space to one or more clients, and/or maintain metadata pertaining to logical operations performed by the method 1600.

At step 1632, the method 1600 may maintain metadata pertaining to physical storage operations performed by the method 1600. The storage operations may include, but are not limited to: reserving physical storage capacity, canceling physical storage capacity reservations, storing data on the non-volatile storage device, deallocating physical storage capacity, grooming operations (e.g., garbage collection, error handling, and so on), physical storage space budgeting, and so on. As discussed above, metadata maintained at step 1632 may include, but is not limited to: indexes associating LIDs in the logical address space 136 with storage locations on the non-volatile storage device; indexes associating storage locations with LIDs (e.g., index 1204 of FIG. 12), allocation entries indicating allocated LIDs having no associated storage location (e.g., index 1304 of FIG. 13), an unallocated index (e.g. index 1444 of FIG. 14), maintaining an indicator of unallocated logical address space 136 (e.g., indicator 1330 of FIG. 13), and so on.

At step 1640, a client request pertaining to physical storage capacity of the non-volatile storage device may be received. The client request may comprise a query to determine if physical storage capacity is available, a request to reserve physical storage capacity, a request to store data, a request to deallocate data (e.g., TRIM), or the like.

At step 1650, the metadata maintained at steps 1630 and/or 1632 may be referenced to determine whether the client request can be satisfied. Step 1650 may comprise referencing the metadata at steps 1630 and/or 1632 to determine an available physical storage capacity of the non-volatile storage device and/or to identify storage locations associated with particular LIDs (e.g., in a deallocation request or TRIM) as described above.

At step 1660, the method 1600 may provide a response to the client request, which if the request cannot be satisfied may comprise providing a response to indicate such. Providing the response may comprise one or more of: indicating that the client request can and/or was satisfied, reserving physical storage capacity for the client; cancelling a physical storage capacity reservation, storing data on the non-volatile storage device, deallocating physical storage capacity, or the like.

Referring back to FIG. 1, the storage layer 130 may be configured to maintain allocations of the logical address space 136 and/or bindings between LIDs and media storage locations using, inter alia, the storage metadata 135. The storage layer 130 may be further configured to store data in contextual format; as disclosed above, the contextual format may comprise associating persistent, contextual metadata (e.g., logical interface) with the data. Accordingly, contextual metadata pertaining to the data may be determined independent of the storage metadata 135. Moreover, the storage layer 130 may be configured to store data in a sequential log, such that a sequence of storage operations performed through the storage layer 130 can be replayed and/or the storage metadata 135 may be reconstructed, based upon the contents of the storage device 120. In some embodiments, the storage layer 130 may maintain a large, thinly provisioned logical address space 136, which may simplify logical allocation operations for the storage clients (e.g., allow the storage clients 116 to operate within large, contiguous LID ranges, with low probability of LID collisions). The storage layer 130 may be further configured to deter the reservation of media storage locations until needed, to prevent premature exhaustion or over-reservation of physical storage resources.

The storage layer 130 may expose access to the logical address space 136 and/or storage metadata 135 to the storage clients 116 through one or more interfaces 140. As disclosed herein, storage clients 116 may delegate certain functions to the storage layer 130. Storage clients 116 may leverage the virtual storage interface 132 to perform various operations, including, but not limited to: logical address space 136 management, media storage location management (e.g., mappings between LIDs and media storage locations, such as thin provisioning), deferred physical resource reservation, crash recovery, logging, backup (e.g., snapshots), crash recovery, data integrity, transactions, data move operations, cloning, deduplication, and so on.

In some embodiments, storage clients 116 may leverage the contextual, log format to delegate crash recovery and/or data integrity functionality to the storage layer 130. For instance, after an invalid shutdown and reconstruction operation, the storage controller 130 may provide access to the reconstructed storage metadata 135 to storage clients 116 through the interface 138. The storage clients 116 may, therefore, delegate crash-recovery and/or data integrity to the storage layer 130. File system storage clients 116 may require crash-recovery and/or data integrity services for certain data, such as I-node tables, file allocation tables, and so on. The storage client 116 may have to implement these services itself, which may impose significant overhead and/or complexity. The storage client 116 may be relieved from this overhead by delegating crash recovery and/or data integrity to the storage layer 130, as disclosed herein.

In some embodiments, storage clients 116 may also delegate logical allocation operations and/or physical storage reservations to the storage layer 130. A storage client 116, such as a file system, may maintain its own metadata to track logical and physical allocations for files; the storage client 116 may maintain a set of logical addresses that "mirrors" the media storage locations of the non-volatile storage device 120. If the underlying storage device 120 provides a one-to-one mapping between logical block address and media storage locations, as with conventional storage devices, the block storage layer performs appropriate LBA-to-media address translations and implements the requested storage operations. If, however, the underlying non-volatile storage device does not support one-to-one mappings (e.g., the underlying storage device is a sequential, or write-out-of-place device, such as a solid-state storage device), another redundant set of translations are needed (e.g., a Flash Translation Layer, or other mapping). The redundant set of translations and the requirement that the storage client 116 maintain logical address allocations may represent a significant overhead, and may make allocating contiguous LBA ranges difficult or impossible without time-consuming "defragmentation" operations. The storage client 116 may delegate such allocation functionality to the storage layer 130. The storage layer 130 may leverage a thinly provisioned logical address space 136 to manage large, contiguous LID ranges for the storage client 116, without the need for redundant address translation layers.

Figure 17:
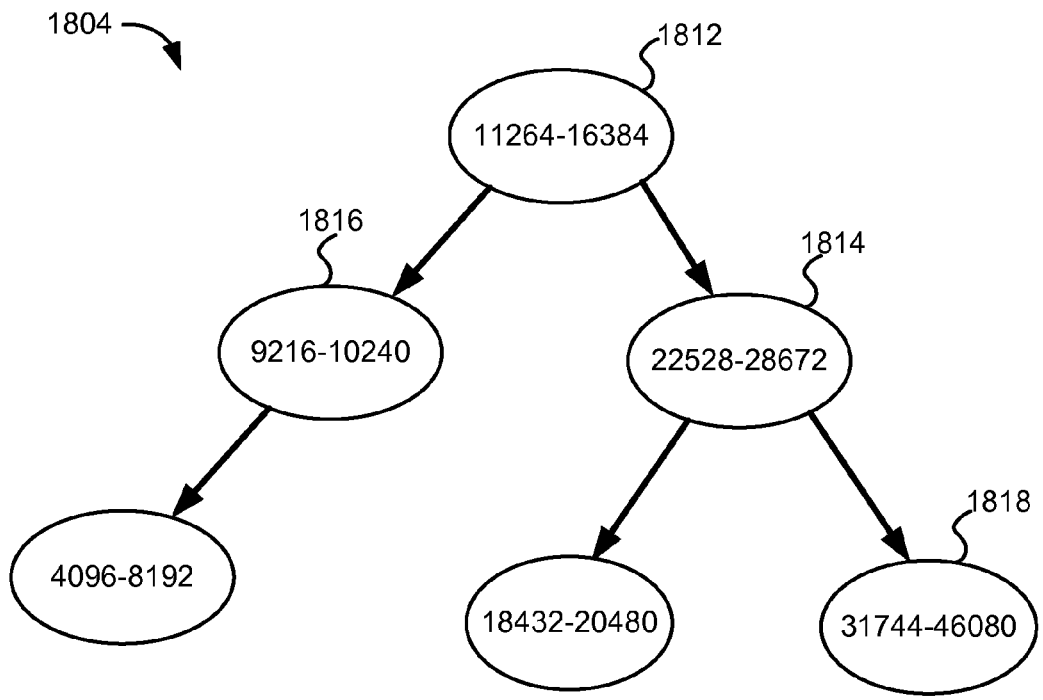
FIG. 17 is a schematic diagram of exemplary embodiments of storage metadata.

FIG. 17 depicts one exemplary embodiment of an index 1804 for maintaining allocations within a logical address space, such as the logical address space 136, described above. The index 1804 may be embodied as a datastructure on a volatile memory 112 and/or non-transitory, machine-readable storage media 114 (e.g., part of the storage metadata 135). The index 1804 may comprise an entry for each allocated range of LIDs. The allocated LIDs may or may not be associated with media storage locations on the non-volatile storage device (e.g., non-volatile storage device 120). The entries may be indexed and/or linked by LID. As discussed above, in some embodiments, the storage metadata (e.g., metadata 135) may comprise a separate index to track unallocated LIDs in the logical address space 136.

The entries in the index 1804 may include LIDs that are allocated, but that are not associated with media storage locations on a non-volatile storage device. Like the index 1204 described above, inclusion in the index 1804 may indicate that a LID is both allocated and associated with valid data on the non-volatile storage device 120. Alternatively, the index 1804 may be implemented similarly to the index 1304 of FIG. 13. In this case, the index 1804 may comprise entries that are associated with valid data on the non-volatile storage device 120 along with entries that are allocated but are not associated with stored data. The entries that are associated with valid data may identify the media storage location of the data, as described above. Entries that are not associated with valid, stored data (e.g., "allocation entries" such as the entry 1314 of FIG. 13) may have a "NULL" media storage location indicator or some other suitable indicator.

In some embodiments, the index 1804 may comprise security-related metadata, such as access control metadata, or the like. The security related metadata may be associated with each respective entry (e.g., entry 1812) in the index 1804. When storage requests pertaining to a particular LID are received by the storage layer 130, the storage layer 130 may access and/or enforce the security-related metadata (if any) in the corresponding entry. In some embodiments, the storage layer 130 delegates enforcement of security-related policy enforcement to another device or service, such as an operating system, access control system, or the like. Accordingly, when implementing storage operations, the storage layer 130 may access security-related metadata and verify that the requester is authorized to perform the operating using a delegate. If the delegate indicates that the requester is authorized, the storage layer 130 implements the requested storage operations; if not, the storage layer 130 returns a failure condition.

The storage layer 130 may access the storage metadata 135, such as the index 1804, to allocate LIDs in the logical address space 136, to determine a remaining logical capacity of the logical address space 136, to determine the remaining physical storage capacity of the non-volatile storage device(s) 120, and so on. The storage layer 130 may respond to queries for the remaining logical capacity, remaining physical storage capacity, and the like via the virtual storage interface 132. Similarly, the storage layer 130 may service requests to reserve physical storage capacity on the non-volatile storage device 120. As described above, a storage client 116 may wish to perform a sequence of storage operations that occur over time (e.g., receive a data stream, perform a DMA transfer, or the like). The storage client 116 may reserve sufficient logical and/or physical storage capacity to perform the sequence of storage operations up-front to ensure that the operations can be completed. Reserving logical capacity may comprise allocating LIDs through the storage layer 130 (using the virtual storage interface 132). Physical capacity may be similarly allocated. The storage client 116 may request to reserve physical capacity through the virtual storage interface 132. If a sufficient amount of physical capacity is available, the storage layer 130 acknowledges the request and updates the storage metadata accordingly (and as described above in conjunction with FIGS. 8 and 12).

The storage layer 130 and/or storage metadata 135 is not limited to the particular, exemplary datastructures described above. The storage metadata 135 may comprise any suitable datastructure (or datastructure combination) for efficiently tracking logical address space 136 allocations and/or associations between LIDs and media storage locations. For example, the index 1804 may be adapted such that entries in the index 1804 comprise and/or are linked to respective physical binding metadata. The physical binding metadata may comprise a "sub-index" of associations between LIDs in a particular allocated range and corresponding media storage locations on the non-volatile storage medium. Each "sub-range" within the allocated LID comprises an entry associating the sub-range with a corresponding media storage location (if any).

Figure 18:
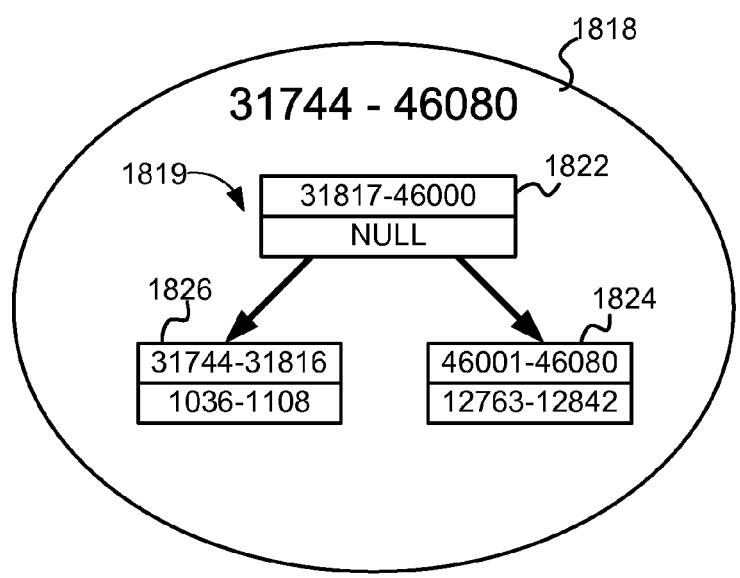
FIG. 18 is a schematic diagram of exemplary embodiments of physical reservation metadata.

FIG. 18 depicts one embodiment of an index entry comprising physical binding metadata. The entry 1818 represents an allocated LID having a range from 31744 through 46080 in the logical address space. The entries of the physical binding metadata associate sub-ranges of the LID with corresponding media storage locations (if any). The physical binding metadata 1819 may be indexed by LID as described above. In the FIG. 18 example, the LID sub-range comprising 31817 to 46000 of entry 1822 is not associated with valid data on the non-volatile storage device and, as such, is associated with a "NULL" media storage location. The entry 1824 for the sub-range 46001 to 46080 is associated with valid data. The entry 1824 identifies the media storage location of the data on the non-volatile storage device (locations 12763 through 12842). The entry 1826 identifies the media storage location of the valid data associated with the sub-range for 31744-31816.

Figure 19A:
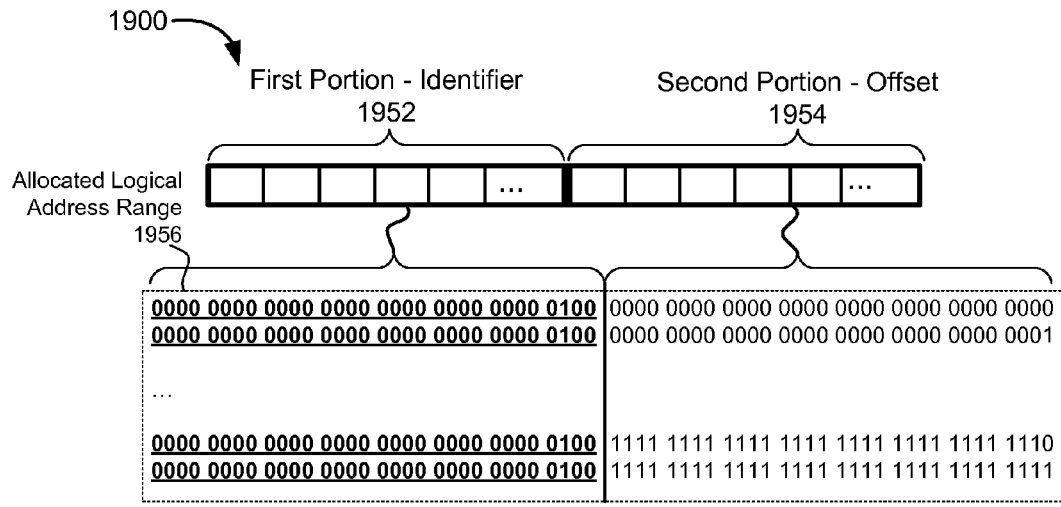
FIG. 19A depicts a logical identifier that has been segmented into a first portion and a second portion.

In some embodiments, the storage layer 130 is configured to segment the LIDs in the logical address space 136 into two or more portions. As shown in FIG. 19A, a LID 1900 is segmented into a first portion 1952 and a second portion 1954. In some embodiments, the first portion 1952 comprises "high-order" bits of the LID 1900, and the second portion comprises "low-order" bits. However, the disclosure is not limited in this regard and could segment LIDs using any suitable segmentation scheme.

The first portion 1952 may serve as a reference or identifier for a storage entity. As used herein, a storage entity refers to any data or data structure that is capable of being persisted to the non-volatile storage device 120; accordingly, a storage entity may include, but is not limited to: file system objects (e.g., files, streams, I-nodes, etc.), a database primitive (e.g., database table, extent, or the like), streams, persistent memory space, memory mapped files, virtual storage unit (VSU), logical unit number (LUN), virtual logical unit number (VLUN), logical storage unit (LSU), block storage device, or the like.

The second portion 1954 may represent an offset into the storage entity. For example, the storage layer 130 may reference the logical address space 136 comprising 64-bit LIDs (the logical address space 136 may comprise $2^{64}$ unique LIDs). The storage layer 130 may partition the LIDs into a first portion 1952 comprising the high-order 32 bits of the 64-bit LID and a second portion 1954 comprising the low-order 32 bits of the LID. The resulting logical address space 136 may be capable of representing $2^{32}-1$ unique storage entities (e.g., using the first portion of the LIDs), each having a maximum size (or offset) of $2^{32}$ virtual storage locations (e.g., 2 TB for a virtual storage location size of 512 bytes). The disclosure is not limited in this regard, however, and could be adapted to use any suitable segmentation scheme. For example, in implementations that require a large number of small storage entities (e.g., database applications, messaging applications, or the like), the first portion 1952 may comprise a larger proportion of the LID. For instance, the first portion 1952 may comprise 42 bits (providing $2^{42}-1$ unique identifiers), and the second portion may comprise 22 bits (providing a maximum offset of 4 GB). Alternatively, where larger files are required, the segmentation scheme may be similarly modified. Furthermore, the storage layer 130 may present larger logical address spaces (e.g., 128 bits and so on) in accordance with the requirements of the storage clients 116, configuration of the computing device 110, and/or configuration of the non-volatile storage device 120. In some embodiments, the storage layer 130 segments the logical address space 136 in response to a request from a storage client 116 or other entity.

The storage layer 130 may allocate LIDs based on the first portion 1952. For example, in a 64 bit address space, when the storage layer 130 allocates a LID comprising a first portion 1952 [0000 0000 0000 0000 0000 0000 0000 0100]

(e.g., first portion 1952 logical address 4), the storage layer 130 is effectively allocating a logical address range comprising $2^{32}$ unique LIDs 1956 (4,294,967,296 unique LIDS) ranging from:

[0000 0000 0000 0000 0000 0000 0100 0000 0000 0000 0000 0000 0000 0000 0000]

to,

[0000 0000 0000 0000 0000 0000 0000 0100 1111 1111 1111 1111 1111 1111 1111 1111]

In some embodiments, the storage layer 130 uses the segmentation of the LIDs to simplify the storage metadata 135. In one example, the number of bits in the first portion 1952 is X, and the number of bits in the second portion 1954 is Y. The storage layer 130 may determine that the maximum number of unique LIDs that can be allocated is $2^X$, and that the allocated LIDs can be referenced using only the first portion of the LID (e.g., the set of X bits). Therefore, the storage layer 130 may simplify the storage metadata index to use entries comprising only the first portion of a LID. Moreover, the storage layer 130 may determine that the LIDs are allocated in fixed-sized ranges of $2^Y$. Accordingly, each entry in the storage metadata 135 (e.g., index 1904) may be of the same extent. Therefore, the range portion of the metadata entries may be omitted.

Figure 19B:
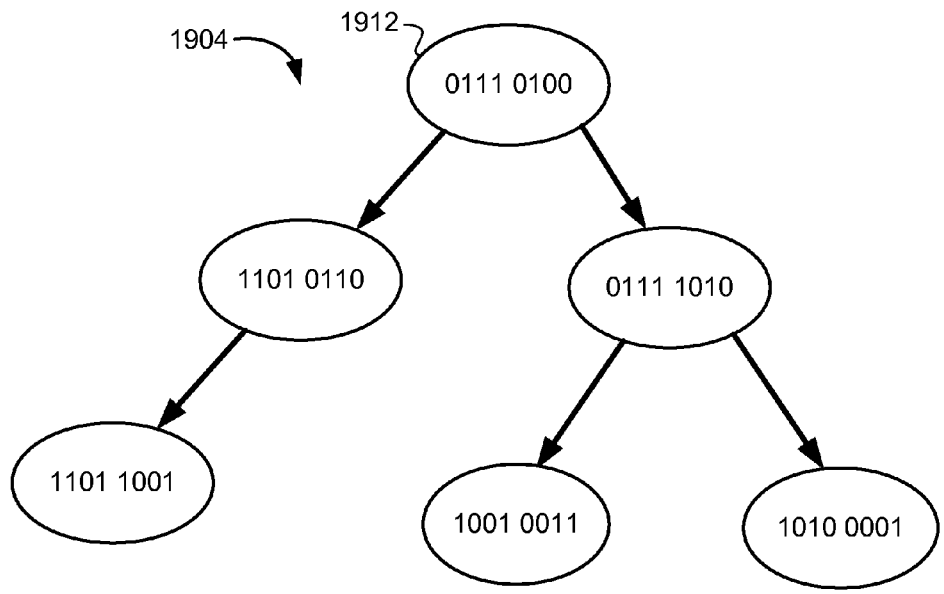
FIG. 19B is a schematic diagram of exemplary embodiments of storage metadata for segmented logical identifiers.

FIG. 19B depicts one example of an allocation index 1904 that has been simplified by segmenting the logical address space 136. For clarity, the first portion 1952 of the LIDs in the logical address space 136 managed by the index 1904 is depicted using eight (8) bits. The remaining portion of the LID (e.g., remaining 54 bits) may be used as the second portion 1954. Alternatively, other portions of the LID may be used for other logical address space 136 segmentation schemes, such as logical volume identifiers, partition identifiers, and so on.

Each entry 1912 in the index 1904 may be uniquely identified using the first portion (eight bits) of a LID. Accordingly, the entries 1912 may be indexed using only the first portion 1952 (e.g., 8 bits). This simplification may reduce the amount of data required to identify an entry 1912 from 64 bits to 8 bits (assuming a 64-bit LID with an 8-bit first portion). Moreover, the LIDs may be allocated in fixed sized logical ranges (e.g., in accordance with the second portion 1954). Therefore, each entry 1912 may represent the same range of allocated LIDs. As such, the entries 1912 may omit explicit range identifiers, which may save an additional 64 bits per entry 1912.

The storage layer 130 may use the simplified index 1904 to maintain LID allocations in the logical address space 136 and/or identify LIDs to allocate in response to requests from storage clients 116. In some embodiments, the storage layer 130 maintains a listing of "first portions" that are unallocated. Since, in some embodiments, allocations occur in a pre-determined way (e.g., using only the first portion 1952, and within a fixed range 1956), the unallocated LIDs may be expressed in a simple list or map as opposed to an index or other datastructure. As LIDs are allocated, they are removed from the datastructure and are replaced when they are deallocated.

Figure 19C:
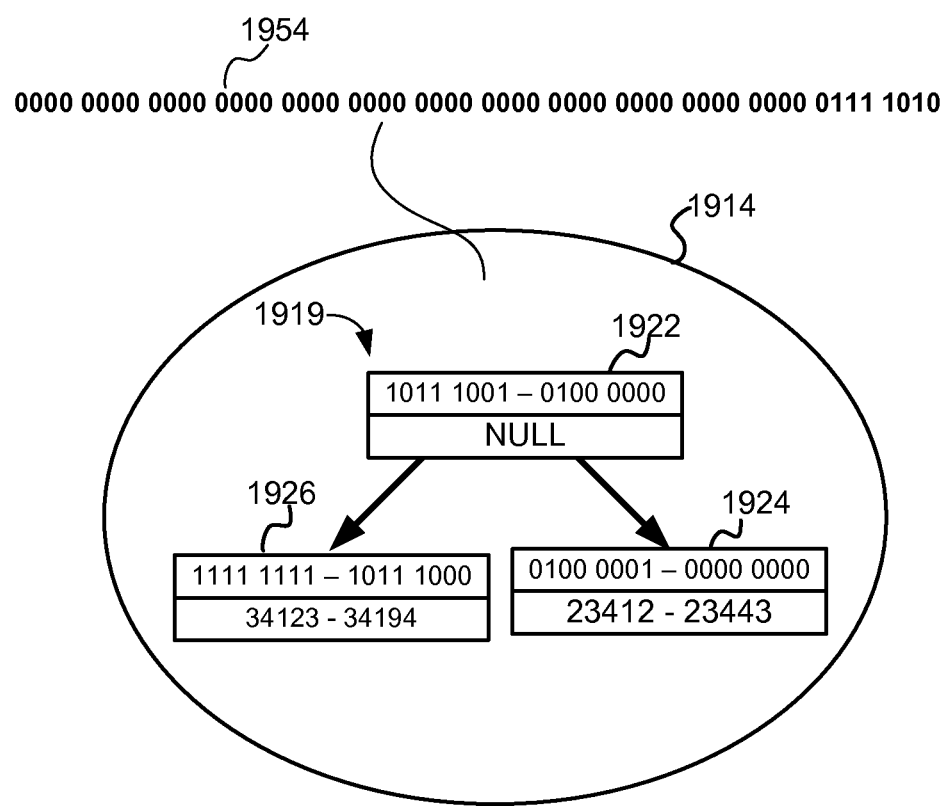
FIG. 19C is a schematic diagram of exemplary embodiments of physical reservation metadata for segmented logical identifiers.

Associations between portions of the entry and valid data on the non-volatile storage device may be maintained in the index 1904 (using physical binding metadata as described above). FIG. 19C depicts an example of physical binding metadata for use in a segmented logical addressing scheme. For clarity, in the FIG. 19C example, LIDs are segmented such that the first portion 1952 comprises 56 bits, and the second portion 1954 comprises 8 bits (the reverse of FIG. 19B). The entry 1914 is identified using the first portion 0000 0000 0000 0000 0000 0000 0000 0000 0000 0000 0000 0000 0111 1010. The entries 1922 of the index 1919 may be simplified to reference only offsets within the entry 1914 (e.g., within the second portion, which comprises 8 bits in the FIG. 19C example). Moreover, the head entry 1926 may omit the top-end of the second portion (e.g., may omit 1111 1111 since it can be determined that the top-most entry will necessarily include the maximal extent of the range defined by the second portion). Similarly, the tail entry 1924 may omit the bottom-end of the second portion 1954 (e.g., may omit 0000 000 since it can be determined that the bottom-most entry will necessarily include the beginning of the range defined by the second portion 1954). Each entry 1914 associates a range within the second portion with valid data on the non-volatile storage device (if any), as described above.

As described above, storage clients 116 may delegate LID allocation to the storage layer 130 using the virtual storage interface 132. The delegation may occur in a number of different ways. For example, a storage client 116 may query the storage layer 130 (via the storage layer 130 interface 138) for any available LID. If a LID is available, the storage layer 130 returns an allocated LID to the storage client 116. Alternatively, the storage client 116 may request a particular LID for allocation. The request may comprise the first portion of the LID or an entire LID (with an offset). The storage layer 130 may determine if the LID is unallocated and, if so, may allocate the LID for the client and return an acknowledgement. If the LID is allocated (or the LID falls within an allocated range), the storage layer 130 may allocate an alternative LID and/or may return an error condition. The storage layer 130 may indicate whether particular LIDs are allocated and/or whether particular LIDs are bound to media storage locations on the non-volatile storage device 120. The queries may be serviced via the virtual storage interface 132.

In embodiments in which the storage layer 130 implements segmented LIDs, the storage layer 130 may expose the segmentation scheme to the storage clients 116. For example, storage clients 116 may query the storage layer 130 to determine the segmentation scheme currently in use. The storage clients 116 may also configure the storage layer 130 to use a particular LID segmentation scheme adapted to the needs of the storage client 116.

The storage layer 130 may allocate LIDs using only the first portion 1952 of a LID. If the LID is unallocated, the storage layer 130 acknowledges the request, and the storage client 116 is allocated a range of LIDs in the logical address space 136 corresponding to the first portion 1952 and comprising the range defined by the second portion 1954. Similarly, when allocating a "nameless LID" (e.g., any available LID selected by the storage layer 130), the storage layer 130 may return only the first portion of the allocated LID. In some embodiments, when a client requests a LID using the first portion and the second portion, the storage layer 130 extracts the first portion from the requested LID, and allocates a LID corresponding to the first portion to the client (if possible). Advantageously, the disclosed embodiments support such a large number of addresses for the second portion over such a high number of contiguous addresses that storage requests that cross a LID boundary are anticipated to be very rare. In certain embodiments, the storage layer 130 may even prevent allocations that cross LID boundaries (as used herein, a LID boundary is between two contiguous LIDs, the first being the last addressable LID in a second portion of a LID and the second being the first addressable LID in a next successive first portion of a LID).

If the request crosses a boundary between pre-determined LID ranges, the storage layer 130 may return an alternative LID range that is properly aligned to the LID segmentation scheme, return an error, or the like. In other embodiments, if the request crosses a boundary between pre-determined LID ranges, the storage layer 130 may allocate both LIDs (if available).

Figure 20A:
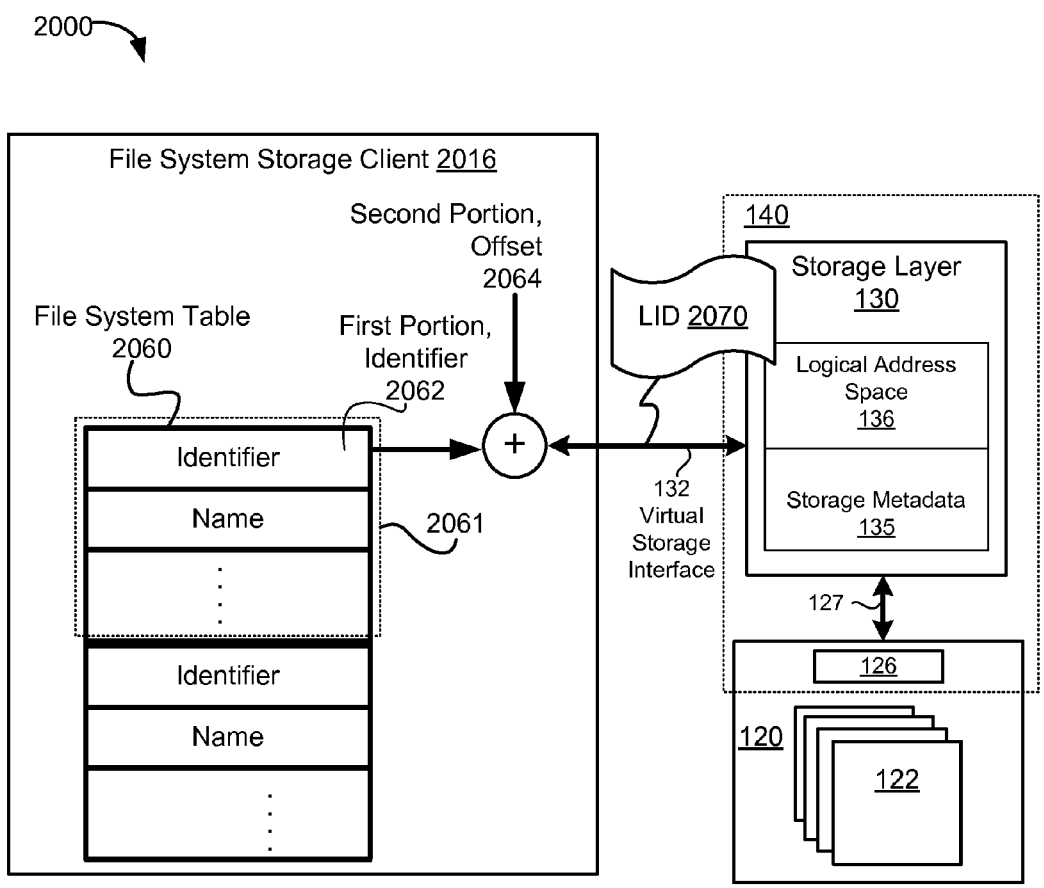
FIG. 20A is a schematic diagram of exemplary embodiments of a file system storage client accessing a storage layer using segmented logical identifiers.

As described above, the storage layer 130 may be leveraged by the storage clients 116 for logical allocations, physical storage bindings, physical storage reservations, crash-recovery, data integrity, and the like. FIG. 20A is a block diagram depicting a file system storage client 2016 leveraging the storage layer 130 to perform file system operations.

The file system storage client 2016 accesses the storage layer 130 via the virtual storage interface 132 to allocate LIDs for storage entities, such as file system objects (e.g., files). In some embodiments, when a new file is created, the file system storage client 2016 queries the storage layer 130 for a LID. The allocation request may be implemented as described above. If the requested LIDs can be allocated, the storage layer 130 returns an allocated LID to the file system storage client 2016. The LID may be returned as a LID and an offset (indicating an initial size for the file), a LID range, a first portion of a LID, or the like. The FIG. 20A example shows the storage layer 130 implementing a segmented LID range and, as such, the storage layer 130 may return the first portion of a LID 2062 in response to an allocation request.

In some embodiments, the file system storage client 2016 may implement a fast and efficient mapping between LIDs and storage entities. For example, when the first portion of the LID is sufficiently large, the file system storage client 2016 may hash file names into LID identifiers (into hash codes of the same length as the first portion of the LID 2062). When a new file is created, the file system storage client 2016 hashes the file name to generate the first portion of the LID 2062 and issues a request to the storage layer 130 to allocate the LID. If the LID is unallocated (e.g., no hash collisions have occurred), the storage layer 130 may grant the request. The file system storage client 2016 may not need to maintain an entry in the file system table 2060 for the new file (or may only be required to maintain an abbreviated version of a table entry 2061), since the LID 2062 can be derived from the file name. If a name collision occurs, the storage layer 130 may return an alternative LID, which may be derived from the hash code (or file name), which may obviate the need for the file system table 2060 to maintain the entire identifier.

The file system storage client 2016 may maintain a file system table 2060 to associate file system objects (e.g., files) with corresponding LIDs in the logical address space 136 of the storage layer 130. In some embodiments, the file system table 2060 is persisted on the non-volatile storage device 120 at a pre-determined LID. Accordingly, the file system storage client 2016 may delegate crash recovery and/or data integrity for the file system table 2060 (as well as the file system objects themselves) to the storage layer 130.

The file system storage client 2016 may reference files using the file system table 2060. To perform storage operations on a particular file, the file system storage client 2016 may access a file system entry 2061 corresponding to the file (e.g., using a file name lookup or another identifier, such as an I-node, or the like). The entry 2061 comprises a LID of the file, which, in the FIG. 20C example, is a first portion of a LID 2062. The file system storage client 2016 performs storage operations using the first portion 2062 of the LID along with an offset (the second portion 2064). The file system storage client 2016 may combine the file identifier (first portion 2062) with an offset 2064 to generate a full LID 2070. The LID 2070 may be sent to the storage layer 130 in connection with requests to perform storage operations within the logical address space 136.

The storage layer 130 performs storage operations using the storage metadata 135. Storage requests to persist data in the logical address space 136 comprise the storage layer 130 causing the data to be stored on the non-volatile storage device 120 in a contextual, log-based format, as disclosed above. The storage layer 130 updates the storage metadata 135 to associate LIDs in the logical address space 136 with media storage locations on the non-volatile storage comprising data stored in the storage operation.

Storage operations to access persisted data on the non-volatile storage device may comprise the storage client, such as the file system storage client 2016 requesting the data associated with one or more LIDs 2070 in the logical address space. The file system storage client 2016 may identify the LIDs using the file system table 2060 or another datastructure. In response to the request, the storage layer 130 determines the media storage location of the LIDs 2070 on the non-volatile storage device 120 using the storage metadata 135, which is used to access the data.

In some embodiments, storage clients, such as the file system storage client 2016 may deallocate a storage entity. Deallocating a storage entity may comprise issuing a deallocation request to the storage layer 130 via the virtual storage interface 132. In response to a deallocation request, the storage layer 130 removes the deallocated LIDs from the storage metadata 135 and/or may mark the deallocated LIDs as unallocated. The storage layer 130 may also invalidate the media storage locations corresponding to the deallocated LIDs in the storage metadata 135 and/or the non-volatile storage device 120 (e.g., using a reverse map, as disclosed above). A deallocation may be a "hint" to a groomer 370 of the non-volatile storage device 120 that the media storage locations associated with the deallocated LIDs are available for recovery.

The groomer 370, however, may not actually remove the data for some time after the deallocation request issued. Accordingly, in some embodiments, the virtual storage interface 132 may provide an interface through which storage clients may issue a deallocation "directive" (as opposed to a hint). The deallocation directive may configure the storage layer 130 to return a pre-determined value (e.g., "0" or "NULL") for subsequent accesses to the deallocated LIDs (or the media storage locations associated therewith), even if the data is still available on the non-volatile storage device 120. The pre-determined value may continue to be returned until the LIDs are reallocated for another purpose.

In some embodiments, the storage layer 130 implements a deallocation directive by removing the deallocated LIDs from the storage metadata and returning a pre-determined value in response to requests for LIDs that are not allocated in the storage metadata 135 and/or are not bound (e.g., are not associated with valid data on the non-volatile storage device). Alternatively, or in addition, in response to a deallocation directive, the storage layer 130 may cause the corresponding media storage locations on the non-volatile storage device 120 to be erased. The storage layer 130 may provide the file system storage client 2016 with an acknowledgement when the erasure is complete. Since erasures make take a significant amount of time to complete relative to other storage operations, the acknowledgement may be issued asynchronously.

Figure 20B:
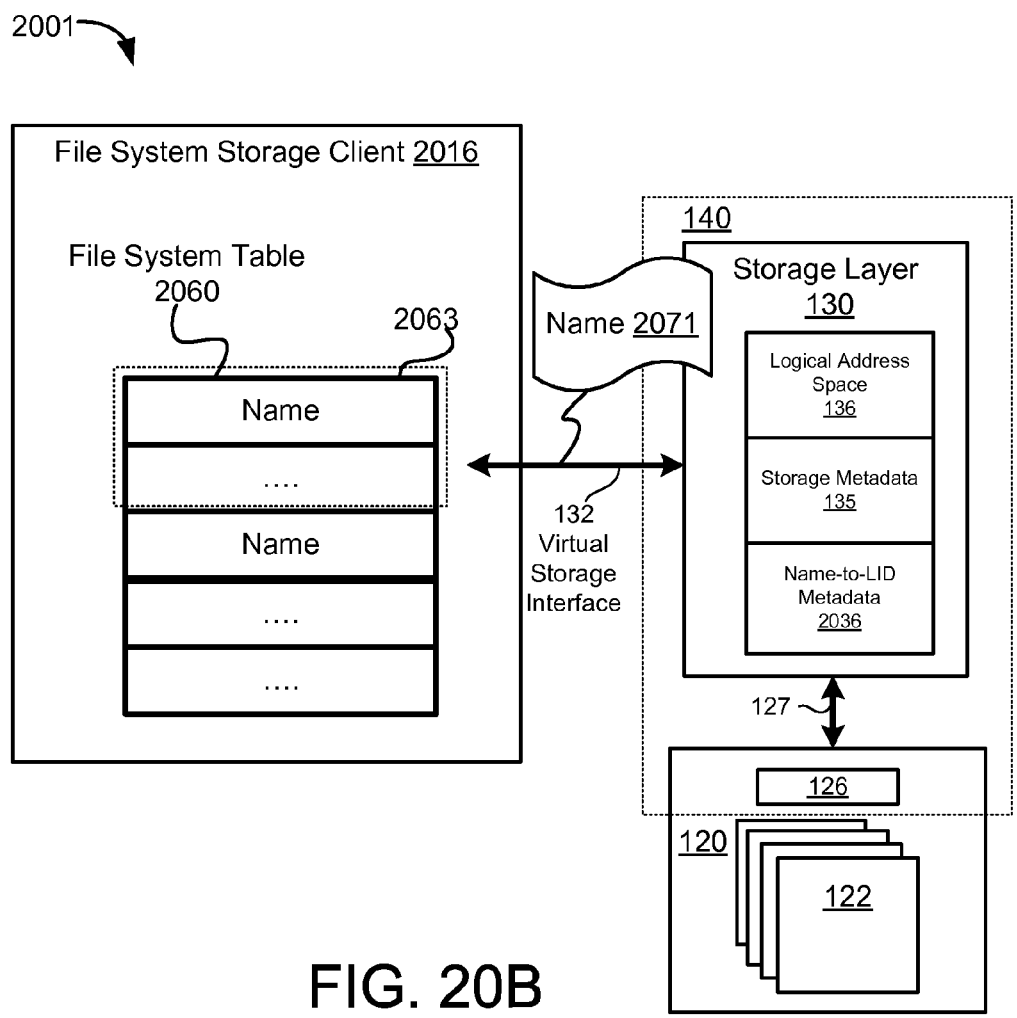
FIG. 20B is a schematic diagram of exemplary embodiments of a file system storage client accessing a storage layer using segmented logical identifiers.

FIG. 20B is a block diagram depicting another embodiment 2001 of storage client leveraging the storage layer 130. In the FIG. 20B example, the storage layer 130 presents a logical address space 136 to the file system storage client 2016 and maintains storage metadata 135 as described above. In addition, the storage layer 130 maintains name-to-LID association metadata 2036. This metadata 2036 may comprise associations between LIDs in the logical address space 136 and storage entity identifiers of storage clients 116. For example, a file system storage client 2016, may request LID allocations using a storage entity identifier or name 2071 (e.g., file name) as opposed to a LID. The file system storage client 2016 relies on the storage layer 130 to select an available LID (as opposed to specifying a particular LID), is referred to as a "nameless write" or "nameless allocation." In response, the storage layer 130 allocates a LID for the file system storage client 2016 within the logical address space 136. In addition, the storage layer 130 may maintain an association between the allocated LID and the name 2071 in name-to-LID metadata 2036. File system storage clients 2016 may request subsequent storage operations on the storage entity using the name 2071 (along with an offset, if needed). The file system table 2060 of the file system storage client 2016 may be simplified since entries 2063 need only maintain the name of a file as opposed to the name and LID. In response to storage requests comprising a name 2071, the storage layer 130 accesses the name-to-LID metadata 2036 to determine the LID associated with the name 2071 and implements the storage request as described above.

In some embodiments, the name-to-LID metadata 2036 may be included with the storage metadata 135. For example, entries in the index 1804 of FIG. 18 may be indexed by name in addition to (or in place of) a LID. The storage layer 130 may persist the name-to-LID metadata 2036 on the non-volatile storage device 120, such that the integrity of the metadata 2036 is maintained despite invalid shutdown conditions. Alternatively, or in addition, the name-to-LID metadata 2036 may be reconstructed using the contextual, log-based data format on the non-volatile storage device 120.

Figure 21:
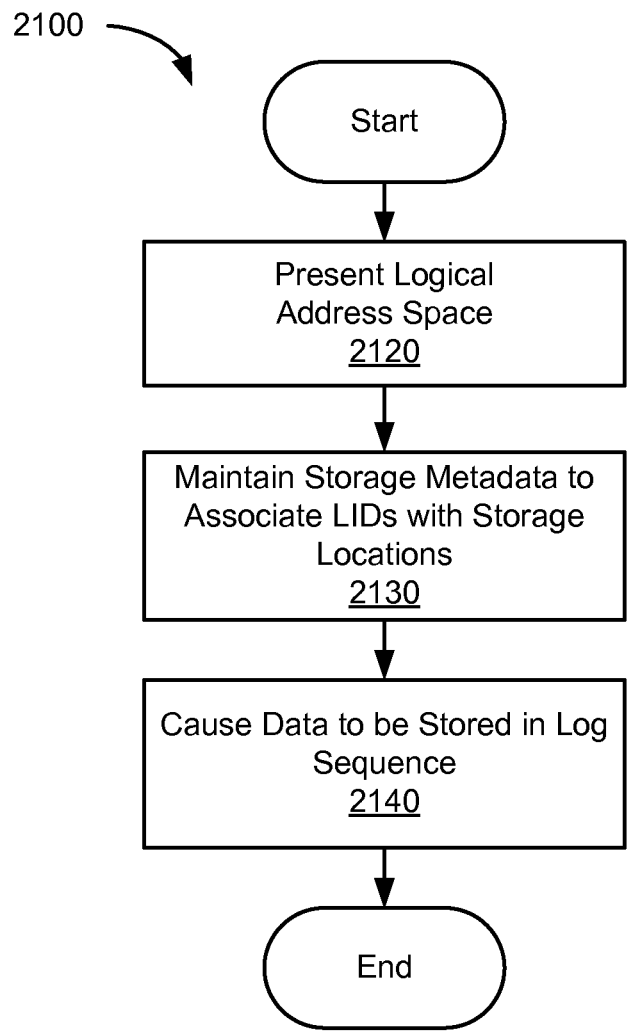
FIG. 21 is a flow diagram of one embodiment of a method for providing a storage layer.

FIG. 21 is a flow diagram of one embodiment of a method 2100 for providing a storage layer. At step 2120, the method 2100 presents a logical address space 136 for the non-volatile device to storage clients. The logical address space 136 may be defined independently of the non-volatile storage device. Accordingly, the logical capacity of the logical address space 136 (e.g., the size of the logical address space 136 and/or the size of the virtual storage blocks thereof) may exceed the physical storage capacity of the non-volatile storage device. In some embodiments, the logical address space 136 is presented via an application-programming interface (API) that is accessible to storage clients, such as operating systems, file systems, database applications, and the like.

At step 2130, storage metadata is maintained. The storage metadata may track allocations of LIDs within the logical address space 136, as well as bindings between LIDs and media storage locations of the non-volatile storage device. The metadata may further comprise indications of the remaining logical capacity of the logical address space 136, the remaining physical storage capacity of the non-volatile storage device, the status of particular LIDs, and so on.

In some embodiments, the metadata is maintained in response to storage operations performed within the logical address space. The storage metadata is updated to reflect allocations of LIDs by storage clients. When storage clients persist data to allocated LIDs, bindings between the LIDs and the media storage locations comprising the data are updated.

At step 2140, storage operations are performed using a log-based sequence. As described above, the storage layer 130 (and non-volatile storage device) may be configured to store data in a log-based format, such that an ordered sequence of storage operations performed on the storage device can be reconstructed in the event of an invalid shutdown (or other loss of storage metadata 135). The ordered sequence of storage operations allows storage clients to delegate crash recovery, data integrity, and other functionality to the storage layer 130.

Figure 22:
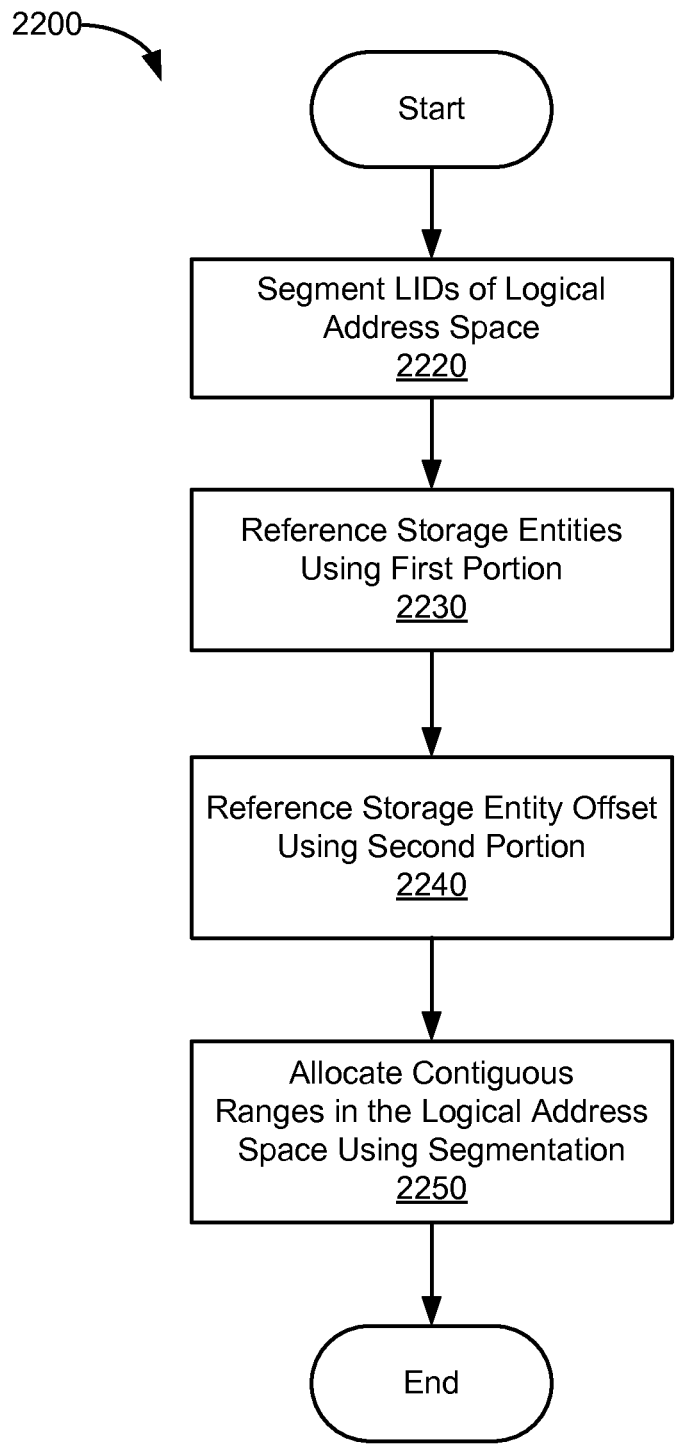
FIG. 22 is a flow diagram of one embodiment of a method for segmenting logical identifiers of a logical address space.

FIG. 22 is a flow diagram of one embodiment of a method 2200 for segmenting LIDs of a logical address space.

At step 2220, the method 2200 segments LIDs of a logical address space 136 into at least a first portion and a second portion. The segmentation of step 2230 may be performed as part of a configuration process of the storage layer 130 and/or non-volatile storage device (e.g., when the device is initialized). Alternatively, or in addition, the segmentation of step 2220 may be performed in response to a request from a storage client. The storage client may request a particular type of LID segmentation, according to the storage requirements thereof. For example, if the storage client has a need to store a large number of relatively small storage entities, the storage client may configure the LID segmentation to dedicate a larger proportion of the LID to identification bits and a smaller proportion to offset bits. Alternatively, a storage client who requires a relatively small number of very large storage entities may configure the method 2200 to implement a different type of segmentation that uses a larger proportion of the LID for offset bits (allowing for larger storage entities).

At step 2230, the storage layer 130 uses the first portion of the LID to reference storage client allocations (e.g., as a reference for storage entities). Step 2230 may comprise reconfiguring the storage metadata to allocate LIDs using only the first portion of the LID (e.g., the upper X bits of a LID). The size of the first portion may determine the number of unique storage entities that can be expressed in the storage metadata (e.g., as $2^X-1$, where X is the number of bits in the first portion). Accordingly, a first portion comprising 32 bits may support approximately $2^{32}$ unique storage entities. The reconfiguration may simplify the storage metadata, since each entry may be identified using a smaller amount of data (only the first portion of the LID as opposed to the entire LID).

At step 2240, the storage layer 130 uses the second portion of the LID as an offset into a storage entity. The size of the second portion may define the maximum size of a storage entity (under the current segmentation scheme). The size of a LID may be defined as the virtual block size times $2^Y$, where Y is the number of bits in the second portion. As discussed above, a virtual block size of 512 and second portion comprise 32 bits results in a maximum storage entity size of 2 TB. Step 2240 may comprise reconfiguring the storage metadata to reference LID to media storage location bindings using only the second portion of the LID. This may allow the storage metadata entries (e.g., entries in physical binding metadata) to be simplified, since the bindings can be expressed using a smaller number of bits.

At step 2250, the storage layer 130 uses the LID segmentation of step 2220 to allocate LIDs comprising contiguous logical address ranges in the logical address space. Step 2250 may comprise the storage layer 130 allocating LIDs using only the first portion of the LID (e.g., the upper X bits).

The allocated LID may comprise a contiguous logical address range corresponding to the number of bits in the second portion, as described above.

In some embodiments, allocating a LID at step 2250 does not cause corresponding logical storage locations to be reserved of "bound" thereto. The bindings between allocated LIDs and media storage locations may not occur until the storage client actually performs storage operations on the LIDs (e.g., stores data in the LIDs). The delayed binding prevents the large, contiguous LID allocations from exhausting the physical storage capacity of the non-volatile storage device.

Figure 23:
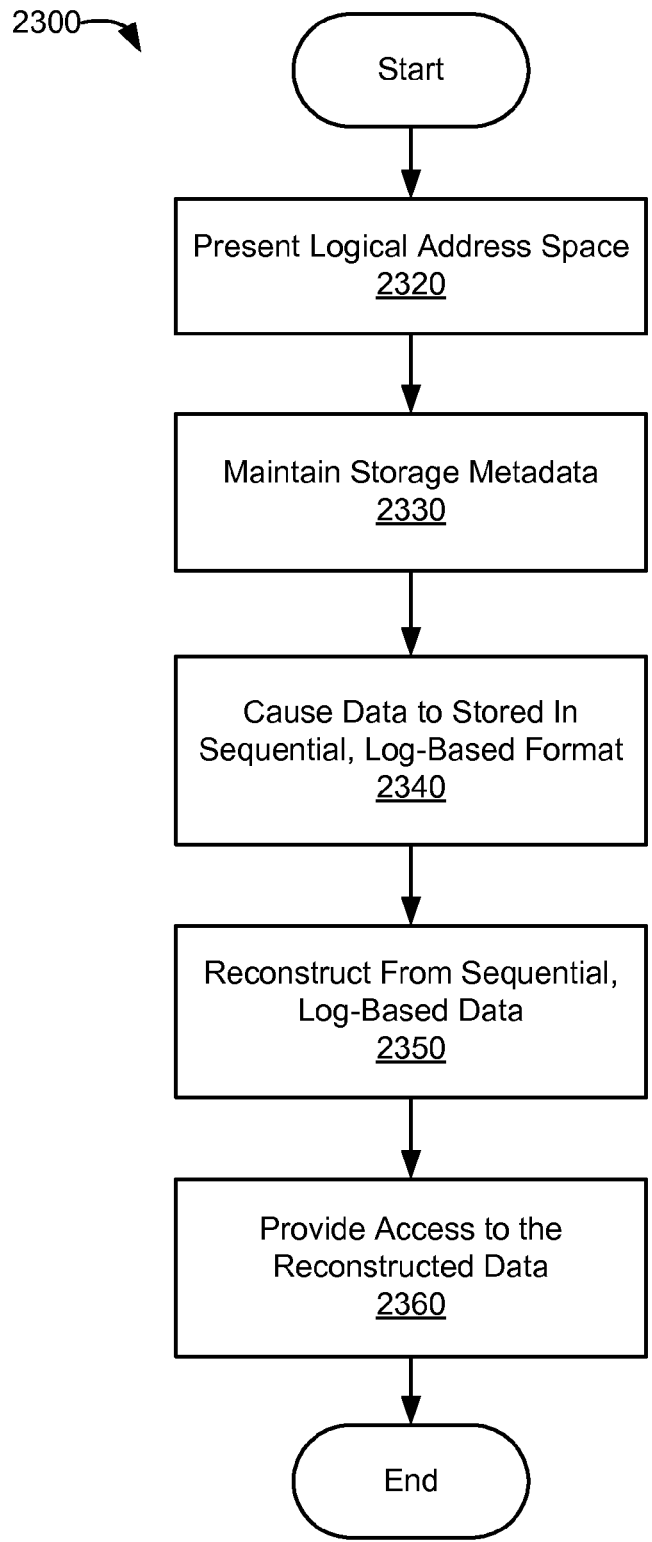
FIG. 23 is a flow diagram of one embodiment of a method for providing crash recovery and data integrity in a storage layer.

FIG. 23 is a flow diagram of one embodiment of a method 2300 for providing crash recovery and data integrity in a storage layer 130. At step 2320, the storage layer 130 presents a logical address space 136 to one or more storage clients 116 (e.g., through the interface 138). Step 2330 may comprise maintaining metadata 135 configured to associate LIDs in the logical address space 136 with media storage locations on the non-volatile storage device 120.

At step 2340, the storage layer 130 causes data to be stored on the non-volatile storage device in a contextual, log-based format. As described above, the contextual, log-based formatting of the data is configured such that, in the event of an invalid shutdown, the data (and metadata pertaining thereto) can be reconstructed.

At step 2350, the storage layer 130 reconstructs data stored on the non-volatile storage device using the data formatted in the contextual, log-based format. As described above, the log-based format may comprise storing LID identifiers with data on the non-volatile storage device. The LID identifiers may be used to associate the data with LIDs in the logical address space 136 (e.g., reconstruct the storage metadata). Sequence indicators stored with the data on the non-volatile storage device are used to determine the most current version of data associated with the same LID; since data is written out-of-place, updated data may be stored on the non-volatile storage device along with previous, obsolete versions. The sequence indicators allow the storage layer 130 to distinguish older versions from the current version. The reconstruction of step 2350 may comprise reconstructing the storage metadata, determining the most current version of data for a particular LID (e.g., identifying the media storage location that comprises the current version of the data), and so on.

At step 2360, the storage layer 130 provides access to the reconstructed data to storage clients. Accordingly, the storage clients may delegate crash recovery and/or data integrity functionality to the storage layer 130, which relieves the storage clients from implementing these features themselves. Accordingly, the storage clients can be simpler and more efficient.

Figure 24A:
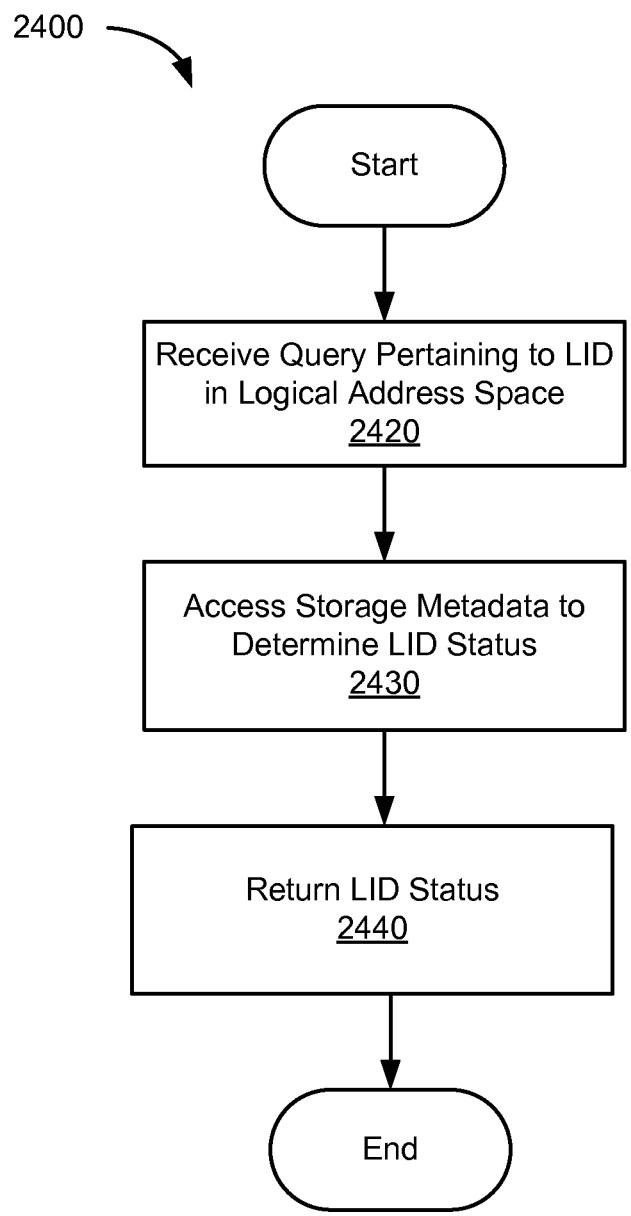
FIG. 24A is a flow diagram of one embodiment of a method for servicing queries pertaining to the status of a logical identifier.

FIG. 24A is a flow diagram of one embodiment of a method 2400 for servicing queries pertaining to the status of a LID. Step 2420 may comprise receiving a request pertaining to the status of a particular LID in the logical address space 136 presented by the storage layer 130. Alternatively, the request may pertain to the logical address space 136 as a whole (e.g., a query for the remaining logical capacity of the logical address space 136, or the like). Similarly, the query may pertain to the physical storage capacity of the non-volatile storage device, such as a query regarding the physical storage capacity that is bound to LIDs in the logical address space 136 (e.g., currently occupied), available physical storage capacity, and so on.

At step 2430, the storage layer 130 accesses storage metadata to determine the status of the requested LID, logical capacity, physical storage capacity, or the like. The access may comprise identifying an entry for the LID in a logical-to-physical map, in an allocation index, or the like. If the particular LID falls within an entry in an allocation index and/or logical to physical index, the storage layer 130 may determine that the LID is allocated and/or may determine whether the LID is bound to a media storage location. The access may further comprise, traversing a metadata index to identify unallocated LIDs, unused media storage locations, and so on. The traversal may further comprise identifying allocated (or unallocated) LIDs to determine current LID allocation (or unallocated LID capacity), to determine bound physical storage capacity, determine remaining physical storage capacity, or the like. At step 2440, the storage layer 130 returns the status determined at step 2430 to the storage client 116.

Figure 24B:
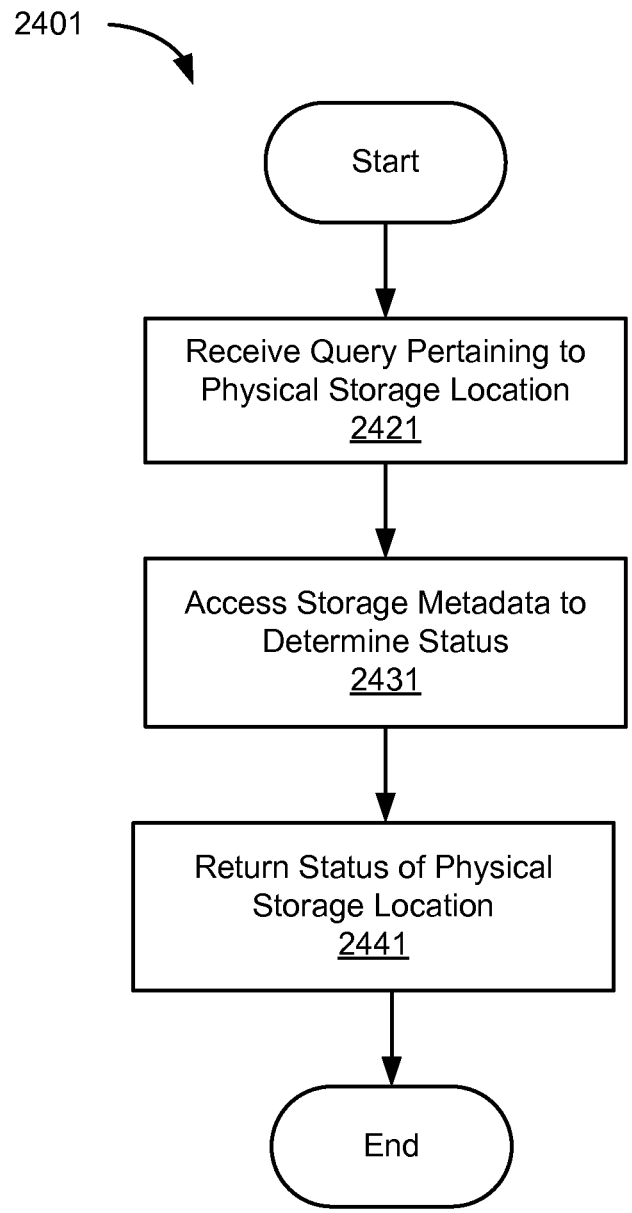
FIG. 24B is a flow diagram of one embodiment of a method of servicing queries pertaining to a media storage location.

FIG. 24B is a flow diagram of one embodiment of a method 2401 for servicing queries pertaining to the status of a media storage location (or range of media storage locations) of a non-volatile storage device.

At step 2421, the storage layer 130 receives a request pertaining to the status of a particular media storage location on a non-volatile storage device. The media storage location may be associated with a LID in the logical address space 136 presented by the storage layer 130. Alternatively, the query may be "iterative" and may pertain to all media storage locations on the non-volatile storage device (e.g., a query regarding the status of all media storage locations on the device). Similarly, the query may pertain to the physical storage capacity of the non-volatile storage device, such as a query regarding the physical storage capacity that is bound to LIDs in the logical address space 136 (e.g., currently occupied), available physical storage capacity, and so on.

The query of step 2421 may be useful in various different contexts. For example, in a RAID rebuild operation, a second non-volatile storage device may be configured to mirror the contents of a first non-volatile storage device. The data stored on the first logical storage device may be stored sequentially (e.g., in a contextual, log-based format). As such, the first non-volatile storage device may comprise "invalid" data (e.g., data was deleted, was made obsolete by a sequent storage operation, etc.). The query of step 2421 may be issued by the second, non-volatile storage device to determine which media storage locations on the first, non-volatile storage device "exist" (e.g., are valid), and should be mirrored on the second non-volatile storage device. Accordingly, the query of step 2421 may be issued in the form of an iterator, configured to iterate over (e.g., discover) all media storage locations that comprise "valid data," and the extent of the valid data.

Step 2431 comprises accessing storage metadata, such as the index 1204 or reverse map 1222 described above in conjunction with FIG. 12, to determine whether the specified media storage location comprises valid data and/or to determine the extent (or range) of valid data in the specified media storage location. At step 2441, the storage layer 130 returns the status determined at step 2431 to the requester.

In some embodiments, methods 2400 and 2401 are used to implement conditional storage operations. As used herein, a conditional storage operation refers to a storage operation that is to occur if one or more conditions are met. A conditional write may comprise a storage client requesting that data be written to a particular set of LIDs. The storage layer 130 may implement the conditional write if the specified LIDs do not exist (e.g., are not already allocated to another storage client), and the non-volatile storage comprises sufficient physical storage capacity to satisfy the request. Similarly, a conditional read may comprise a storage client requesting data from a particular set of LIDs. The storage layer 130 may implement the conditional read if the specified LIDs exist and are bound to valid data (e.g., are in storage metadata maintained by the storage layer 130, and are bound to media storage locations). In other examples, the storage layer 130 provides for "nameless" reads and writes, in which a storage client presents identifier, and the storage layer 130 determines the LIDs associated with the identifier, and services the storage request accordingly (e.g., "nameless" writes as described above). In this case, the storage layer 130 offloads management of identifier-to-LID mappings for the storage client.

In some embodiments, the storage metadata maintained by the storage layer may provide for designating certain portions of the logical address space 136 as being "temporary" or "ephemeral." As used herein, an ephemeral address range is an address range that is set to be automatically deleted under certain conditions. The conditions may include, but are not limited to: a restart operation, a shutdown event (planned or unplanned), expiration of a predetermined time, resource exhaustion, etc.

Data may be identified as ephemeral in storage metadata maintained by the storage layer 130, in metadata persisted to the solid-state storage media, or the like. Referring back to FIG. 12, an entry 1214 in the index 1204 (forward map) may be identified as ephemeral in the metadata 1219 thereof. When the storage layer persists the index 1204 as part of a shutdown, restart, or other operation, entries that include an ephemeral indicator may be omitted, effectively "invalidating" the corresponding data. Alternatively, or in addition, the storage layer 130 may designate an a portion of the large logical address space 136 as comprising ephemeral data. Any entries in the ephemeral address range may be designated as ephemeral in the index without additional modifications to entry metadata.

Figure 25A:
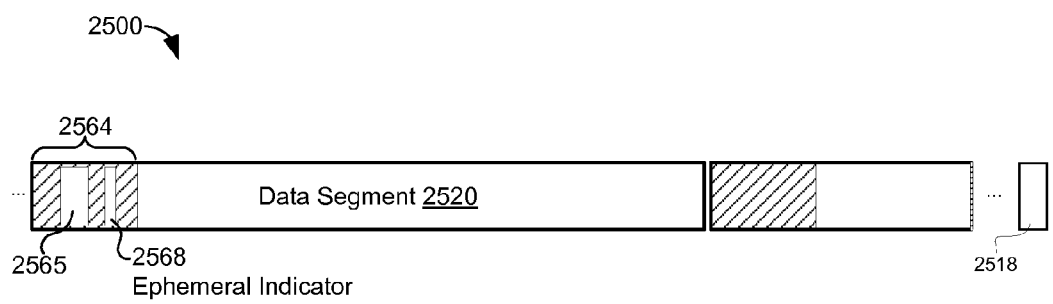
FIG. 25A depicts one embodiment of a contextual, log-based data format.

In some embodiments, an ephemeral indicator may be included in a media storage location on the non-volatile storage media. FIG. 25A depicts one example of a contextual data format (e.g., packet format) 2500, which may be used to store a data segment 2520 on a non-volatile storage media. As described above, in some embodiments, packets 2500 may be subject to further processing before being persisted on a media storage location (e.g., packets may be encoded into ECC codewords by an ECC generator 304 as described above).

The packet format 2500 may comprise persistent metadata 2564, which may include logical interface metadata 2565, as described above. The packet format 2500 may comprise and/or be associated with a sequence indicator 2518, which may include, but is not limited to a sequence number, timestamp, or other suitable sequence indicator. The sequence indicator 2518 may be included in the persistent metadata 2564 (e.g., as another field, not shown). Alternatively, or in addition, a sequence indicator 2518 may be stored elsewhere on the non-volatile storage media 122. For example, a sequence indicator 2518 may be stored on a page (or virtual page) basis, on an erase-block basis, or the like. As described above, each logical erase block may be marked with a respective marking, and packets may be stored sequentially therein. Accordingly, the sequential order of packets may be determined by a combination of the logical erase block sequence indicators (e.g., indicators 2518) and the sequence of packets 2500 within each logical erase block.

The storage layer 130 may be configured to reconstruct the storage metadata (e.g., index, etc.) using the contextual, log-based formatted data stored on the non-volatile storage media 122. Reconstruction may comprise the storage layer 130 (or another process) reading packets 2500 formatted in the contextual, log-based format from media storage locations of the solid-state storage media 122. As each packet 2500 is read, a corresponding entry in the storage metadata (e.g., the indexes described above) may be created. The LID range associated with the entry is derived from the LID 2516 in the header 2512 of the packet. The sequence indicator 2518 associated with the data packet may be used to determine the most up-to-date version of data 2514 for a particular LID. As described above, the storage layer 130 may write data "out-of-place" due to, inter alia, wear leveling, write amplification, and other considerations. Accordingly, data intended to overwrite an existing LID may be written to a different media storage location than the original data. The overwritten data is "invalidated" as described above; this data, however, remains on the solid-state storage media 122 until the erase block comprising the data is groomed (e.g., reclaimed and erased). The sequence identifier may be used to determine which of two (or more) contextual, log-based packets 2500 corresponding to the same LID comprises the current, valid version of the data.

In some embodiments, and as illustrated in FIG. 25A, the header 2512 includes an ephemeral indicator 2568. When reconstructing the storage metadata, the ephemeral indicator 2568 may be used to identify data that should be invalidated (e.g., deleted). Invalidating ephemeral data may comprise omitting the LIDs 2514 referenced in the logical interface 2565 of the packet 2500, marking the data segment 2520 as invalid in a reverse-index, and so on. Similarly, if data marked as ephemeral is more "up-to-date" than other data per the sequence indicator 2518, the original, "older" data may be retained and the ephemeral data may be ignored.

The storage layer 130 may provide an API through which storage clients may designate certain LID ranges (or other identifiers) as being ephemeral. Alternatively, or in addition, the storage layer 130 may implement higher-level interfaces using ephemeral data. For example, a multi-step atomic write (e.g., multi-block atomic write), may be implemented by issuing multiple write requests, each of which designates the data as being ephemeral. When all of the writes are completed, the ephemeral designation may be removed. If a failure occurs during the multi-step atomic write, data that was previously written can be ignored (no "roll-back" is necessary), since the data will be removed the next time the device is restarted. A similar approach may be used to provide support for transactions. As used herein, a "transaction" refers to a plurality of operations that are completed as a group. If any one of the transaction operations is not completed, the other transaction operations are rolled-back. As a transaction are implemented, the constituent storage operations may be marked as ephemeral. Successful completion of the transaction comprises removing the ephemeral designation from the storage operations. If the transaction fails, the ephemeral data may be ignored.

In some embodiments, ephemeral data may be associated with a time-out indicator. The time-out indicator may be associated with the operation of a storage reclamation process, such as a groomer. When the groomer evaluates a storage division (e.g., erase block, page, etc) for reclamation, ephemeral data therein may be treated as invalid data. As such, the ephemeral data may be omitted during reclamation processing (e.g., not considered for storage division selection and/or not stored in another media storage location during reclamation). In some embodiments, ephemeral data may not be treated as invalid until its age exceeds a threshold. The age of ephemeral data may be determined by the sequence indicator 2518 associated therewith. When the age of ephemeral data exceeds a pre-determined threshold, it may be considered to be part of a failed transaction, and may be invalidated as described above. The threshold may be set on a per-packet basis (e.g., in the header 2512), may be set globally (through an API or setting of the storage layer), or the like.

Figure 25B:
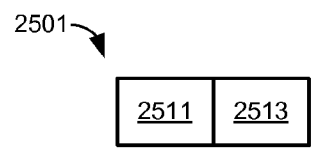
FIG. 25B depicts one embodiment of a persistent note.

As described above, removing an ephemeral designation may comprise updating storage metadata (e.g., index 1204) to indicate that a particular entry is no longer to be considered to be ephemeral. In addition, the storage layer 130 may update the ephemeral indicator stored on the solid-state storage media (e.g., in persistent metadata 2564 of a packet 2500). However, if the solid-state storage media is write-out-of-place, it may not be practical to overwrite (or rewrite) these indicators. Therefore, in some embodiments, the storage layer 130 persists a "note" on the solid-state storage media (e.g., writes a persistent note to a media storage location of the solid-state storage media). As used herein, a persistent note refers to a "metadata note" that is persistently stored on the solid-state storage media. Removing the ephemeral designation may comprise persisting a metadata note indicating the removal to the solid-state storage media. As depicted in FIG. 25B, a persistent note 2501 may comprise a reference 2511 that identifies one or more packets 2500 on a media storage location. The reference 2511 may comprise any suitable identifying information including, but not limited to: a logical interface, a LID, a range, a media storage location identifier, a sequence indicator, or the like. The persistent note 2501 may also include a directive 2513, which, in the FIG. 25B example, may be a directive to remove an ephemeral designation from the identified packets. Additional details regarding persistent notes are disclosed in U.S. patent application Ser. No. 13/330,554, entitled "Apparatus, System, and Method for Persistent Metadata," filed Dec. 19, 2011, and which is hereby incorporated by reference.

In some embodiments, the logical address space 136 presented by the storage layer 130 may include an "ephemeral" LID range. As used herein, an ephemeral LID range comprises references to ephemeral data (e.g., LIDs that are to be "auto-deleted" on restart, or another condition). This segmentation may be possible due to the storage layer 130 maintaining a large (e.g., sparse) logical address space 136, as described above. The storage layer 130 maintains ephemeral data in the ephemeral logical address range, as such, each entry therein is considered to be ephemeral. An ephemeral indicator may also be included in contextual, log-based formatted data bound to the LIDs within the ephemeral range.

Figure 25C:
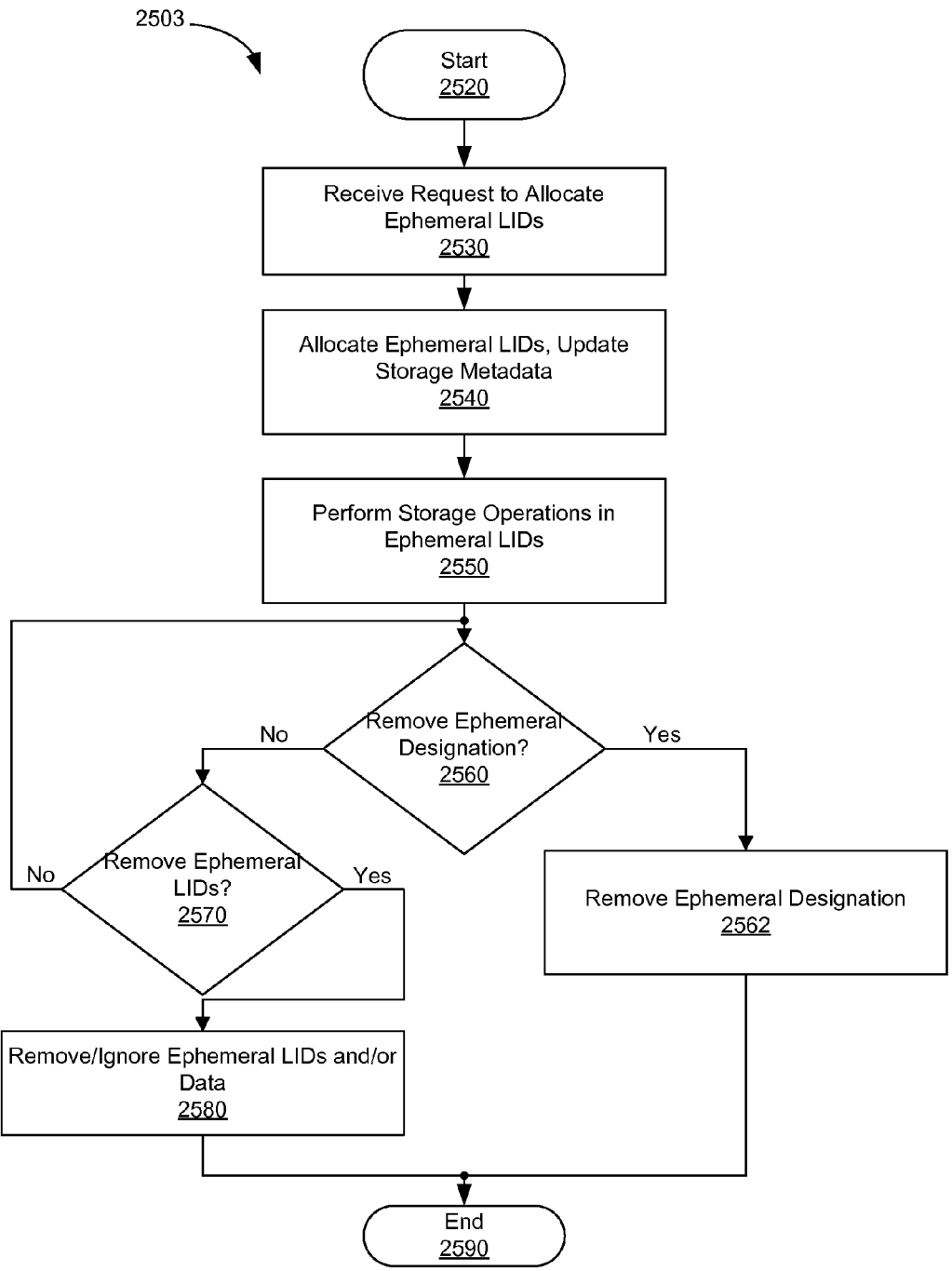
FIG. 25C is a flow diagram of one embodiment of a method for designating ephemeral data.

FIG. 25C depicts one example of a method for using ephemeral designations to implement a multi-step operation. At step 2520, the method 2503 may start and be initialized as described above. At step 2530, the method receives a request to allocate a range of LIDs in a logical address space. The request may indicate that the LIDs are to be designated as ephemeral. The request may be received from a storage client (e.g., an explicit allocation request). Alternatively, or in addition, the request may be made as part of a higher-level API provided by the storage layer 130, which may include, but is not limited to: a transaction API, a clone API, move API, deduplication API, an atomic-write API, or the like.

At step 2540, the requested LIDs are allocated as described above (unless not already allocated by another storage client). Step 2540 may further comprise updating storage metadata to indicate that the LIDs ephemeral, which may include, but is not limited to: setting an indicator in a entry for the LIDs in the storage metadata (e.g., index), allocating the LIDs in an "ephemeral range" of the index.

At step 2550, the storage client may request one or more persistent storage operations on the ephemeral LIDs of step 2540. The storage operations may comprise a multi-block atomic write, operations pertaining to a transaction, a snapshot operation, a clone (described in additional detail below), or the like. Step 2550 may comprise marking contextual, log-based data associated with the persistent storage operations as ephemeral as described above (e.g., in a header of a packet comprising the data).

At step 2560, if the method receives a request to remove the ephemeral designation, the flow continues to step 2562; otherwise, the flow continues to step 2570. The request of step 2560 may be issued by a storage client and/or the request may be part of a higher-level API as described above. For example, the request may be issued when the constituent operations a transaction or atomic operation are complete.

At step 2562, the ephemeral designation applied at steps 2540 and 2550 are removed. Step 2562 may comprise removing metadata indicators from storage metadata, "folding" the ephemeral range into a "non-ephemeral range" of the storage metadata index, or the like (folding is described in additional detail below). Step 2562 may further comprising storing one or more persistent notes on the non-volatile storage media that remove the ephemeral designation from data corresponding to the formerly ephemeral data as described above.

At step 2570, the method 2500 may determine whether the ephemeral data should be removed. If not, the flow continues back to step 2560; otherwise, the flow continues to step 2780. At step 2780, the ephemeral data is removed (or omitted) when the storage metadata is persisted (as part of a shutdown or reboot operation). Alternatively, or in addition, data that is designated as ephemeral on the non-volatile storage media may be ignored during a reconstruction process.

At step 2790, the flow ends until a next request is received, at which point the flow continues at step 2530.

Figure 26:
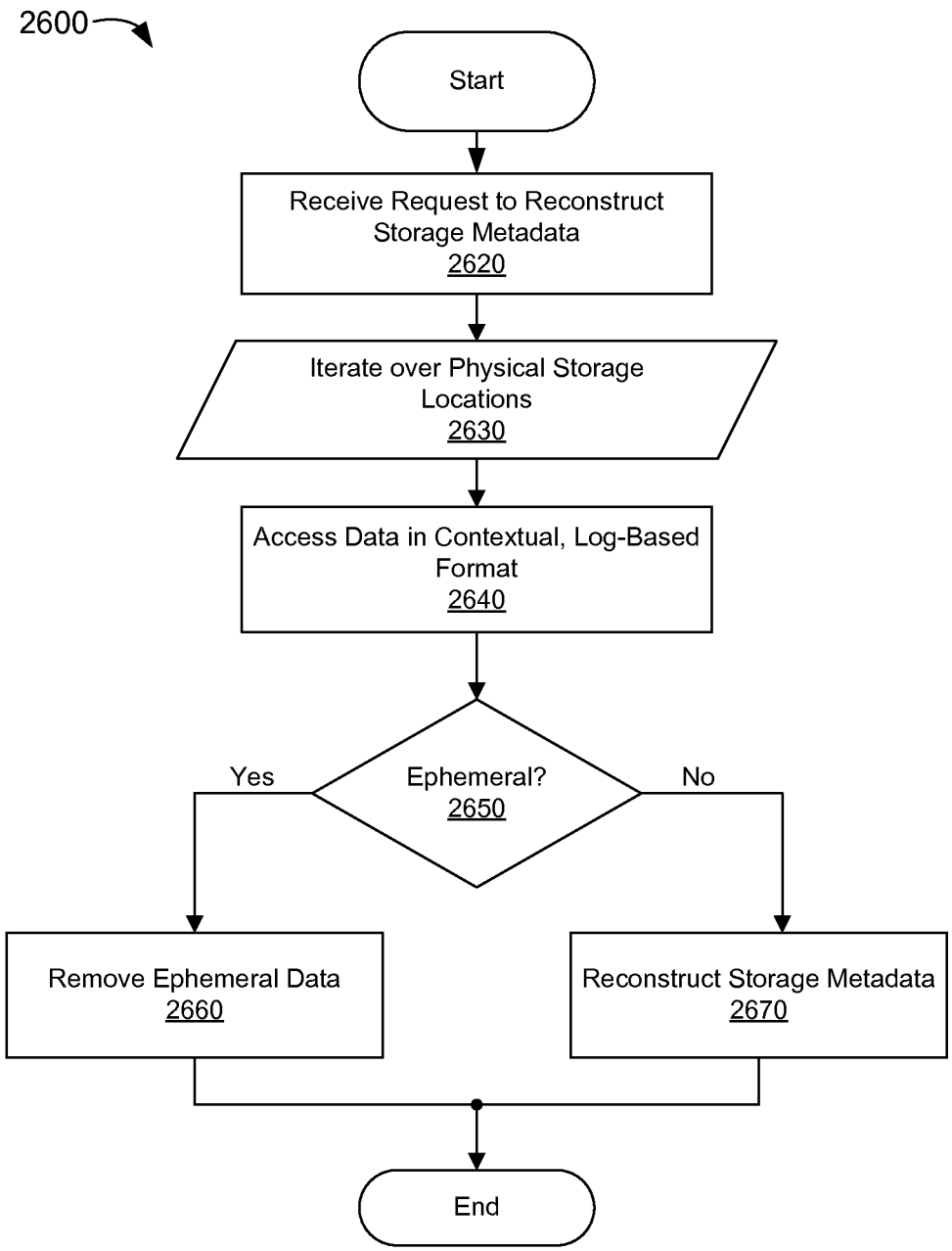
FIG. 26 is a flow diagram of one embodiment of a method reconstructing storage metadata and/or determining the status of media storage locations using a contextual, log-based data format.

FIG. 26 depicts one example of a method for reconstructing storage metadata from data stored on a non-volatile storage medium in a contextual, log-based format. Step 2620 may comprise receiving a request to reconstruct storage metadata from the contents of a non-volatile storage medium or device. The request may be received in response to storage metadata maintained by the storage layer 130 (or another entity) being lost or out-of-sync with the contents of the physical storage media. For example, portions of the storage metadata described herein (e.g., the index 1204 and/or reverse map 1222) may be maintained in volatile memory. In an invalid shutdown, the contents of the volatile memory may be lost before the storage metadata can be stored in non-volatile storage. In another example, a second storage device may be configured to mirror the contents of a first storage device; accordingly, the second storage device may maintain storage metadata describing the contents of the first storage device. The second storage device may lose communication with the first storage device and/or may need to be rebuilt (e.g., initialized). The initialization may comprise reconstructing storage metadata from the contents of the first storage device (e.g., through queries to the first storage device as described above in conjunction with FIG. 24B).

At step 2630, the method iterates over media storage locations of the storage device. The iteration may comprise accessing a sequence of media storage locations on the non-volatile storage medium, as described above in conjunction with FIG. 23.

At step 2640, for each media storage location, the method 2600 access data formatted in the contextual, log-based format described above. The method 2600 may reconstruct the storage metadata using information determined from the contextual, log-based data format on the non-volatile storage media 122. Using the contextual, log-based data format, the method 2600 may determine the LIDs associated with the data, may determine whether the data is valid (e.g., using persistent notes and/or sequence indicators as described above), and so on. Alternatively, step 2640 may comprise issuing queries to another storage device to iteratively determine which media storage locations comprise valid data. The iterative query approach (described above in conjunction with FIG. 24B) may be used to mirror a storage device.

In addition, at step 2650, the method 2600 determines whether a particular data packet is designated as being ephemeral. The determination may be based on an ephemeral indicator in a header of the packet. The determination may also comprise determining whether a persistent note that removes the ephemeral designation exists (e.g., a persistent note as described above in conjunction with FIG. 25B). Accordingly, step 2650 may comprise the method 2650 maintaining the metadata for the packet in a temporary (e.g., ephemeral) location, until the iteration of step 2630 completes and the method 2600 can determine whether a persistent note removing the ephemeral designation exists.

If step 2650 determines that the data is ephemeral, the flow continues to step 2660; otherwise, the flow continues to step 2670. At step 2660, the method 2600 removes the ephemeral data. Removing the data may comprise omitting LIDs associated with the data from storage metadata (e.g., the index 1204 described above), marking the media storage location as "invalid" and available to be reclaimed (e.g., in the reverse map 1222), or the like.

At step 2670, the method reconstructs the storage metadata as described above. In some embodiments, step 2670 may further comprise determining whether the data is valid (as described above in conjunction with FIG. 24B). If the data is valid, the method 2600 may be configured to perform further processing. For example, if the method 2600 is being used to construct a mirror of another storage device, step 2670 may comprise transferring the valid data to the mirror device.

In some embodiments, the storage layer 130 may provide an API to order storage operations performed thereon. For example, the storage layer 130 may provide a "barrier" API to determine the order of operations. As used herein, a "barrier" refers to a primitive that enforces an order of storage operations. A barrier may specify that all storage operations that were issued before the barrier are completed before the barrier, and that all operations that were issued after the barrier complete after the barrier. A barrier may mark a "point-in-time" in the sequence of operations implemented on the non-volatile storage device.

In some embodiments, a barrier is persisted to the non-volatile storage media as a persistent note. A barrier may be stored on the non-volatile storage media, and may, therefore, act as a persistent record of the state of the non-volatile storage media at a particular time (e.g., a particular time within the sequence of operations performed on the non-volatile storage media). The storage layer 130 may issue an acknowledgement when all operations issued previous to the barrier are complete. The acknowledgement may include an identifier that specifies the "time" (e.g., sequence pointer) corresponding to the barrier. In some embodiments, the storage layer 130 may maintain a record of the barrier in the storage metadata maintained thereby.

Barriers may be used to guarantee the ordering of storage operations. For example, a sequence of write requests may be interleaved with barriers. Enforcement of the barriers may be used to guarantee the ordering of the write requests. Similarly, interleaving barriers between write and read requests may be used to remove read before write hazards.

Barriers may be used to enable atomic operations (similarly to the ephemeral designation described above). For example, the storage layer 130 may issue a first barrier as a transaction is started, and then issue a second barrier when complete. If the transaction fails, the storage layer 130 may "roll back" the sequence of storage operations between the first and second barriers to effectively "undo" the partial transaction. Similarly, a barrier may be used to obtain a "snapshot" of the state of the non-volatile storage device at a particular time. For instance, the storage layer 130 may provide an API to discover changes to the storage media that occurred between two barriers.

In another example, barriers may be used to synchronize distributed storage systems. As described above, a second storage device may be used to mirror the contents of a first storage device. The first storage device may be configured to issue barriers periodically (e.g., every N storage operations). The second storage device may lose communication with the first storage device for a certain period of time. To get back in sync, the second storage device may transmit its last barrier to the first storage device, and then may mirror only those changes that occurred since the last barrier.

Distributed barriers may also be used to control access to and/or synchronize shared storage devices. For example, storage clients may be issued a credential that allows access to a particular range of LIDs (read only access, read/write, delete, etc.). The credentials may be tied to a particular point or range in time (e.g., as defined by a barrier). As the storage client interacts with the distributed storage device, the credential may be updated. However, if a storage client loses contact with the distributed storage device, the credential may expire. Before being allowed access to the distributed storage device, the client may first be required to access a new set of credentials and/or ensure that local data (e.g., cached data, etc.), is updated accordingly.

Figure 27:
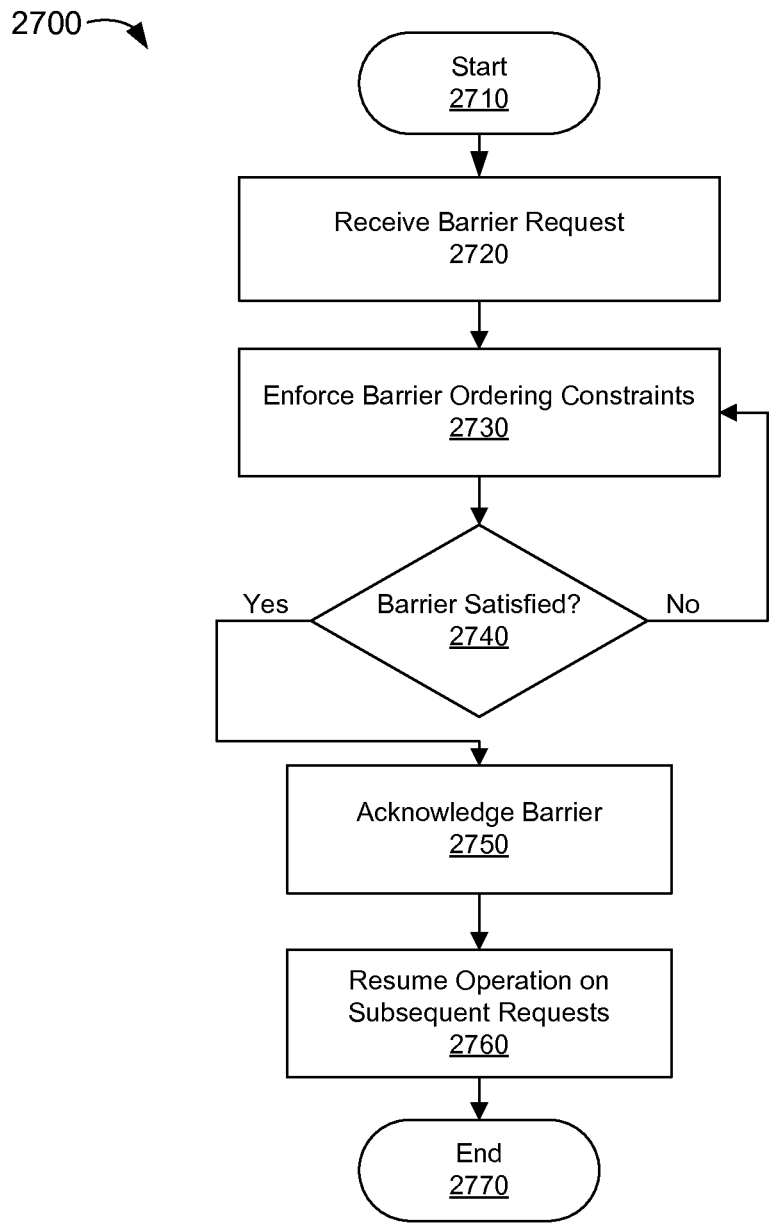
FIG. 27 is a flow diagram of one embodiment of a method ordering storage operations using barriers.

FIG. 27 is a flow chart of one embodiment of a method for providing barriers in storage system 102. At step 2710, the method 2700 starts and is initialized as disclosed herein. At step 2720, a request to issue a barrier is received. The request may be received from a storage client and/or as part of a high-level API provided by the storage layer 130 (e.g., an atomic write, transaction, snapshot, or the like).

At step 2730, the method 2700 enforces the ordering constraints of the barrier. Accordingly, step 2730 may comprise causing all previously issued storage requests to complete. Step 2730 may further comprise queuing all subsequent requests until the previously issued requests complete, and the barrier is acknowledged (at step 2740).

At step 2740, the method 2700 determines if the ordering constraints are met, and if so, the flow continues to step 2750; otherwise, the flow continues at step 2730.

At step 2750, the barrier is acknowledged, which may comprise returning a current "time" (e.g., sequence indicator) at which the operations issued before the barrier were completed. Step 2750 may further comprise storing a persistent note of the barrier on the non-volatile storage. At step 2760, the method resumes operation on storage requests issued subsequent to the barrier at step 2720. At step 2770, the flow ends until a next request for a barrier is received.

In some embodiments, the storage layer 130 leverages the logical address space 136 to manage "logical copies" of data (e.g., clones). As used herein, a "clone" or "logical cloning operation" refers to replicating a range (or set of ranges) of LIDs within the logical address space 136 and/or other addressing system. The cloned range may comprise different set(s) of LIDs, which may be bound to the same media storage locations as the original LIDs (source LIDs), allowing two or more LIDs and/or LID ranges to reference the same data. Clone operations may be used to perform higher-level operations, such as deduplication, snapshots, logical copies, atomic operations (e.g., atomic writes, transactions, etc.), and the like.

Creating a clone may comprise modifying the logical interface of data stored in a non-volatile storage device 120 in order to, inter alia, allow the data to be referenced by use of two or more different LIDs and/or LID extents. Accordingly, creating a clone of a LID (or set of LIDs) may comprise allocating new LIDs in the logical address space 136 (or dedicated portion thereof), and associating the new LIDs with the same media storage location(s) as the original LIDs in the storage metadata 135. Creating a clone may, therefore, comprise adding one or more entries to a forward index 1204 configured to associate the new set of LIDs with the data.

Figure 28A:
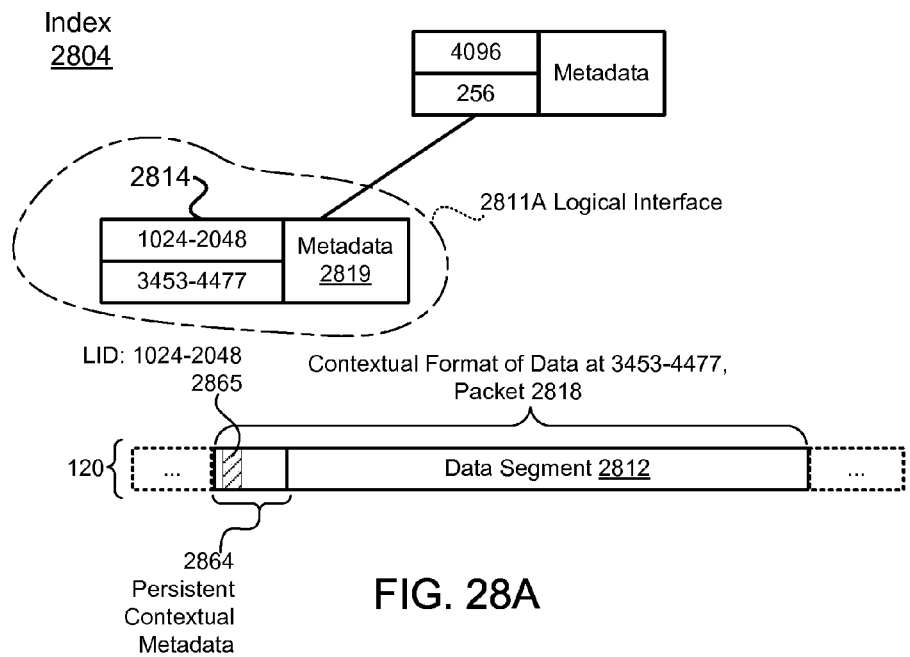
FIGS. 28A-E depict embodiments of clone operations.

FIG. 28A depicts one embodiment of a range clone operation. The range clone operation of FIG. 28A may be implemented in response to a request from a storage client 116 and/or as part of a higher-level API provided by the storage layer 130, such as an atomic operation, snapshot, logical copy, or the like. In some embodiments, the interface 138 of the storage layer 130 may be configured to provide interfaces and/or APIs for performing clone operations.

FIG. 28A depicts one embodiment of an index 2804 before the clone is created. The index 2804 of FIG. 28A comprises, inter alia, an entry 2814 that binds LIDs 1024-2048 to media storage locations 3453-4477. Other entries are omitted from FIG. 28A to avoid obscuring the details of the depicted embodiment. As disclosed herein, the entry 2814, and the bindings thereof, may define a logical interface 2811A through which storage clients 116 may reference the corresponding data (e.g., data segment 2812); storage clients 116 may access and/or reference the data segment 2812 (and/or portions thereof) through the storage layer 130 by use of the LIDs 1024-2048.

As disclosed herein, the storage controller 140 may be configured to store data in a contextual format on a storage device 120. The contextual format may comprise associating data with corresponding persistent metadata that defines and/or references, inter alia, the logical interface of the data. In the FIG. 28A embodiment, the data stored at media addresses 3453-4477 comprises a packet format 2818 that includes persistent metadata 2864. The persistent metadata 2864 may comprise the logical interface of the data segment 2812 (logical interface metadata 2865), and as such, may associate the data segment 2812 with the LIDs 1024-2048 of the entry 2814. As disclosed herein, the contextual data format 2818 may enable the index 2804 (and/or other metadata 135) to be reconstructed from the contents of the storage device 120; in the FIG. 28A embodiment, the entry 2814 may be reconstructed by associating the data stored at media addresses 3453-4477 with the LIDs 1024-2048 identified in the persistent metadata 2864 of the packet 2818. Although, FIG. 28A depicts a single packet 2818, the disclosure is not limited in this regard. In some embodiments, the data of the entry 2814 may be stored in multiple, different packets 2818, each comprising respective persistent metadata 2864 (e.g., a separate packet for each media storage location, etc.).

Creating a clone of the entry 2814 may comprise allocating one or more LIDs in the logical address space 136, and binding the new LIDs to the same data segment 2812 as the entry 2814 (e.g., the data segment at media storage location 3453-4477). Creating the clone may therefore, comprise modifying the storage metadata 135 without requiring the underlying data segment 2812 to be copied and/or replicated.

Figure 28B:
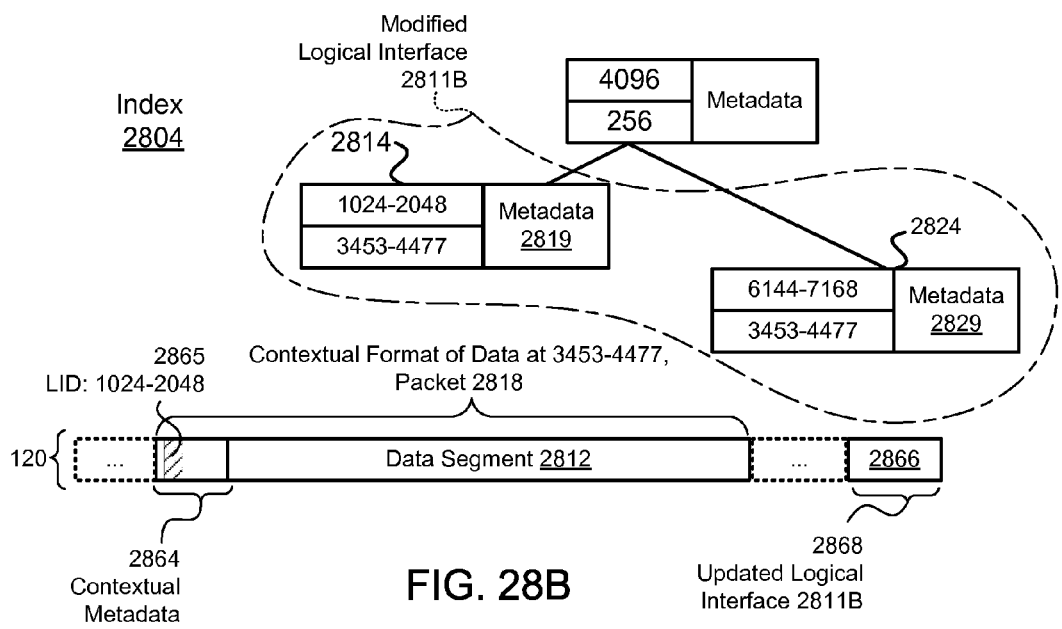

FIG. 28B depicts storage metadata 135 of one embodiment of a clone operation. Cloning the LIDs 1024-2048 may comprise allocating a new set of LIDs within the logical address space 136, and associating the new set of LIDs with the media addresses of LIDs 1024-2048. As depicted in FIG. 28B, cloning the LIDs 1024-2048 may comprise allocating a new set of LIDs 6144-7168 (represented in index entry 2824), and associating the LIDs with the media addresses 3453-4477 of entry 2814. The data stored at media addresses 3453-4477 may, therefore, be referenced through both the LIDs 1024-2048 of entry 2814 and the LIDs 6144-7168 of entry 2824. Accordingly, the clone operation modifies the logical interface 2811B of the data segment 2812, such that the data can be referenced through either the LIDs of entry 2814 and/or the LIDs of entry 2824.

The modified logical interface 2811B of the data may be inconsistent with the contextual format of the data segment 2812 on the storage device 120. As disclosed above, the persistent metadata 2864 of the data segment 2812 comprises logical interface metadata 2865 that associates the data segment 2812 with LIDs 1024-2048 of the logical interface 2811A, and not LIDs 6144-7168 of the modified logical interface 2811B. The contextual format of the data 2818 may be updated to be consistent with the modified logical interface 2811B (e.g., updated to associate the data with LIDs 1024-2048 and 6144-7168, as opposed to only LIDs 1024-2048).

Updating the contextual format of the data segment 2812 may comprise updating the persistent metadata 2864 on the storage device 120. If the storage device 120 is a random-access, write-in-place, storage device, the persistent metadata 2864 may be updated by overwriting and/or updating the persistent metadata 2864 without relocating the data segment 812 and/or packet 2818. In other embodiments, however, the storage controller 140 may be configured to append data to a log and/or update data out-of-place on the storage device 120. In such embodiments, updating the contextual format of the data segment 2812 may comprise relocating and/or rewriting the data segment 2812 on the storage device 120, which may be a time-consuming processes, and may be particularly inefficient if the data segment 2812 is large and/or the clone comprises a large number and/or of LIDs. Therefore, in some embodiments, the storage layer 130 may defer updating the contextual format of cloned data and/or may update the contextual format in one or more background operations. In the meantime, the storage layer 130 may be configured to provide access to the data while stored in the inconsistent contextual format 2818.

The storage layer 130 may be configured to acknowledge completion of clone operations before contextual format of the corresponding data is updated. The data may be subsequently rewritten (e.g., relocated) in the updated contextual format on the storage device 120 in another process, which may be outside of the "critical path" of the clone operation and/or other storage operations (e.g., in one or more background operations). In some embodiments, the data segment 2812 is relocated using the groomer 370, or the like. Accordingly, storage clients 116 may be able to access the data segment 2812 through the modified logical interface 2811B (both 1024-2048 and 6144-7168) without waiting for the contextual format of the data segment 2812 to be updated to be consistent with the modified logical interface 2811B.

Until the contextual format of the data segment 2812 is updated on the non-volatile storage media 122, the modified logical interface 2811B of the data segment 2812 may exist only in the index 2804. Therefore, if the index 2804 is lost, due to, inter alia, power failure or data corruption, the clone operation may not be reflected in the reconstructed storage metadata 135 (the clone operation may not be persistent and/or crash safe). In a metadata reconstruction operation, the contextual format of the data at 3453-4477 is accessed, the logical interface metadata 2865 of the persistent metadata 2864 indicates that the data is associated only with LIDs 1024-2048, not 1024-2048 and 6144-7168. Therefore, only entry 2814 will be reconstructed (as in FIG. 28A), and 2824 will be omitted; moreover, subsequent attempts to access the data segment 2812 through the modified logical interface 2811B (e.g., through 6144-7168) may fail.

In some embodiments, a clone operation may further comprise storing a persistent note on the storage device 120 to make a clone operation persistent and/or crash safe. The persistent note may comprise an indication of the modified logical interface of the data. In the FIG. 28B embodiment, the persistent note 2866 corresponding to the depicted clone operation may comprise a persistent indicator 2868 that associates the data stored at media addresses 3453-4477 with both LID ranges 1024-2048 and 6144-7168. During reconstruction of the index 2804, the persistent note 2866 may indicate that the data segment 2812 is associated with both LID ranges, such that both entries 2814 and 2824 can be reconstructed. In some embodiments, the storage layer 130 may acknowledge completion of a clone operation in response to updating the metadata 135 (e.g., creating the index entry 2824) and storing the persistent note 2866 on the storage device 120. The persistent note 2866 may be invalidated and/or marked for erasure in response updating the contextual format of the data segment 2812 to be consistent with the logical interface 2811B (e.g., relocating the data segment 2812 by the groomer module 370 as disclosed above).

Figure 28C:
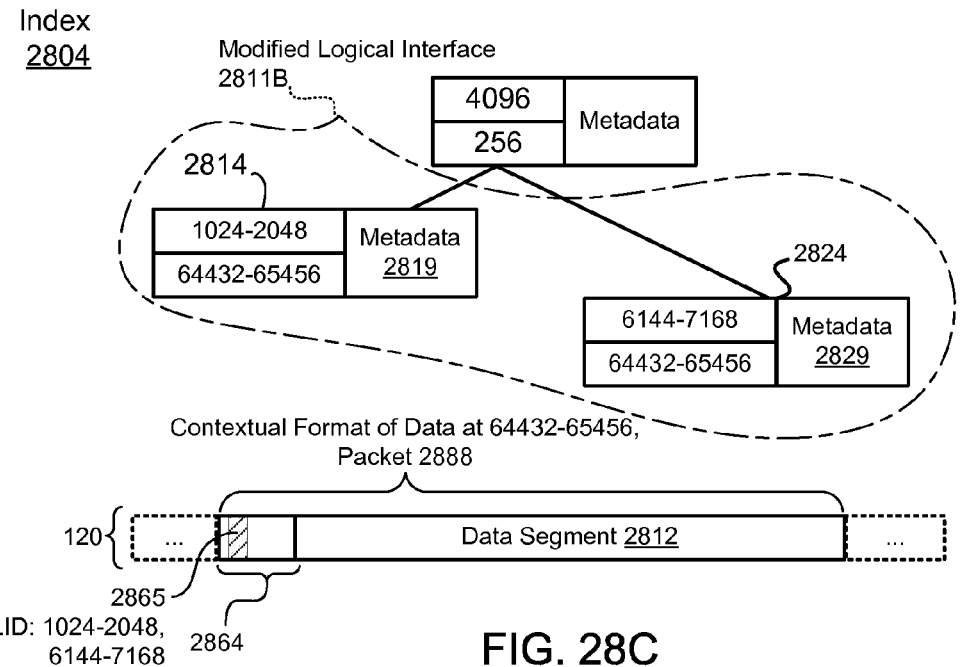

As disclosed above, the storage controller 140 may be configured to store the data segment 2812 in an updated contextual format that is consistent with the modified logical interface 2811B. In some embodiments, the updated contextual format may comprise associating the data segment 2812 with the LIDs of both entries 2814 and 2824 (e.g., both LIDs 1024-2048 and 6144-7168). FIG. 28C depicts one embodiment of an updated contextual format (packet 2888) of the data segment 2812.

As illustrated in the FIG. 28C embodiment, the logical interface metadata 2865 of the updated packet 2888 indicates that the data segment 2812 is associated with both LID ranges 1024-2048 and 6144-7168 (as opposed to only 1024-2048). The updated contextual data format (packet 2888) may be written out-of-place, at different media addresses (64432-65456), which is reflected in the entries 2814 and 2824 in the index 2804. In response to updating the contextual format of the packet 2888, the corresponding persistent note 2866 (if any) may be invalidated (removed and/or marked for subsequent removal) from the storage device 120. In some embodiments, removing the persistent note 2866 may comprise issuing one or more TRIM messages indicating that the persistent note 2866 no longer needs to be retained on the storage device 120. Alternatively, or in addition, portions of the index 2804 may be stored in a persistent crash safe storage location (e.g., non-transitory storage media 114 and/or the storage device 120). In response to persisting the storage metadata 2804 (e.g., the entries 2814 and 2824), the persistent note 2866 may be removed, even if the contextual format 2818 of the data has not yet been updated on the storage device 120.

Figure 28D:
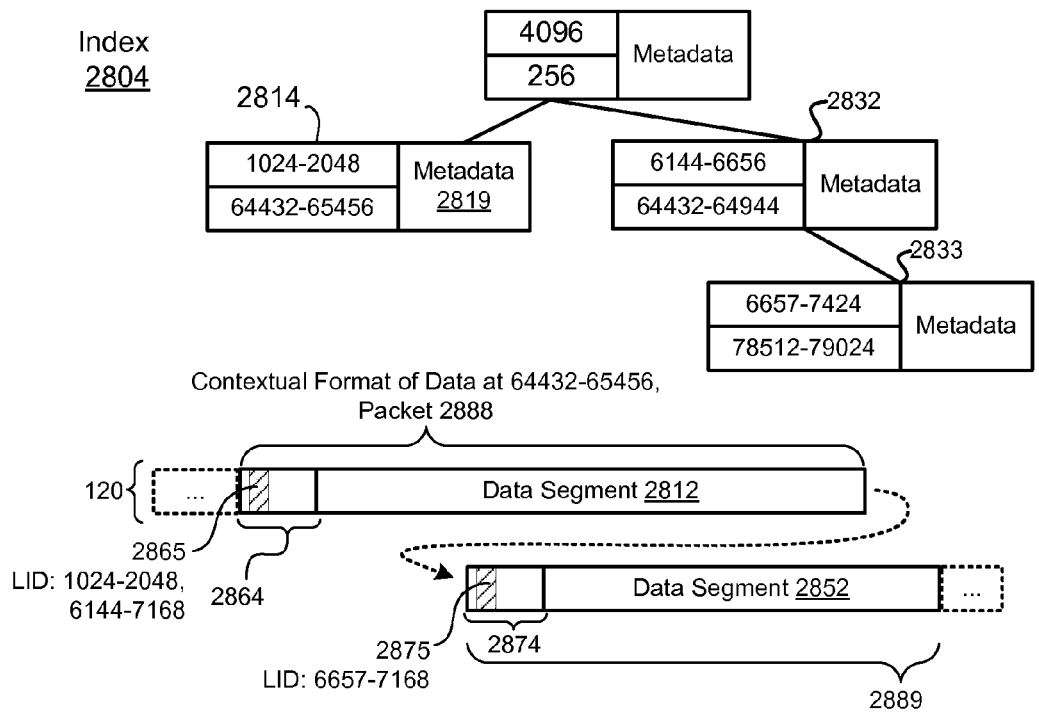

Clones may operate in different modes. In a "copy on write" mode, storage operations that occur after creating the clone may cause the clones to diverge from one another (e.g., the entries 2814 and 2824 may refer to different media addresses). FIG. 28D depicts one embodiment of a storage operation performed within a cloned range in a copy-on-write mode. In the FIG. 28D embodiment, the storage controller 140 has written the data segment 2812 in the updated contextual data format (packet 2888) that is configured to associate the data with both LID ranges 1024-2048 and 6144-7168 (as depicted in FIG. 28C). A storage client 116 may then issue one or more storage requests to modify and/or overwrite data corresponding to the LIDs 6657-7168. In the FIG. 28D embodiment, the storage request comprises modifying and/or overwriting LIDs 6657-7168. In response to the storage request, the storage controller 140 may store the new and/or modified data on the storage device 120, which may comprise appending a data segment 2852 to the log in a contextual format (packet 2889). The packet 2889 may associate the data segment 2852 with the LIDs 6657-7424 as disclosed herein (e.g., by use of LID indicators 2875 within persistent metadata 2874 of the packet 2889). The index 2804 may be updated to associate the LIDs 6657-7424 with the data segment 2852, which may comprise splitting the entry 2824 into an entry 2852 configured to continue to reference the unmodified portion of the data in the data segment 2812 and an entry 2833 that references the new data segment 2852 stored at media addresses 78512-79024. In the copy-on-write mode depicted in FIG. 28D, the entry 2814 corresponding to the LIDs 1024-2048 may continue to reference the data segment 2812 at media addresses 64432-65456. Although not depicted in FIG. 28D, modifications to within the LID range 1024-2048 may result in similar divergent changes affecting the entry 2814. Moreover, the storage request(s) are not limited to modifying and/or overwriting data. Other operations may comprise expanding a LID range (appending data), removing LIDs (deleting and/or trimming data), and/or the like.

In some embodiments, the storage controller 130 may support other clone modes, such as a "synchronized clone" mode. In a synchronized clone mode, changes made within a cloned LID range may be reflected in one or more other, corresponding LID ranges. In the FIG. 28D embodiment, implementing the described storage operations in a "synchronized clone" mode may comprise updating the entry 2814 to reference the new data segment 2852, as disclosed herein, which may comprise inter alia, splitting the entry 2814 into an entry configured to associate LIDs 1024-1536 with the original data segment 2812, and adding an entry configured to associate the LIDs 1537-2048 with the new data segment 2852.

Referring back to the copy-on-write embodiment of FIG. 28D, the storage layer 130 may be further configured to manage clone merge operations. As used herein, a "range merge" or "clone merge" refers to an operation to combine two or more different sets of LIDs. In the FIG. 28D embodiment, a range merge operation may comprise merging the entry 2814 with the cloned entries 2832 and 2833. The storage layer 130 may be configured to implement range merge operations according to a merge policy, such as a recency policy in which more recent changes override earlier changes, a priority-based policy based on the relative priority of storage operations (e.g., based on properties of the storage client(s) 116, applications, and/or users associated with the storage operations), a completion indicator (e.g., completion of an atomic storage operation, failure of an atomic storage operation, or the like), fadvise parameters, ioctrl parameters, and/or the like.

Figure 28E:
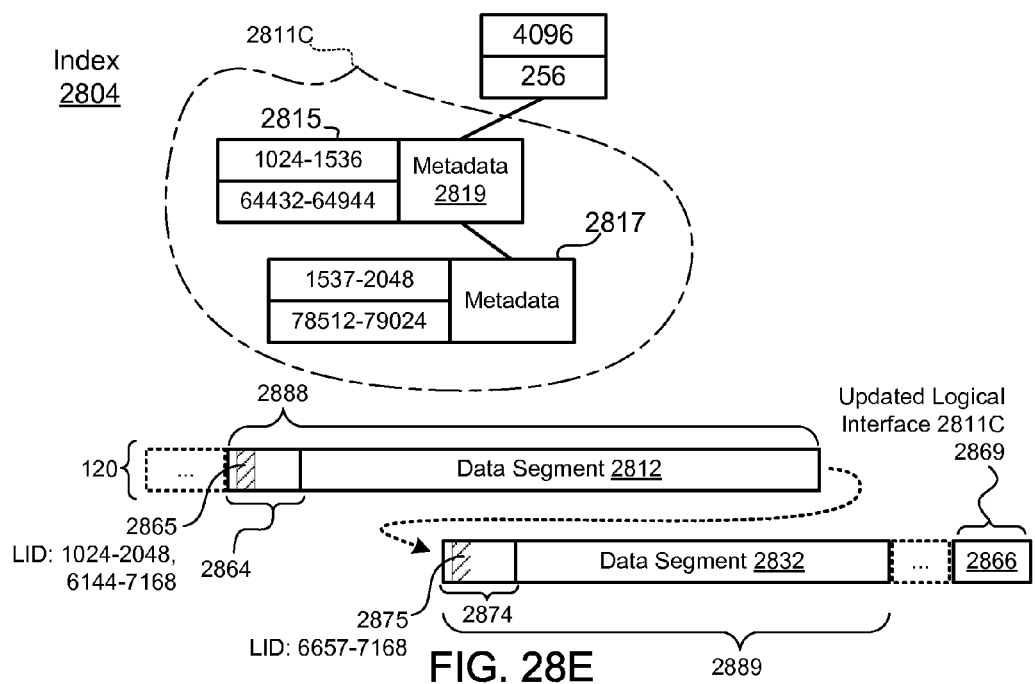

FIG. 28E depicts one embodiment of a range merge operation. The range merge operation of FIG. 28E may be performed in accordance with a recency merge policy. The range merge operation may comprise merging the range 6144-6656 into the range 1024-2048. Accordingly, the range merge operation may comprise selectively applying changes made within the LID range 6144-6656 to the LID range 1024-2048 in accordance with the merge policy. In the FIG. 28E embodiment, the modify/overwrite operation to LIDs 6657-7424 may be applied to the merged LID range 1024-2048 in accordance with the recency merge policy. The range merge operation may, therefore, comprise updating the LID range 1024-2048 to associate LIDs 1537-2048 with the media addresses 78512-79024 comprising the new/modified data segment 2852. The resulting LID range may be split into two separate entries 2815 and 2817 in the index 2804; entry 2815 may be configured to associate LIDs 1024-1536 with portions of the data segment 2812; and entry 2817 may be configured to associate LIDs 1537-2048 with the data segment 2852. Portions of the data segment 2812 no longer referenced by the LIDs 1537-2048 may be invalidated, as disclosed herein. The merged LID range 6144-7168 may be deallocated and/or removed from the index 2804.

The range merge operation illustrated in FIG. 28E may result in modifying the logical interface 2811C to portions of the data. The contextual format 2889 of the data segment 2852 may associate the data with LIDs 6657-7168, rather than LIDs 1537-2048. As disclosed above, the storage layer 130 may provide access to the data stored in the inconsistent contextual format. The storage controller 140 may be configured to store the data in an updated contextual format, in which the data segment 2852 is associated with LIDs 1537-2048 in one or more background operations (e.g., grooming operations). In some embodiments, the range merge operation may further comprise storing a persistent note 2866 on the storage device 120 to associate the data segment 2852 with the updated logical interface 2811C (e.g., associate the data at media addresses 78512-79024 with LIDs 1537-2048). As disclosed above, the persistent note 2866 may be used to ensure that the range merge operation is persistent and crash safe. The persistent note 2866 may be removed in response to relocating the data segment 2852 in a contextual format that is consistent with the logical interface 2811C (e.g., associates the data segment 2852 with the LIDs 1537-2048).

The logical clone operations disclosed in conjunction with FIGS. 28A-E may be used to implement other logical operations, such as a range move operation. Referring back to FIGS. 28A-C, the clone operation of entry 2814 comprises modifying the logical interface associated with the data segment 2812 to associate the data segment 2812 with the LIDs 1024-2048 of entry 2814 and the LIDs 6144-7168 of entry 2824. The cloning operation further includes storing a persistent note 2866 indicating the updated logical interface 2811B of the data and rewriting the data segment 2812 in accordance with the updated logical interface 2811B in one or more background storage operations (e.g., grooming operations).

The same set of operations may be performed to perform a "range move" operation. As used herein, a "range move" operation refers to modifying the logical interface of one or more data segments to associate the data segments with a different set of LIDs. A range move operation may, therefore, comprise updating storage metadata 135 (e.g., the index 2804) to associate the one or more data segments with the updated logical interface, storing a persistent note 2866 on the storage device 120 comprising the updated logical interface of the data segments, and rewriting the data segments in accordance in a contextual format (packet 2888) that is consistent with the updated logical interface (e.g., includes the updated logical interface 2865 in the persistent metadata 2864), as disclosed herein. Accordingly, the storage layer 130 may implement range move operations using the same mechanisms and/or processing steps as those disclosed above in conjunction with FIGS. 28A-E.

The logical clone operations disclosed in FIGS. 28A-E, however, may impose certain limitations on the storage layer 130. As disclosed above, storing data in a contextual format (packet 2888) may comprise associating the data with each LID that references the data. In the FIG. 28C embodiment, the persistent metadata 2864 comprises references to both LID ranges 1024-2048 and 6144-7168. Increasing the number references to a data segment may, therefore, impose a corresponding increase in persistent metadata overhead. In some embodiments, the size of the persistent metadata 2864 may be limited, which may limit the number of references and/or clones that can reference a particular data segment. Moreover, inclusion of multiple LID references may complicate groomer operations. The number of index entries needed to be updated in a grooming operation may vary in accordance with the number of LIDs that reference the data that is to be relocated. Referring back to FIG. 28C, relocating the data segment 2812 in a grooming and/or storage recovery operation may comprise updating two separate index entries 2814 and 2824. Relocating a data segment referenced by N different clones (e.g., N different LIDs) may comprise updating N different index entries. Similarly, storing the data segment may comprise writing N entries into the persistent metadata 2864. This variable overhead may reduce the performance of background grooming operations and may limit the number of concurrent clones and/or references that can be supported.

In some embodiments, the storage layer 130 may comprise and/or leverage an intermediate mapping layer to reduce the overhead imposed by clone operations. The intermediate mapping layer may comprise "reference entries" configured to facilitate efficient cloning operations (as well as other operations, as disclosed in further detail herein). As used herein, a reference entry refers to an entry that only exists while it is being referenced by one or more entries in the logical address space 136. Accordingly, a reference entry does not exist in its own right, but only exists as long as it is being referenced by one or more other index entries. In some embodiments, reference entries may be immutable. Multiple clones may reference the same set of data through a single reference entry. The contextual format of cloned data (data that is referenced by multiple LIDs) may be simplified to associate the data with a reference entry which, in turn, is associated with N other references through other persistent metadata (e.g., persistent notes 2866). Relocating cloned data may, therefore, comprise updating a single mapping between the reference entry and the new media address of the data.

Figure 28F:
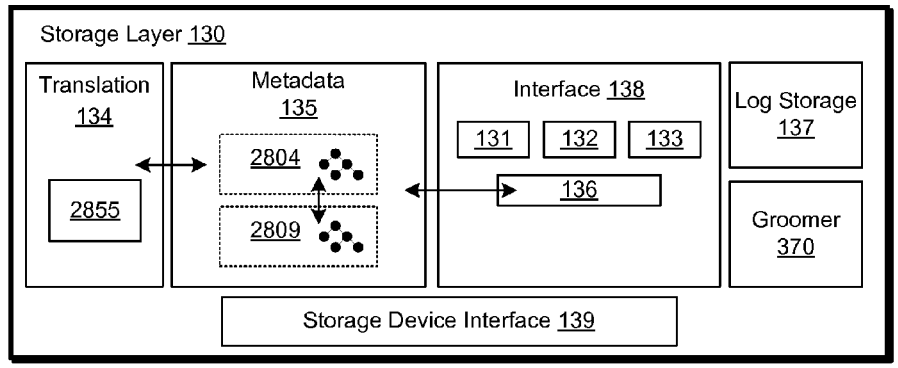
FIG. 28F depicts another embodiment of a storage layer.

FIG. 28F depicts one embodiment of a storage layer 130 configured to implement an intermediate mapping layer. As disclosed above, the metadata module 135 of the storage layer may comprise a forward index 2804 pertaining to the logical address space 136 that is exposed to the storage clients via the interface 138. The metadata 2804 may include information pertaining to LID allocations, bindings between LIDs and media addresses and so on. The metadata module 135 may further comprise a reference index 2809 comprising reference entries. As disclosed above, the reference entries may be used to reference cloned data. The translation module 134 may monitor reference entries of the reference index 2809, and may remove reference entries that are no longer needed (e.g. are not longer being referenced by other entries in the forward index 2804). In some embodiments, reference entries may be maintained in a separate portion of the storage metadata 135 (within a separate reference index 2809). The reference entries may be identified by use of reference identifiers, which may be maintained in a separate namespace from the index 2804. Accordingly, the reference entries may be part of an intermediate, "virtual" or "reference" address space that is separate and distinct from the logical address space 136 exposed to the storage clients 116. Alternatively, in some embodiments, reference entries may be assigned LIDs selected from pre-determined ranges and/or portions of the logical address space 136 that are not directly accessible by storage clients 116.

A clone operation may comprise linking one or more LID entries in the logical address space 2804 to reference entries in the reference index 2809. The reference entries may comprise the media address(es) of the cloned data. Accordingly, LIDs that are associated with cloned data may reference the cloned data indirectly through the reference index 2809. Such entries may be referred to as "indirect entries." As used herein, an indirect entry refers to an entry in the index 2804 that references and/or is linked to a reference entry in the reference index 2804. Indirect entries may be assigned a LID within the logical address space 136, and may be accessible to the storage clients 116.

As disclosed above, after cloning a particular address range, storage clients 116 may perform storage operations within one or more of the cloned ranges, which may cause the clones to diverge from one another (in accordance with the clone mode). In a "copy on write" mode, changes made to a particular clone may not be reflected in the other cloned ranges. In the FIG. 28F embodiment, changes made to a clone may be reflected in "local" entries within an indirect entry. As used herein, a "local entry" or "local LID" refers to a portion of an indirect entry that is directly mapped to one or more media addresses on the storage device 120. Accordingly, local entries and/or local LIDs may be configured to reference data that has been changed in a particular clone and/or differs from the contents of other clones.

The translation module 134 may be configured to access data associated with cloned data. In some embodiments, the translation module 134 is configured to determine the media addresses associated with an indirect entry by use of the corresponding reference entries in the reference index 2809. The translation module 134 may further comprise a cascade lookup module 2855 configured to manage indirect entries that comprise local LIDs. The cascade lookup module 2855 may be configured to traverse local LIDs of indirect entries first and, if the LID is not found within local entries, the cascade lookup module 2855 may continue searching within the reference entries to which the indirect entry is linked.

The log storage module 137 and groomer module 370 may be configured to manage the contextual format of cloned data. In the FIG. 28F embodiment, cloned data (data that is referenced by two or more LIDs and/or LID ranges within the index 2804) may be stored in a contextual format that associates the data with the corresponding reference entries. Accordingly, the logical interface metadata stored with cloned data segments may correspond to a single reference entry as opposed to identifying each LID and/or LID range of the clone. Creating a clone may, therefore, comprise updating the contextual format of the cloned data in one or more background operations by use of, inter alia, the groomer module 370.

Figure 28G:
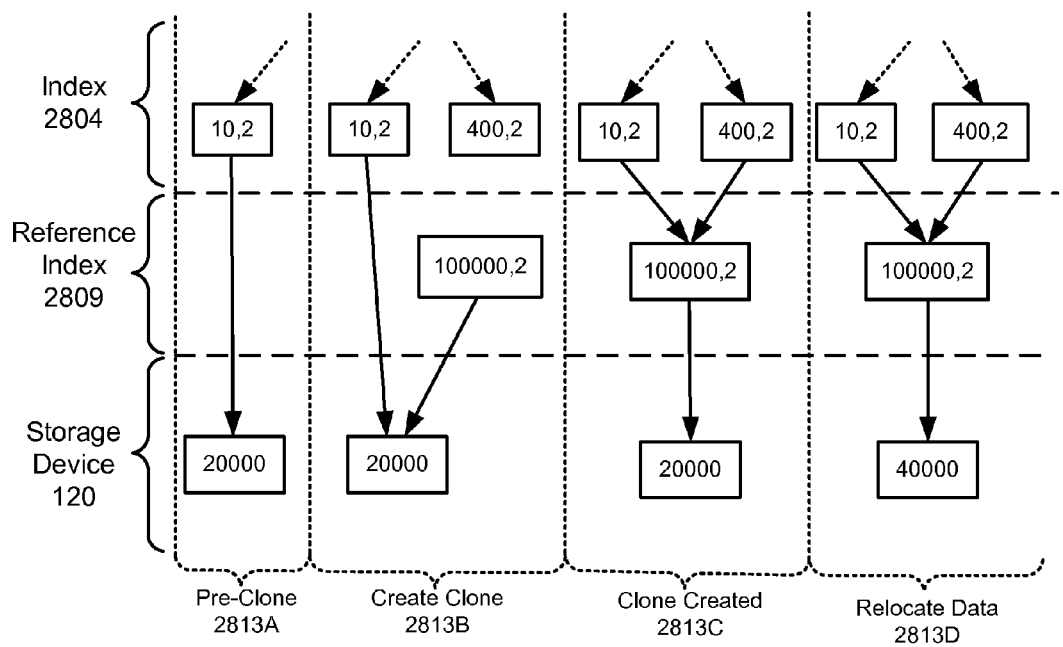
FIGS. 28G-J depict embodiments of clone operations using reference entries.

FIG. 28G depicts one embodiment of a clone operation using a reference index 2809. In state 2813A, an entry corresponding to logical identifier 10 extent 2 in the logical address space 136 (denoted 10,2 in FIG. 28G) may directly reference data at media address 20000 on the storage device 120. Other entries are omitted from FIG. 28F to avoid obscuring the details of the disclosed embodiment. In state 2813B, the storage controller 130 is configured to create a clone of the entry 10,2 at LID 400 (denoted 400,2 in FIG. 28G). The storage controller 130 may be configured to create the clone in response to a request from a storage client 116 and/or as part of a higher-level operation, such as an atomic storage operation, snapshot, or the like. In the FIG. 28G embodiment, creating a clone of entry 10,2 may comprise creating an entry in the logical address space 136 (index 2804) to represent the clone. The clone may be created at LID 400 (entry 400,2 in FIG. 28G). Creating the clone may further comprise creating an entry in the reference index 2809 through which the entries 10,2 and 400,2 may reference the cloned data at media address 20000. The reference entry may correspond to a particular portion of the logical address space 136 and/or may be part of a separate, reference address space. The reference entry is identified in FIG. 28G as entry 100000,2. The clone operation may further comprise associating the entries 10,2 and 400,2 within the index 2804 with the reference entry 100000,2 as illustrated at state 2813C. As disclosed above, associating the entries 10,2 and 400,2, with the reference entry 100000,2 may comprise indicating that the entries 10,2 and 400,2 are indirect entries. State 2813C may further comprise storing a persistent note 2866 on the storage device 120 to associate the data at media address 20000 with the reference entry 100000,2 and/or to associate the entries 10,2 and 400,2 with the reference entry 100000,2 in the reference index 2809.

The storage layer 130 may provide access to the data at media address 20000 through either LID 10 or LID 400 (and by reference to the reference entry 100000,2). In response to a request pertaining to LID 10 or LID 400, the translation module 134 may determine that the corresponding entry in the index 2804 is an indirect entry that is associated with an entry in the reference index 2809. In response, the cascade lookup module 2855 may determine the media address associated with the LID by use of local entries (if any) and the corresponding reference entry 100000,2.

The data stored at media address 20000 may be stored in a contextual format that is inconsistent with the clone configuration (e.g., the data may be associated with LID 10,2 as opposed to the reference entry 100000,2 and/or LID 400). The data may be stored in an updated contextual format (in state 2813D) in one or more background and/or grooming operations. The data may be stored with persistent metadata that associates the data with the reference entry 100000,2 as opposed to the separate LIDs ranges 10,2 and 400,2. Relocating the cloned data may only require updating a single entry in the reference index 2809 as opposed to multiple entries corresponding to each LID that references the data (e.g., entries 10,2 and 400,2). Moreover, any number of LIDs in the index 2804 may reference the cloned data, without increasing the size of the persistent metadata associated with the cloned data and/or complicating the operation of the groomer module 370.

Figure 28H:
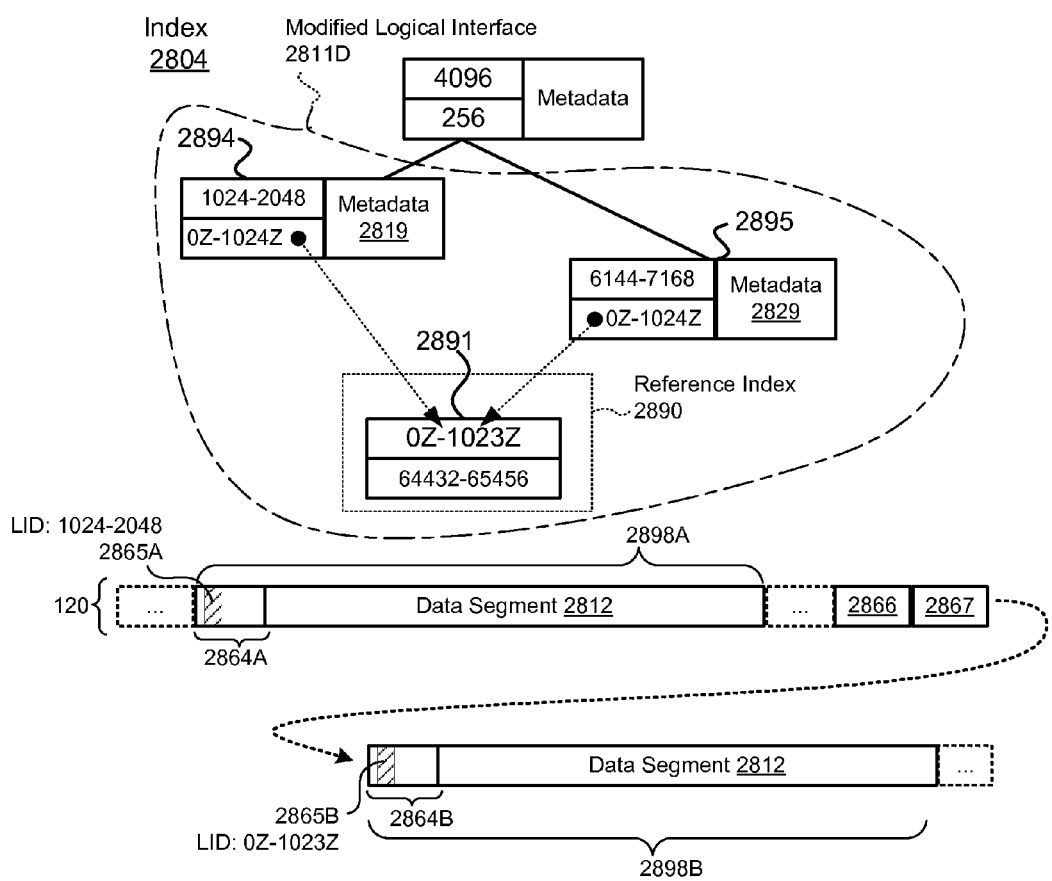

FIG. 28H depicts another embodiment of a clone operation implemented using a reference index 2890. As disclosed above, in response to a request to create a clone of the logical identifiers 1024-2048 and/or data segment 2812, the storage layer 130 may be configured to create a reference entry 2891 in a designated portion of the index 2804 (e.g., the reference index 2890), or within a separate namespace. The reference entry 2891 may represent the cloned data segment 2812. Any number of LIDs and/or LID ranges in the index 2804 may reference the data through the reference index entry 2891. As depicted in FIG. 28H, the reference entry 2891 may be bound to the media storage locations of the cloned data segment 2812 (media addresses 3453-4477). The entries 2894 and 2895 may reference the media addresses indirectly, through the reference entry 2891.

The reference entry 2891 may be assigned identifiers 0Z-1023Z. As disclosed above, the identifier(s) of the reference entry 2891 may correspond to a particular portion of the logical address space 136 or may correspond to a different, separate namespace. The storage layer links the entries 2894 and 2895 to the reference entry 2891 by use of, inter alia, metadata 2819 and 2829. Alternatively, or in addition, the indirect entries 2894 and 2895 may replace media address information with references and/or links to the reference entry 2891. The reference entry 2891 may not be directly accessible by storage clients 116 via the storage layer 130 and/or interface 138.

The clone operation may further comprise modifying the logical interface 2811D of the data segment 2812; the modified logical interface 2811D may allow the data segment 2812 to be referenced through the LIDs 1024-2048 of the indirect entry 2894 and/or the LIDs 6144-7168 of the indirect entry 2895. Although the reference entry 2891 may not be used by storage clients 116 to reference the data segment 2812, FIG. 28H depicts the reference entry 2891 as part of the modified logical interface 2811D of the data segment 2812, since the reference entry 2891 is used to access the data by the translation module 132 (through the indirect entries 2894 and 2895).

Creating the clone may further comprise storing a persistent note 2866 on the storage device 120. As disclosed above, the persistent note 2866 may identify the reference entry 2891 associated with the data segment 2812. Accordingly, the persistent note 2866 may associate the media addresses 64432-65456 with the identifier(s) of the reference entry 2891. The clone operation may further comprise storing another persistent note 2867 configured to associate the LIDs of entries 2894 and 2895 (LIDs 1024-2048 and 6144-7168) with the reference entry 2891. Alternatively, metadata pertaining to the association between entries 2894 and 2895 and the reference entry 2891 may be included in the persistent note 2866. The persistent notes 2866 and/or 2867 may be retained on the storage device 120 until the data segment 2812 is relocated in an updated contextual format and/or the index 2804 (and/or reference index 2890) are persisted. As disclosed above, storage of the persistent note(s) 2866 and/or 2867 may ensure that the clone operation is persistent and crash safe.

The modified logical interface 2811D of the data segment 2812 may be inconsistent with the contextual format of the data 2898A; the logical interface metadata 2865A of the persistent metadata 2864A may reference LIDs 1024-2048 rather than the identifiers of the reference entry 2891 and/or the cloned entry 2895. The storage controller 140 may be configured to store the cloned data segment 2812 in an updated contextual format 2864B that is consistent with the modified logical interface 2811D; the logical interface metadata 2865B of the persistent metadata 2864B may associate the data segment 2812 with the reference entry 2891, as opposed to separately identifying the LIDs within each cloned range (LIDs of entries 2894 and 2895). Accordingly, the use of the indirect entry 2894 allows the logical interface 2811D of the data segment 2812 to comprise any number of LIDs, independent of size limitations of the contextual data format 2898A-B (e.g., independent of the number of LIDs that can be included in the logical interface metadata 2865). Moreover, additional logical copies of the reference entry 2891 may be made without updating the contextual format 2864B of the data; such updates may be made by associating the LID ranges with the reference entry 2891 in the index 2804 and/or by use of, inter alia, persistent notes 2867.

Figure 28I:
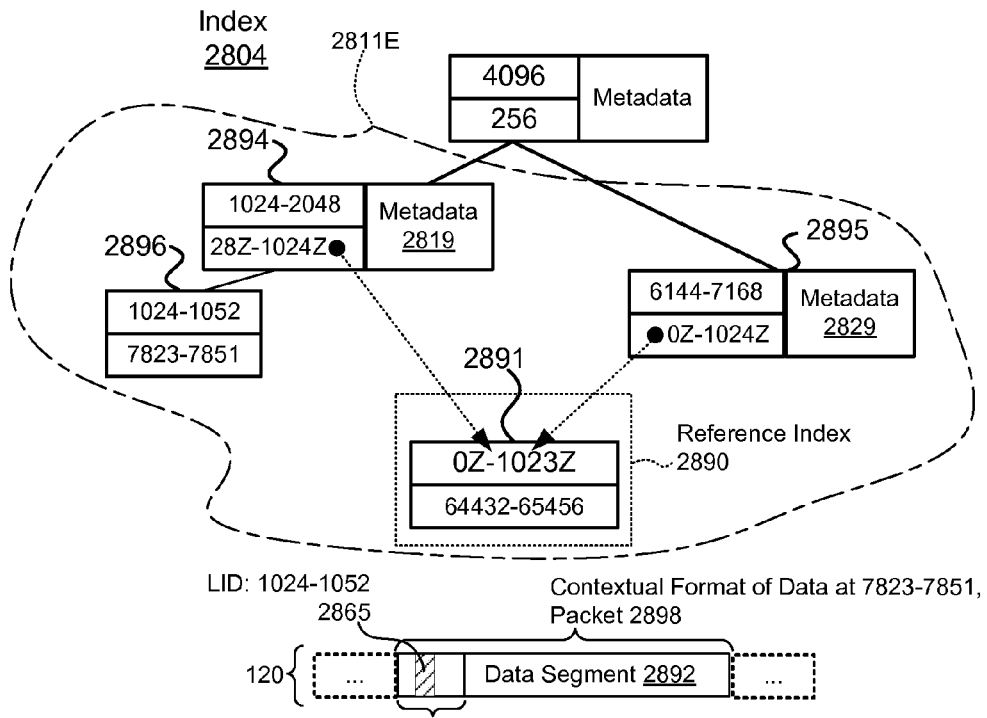

As disclosed above, the indirect entries 2894 and/or 2895 may initially reference the data segment 2812 through the reference entry 2891. Storage operations performed after creating the clones 2894 and/or 2895 may be reflected by use of local LIDs within the respective entries 2894 and/or 2895. FIG. 28I depicts one embodiment of the result of a storage operation pertaining to LIDs 1024-1052 performed after completing the clone operation of FIG. 28H. After completion of the clone operation, a storage client 116 may modify data associated with one or more of the clones. In the FIG. 28I embodiment, a storage client 116 modifies and/or overwrites data corresponding to LIDs 1024-1052 of entry 2894, which may comprise appending a new data segment 2892 to the storage device 120. The data segment 2892 may be stored in a contextual format 2898 comprising persistent metadata 2864 configured to associate the data segment 2892 stored at media addresses 7923-7851 with logical interface metadata 2865 (LIDs 1024-1052). The storage layer 130 may be configured to associate the data segment 2892 with the LIDs 1024-1052 in a local LID entry 2896. The local LID entry 2896 may reference the updated data directly, as opposed to referencing the data through a reference entry (e.g., reference entry 2891).

In response to a request pertaining to data 1024-1052 (or sub-set thereof), the cascade lookup module 2855 may search for references to the LIDs in a cascading lookup operation, which may comprise searching for references to local LIDs (if available) followed by the reference entries 2891. In the FIG. 28I embodiment, the local entry 2896 may be used to satisfy requests pertaining to LIDs 1024-1052 (media addresses 7823-7851 rather than 64432-64460 per the reference entry 2891). Requests for LIDs that are not found in local entries (e.g., LIDs 1053-2048) may continue to be serviced through the reference entry 2891. Accordingly, the storage layer 130 may use the indirect entry 2894 and reference entry 2891 to implement a cascade lookup for LIDs pertaining to the clone range 1024-2048. The logical interface 2811E of the data may, therefore comprise one or more local entries 2896 and/or one or more indirect and/or reference entries.

Figure 28J:
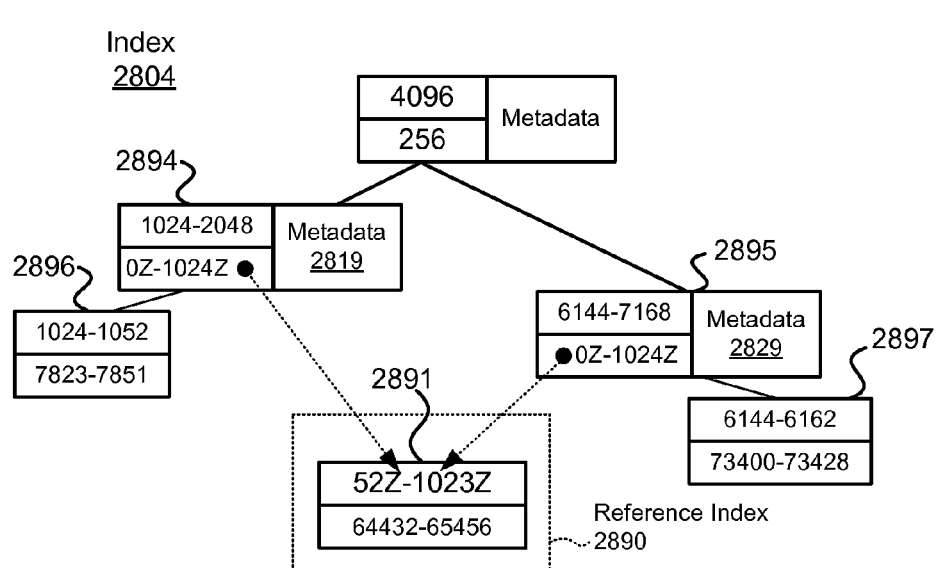

In a further embodiment, illustrated in FIG. 28J, a storage client 116 may modify data of the clone through another one of the LIDs of the logical interface 2811E (e.g., LIDs 6144-6162); the logical interface delimiters are not shown in FIG. 28J to avoid obscuring the details of the illustrated embodiment. The modified data may be referenced using a local entry 2897, as disclosed above. Since each of the clones now has its own, respective version of the original clone data 0Z-52Z; neither clone references that portion of the reference entry 2891. The storage layer 130 may determine that the corresponding clone data (and reference identifiers) are no longer being referenced, and may be removed (as depicted in FIG. 28J). The clones may continue to diverge, until neither 2894 nor 2895 references any portion of the reference entry 2891, at which point the reference entry 2891 may be removed.

Although FIGS. 28I and 28J depict local entries 2896 and 2897 that overlap with the corresponding indirect entries 2894 and 2895, the disclosure is not limited in this regard. In some embodiments, the storage operation of FIG. 28I may be reflected by creating the local entry 2896 and modifying the indirect entry to reference LIDs 1053-2048. Similarly, the operation of FIG. 28J may comprise creating the local entry 2897 and modifying the indirect entry to reference LIDs 6163-7168.

Referring back to FIG. 28F, the translation module 134 may be configured to "groom" the reference index 2809. In some embodiments, each entry in the reference index 2809 comprises metadata that includes a reference count (not shown). The reference count may be incremented as new references or links to the reference entry are added, and may be decremented in response to removing references to the entry. In some embodiments, reference counts may be maintained for each reference identifier in the reference index 2809. Alternatively, reference counts may be maintained for reference entries as a whole. When the reference count of a reference entry reaches 0, the reference entry 2891 (or a portion thereof) may be removed from the reference index 2809. Removing a reference entry (or portion of a reference entry) may comprise invalidating the corresponding data on the storage device 120, as disclosed herein (indicating that the data no longer needs to be retained on the storage device 120).

In another example, the storage layer 130 may remove reference entries using a "mark-and-sweep" approach. The storage layer 130 (or other process, such as the translation module 134 and/or groomer 370) may periodically check references to entries in the reference index 2809 by, inter alia, following links to the reference entries from indirect entries (or other types of entries) in the index 2804. Entries that are not referenced by any entries during the mark-and-sweep may be removed, as disclosed above. The mark-and-sweep may operate as a background process, and may periodically perform a mark-and-sweep operation to garbage collect reference entries that are no longer in use.

The reference index disclosed in conjunction with FIGS. 28F-28J may be created on demand (e.g., in response to creation of a clone, or other indirect data reference). In other embodiments, all data may be referenced through intermediate, two-layer mappings. In such embodiments, storage clients 116 may allocate indirect, virtual identifiers (VIDs) in a virtual address space, which may be linked to and/or reference media addresses through an intermediate mapping layer, such as the logical address space 136 of the storage layer 136. These embodiments may result in an additional mapping layer between storage clients 116 and the storage device(s) 120. Storage clients may reference data using VIDs of a virtualized address space that map to logical identifiers of the logical address space 136, which, in turn, are associated with media addresses on respective storage device(s) 120.

Figure 28K:
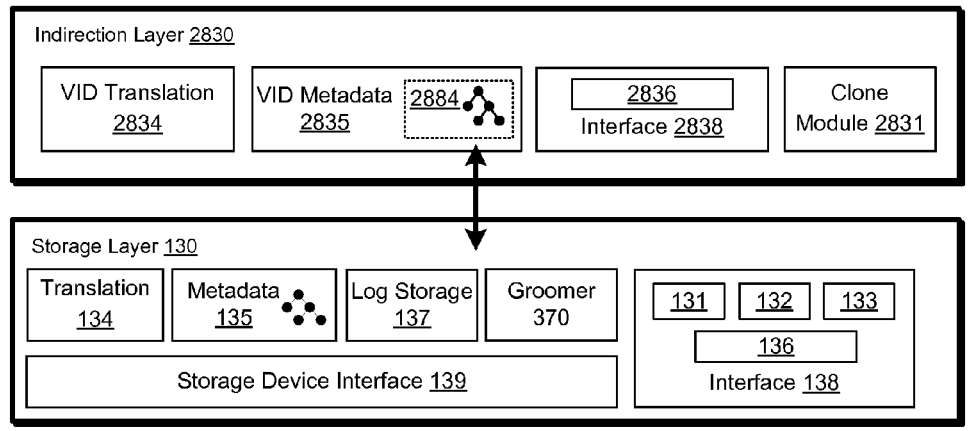
FIG. 28K depicts one embodiment of an indirection layer.

FIG. 28K depicts one embodiment of an indirection layer 2830 configured to implement cloning operations using a two-layer, virtualized address space. The indirection layer 2830 may be configured to present a virtual address space 2836 to the storage clients 116. The indirection layer 2830 may implement the virtual address space 2836 using the same modules and/or interfaces for managing the logical address space 136 disclosed herein. The virtual address space 2836 may comprise 64-bit VIDs, which may be defined independently of the underlying logical address space 136 and/or storage device(s) 120. The indirection layer 2830 may comprise VID metadata 2835, which may comprise a VID index 2884. The VID index 2884 may be implemented as the index 2804 disclosed herein. The indirection layer 2830 may further comprise a VID translation module 2834 configured to map VIDs to LIDs within the logical address space 136 of the storage layer 130.

The indirection layer 2830 may provide access to the virtual address space 2836 through the interface 2838. The interface 2838 may comprise one or more of a block device interface, virtual storage interface, cache interface, and the like, as disclosed herein. The clone module 2831 may be configured to manage clone operations within the virtual address space 2836. Although FIG. 28K depicts the indirection layer 2830 separately from the storage layer 130, the disclosure is not limited in this regard. In some embodiments, virtual address space 2836, VID index 2884, VID translation module 2834, and/or the clone module 2831 may be implemented as part of the storage layer 130.

The VIDs of the virtual address space may be used to, inter alia, perform efficient cloning operations. Alternatively, or in addition, the additional mapping layer may be leveraged to enable logical clone operations on random access, write-in-place storage devices 120, such as hard disks.

Storage clients 130 may perform storage operations in reference to VIDs of the virtual address space 2836. Accordingly, storage operations may comprise two (or more) translation layers. The VID index 2884 may comprise a first translation layer between VIDs of the virtual address space 2836 and LIDs of the logical address space 136. The index 2804 of the storage layer 130 may implement a second translation layer between the LIDs and media address(es) on respective storage devices 120.

The indirection layer 2830 may be configured to manage allocations within the virtual address space 2836 by use of, inter alia, the VID metadata 2835, VID index 2884, and/or VID translation module 2834. The VID translation module 2834 may be configured to maintain associations between VIDs of the virtual address space 2836 and LIDs of the logical address space 136 (by use of the VID index 2884). In some embodiments, allocating a VID in the virtual address space 2836 may comprise allocating one or more corresponding LIDs in the logical address space 136. Accordingly, each VID allocated in the virtual address space 2836 may be mapped to one or more LIDs in the logical address space 136. The mappings may be sparse and/or any-to-any, as disclosed herein. The logical address space 136 may not be directly accessible to the storage clients 116 (e.g., the logical address space 136 may be used as an intermediate mapping layer). Performing a storage operation through the indirection layer 2830 may comprise: a) identifying the LIDs corresponding to one or more VIDs referenced in the storage operation by use of the VID translation module 2834 and/or VID index 2884; and b) implementing the storage operation within the storage layer 130 in reference to the identified LIDs.

FIG. 28J depicts one embodiment of a clone operation using an indirection layer 2830. As disclosed above, the VID index 2884 may correspond to a virtual address space 2836 that is indirectly mapped to media addresses through the logical address space 136 of the storage layer 130. The indirection layer 2830 may provide access to the virtual address space 2836 through an interface 2838. Storage clients 116 may allocate portions of the virtual address space 2836 and/or perform storage operations using VIDs of the virtual address space through the indirection layer 2830 (and storage layer 130), as disclosed herein.

In state 2863A, the VID index 2884 may comprise an entry 10,2 that represents two VIDs (10 and 11) in the virtual address space 2836. The VID index 2884 may be configured to map the VID entry 10,2 to LIDs within the logical address space 136 (using the VID index 2884). In the FIG. 28K embodiment, the VID index 2884 maps the VID entry 10,2 to the LID entry 100000,2. The entry 10,2 may be allocated to a storage client 116, which may perform storage operations in reference to the VIDs. In state 2863A, the storage layer 130 may be configured to map the LID entry 100000,2 to one or more media addresses on the storage device 120 (media address 20000).

Figure 28L:
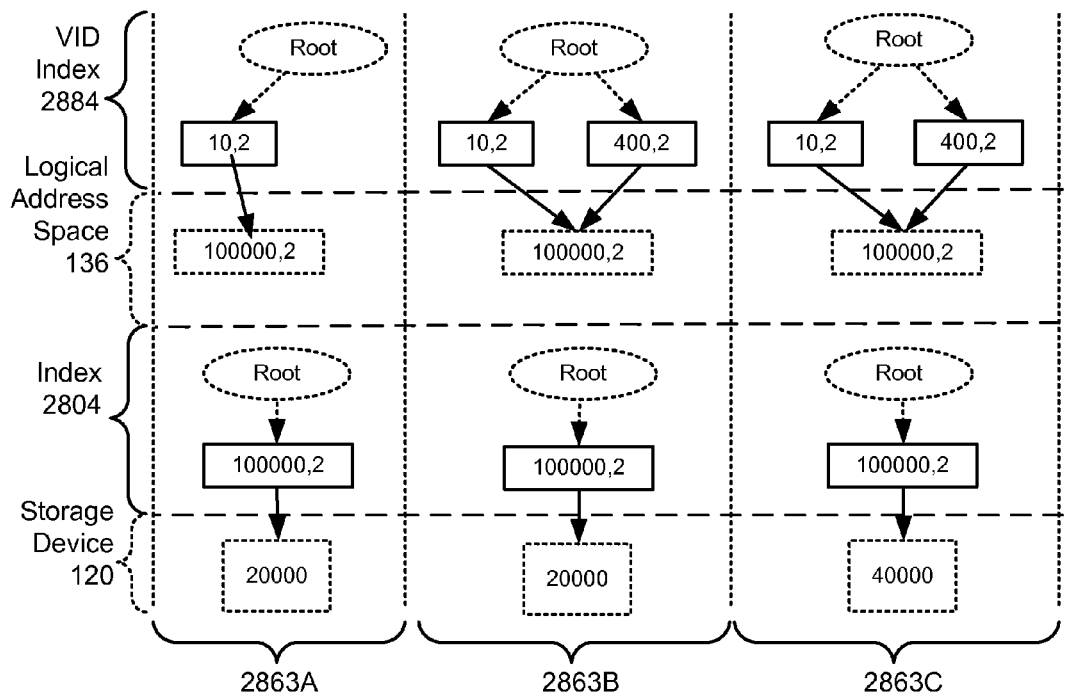
FIG. 28L depicts one embodiment of a clone operation performed using intermediate mapping layers.

In state 2836B, the indirection layer 2830 is configured to implement a clone operation. The clone operation may comprise creating a clone of the VID entry 10,2. In FIG. 28L, the clone is identified as VID index entry 400,2. The clone operation may further comprise associating the cloned entry 400,2 with corresponding LID entry 100000,2 in the VID index 2884. The corresponding entry 100000,2 in the index 2804 may remain unchanged. Alternatively, a reference count (or other indicator) of the LID entry 100000,2 may be updated to indicate that the entry is being referenced by multiple VID entries. The contextual format of the data stored at media address 20000 may be left unchanged (e.g., continue to associate the data with the LID entry 100000,2). The clone operation may further comprise storing a persistent note 2866 and/or 2867 on the storage device 120 to persist the association between VID entry 400,2 and the LID entry 100000,2. Alternatively, or in addition, the clone operation may be made persistent and/or crash safe by persisting the VID index 2884.

In state 2836C, the data at media address 20000 may be relocated to media address 40000. The relocation may occur in a standard grooming operation, and not to update the contextual format of the cloned data. Relocating the data may comprise updating a single entry in the index 2804.

The clone implementations disclosed herein may be used to efficiently implement storage operations, such as range clone operations, range move operations, snapshots, deduplication, atomic writes, and the like.

The embodiments for clone operations disclosed herein may be leveraged to manage snapshots of the logical address space 136 (or virtual address space 2836). Creating a snapshot of a address range may comprise maintaining an immutable copy of the AR, and the corresponding data. As used herein, an address range (or AR) refers to a logical address range, a virtual address range, or the like.

The embodiments for managing range clone and/or range move operations disclosed herein may be leveraged to perform one or more higher-level operations, such as deduplication operations. Referring back to FIG. 3A, the storage layer 130 may comprise a deduplication module 374 configured to identify duplicate data on the storage device 120 and/or non-volatile storage media 122. Duplicate data may be identified using any suitable mechanism. In some embodiments, duplicated data is identified by scanning the contents of the storage device 120, generating signature values for various data segments, and comparing data signature values to identify duplicates. The signature values may include, but are not limited to: cryptographic signatures, hash codes, cyclic codes, and/or the like. Signature information may be stored within storage metadata 135, such as the index 2804 (e.g., in metadata associated with the entries) and/or may be maintained and/or indexed in one or more separate datastructures (not shown). The deduplication module 374 may compare data signatures and, upon detecting a signature match, may perform one or more deduplication operations. The deduplication operations may comprise verifying the signature match (e.g., performing a byte-by-byte data comparison), and performing one or more range clone operations to reference the duplicate data within two or more LIDs and/or LID ranges.

Figure 28M:
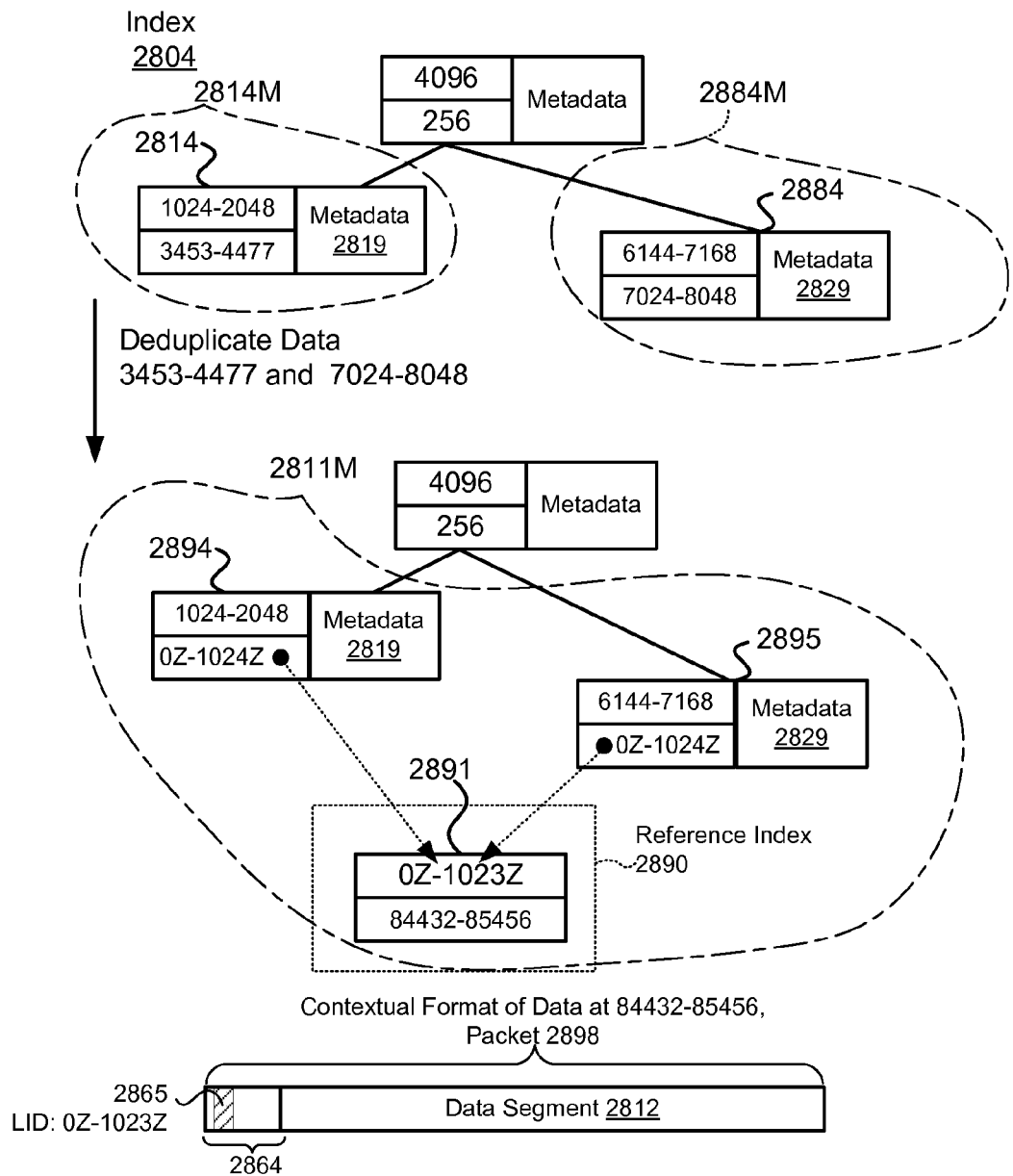
FIG. 28N depicts embodiments of snapshot operations.
FIGS. 28O-S depict embodiments of range move operations.

FIG. 28M depicts one embodiment of a deduplication operation. The index 2804 may comprise entries 2814 and 2884, which may reference duplicated data (e.g., duplicated data segment 2812) stored at different respective media addresses 3453-4477 and 7024-8048. The entries 2814 and 2884 may correspond to different, respective logical interfaces 2814M and 2884M. The duplicated data segment 2812 may be identified and/or verified by the deduplication module 374, as disclosed above. Alternatively, the duplicated data may be identified as data is received for storage at the storage layer 130. Accordingly, the data may be deduplicated before an additional copy of the data is stored on the storage device 120.

In response to identifying and/or verifying that entries 2814 and 2884 reference duplicate data, the storage layer 130 may be configured to deduplicate the data, which may comprise creating one or more range clones. As disclosed above, creating a range clone may comprise modifying the logical interface 2811G of the duplicated data segment 2812 to associate a single version of the data segment 2812 with both sets of LIDs 1024-2048 and 6144-7168.

The range clone may be implemented using any of the clone embodiments disclosed herein including the range clone embodiments of FIGS. 28A-E, the reference entry embodiments of FIGS. 28F-J, and/or the two-layer mapping embodiments of FIGS. 28K-L. In the de-deduplication embodiment of FIG. 28M, both LID ranges 1024-2048 and 614407168 may be modified to reference a single version of the data segment 2812 (the other data segment 2812 may be removed and/or groomed from the storage device 120).

The FIG. 28M embodiment uses the reference entry implementation of FIGS. 28F-J. As such, the deduplication operation may comprise creating a reference entry 2981 to represent the deduplicated data segment 2812 (the cloned data). The deduplication operation may further comprise modifying and/or converting the entries 2814M and 2884M to indirect entries 2894 and 2895, which may be mapped to the data segment 2812 through the reference entry 2891, as disclosed above. The deduplication operations may comprise modifying the logical interface 2811G to reference the data segment 2812 through both sets of LIDs 1024-2048 and 6144-7168 (as well as the reference entry 2891). The deduplication operations may further comprise storing a persistent note on the non-volatile storage media 122 to associate the data segment 2812 with the updated logical interface 2811G (e.g., associate the data segment 2812 with the reference entry 2891 and/or the linked indirect entries 2894 and 2895), as disclosed herein. The deduplication operations may further comprise updating the contextual format of the data segment 2812 to be consistent with the modified logical interface 2811G, as disclosed above. Updating the contextual format may comprise relocating (e.g., rewriting) the data segment 2812 in an updated contextual format 2898 to new media storage locations (e.g., media storage locations 84432-84556) in one or more background operations. The updated contextual format 2898 may comprise persistent metadata 2864 that includes logical interface metadata 2865 to associates the data segment 2812 with the reference entry 2891 (e.g., identifiers 0Z-1023Z).

Although FIGS. 28A-G depict cloning and/or deduplicating a single entry or range of LIDs, the disclosure is not limited in this regard. In some embodiments, a plurality of LID ranges may be cloned in a single clone operation. For example, referring back to FIG. 12, a cloning operation may clone the entry 1214 along with all of its child entries. In another example, a clone operation may comprise copying the entire contents of the index 1204 (e.g., all of the entries in the index 1204). This type of clone operation may be used to create a "snapshot" of a logical address space 136 (or a particular LID range). As used herein, a snapshot refers to the state of a storage device (or set of LIDs) at a particular point in time. The snapshot may persist the state of a logical address range despite changes to the original.

Figure 28N:
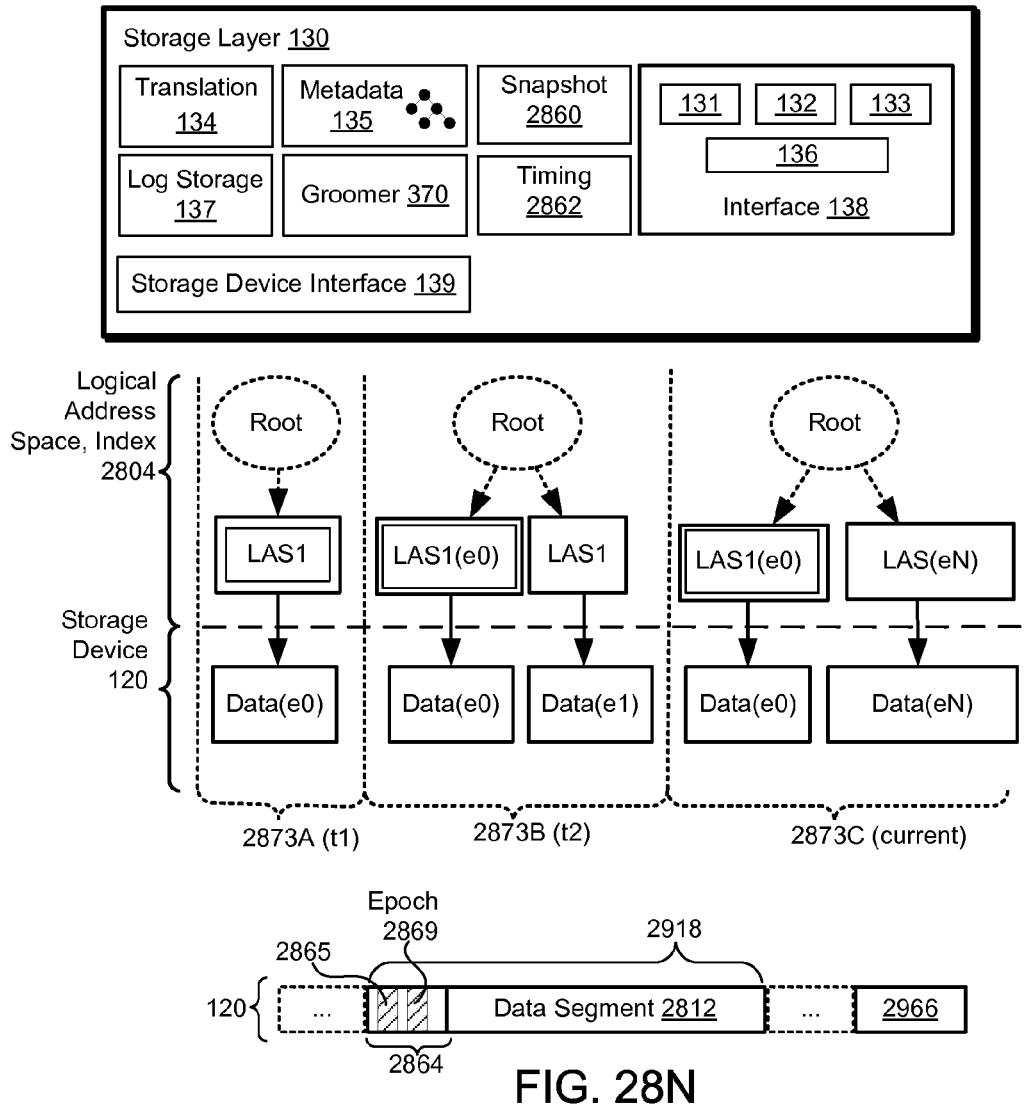

FIG. 28N depicts one embodiment of a storage layer configured to perform snapshot operations. The FIG. 28N embodiment pertains to an address range with a logical address space 136 (logical address range 2904). The disclosure is not limited in this regard, however, and could be adapted for use with other types of address ranges, such as ranges and/or extents within the virtual address space 2836, as disclosed above.

At time t1 2913A, the storage layer 130 may be configured to create a snapshot of the logical address range LAS1. As used herein, a snapshot of an address range refers to an operation that is configured to maintain the state of the address range at a particular time (e.g., freeze the address range). The snapshot operation may comprise preserving the state of the (LAS1) at a particular time. The snapshot operation may further comprise preserving the logical address range while allowing subsequent storage operations to be performed within the logical address range.

As disclosed above, the storage layer 130 may be configured store data in an ordered log by use of, inter alia, the log storage module 137. The log order of storage operations may be determined using sequence information associated with the data, such as sequence indicators on storage divisions 253 of a solid-state storage medium (e.g., logical storage element 229 of FIG. 3A) and/or sequential storage locations within the physical address space of the storage device 120 (as disclosed in conjunction with FIG. 3C).

The storage controller 140 may be further configured to maintain other types of ordering and/or timing information, such as the relative time ordering of data in the log. However, in some embodiments, the log order of data may not accurately reflect data information. As disclosed above, the groomer module 370 may be configured to relocate data on the storage device 120. Relocating data may comprise reading the data from its original storage location on the storage device 120 and appending the data at a current append point in the log. As such, older, relocated data may be stored with newer, current data in the log.

In some embodiments, the log storage module 137 is configured to associate data with timing information, which may be used to establish relative timing information of the storage operations performed in the log. In some embodiments, the timing information may comprise respective timestamps (maintained by the timing module 2862), which may be applied to each data packet stored in the log. The timestamps may be stored within persistent metadata 2864 of the data packets (e.g. in packet headers). Alternatively, or in addition, the timing module 2862 may be configured to track timing information at a higher-level of granularity. In some embodiments, the timing module 2862 maintains one or more global timing indicators (an epoch identifier). As used herein, an "epoch identifier" refers to an identifier used to determine relative timing of storage operations performed through the storage layer 130. The log storage module 137 may be configured to include an indicator 2869 of the current epoch identifier in the persistent metadata 2864; the epoch indicator 2869 may correspond to the epoch in which the data segment 2812 was written to the log. The timing module 2862 may be configured to increment the global epoch identifier in response to certain events, such as the creation of new snapshots, user requests, and/or the like. The epoch indicator 2869 of the data segment 2812 may remain unchanged through relocation and/or other grooming operations. Accordingly, the epoch indicator 2869 may correspond to the original storage time of the data segment 2812 independent of the relative position of the contextual data format (packet 2918) in the log.

As disclosed above, a snapshot operation may comprise preserving the state of a particular logical address range (LAS1) at a particular time. A snapshot operation may, therefore, comprise preserving data pertaining to the LAS1 on the storage device 120. Preserving the data may comprise a) identifying data pertaining to a particular timeframe (epoch), and b) preserving the identified data on the storage device 120 (e.g., preventing the identified data being removed from the storage device 120 in, inter alia, grooming operations). Data that needs to be preserved for a particular snapshot may be identified by use of the epoch indicators 2869 disclosed above.

In state 2873A (time t1, denoted by epoch indicator e0), the storage layer 130 may receive a request to implement a snapshot operation through the interface 138. In response to the request, the snapshot module 2860 may determine the current value of the epoch identifier maintained by the timing module 2862. The current value of the epoch identifier may be referred to as the current "snapshot epoch." In the FIG. 28N embodiment, the snapshot epoch is 0. The snapshot module 2860 may be further configured to cause the timing module 2862 to increment the current, global epoch indicator (e.g., increment the epoch identifier to 1). Creating the snapshot may further comprising storing a persistent note 2966 on the storage device 120. The persistent note 2966 may indicate the current, updated epoch indicator, and may further indicate that data pertaining to the snapshot epoch is to be preserved. The persistent notes 2966 may be using during a metadata reconstruction operation to a) determine the current epoch identifier and to b) configure the snapshot module 2860 and/or groomer module 370 to preserve data associated with the snapshot epoch e0.

The snapshot module 2860 may be further configured to instruct the groomer 370 to preserve data associated with the snapshot epoch. In response, the groomer 370 may be configured to a) identify data to preserve for the snapshot (snapshot data), and b) prevent the identified data from being removed from the storage device 120 in, inter alia, grooming operations (e.g., storage recovery operations). The groomer module 370 may identify snapshot data in reference to the epoch indicators 2869 associated with the data. As disclosed in conjunction with FIG. 3C, data may be written out-of-place on the storage device 120. The most current version of data associated with a particular LID (or LID range) may be determined based on the order of the corresponding data packets 2918 within the log. The groomer 370 may be configured to identify the most current version of data within the snapshot epoch as data that needs to be preserved. Data that has been rendered obsolete by other data in the snapshot epoch may be removed. Referring to the FIG. 3C embodiment, if the data A and A' (associated with the same LIDs) were both marked with the snapshot epoch 0, the groomer module 370 would identify the most current version of the data in epoch 0 as A', and would identify the data A for removal.

In state 2873B, the snapshot module 2860 may be configured to preserve data pertaining to the snapshot LAS1 (data associated with epoch e0), while allowing storage operations to continue to be performed during subsequent epochs (e.g., epoch e1). The storage operations may comprise storing data on the storage device. The data may be stored with an indicator of the current epoch (e1). The snapshot module 2860 may be configured to preserve data that is rendered obsolete and/or invalidated by storage operations performed during epoch e1 (and subsequent epochs). Referring back to the FIG. 3C embodiment, the groomer module 370 may identify data A' as data to preserve for the snapshot LAS1 (the data A' may be the most current version within epoch e0). The snapshot module 2860 and/or groomer 370 may be configured to preserve the data A' even of the corresponding LIDs are trimmed and/or deleted during epoch e1. Similarly, the data A' may be preserved in response to overwriting the data with a new version A" during epoch e1.

The snapshot for LAS1 (data marked with epoch indicator e0) may be preserved until it is deleted. The snapshot may be deleted in response to a request received with the interface 138. As indicated in state 2873C, the epoch 0 may persist on the storage device 120 even after other, intervening epochs (epochs e1-eN) have been created and/or deleted. Deleting the epoch e0 may comprise configuring the snapshot module 2860 and/or groomer module 370 to remove invalid/obsolete data associated with the epoch e0.

The storage operations performed after creating the snapshot at 2873A may modify the logical address space 136 and specifically, the index 2804. The modifications may comprise updating LID-to-media address bindings in response to appending data to the storage device 120, adding LIDs, removing and/or trimming LIDs, and so on. In some embodiments, the snapshot module 2860 is configured to preserve the LAS1 index in a separate storage location, such as a separate location in the logical address space 136, in a separate namespace, or the like. Alternatively, the snapshot module 2860 may allow the changes to take place in the index 2804 without preserving the original version of the index 2804 LAS1 at time t1. The snapshot module 2860 may be configured to reconstruct the index 2804 for LAS1 at time t1 using the data stored in the contextual, log-based data format on the storage device 120. The LAS1 at time t1 may be reconstructed as disclosed above, which may comprise sequentially accessing data stored on the storage device 120 (in a log-order), and creating index entries based on persistent metadata 2864 associated with the data packet 2918. In the FIG. 28N embodiment, the LAS1 may be reconstructed by referencing data packets 2918 that are marked with the epoch indicator 2869 e0 (or lower). Data associated with epoch indicators 2869 greater than e0 may be ignored (since such data corresponds to operations after creation of the snapshot LAS1).

Figure 28O:
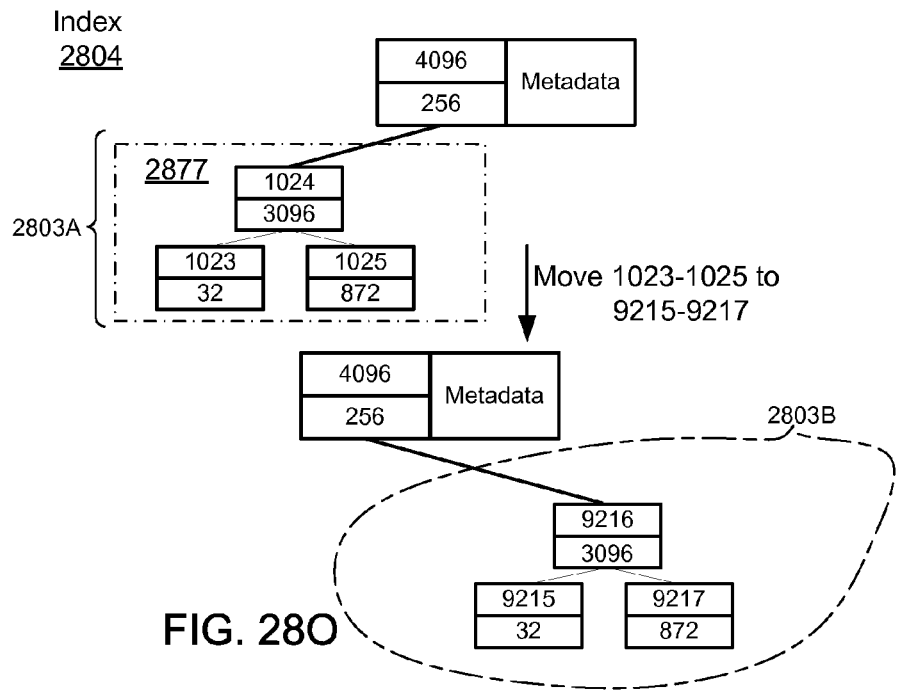

FIG. 28O depicts one example of a move operation. The index 2804 includes entries 2877 configured to bind LIDs 1023-1025 to respective data segments on the storage device. The entries 2877 are depicted separately to better illustrate details of the embodiment, however, the entries 2877 could be included in a single entry comprising a range of LIDs 1023-1025. The entries 2877 define a logical interface 2811A of the data stored at media storage locations 32, 3096, and 872. As disclosed above, data of the entries 2877 may be stored in a contextual format that associates the data with the corresponding LIDs 1023, 1024, and 1025.

The storage layer 130 may be configured to implement a move operation. The move operation may comprise modifying the logical interface to the data 2811B by, inter alia, replacing the association between the LIDs 1023, 1024, and 1025 and the data at the respective media storage locations 32, 3096, and 872, with a new logical interface 2811B for the data that includes a new set of LIDs (e.g., 9215, 9216, and 9217). The move operation may be performed in response to a request received via the interface 138 and/or as part of a higher-level storage operation (e.g., a request to rename a file, operations to balance and/or defragment the index 2804, or the like).

The move operation may be implemented in accordance with one or more of the cloning embodiments disclosed above. In some embodiments, the move operation may comprise associating the media addresses mapped to LIDs 1023, 1024, and 1025 with the destination LIDs 9215, 9216, and 9217, which may result in modifying the logical interface 2811B of the data in accordance with the move operation. The move operation may further comprise storing a persistent note 2866 on the storage device 120 to ensure that the move operation is persistent and crash safe. The data stored at media addresses 32, 872, and 3096 may be re-written in accordance with the updated logical interface 2811B in one or more background operations, as disclosed above.

Figure 28P:
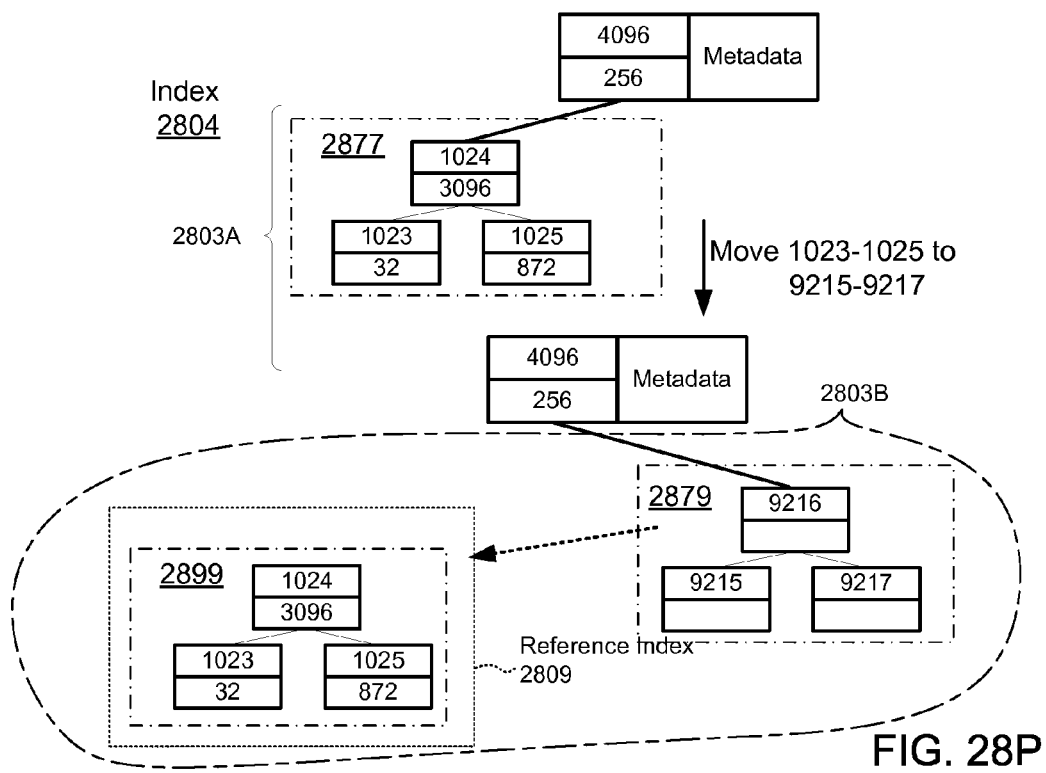

FIG. 28P depicts another embodiment of a move operation. As above, the move operation may comprise moving the data associated with LIDs 1023-1025 to LIDs 9215-9217. The move operation of FIG. 28P may utilize the reference entries as disclosed in FIGS. 28F-J. Accordingly, the move operation may comprise creating reference entries 2899 in a reference index 2809 to represent the logical move operation. The reference entries 2899 may comprise the pre-move LIDs 1023, 1024, and 1025, which may be associated with the addresses 32, 3096, and 872. The new logical interface 2811B of the data, therefore, may comprise the indirect LIDs entries 2879 and the corresponding reference entries 2899. The move operation may further comprise storing a persistent note 2866 on the storage device 120 to ensure that the move operation is persistent and crash safe.

As disclosed herein, the contextual format of the data on the media addresses 32, 3096, and 872 may be inconsistent with the updated logical interface 2811B; the contextual format of the data may associate the respective data segments with LIDs 1023, 1024, and 1025 as opposed to 9215, 9216, and 9217. The persistent note 2866 may comprise the updated logical interface for the data, so that the storage metadata 135 (e.g., index 2804) can be correctly reconstructed if necessary.

The storage layer 130 may provide access to the data in the inconsistent contextual format through the modified logical interface 2811B (LIDs 9215, 9216, and 9217). The data may be rewritten and/or relocated in a contextual format that is consistent with the modified logical interface 2811B subsequent to the move operation (outside of the path of the move operation and/or other storage operations). In some embodiments, the data at media addresses 32, 3096, and/or 872 may be rewritten by a groomer module 370 in one or more background grooming operations, as described above. Therefore, the move operation may complete (and/or return an acknowledgement) in response to updating the index 2804 is updated (and/or storing the persistent note 2866).

Figure 28Q:
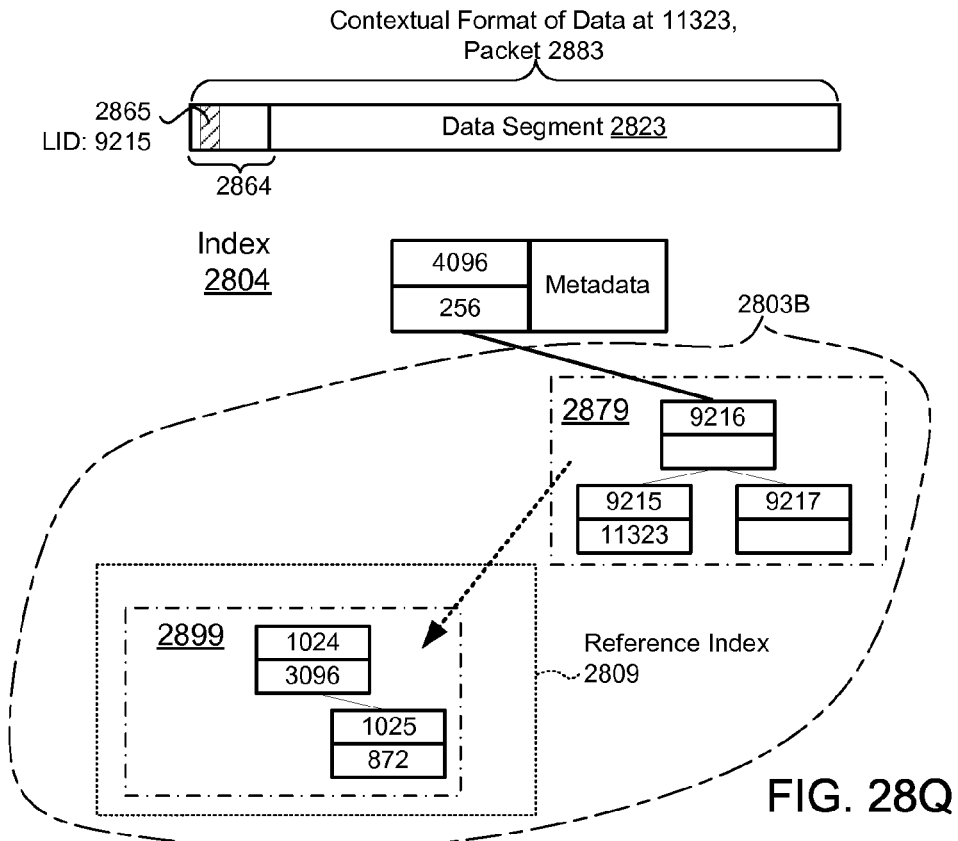

As illustrated in FIG. 28Q, the index 2804 may be updated in response to storing data in the consistent contextual format. The data segment 2823 at media storage location 32 may be relocated in a grooming operation, which may comprise storing the data in a contextual format 2883 that is consistent with the modified logical interface 2811B of the move operation (e.g., includes persistent metadata 2864 comprising the logical interface 2865 that associates the data segment 2823 with LID 9215). The index 2804 may be updated to reference the data in the updated contextual format, which may comprise modifying the entry for LID 9215, such that it no longer is linked to the reference entry for 1023. The entry for LID 9215 may revert from an indirect node to a standard index entry and the reference entry for LID 1023 may be removed.

Figure 28R:
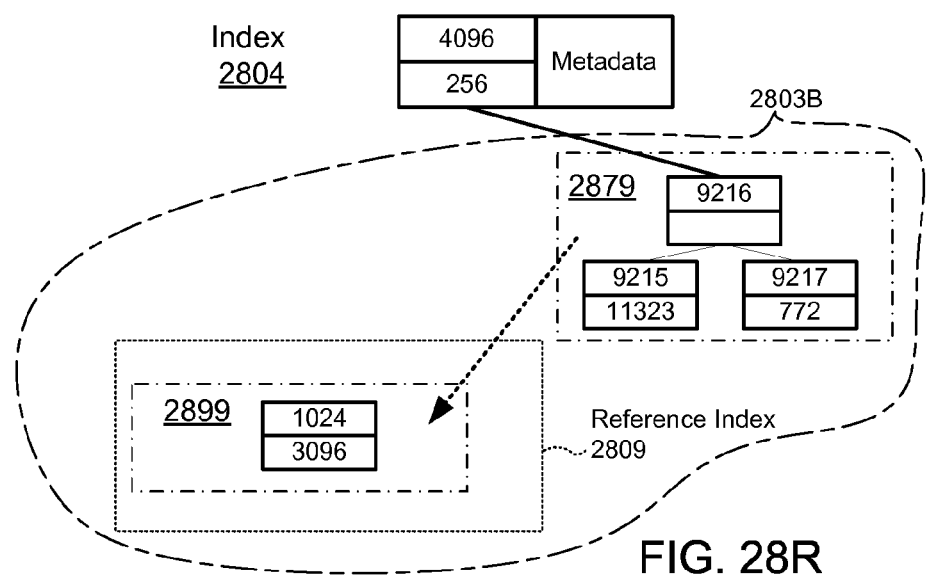

Referring to FIG. 28R, a storage client 116 may modify data associated with LID 9217, which may comprise storing the modified data, out-of-place (at media address 772). The data may be written in a contextual format that is consistent with the modified logical interface 2811B (e.g., associates the data with LID 9217). In response, the index 2804 may be updated to associate the entry 9217 with the media storage location of the modified data (e.g., media storage location 772), and to remove the reference entry for LID 1025, as disclosed above.

Figure 28S:
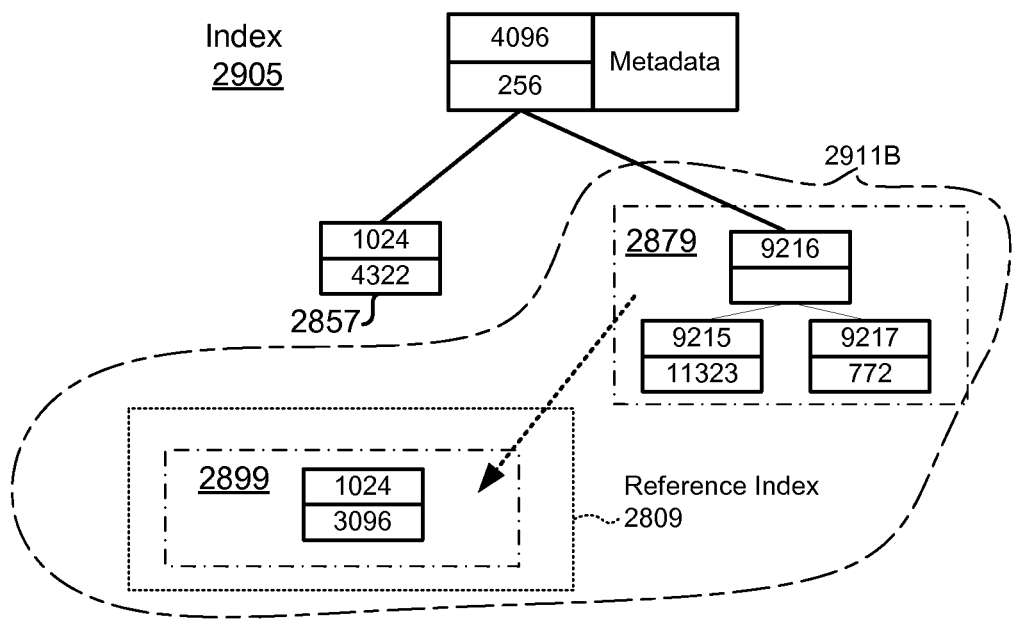

In some embodiments, the reference index 2809 may be maintained separately from the index 2804, such that the entries therein (e.g., entries 2899) cannot be directly referenced by storage clients 116. This segregation of the logical address space 136 may allow storage clients to operate more efficiently. For example, rather than stalling operations until data is rewritten and/or relocated in the updated contextual format, data operations may proceed while the data is rewritten in one or more processes outside of the path for servicing storage operations and/or requests. Referring to FIG. 28S, following the move operation disclosed above, a storage client 116 may store data in connection with the LID 1024. The reference entry 2899 corresponding to LID 1024 may be included in the reference index 2809, due to inter alia the data at 3096 not yet being rewritten in the updated contextual format. However, since the reference index 2809 is maintained separately from the index 2804, a name collision may not occur, and the storage operation may complete. The index 2804 may include a separate entry 2857 comprising the logical interface for the data stored at media storage location 4322, while continuing to provide access to the data formerly bound to 1024 through the reference index 2809 through the logical interface 2811B.

When the entries 2879 are no longer linked, any entries in the reference index 2809, due to, inter alia, rewriting, relocating, modifying, deleting, and/or overwriting, the data, the last of the reference entries 2899 may be removed, and the entries 2879 may no longer be linked to reference entries in the reference index 2809. In addition, the persistent note associated with the move operation may be invalidated and/or removed from the storage device 120, as disclosed above.

Referring back to FIG. 1, the interface 138 of the storage layer 130 may be configured to provide APIs and/or interfaces for performing the storage operations disclosed herein. The APIs and/or interfaces may be exposed through one or more of the block interface 131, an extended virtual storage interface 132, and/or the like. The block interface 131 may be extended to include additional APIs and/or functionality use of interface extensions such as fadvise parameters, I/O control parameters, and the like. The interface 138 may provide APIs to perform range clone operations, range move operations, range merge operations, apply attributes and/or metadata to ranges (e.g., freeze a range), manage range snapshots, and the like. As disclosed above, a range clone operation comprises creating a logical copy of a set of one or more sources LIDs. Range clone operations may be implemented using any of the embodiments disclosed herein including, but not limited to: the range clone embodiments depicted in FIGS. 28A-E (including the range merge embodiment of FIG. 28E), the reference entry embodiments of FIGS. 28F-J, and/or the two-layer mapping embodiments of FIGS. 28K-28J. As disclosed above in conjunction with FIGS. 28A-E, the disclosed embodiments may be further configured to implement range move operations.

The lower-level interfaces disclosed herein may be used to implement higher-level operations, such as deduplication, file-level snapshots, efficient file copy operations (logical file copies), address space management, mmap checkpoints, atomic writes, and the like. These higher-level operations may also be exposed through the interface 138 of the storage layer 130.

Figure 29A:
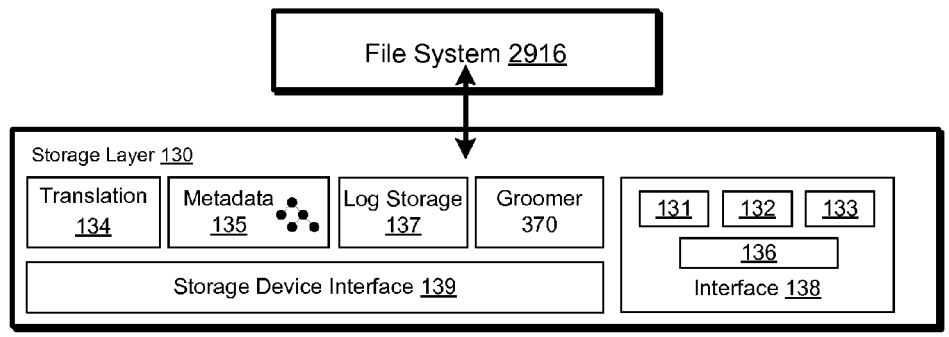
FIG. 29A depicts one embodiment of a storage layer configured to perform logical storage operations for a file system.
Figure 29A:
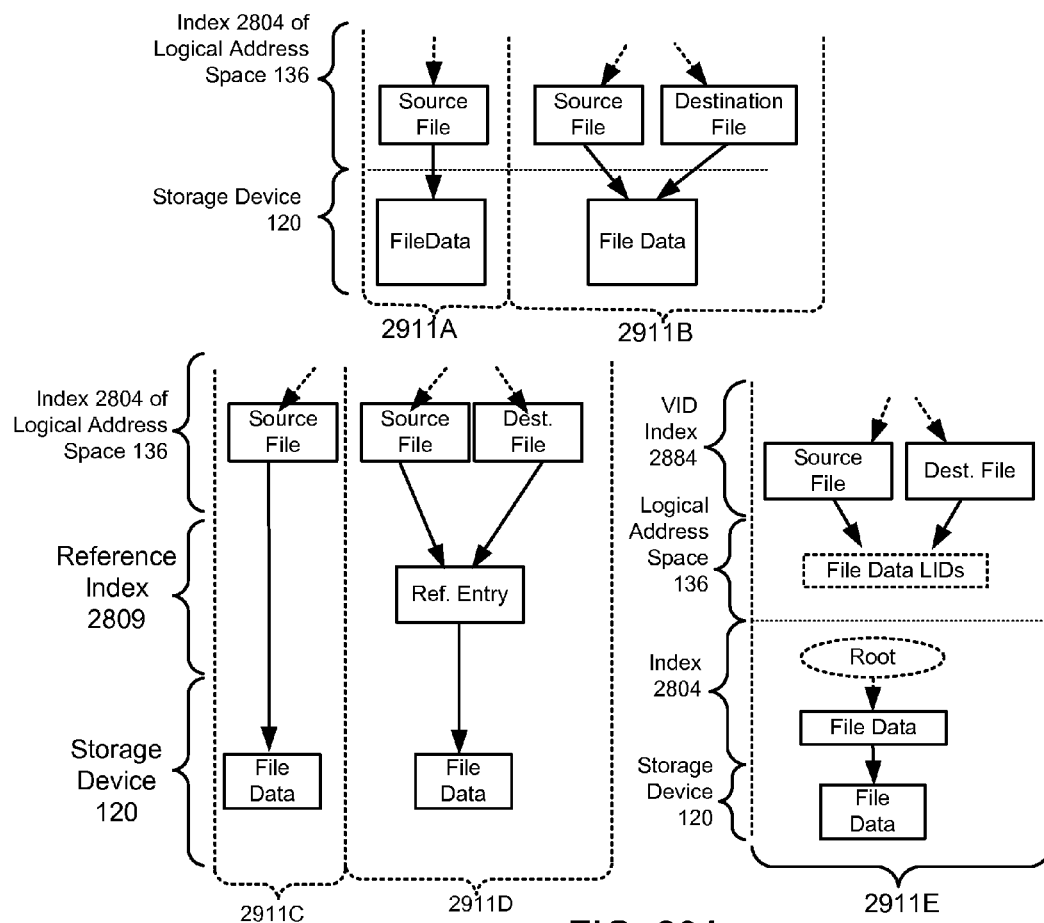

FIG. 29A depicts one embodiment of a storage layer 130 configured to provide storage services to a file system 2916. The file system 2916 may be configured to leverage functionality of the storage layer 130 to reduce complexity, overhead, and the like. For example, the file system 2916 may delegate crash recovery functionality to the storage layer 130, as disclosed above. The file system 2916 may be further configured to leverage the range clone functionality of the storage layer to implement efficient file-level snapshot and/or copy operations. The file system 2916 may be configured to implement such operations in response to a request (e.g., a copy command, a file snapshot ioctl, or the like). The file system 2916 may be configured to implement efficient file copy and/or file-level snapshot operations on a source file may by, inter alia: a) flushing dirty pages of the source file (if any), b) creating a new destination file to represent the copied file and/or file-level snapshot, and c) instructing the storage module to perform a range clone operation configured to clone the source file to the destination file.

FIG. 29A depicts various embodiments for implementing the range clone operation. In some embodiments, and as depicted in state 2911A, the storage layer 130 may be configured to maintain an logical address space 136 in which LIDs of the source file are mapped to source file data in the index 2804 (e.g., as disclosed in FIGS. 28A-E). The corresponding range clone operation depicted in state 2911B may comprise mapping the LIDs of the source file and the destination file to the source file data. The range clone operation may further comprise storing a persistent note 2866 on the storage device 120 to indicate that the file data is associated with both the source file LIDs and the destination file LIDs. The range clone operation may further comprise storing the file data in accordance with the uploaded contextual format, as disclosed herein.

In other embodiments, the clone operation may leverage a reference index 2809 (e.g., as disclosed in FIGS. 28F-J). Before the range clone operation, in state 2911C, the LIDs of the source file may be directly mapped to the corresponding file data in the index 2804. Creating the range clone in state 2911D may comprise creating a reference entry in the reference index 2809 and associating the source file LIDs and destination file LIDs with the reference entry. The range clone operation may further comprise storing a persistent note 2866 on the storage device and/or updating the contextual format of the file data, as disclosed herein.

The storage layer 130 may implement the clone operation using a two-layer mapping embodiment (e.g., as disclosed in FIGS. 28K-L). Initially, the source file may correspond to virtual identifiers (VIDs) in a virtual address space (VID index 2884), which may be mapped to file data LIDs in the logical address space 136 (in the index 2804). Performing the range clone operation may comprise associating the destination file VIDs with the LIDs of the intermediate mapping layer. The range clone operation may further comprise storing a persistent note on the storage device 120 indicating that the destination VIDs are associated with the file data LIDs. Since the file data is already bound to the intermediate file data LIDs, the contextual format of the file data may not need to be updated.

The file system 2916 may be further configured to leverage the storage layer 130 to checkpoint mmap operations. As used herein, an "mmap" operation refers to an operation in which the contents of files are accessed as pages of memory through standard load and store operations rather than the standard read/write interfaces provided by the file system 2916. An "msync" operation refers to an operation to flush the dirty pages of the file (if any) to the storage device 120. The use of mmap operations may make file checkpointing difficult. File operations are performed in memory and an msync is issued when the state has to be saved. However, the state of the file after msync represents the current in-memory state and the last saved state is lost. If the file system 2916 were to crash during an msync, the file could be left in an inconsistent state.

Figure 29B:
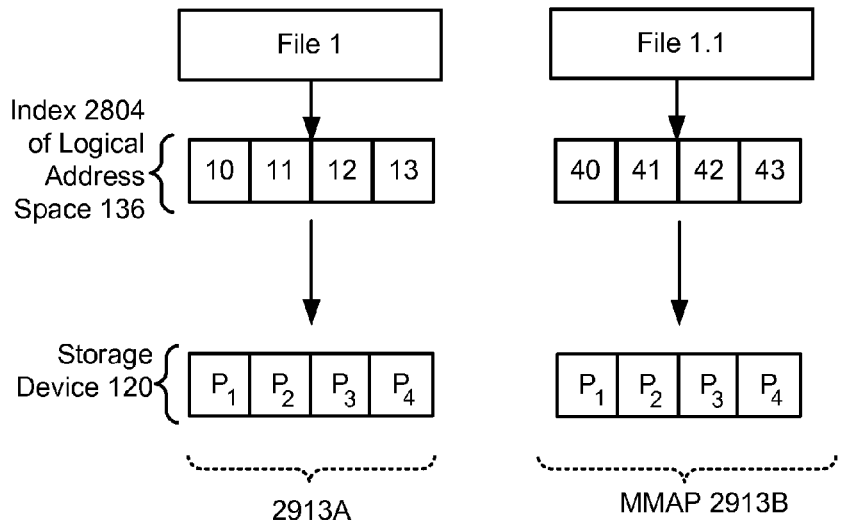
FIG. 29B depicts one embodiment of a storage layer configured to implement mmap checkpoints.
Figure 29B:
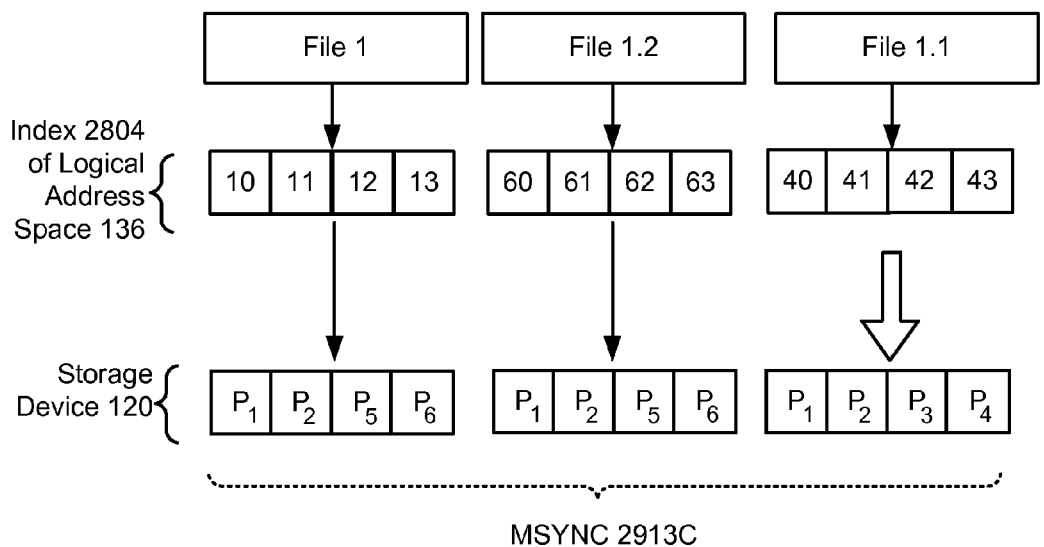

In some embodiments, the file system 2916 is configured to checkpoint the state of an mmap-ed file during calls with msync. Checkpointing the file may comprise creating a file-level snapshot (and/or range clone), as disclosed above. The file-level snapshot may be configured to save the state of the file before the changes are applied. When the msync is issued, another clone may be created to reflect the changes applied in the msync operation. As depicted in FIG. 29B, in state 2913 (prior to the mmap operation), file 1 may be associated with LIDs 10-13 and corresponding media addresses P1-P4. In response to the mmap operation, the file system 2916 may perform a range clone operation through the interface 138 of the storage layer 130, which may comprise creating a cloned file 1.1. The cloned file 1.1 may be associated with a different set of LIDs 40-43 that reference the same data (same media addresses P1-P4). In other embodiments, the files may be cloned using a reference entry embodiment and/or two-layer mapping embodiment, as disclosed above.

In response to an msync call, the file system 2916 may perform another range clone operation (through the interface 138). As illustrated in state 2913C, the range clone operation associated with the msync operation may comprise updating the file 1 with the contents of one or more dirty pages (media addresses P5 and P6) and cloning the updated file 1 as file 1.2. The file 1.1 may reflect the state of the file before the msync operation. Accordingly, in the event of a failure, the file system 2916 may be capable of reconstructing the previous state of the file 1.

Figure 29C:
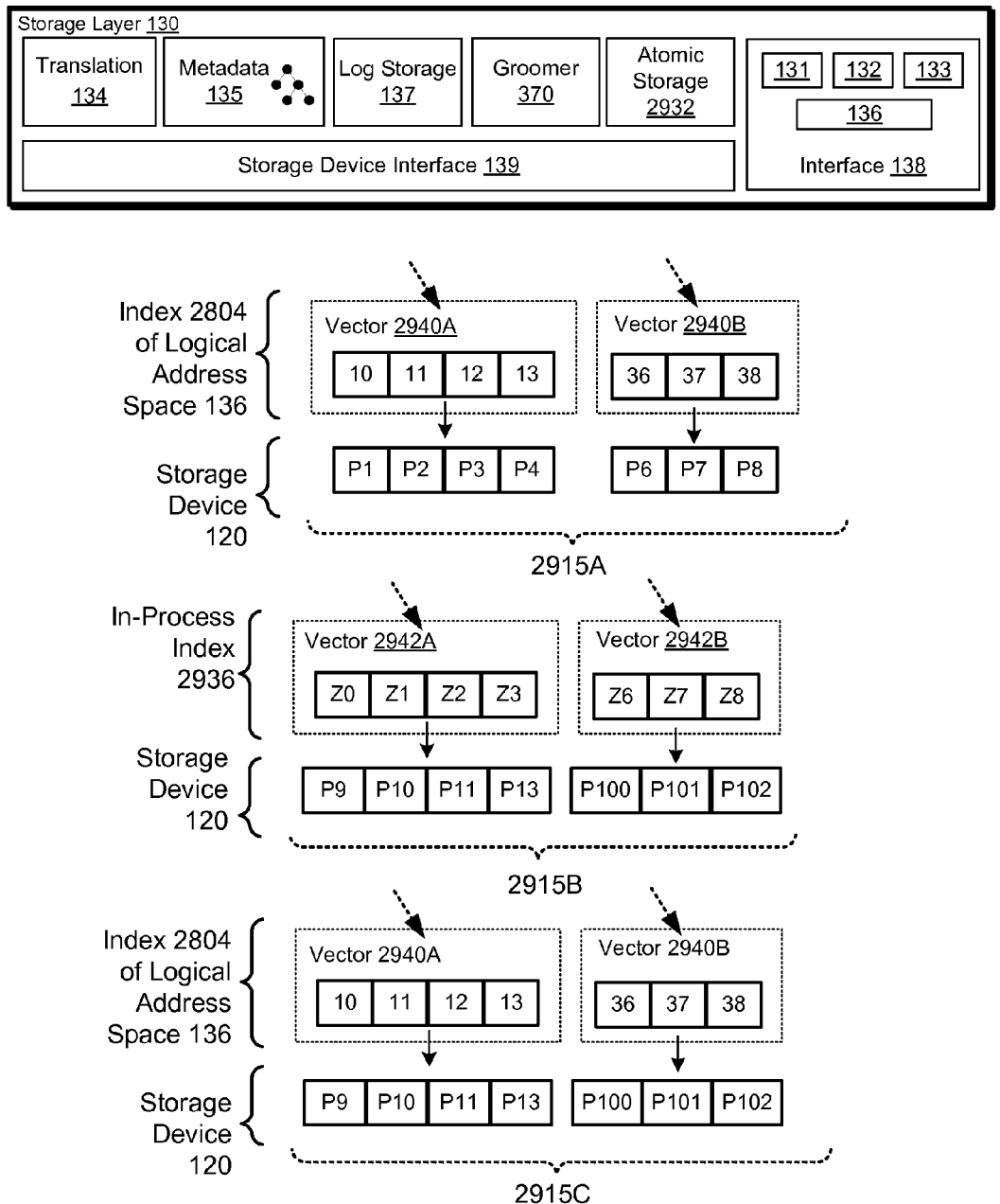
FIG. 29C depicts one embodiment of storage layer configured to implement atomic storage operations.

The storage layer 130 may be further configured to implement efficient atomic storage operations. Referring to FIG. 29C, in some embodiments, the storage layer 130 comprises an atomic storage module 2932. As used herein, an atomic storage operation refers to a storage operation that is either fully completed, or is rolled back as a whole. Accordingly, atomic storage operations may not remain in a "partially completed" state. Implementing atomic storage operations, and particularly, atomic storage operations comprising multiple steps and/or pertaining to multiple different LID ranges or vectors, may impose high overhead costs. For example, some database systems implement atomic storage operations using multiple sets of redundant write operations. The atomic storage module 2932 may leverage the range clone, range move, and/or other operations disclosed herein to increase the efficiency of atomic storage operations.

In some embodiments, the interface 138 provides APIs and/or interfaces for performing vectored atomic storage operations. A vector may be defined as a data structure, such as:

```
struct iovect {
    uint64 iov_base;   // Base address of memory region for input or output
    uint32 iov_len;    // Size of the memory referenced by iov_base
    uint64 dest_lid;   // Destination logical identifier
}
```

The iov_base parameter may reference a memory or buffer location comprising data of the vector, iov_len may refer to a length or size of the data buffer, and dest_lid may refer to the destination logical identifier(s) for the vector (e.g., base logical identifier, the length of the logical identifier range may be implied and/or derived from the input buffer iov_len).

A vector storage request to write data to one or more vectors may, therefore, be defined as follows:

```
vector_write (
    int fileids,
    const struct iovect *iov,
    uint32 iov_cnt,
    uint32 flag)
```

The vector write operation above may be configured to gather data from each of the vector data structures referenced by the *iov pointer and/or specified by the vector count parameter (iov_cnt), and write the data to the destination logical identifier(s) specified in the respective iovect structures (e.g., dest_lid). The flag parameter may specify whether the vector write operation should be implemented as an atomic vector operation.

As illustrated above, a vector storage request may comprise performing the same operation on each of a plurality of vectors (e.g., implicitly perform a write operation pertaining to one or more different vectors). In some embodiments, a vector storage request may specify different I/O operations for each constituent vector. Accordingly, each iovect data structure may comprise a respective operation indicator. In some embodiments, the iovect structure may be extended as follows:

```
struct iovect {
    uint64 iov_base;   // Base address of memory region for input or output
    uint32 iov_len;    // Size of the memory referenced by iov_base
    uint32 iov_flag;   // Vector operation flag
    uint64 dest_lid;   // Destination logical identifier
}
```

The iov_flag parameter may specify the storage operation to perform on the vector. The iov_flag may specify any suitable storage operation, which include, but is not limited to, a write, a read, an atomic write, a trim or discard request, a delete request, a format request, a patterned write request (e.g., request to write a specified pattern), a write zero request, or an atomic write operation with verification request, allocation request, or the like. The vector storage request interface described above, may be extended to accept vector structures:

```
vector_request(
    int fileids,
    const struct iovect *iov,
    uint32 iov_cnt,
    uint32 flag)
```

The flag parameter may specify whether the vector operations of the vector_request are to be performed atomically.

The atomic storage module 136 may be configured to redirect storage operations pertaining to an atomic storage operation to a pre-determined range (an "in-process" range). The in-process range may be a designated portion of the logical address space 136 that is not accessible to the storage clients 116. Alternatively, the in-process range may be implemented in a separate address namespace. After the atomic storage operation has been completed within the in-process range (e.g., all of the constituent I/O vectors have been processed), the atomic storage module 2932 may perform an atomic range move operation to move the data from the in-process range to the destination range(s). As disclosed above, the range move operation may comprise writing a single persistent note 2866 to the storage device 120.

A storage client 116 may issue an atomic write request pertaining to vectors 2940A and 2940B. As illustrated in FIG. 29C, before the atomic storage operation is performed (at state 2915A), the LIDs 10-13 of vector 2940A may be bound to media addresses P1-P4 and the LIDs 36-38 of vector 2940B may be bound to media addresses P6-8. As depicted in state 2915B, the atomic storage module 2932 may be configured to redirect the atomic storage operations to an in-process index 2836. As disclosed above, the in-process index 2836 may comprise a designated region of the logical address space 136 and/or may be implemented within a separate index and/or address namespace. The vector 2942A within the in-processes index 2836 may correspond to the LIDs 10-13 of vector 2940A and the in-process vector 2942B may correspond to the LIDs 36-38 of vector 2940B. The vectors 2942A and 2942B may comprise metadata configured to reference the corresponding vectors 2940A and 2940B in the index 2804. Implementing the atomic storage operations in state 2915B may comprise appending data to the storage device 120 in association with the in-process LIDs Z0-Z3 and/or Z6-Z6 of the in-process vectors 2942A and 2942B. Other storage operations may be performed concurrently with and/or interleaved within the atomic vector operations within the in-process index 2936.

If the atomic storage operation fails before completion, the original data of vectors 2940A and 2940B may be unaffected. During reconstruction, the data associated with the in-process entries (the data at P9-P13 and/or P100-P102) may identified as part of an incomplete atomic storage operation (due to the association between the data and identifiers within the in-process index 2836), and the data may be removed.

As illustrated in FIG. 29C, in state 2915B, the atomic storage operation(s) may be completed within the in-process index 2936. Completion of the atomic storage request may comprise performing a range move operation to move the data written to the in-process vectors 2942A and 2942B into the logical address space 136. The range move operation may comprise performing an atomic storage operation to store a persistent note on the storage device to bind the media address P9-P13 to LIDs 10-13 and P100-102 to LIDs 36-38. The range move operation may be implemented in other ways including, but not limited to: the reference entry embodiments of FIGS. 28F-J and/or the two-layer mapping embodiments of FIGS. 28K-L.

Figure 30:
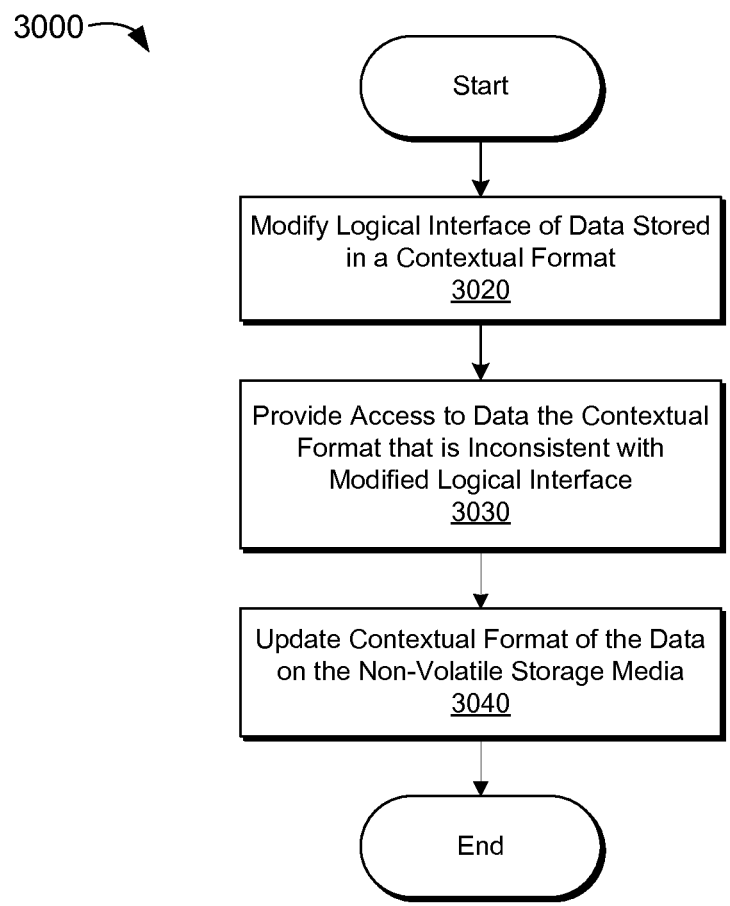
FIG. 30 is a flow diagram of one embodiment of a method for managing a logical interface of data storage in a contextual format on a non-volatile storage media.

FIG. 30 is a flow diagram of one embodiment of a method 3000 for managing a logical interface of data stored in a contextual format on a non-volatile storage medium.

Step 3020 may comprise modifying a logical interface of data stored in a contextual format on a non-volatile storage media. The logical interface may be modified at step 3020 in response to performing an operation on the data, which may include, but is not limited to: a clone operation, a deduplication operation, a move operation, or the like. The request may originate from a storage client 116, the storage layer 130 (e.g., deduplication module 374), or the like.

Modifying the logical interface may comprise modifying the LID(s) associated with the data, which may include, but is not limited to: referencing the data using one or more additional LIDs (e.g., clone, deduplication, etc.), changing the LID(s) associated with the data (e.g., a move), or the like. The modified logical interface may be inconsistent with the contextual format of the data on the non-volatile storage media 122, as described above.

Step 3020 may further comprise storing a persistent note on the non-volatile storage media 122 that identifies the modification to the logical interface. The persistent note may be used to make the logical operation persistent and crash safe, such that the modified logical interface (e.g., storage metadata 135) of the data may be reconstructed from the contents of the non-volatile storage media 122 (if necessary). Step 3020 may further comprise acknowledging that the logical interface has been modified (e.g., returning from an API call, returning an explicit acknowledgement, or the like). The acknowledgement occur (and access through the modified logical interface at step 3030) before the contextual format of the data is updated on the non-volatile storage media 122. Accordingly, the logical operation may not wait until the data is rewritten and/or relocated; as discussed below, updating contextual format of the data may be deferred and/or implemented in a processes that is outside of the "critical path" of the method 3000 and/or the path for servicing other storage operations and/or requests.

Step 3030 may comprise providing access to the data in the inconsistent contextual format through the modified logical interface of step 3020. As described above, updating the contextual format of the data to be consistent with the modified contextual interface may comprise rewriting and/or relocating the data on the non-volatile storage media, which may impose additional latency on the operation of step 3020 and/or other storage operations pertaining to the modified logical interface. Therefore, the storage layer 130 may be configured to provide access to the data in the inconsistent contextual format while (or before) the contextual format of the data is updated. Providing access to the data at step 3030 may comprise referencing and/or linking to one or more reference entries corresponding to the data (via one or more indirect entries), as described above.

Step 3040 may comprise updating the contextual format of the data on the non-volatile storage media 122 to be consistent with the modified logical interface of step 3020. Step 3040 may comprise rewriting and/or relocating the data to another media storage location on the non-volatile storage media 122 and/or on another non-volatile storage device 120A-N. As described above, step 3040 may be implemented using a process that is outside of the critical path of step 3020 and/or other storage requests performed by the storage layer 130; step 3040 may be implemented by another, autonomous module, such as groomer module 370, deduplication module 374, or the like. Accordingly, the contextual format of the data may be updated independent of servicing other storage operations and/or requests. As such, step 3040 may comprise deferring an immediate update of the contextual format of the data, and updating the contextual format of the data in one or more "background" processes, such as a groomer process. Alternatively, or in addition, updating the contextual format of the data may occur in response to (e.g., along with) other storage operations. For example, a subsequent request to modify the data may cause the data to be rewritten out-of-place and in the updated contextual format (e.g., as described above in connection with FIG. 29C).

Step 3040 may further comprise updating storage metadata 135 as the contextual format of the data is updated. As data is rewritten and/or relocated in the updated contextual format, the storage layer 130 may update the storage metadata 135 (e.g., index) accordingly. The updates may comprise removing one or more links to reference entries in a reference index and/or replacing indirect entries with local entries, as described above. Step 3040 may further comprise invalidating and/or removing a persistent note from the non-volatile storage media 122 in response to updating the contextual format of the data and/or persisting the storage metadata 135, as described above.

Figure 31:
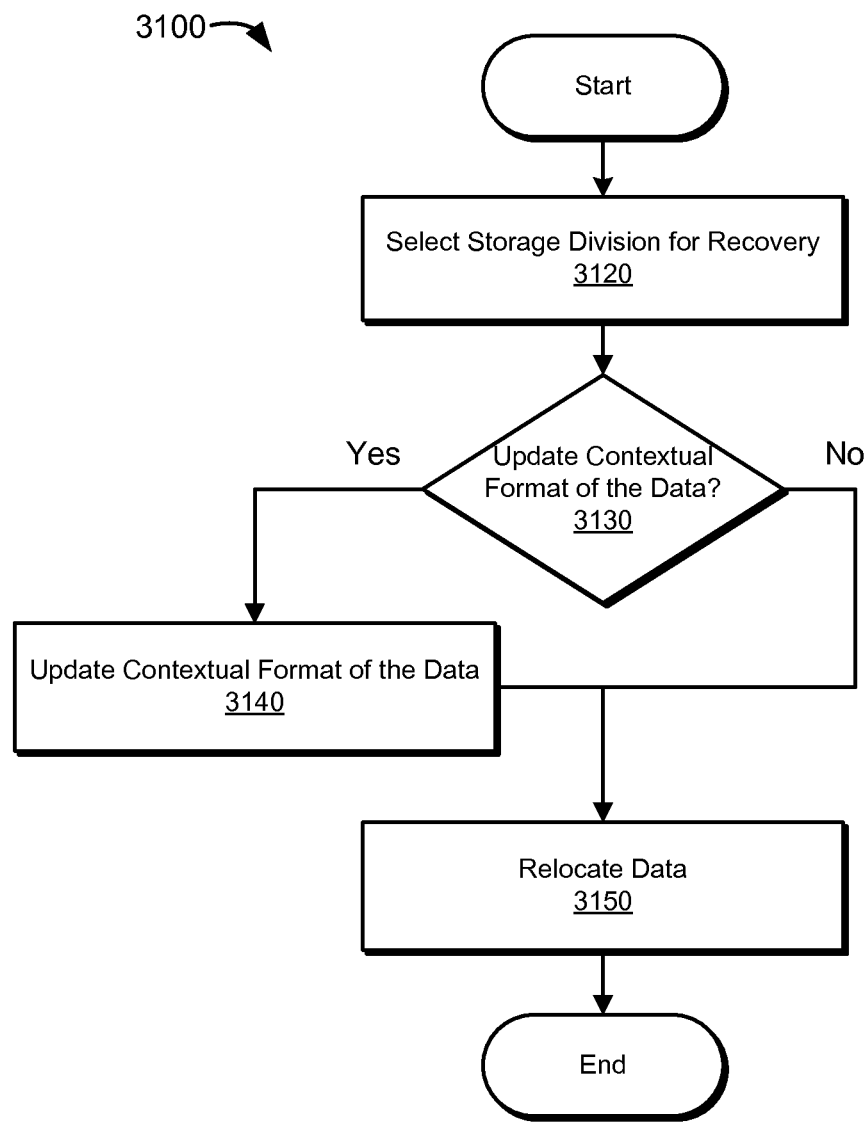
FIG. 31 is a flow diagram of one embodiment of a method for managing a logical interface of contextual data.

FIG. 31 is a flow diagram of another embodiment of a method 3100 for managing a logical interface of data stored in a contextual format on a non-volatile storage media. The method 3100 may be implemented by one or more modules and/or components of the storage controller 140, such as the groomer module 370, disclosed herein.

Step 3120 comprises selecting a storage division for recovery, such as an erase block or logical erase block. As described above, the selection of step 3120 may be based upon a number of different factors, such as a lack of available storage capacity, detecting a percentage of data marked as invalid within a particular logical erase block reaching a threshold, a consolidation of valid data, an error detection rate reaching a threshold, improving data distribution, data refresh, or the like. Alternatively, or in addition, the selection criteria of step 3120 may include whether the storage division comprises data in a contextual format that is inconsistent with a corresponding logical interface thereof, as described above.

As discussed above, recovering (or reclaiming) a storage division may comprise erasing the storage division and relocating valid data thereon (if any) to other storage locations on the non-volatile storage media. Step 3130 may comprise determining whether the contextual format of data to be relocated in a grooming operation should be updated (e.g., is inconsistent with the logical interface of the data). Step 3130 may comprise accessing storage metadata 135, such as the indexes described above, to determine whether the persistent metadata (e.g., logical interface metadata) of the data is consistent with the storage metadata 135 of the data. If the persistent metadata is not consistent with the storage metadata 135 (e.g., associates the data with different LIDs, as described above), the flow continues at step 3140; otherwise, the flow continues at step 3150.

Step 3140 may comprise updating the contextual format of the data to be consistent with the logical interface of the data. Step 3140 may comprise modifying the logical interface metadata to reference a different set of LIDs (and/or reference entries), as described above.

Step 3150 comprises relocating the data to a different storage location in a log format that, as described above, preserves an ordered sequence of storage operations performed on the non-volatile storage media. Accordingly, the relocated data (in the updated contextual format) may be identified as the valid and up-to-date version of the data when reconstructing the storage metadata 135 (if necessary). Step 3150 may further comprise updating the storage metadata 135 to bind the logical interface of the data to the new media storage locations of the data, remove indirect and/or reference entries to the data in the inconsistent contextual format, and so on, as disclosed herein.

Figure 32:
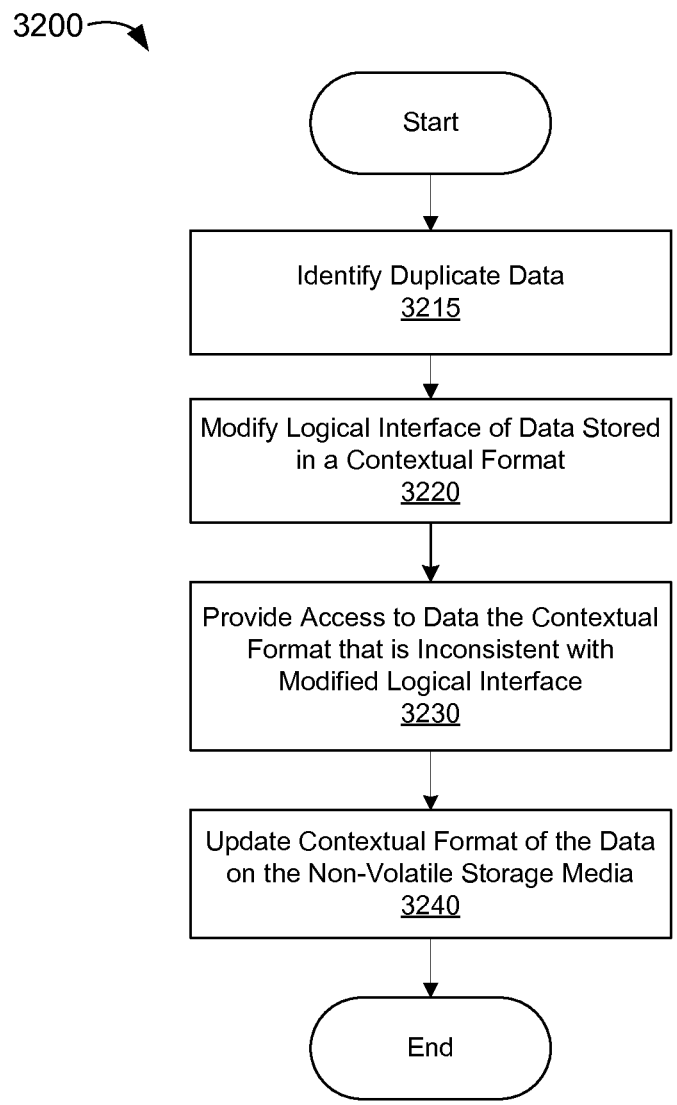
FIG. 32 is a flow diagram of another embodiment of a method managing a logical interface of contextual data.

FIG. 32 is a flow diagram of another embodiment of a method 3200 for managing logical interfaces of data stored in a contextual format. Step 3215 may comprise identifying duplicate data on one or more storage devices 120. Step 3215 may be performed by a deduplication module 374 operating within the storage layer 130. Alternatively, step 3220 may be performed by the storage layer 130 as storage operations are performed.

Step 3215 may comprise determining and/or verifying that the non-volatile storage media 122 comprises duplicate data (or already comprises data of a write and/or modify request). Accordingly, step 3220 may occur within the path of a storage operation (e.g., as or before duplicate data is written to the non-volatile storage media 122) and/or may occur outside of the path of servicing storage operations (e.g., identify duplicate data already stored on the non-volatile storage media 122). Step 3220 may comprise generating and/or maintaining data signatures in storage metadata 135, and using the signature to identify duplicate data.

In response to identifying the duplicate data at step 3215, the storage layer 130 (or other module, such as the deduplication module 374) may modify a logical interface of a copy of the data, such that a single copy may be referenced by two (or more) sets of LIDs. The modification to the logical interface at step 3220 may comprise updating storage metadata 135 and/or storing a persistent note on the non-volatile storage media 135, as described above. Step 3220 may further comprise invalidating and/or removing other copies of the data on the non-volatile storage media, as described above.

The contextual format of the data on the non-volatile storage media 122 may be inconsistent with the modified logical interface. Therefore, steps 3230 and 3240 may comprise providing access to the data in the inconsistent contextual format through the modified logical interface and updating the contextual format of the data on the non-volatile storage media 122, as described above.

Referring back to the cloning embodiments depicted in FIGS. 28A and 28B, in other examples, clone operations may be used to perform atomic operations, such as multi-step writes or transactions. An atomic operation to modify a data in a particular logical address range may comprise creating a clone of the logical address range, implementing storage operations within the clone, and, when the operations complete, "folding" the clone back into the logical address space 136 (e.g., overlaying the original logical address range with the clone). As used herein, "folding" a logical address range refers to combining two or more address ranges together (e.g., folding a logical address range with a clone thereof). The folding may occur according to one of a plurality of operational modes, which may include, but are not limited to: an "overwrite" mode, in which the contents of one of one logical address range "overwrites" the contents of another logical address range, a "merge" mode, in which the contents of the logical address ranges are merged together (e.g., in a logical OR operation), or the like.

Figure 33A:
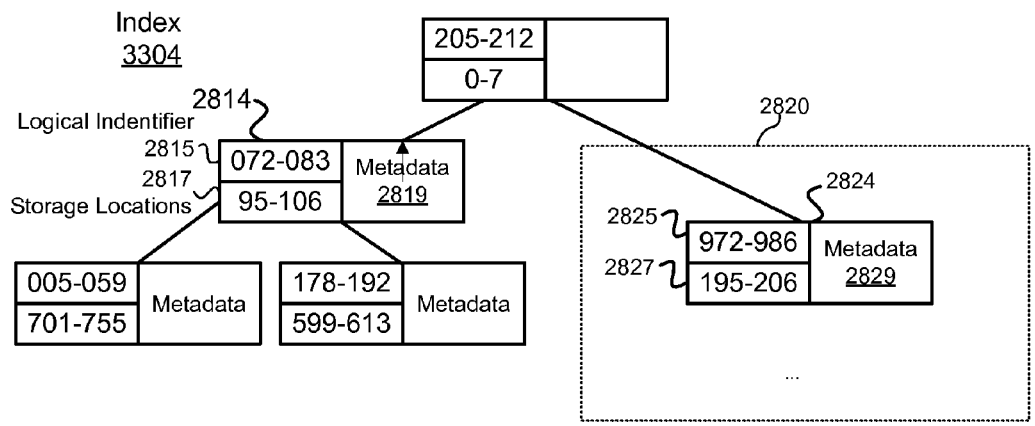
FIGS. 33A-B depict exemplary clone operations.

FIG. 33A depicts one example of a clone between entries 2814 and 2820 in the index 3304. Following the clone operation, a storage client modified the data within the clone 972-983, with the updated data being stored at media storage locations 195-206. Folding the clone 2824 back into the entry 2814 in an "overwrite" mode results in the entry 2814 being bound to the media storage locations of the clone 2824 (195-206). Portions of the clone 2824 that were not modified (if any) may remain unchanged in the entry 2814.

In another example, in which the LID range of the clone was modified (e.g., data was appended or deleted from the clone), the LID 2814 would be modified in a corresponding way. Accordingly, a folding operation may comprise allocation of additional LIDs in the logical address space 136. Therefore, in some embodiments, clones may be tied to one another (e.g., using entry metadata 2819 and/or 2829). An extension to a clone, such as entry 2824, may be predicated on the logical address range being available to the original entry 2814. The link between the entries may be predicated on the "mode" of the clone as described above. For example, if the entries are not to be "folded" at a later time, the clones may not be linked.

Figure 33B:
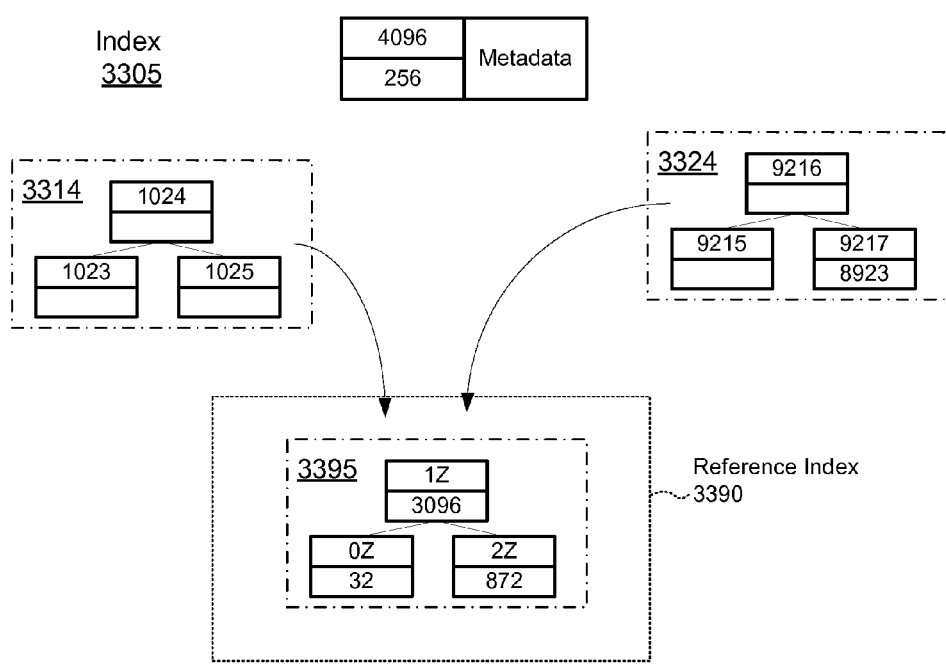

FIG. 33B depicts another example of a folding operation using reference and indirect entries. The clones 3314 and 3324 are linked to reference entries 3395 in a reference index 3390 associated with data of the clone. A storage client 116 may modify one clone 3324, resulting in modified data being bound to the clone 3324 (e.g., entry 9217 is bound to media storage location 8923). Accordingly, the clone 3324 has diverged from the clone 3314. When folding the clone 3324 into the clone 3314, the modified data of 9217 may overwrite the original data (e.g., the data at media storage location 872).

As described above, clones may be "tied" together, according to an operational mode of the clones. For example, changes to a clone may be automatically mirrored in the other clone. This mirroring may be uni-directional, bi-direction, or the like. The nature of the tie between clones may be maintained in storage metadata (e.g., metadata entries 2819 and 2829 and/or in reference entries 3395). The storage layer 130 may access the metadata entries 2819 and/or 2829 when storage operations are performed within the LID ranges 2815 and/or 2825 to determine what, if any, synchronization operations are to be performed.

Figure 34:
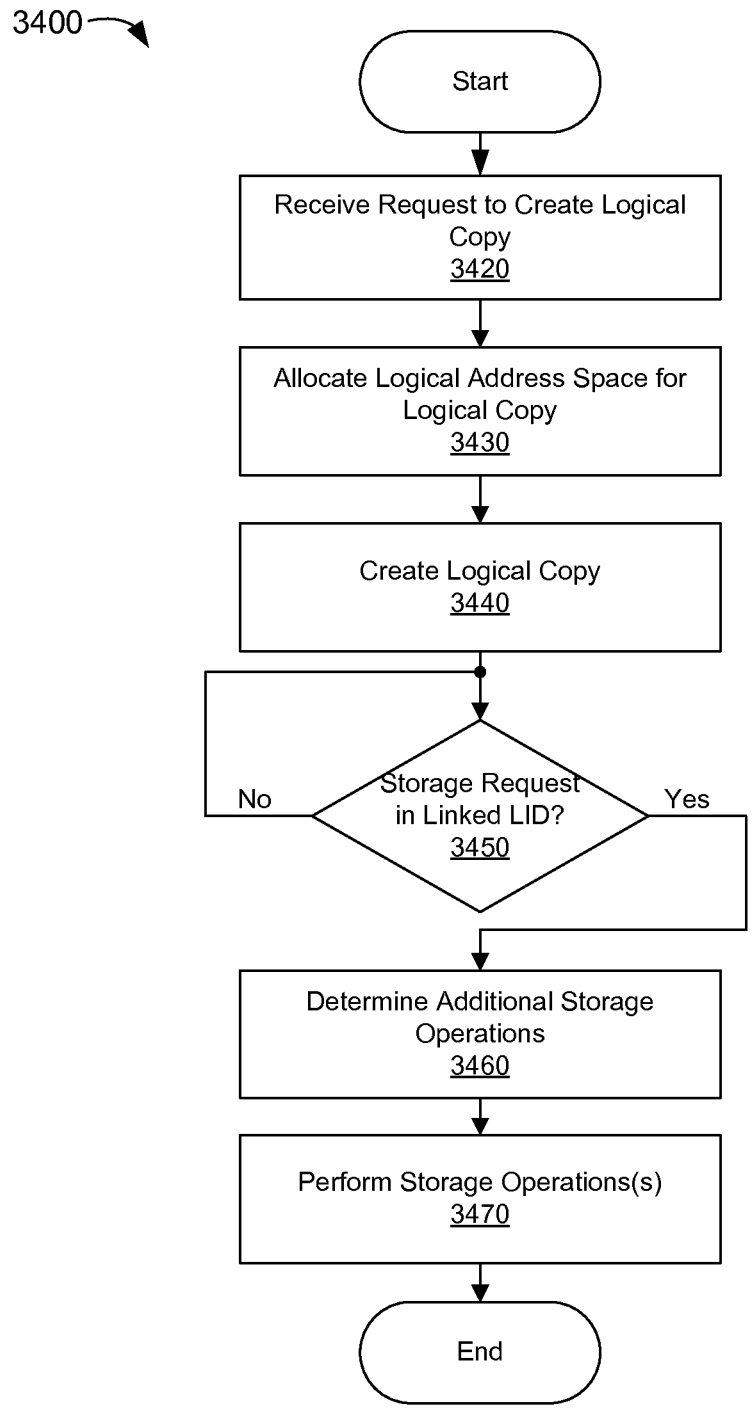
FIG. 34 is a flow diagram of one embodiment of a method for managing a clone of contextual data.

In some embodiments, data of a clone may be designated as ephemeral, as described above. Accordingly, if upon reboot (or another condition), the ephemeral designation is not removed, the clone may be deleted (e.g., invalidated as described above). FIG. 34 is a flow diagram of another embodiment of a method for cloning ranges of a logical address space 136.

Step 3420 may comprise receiving a request to create a clone. The request may be received from a storage client 116 through an interface 138 and/or may be part of a higher-level API provided by the storage layer 130. The request may include an "operational mode" of the clone, which may include, but is not limited to: how the clones are to be synchronized, if at all, how folding is to occur, whether the copy is to be designated as ephemeral, and so on.

Step 3430 may comprise allowing LIDs in the logical address space 136 to service the request. The allocation of step 3430 may further comprise reserving physical storage space to accommodate changes to the clone. The reservation of physical storage space may be predicated on the operational mode of the clone. For instance, if all changes are to be synchronized between the clone and the original address range, a small portion (if any) physical storage space may be reserved. Step 3430 may further comprise allocating the clone within a designated portion or segment of the logical address space 136 (e.g., a range dedicated for use with clones).

Step 3440 may comprise updating the logical interface of data of the clone, as described above. Step 3440 may further comprise storing a persistent note on the non-volatile storage media to make the clone persistent and crash safe, as described above.

Step 3450 may comprise receiving a storage request and determining if a storage request pertains to the original LID range and/or the clone of the LID range. If so, the flow continues to step 3460, otherwise, the flow remains on step 3450.

Step 3460 may comprise determining what (if any) operations are to be taken on the other associated LID ranges (e.g., synchronize changes, allocate logical and/or physical storage resources, or the like). The determination of step 3460 may comprise accessing storage metadata describing the operational mode of the clone and/or the nature of the "tie" (if any) between the original LIDs and the clone thereof.

Step 3470 may comprise performing the operations (if any) determined at step 3460 along with the requested storage operation. If one or more of the synchronization operations cannot be performed (e.g., additional logical address space 136 cannot be allocated), the underlying storage operation may fail.

Figure 35:
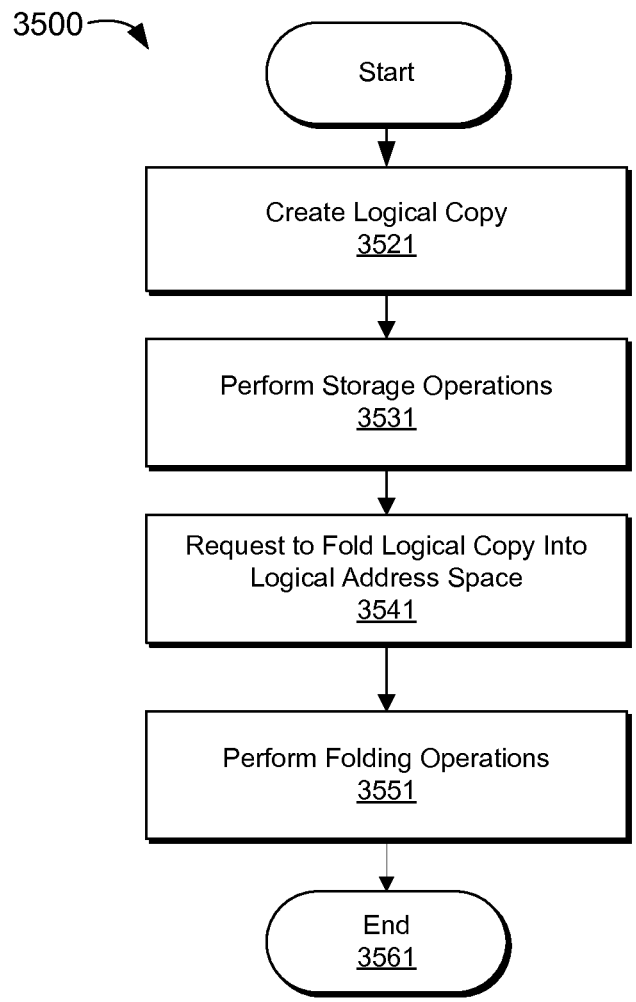
FIG. 35 is a flow diagram of one embodiment of a method for folding a clone of contextual data.

FIG. 35 is a flow diagram of another embodiment of a method for managing clones of contextual data. Step 3521 may comprise creating a clone of a logical address range as disclosed herein. At step 3531, one or more storage operations within the original logical address range and/or the clone thereof are performed along with additional, synchronization operations (if any), as described above.

At step 3541, a request to fold the clone is received. The request may specify an operational mode of the fold and/or the operational mode may have been specified when the clone was created at step 3521.

Step 3551 comprises folding the clone back into the logical address space 136 of the original logical range. Step 3551 may comprise overwriting the contents of the original logical address range with the contents of the clone, merging the logical address ranges (e.g., in an OR operation), or the like. In some embodiments, the merging comprises deleting (e.g., invalidating) the clone, which may comprise removing entries of the clone from the storage metadata index, removing shared references to media storage locations from a reference count datastructure, and the like. Step 3551 may further comprise modifying a logical interface of the merged data, as described above. The modified logical interface may change the LIDs used to reference the data. The modified logical interface may be inconsistent with the contextual format of the data on the non-volatile storage media 122. Therefore, step 3551 may further comprise providing access to the data in the inconsistent contextual format and/or updating the contextual format of the data, as described above.

As disclosed above, in some embodiments, the storage layer 130 may be configured to segment the logical address logical address space 136 into a plurality of contiguous LID ranges. As illustrated in FIG. 19A, a LID (e.g., address) 1900 is segmented into a first portion 1952 and a second portion 1954. In some embodiments, the first portion 1952 comprises "high-order" bits of the LID 1900, and the second portion comprises "low-order" bits. The first portion 1952 may serve as a reference or identifier, and the second portion 1952 may represent a range (e.g., block size) offset within a contiguous range of LIDs. In this manner, the storage layer 130 may logically segment or divide the sparse logical address space into segments of contiguous LIDs that can be efficiently allocated as a group. In the FIG. 19A embodiment, segmenting LIDs into 32 high order and 32 low order bits may result in a logical address space 136 that is capable of representing $2^{32}-1$ unique LID allocation ranges (e.g., using the first portion of the LIDs 1952), each of which have a maximum size (or offset) of $2^{32}$ virtual storage locations (e.g., 2 TB for a virtual storage location size of 512 bytes). In other embodiments, different segmentation schemes may be used. In embodiments require a large number of small storage entities (e.g., database applications, messaging applications, or the like), the first portion 1952 may comprise a larger proportion of the LID address range and the second portion 1954 (e.g., first portion 1952 comprising 42 bits providing $2^{42}-1$ unique identifiers). Alternatively, where larger storage entitles are used, the ratio between the size of the first and second address portions 1952 and 1954 may be reversed.

The LID segmentation scheme disclosed herein may be used to define an allocation granularity of the logical address space 136. In the FIG. 19A embodiment, the allocation granularity is fixed according to the segmentation of the logical addresses 1900; each allocation operation in the logical address space 136 comprises allocating X LIDs where X is determined according to the size of the second portion 1954 of the logical addresses 1900. The allocation granularity may also determine the number of unique storage entities that can be represented within the logical address space: in the FIG. 19A embodiment, the logical address space is capable of supporting Y unique storage entities (Y unique LID ranges of size X) where Y is determined according to the size of the first portion 1952.

The fixed allocation granularity may result in wasted storage resources. In embodiments in which each file is allocated a pre-determined range of contiguous LIDs (e.g., $2^{32}-1$ LIDs), a large proportion of the LIDs allocated for small files will likely never be used, which may result in increased metadata overhead and/or may reduce the number of unique files that can be represented within the logical address space 136. Similarly, large files that do not fit within a single LID allocation range (e.g., require more than $2^{32}$ LIDs) may have to allocate multiple LID ranges, which may result in additional wasted resources. These issues may be compounded in embodiments that have a more limited logical address space 136 (e.g., fewer number of bits available to represent LIDs 1900). In some embodiments, for example, LIDs may be limited to 48 bits rather than 64, due to, inter alia, operating system limitations, addressing limitation, addressing overhead (e.g., use of a portion of a LID to represent different virtual storage units), and so on.

Accordingly, in some embodiments, the storage layer 130 may be configured to implement an adaptive and/or variable allocation scheme in which different portions of the logical address space 136 are configured to provide a different, respective allocation granularity. As used herein, "allocation granularity" refers to the amount of storage resources that are allocated in a single allocation operation. The allocation granularity of a region may refer to the size of LID blocks or ranges allocated in the region. In the FIG. 19A embodiment, the allocation granularity of the logical address space 1900 was determined according to the size of the first and second portions 1952 and 1952 of the segmented LIDs 1900.

Alternatively, or in addition, allocation granularity may refer to physical storage allocations and/or operations. As disclosed above, LIDs in the logical address space 136 may correspond to (be bound to) physical storage resources, such as physical sectors. As used herein a "physical sector," "data sector," or "sector" refers to physical storage capacity capable of storing a particular amount of data. The physical sector size may, therefore, determine the granularity of data storage operations performed on the storage device 120; the data sector size may determine the smallest granularity of write/read operations that can be performed on the storage device 120. As such, storage clients 116 may be configured align storage operations in accordance with a particular data sector size. For example, in embodiments comprising a 512 byte sector size, storage clients 116 may adapt storage operations to fall within the 512 byte boundaries. In some storage systems, the sector size is based on physical characteristics the underlying storage devices; a storage device may, for example, be physically partitioned into sectors or pages having a particular, pre-determined size. By contrast, the storage layer 130 disclosed herein, may be capable of storing data within large, logical constructs, such as logical storage divisions 253 and/or logical pages 254, of the logical storage element 229, disclosed above in FIG. 3A. As such, the storage layer 130 may be capable of performing storage operations according to arbitrarily-sized physical sectors that are independent of the underlying partitioning of the storage device 120 and/or individual, non-volatile storage elements 123. Accordingly, in some embodiments, the physical sector size implemented by the storage layer 130 may be configurable and/or variable. As disclosed in further detail below, the physical sector size may vary within different regions of the logical address space 136; a LID in a first allocation region of the logical address space 136 may correspond to a 512 byte sector and a LID in a different allocation region may correspond to a 4 kb sector, and so on. Storage clients 116 may be configured to operate in different allocation regions in accordance with a preferred physical sector size.

Figure 36A:
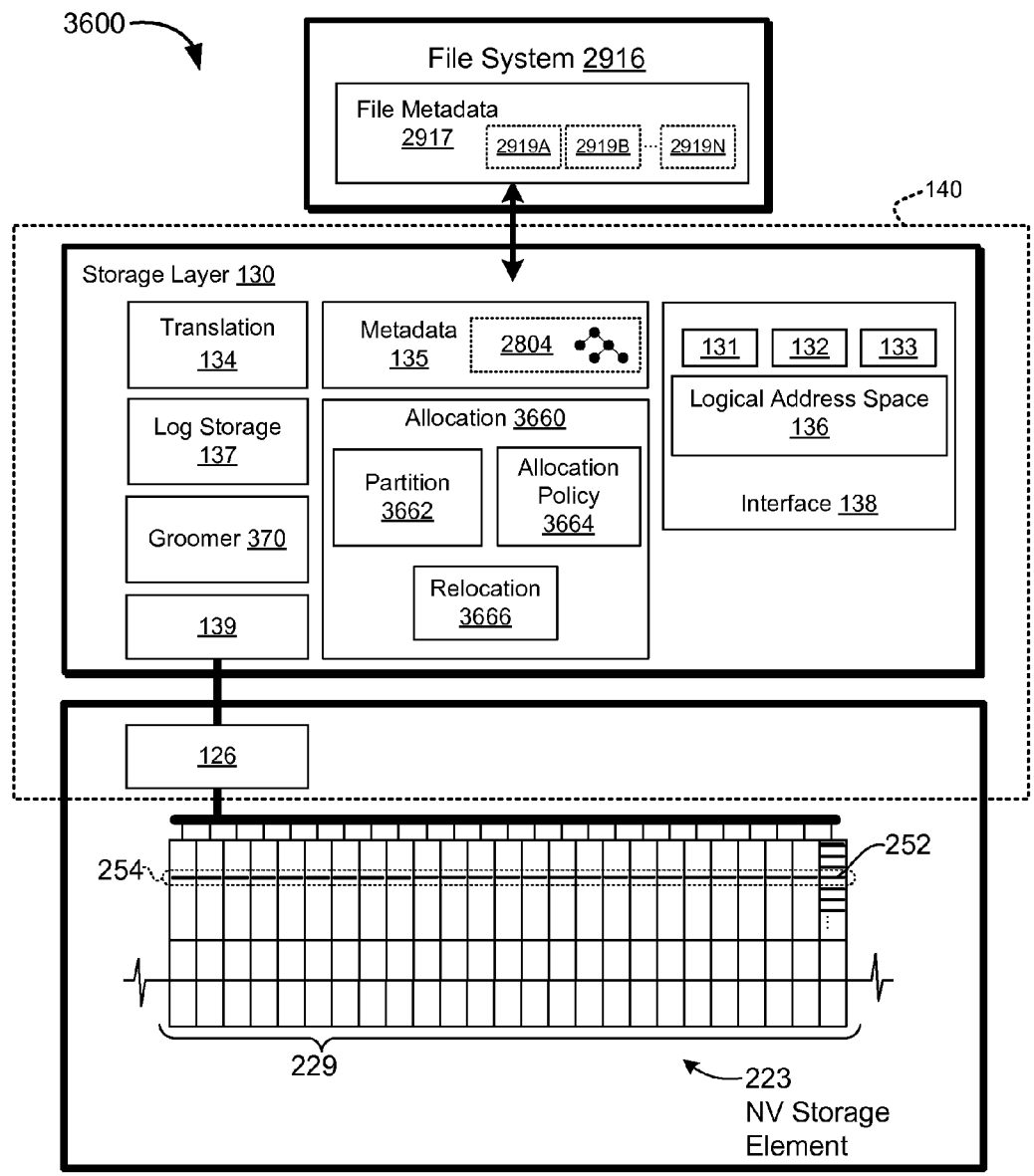
FIG. 36A depicts another embodiment a storage layer.

FIG. 36A is a block diagram of a system 3600 comprising another embodiment of a storage layer 130. The storage layer 130 of the FIG. 36A embodiment may comprise an allocation module 3360 configured to manage allocation within one or more of the logical address space 136 and storage device 120. As disclosed above, the storage layer 130 may be configured to store data on a storage device 120 in a contextual, log-based format. In the FIG. 36A embodiment, the storage device 120 may comprise a plurality of independent non-volatile storage elements 223. The non-volatile storage elements 223 may comprise solid-state storage elements, packages, die, chips, and/or the like. The storage controller 140 may be configured to manage the independent, non-volatile storage elements 223 as a logical storage element 229. The storage layer 130 may, therefore, be capable of storing data within logical storage units (e.g., logical pages) 254, which may be formed by combining physical storage units (e.g., pages) 252 of a plurality of the non-volatile storage elements 223. Accordingly, the storage layer 130 may be capable of storing data segments of different sizes (e.g., different physical sector sizes), independent of the underlying partitioning and/or configuration of the non-volatile storage elements 223. In some embodiments, for example, the non-volatile storage elements 223 may comprise 2 kb physical pages. The logical storage units 254 may comprise 25 physical pages of separate non-volatile storage elements 223, which may allow the storage layer 130 to perform read/write operations ranging from 0 to 50 kb. The disclosure is not limited in this regard, however, and could be adapted to include logical storage elements 229 comprising any number of non-volatile storage elements 223 having any suitable page size.

The storage controller 140 may be further configured to store data in a contextual, log-based format (a packet format). As disclosed above, the data write module 240 may be configured to generate packets corresponding to any suitable physical sector size (comprising any sized data segment). The size of the packets may be independent of the underlying partitioning and/or arrangement of the non-volatile storage elements 223. Therefore, the storage layer 130 may be capable of performing storage operations corresponding to any suitable physical sector size and/or physical granularity from a few bytes (e.g., 256 byte sector sizes) to 50 kb, or more. The storage layer 130 may be configured to store a packet comprising a 512 data segment within a logical page 254 along a packet comprising a 2 kb data segment 3612B.

In some embodiments, the allocation module 3660 comprises a partition module 3662 configured to partition and/or segment the logical address space into two or more allocation regions. The allocation regions may correspond to different allocation granularities. The allocation granularity of a particular region may refer to the allocation of physical storage resources (e.g., physical sector size) and/or logical allocation granularity such as LID allocation block size. The allocation module 3660 may further comprise an allocation policy module 3664 configured to determine an allocation granularity for storage client 116, storage requests, and/or storage entities and/or to selectively reallocate storage resources. The reallocation module 3666 may be configured to reallocate storage resources, which may comprise performing one or more of the range clone and/or range move operations, as disclosed herein.

Figure 36B:
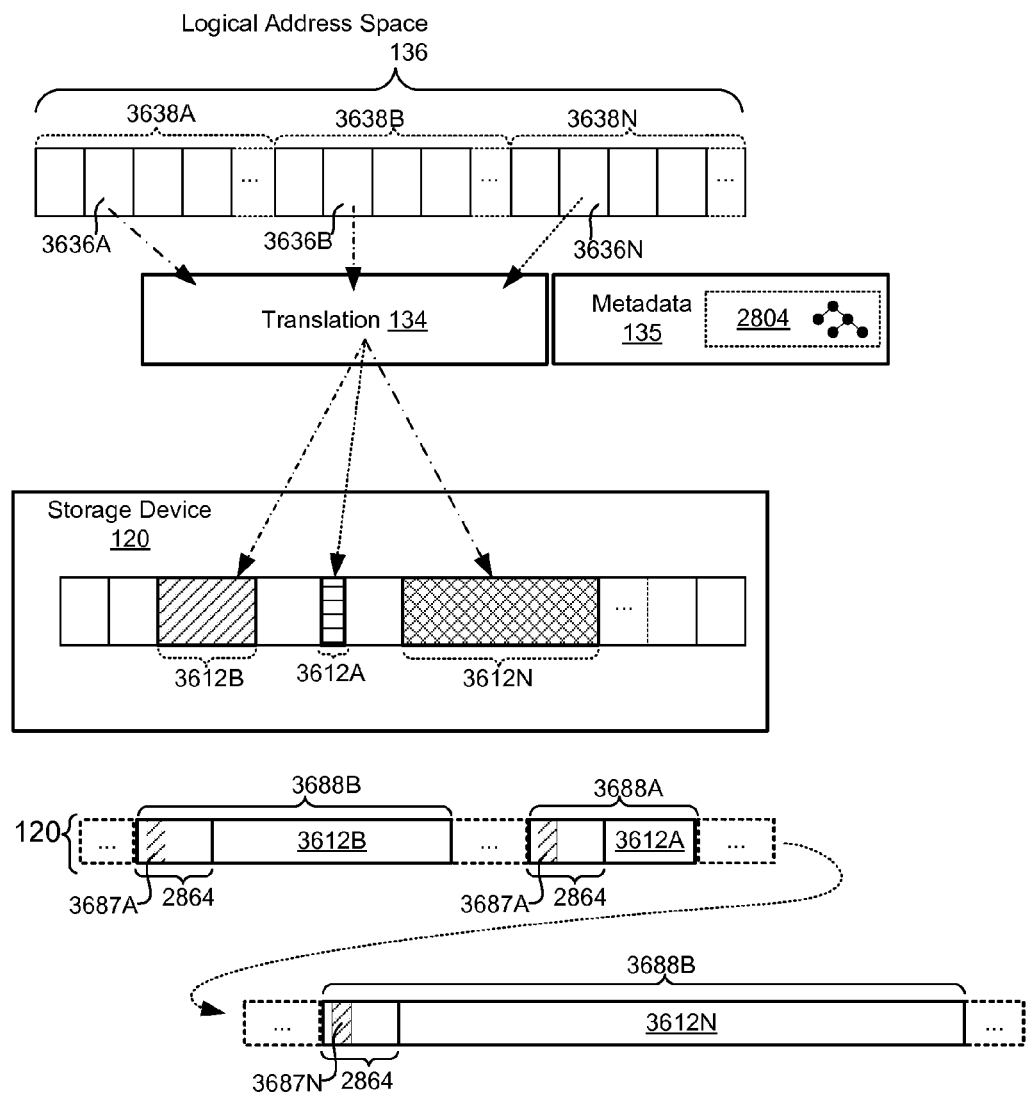
FIG. 36B depicts one embodiment of a logical address space comprising a plurality of allocation regions.

FIG. 36B illustrates one embodiment of a logical address space 136 comprising allocation regions 3638A, 3638B, through 3638N. The partitioning module 3662 may be configured to partition the logical address space 136 into any number of partitions, corresponding to any suitable physical allocation granularity (e.g., any suitable sector size). The allocation regions of FIG. 36B may correspond to the granularity of physical storage allocation: LIDs within the region 3638A may correspond to a relative small data sectors (e.g., 512 bytes); region 3638B may correspond to a larger data sectors (e.g., 2 kb); and region 3638N may correspond to larger 4 k data sectors. Accordingly, storage operations pertaining to LIDs within the region 3636A may correspond to 512 byte physical sectors; LIDs within the region 3636A may correspond data packets 3688A comprising 512 byte data segments 3612A. Storage operations performed within the region 3636A may, therefore, operate at a 512 byte sector granularity (the smallest read/write operation in region 3636A is 512 bytes).

In the FIG. 36B embodiment, the LID 3636A in region 3638A is bound to data packet 3688A (in the index 2804). The data packet 3688A may comprise a 512 byte data segment 3612A in accordance with the physical allocation granularity of the region 3638A. In some embodiments, the persistent metadata 3864 of the packets 3688A-N comprise respective size indicators 3687A-N indicating a size of the corresponding data segments 3612A-N. Alternatively, or in addition, the data segment size may be indicated in the index 2804 and/or other metadata 135. The LID 3636B in region 3638B may be bound to data packet 3688B. The data packet 3688 may comprise a 2 k data segment 3812B in accordance with the physical sector size of region 3638B. LID 3636N may be bound to data packet 3688N, which may comprise a 4 k data segment 3812N in accordance with the physical allocation granularity of region 3638N. The differently sized data packets 3688A-N may be stored at arbitrary physical storage locations within the storage device 120. In some embodiments, the data packets 3688A-N may be stored within large, logical storage units 254 of a logical storage element 229, as disclosed above. Although FIG. 36B depicts a particular embodiment of logical address partitioning, the disclosure is not limited in this regard and could be adapted to partition the logical address space 136 into any number of different allocation regions 3638A-N corresponding to any suitable physical and/or logical allocation granularity.

Certain storage clients 116 may operate more efficiently at specific sector sizes. For example, an application that processes large amounts of contiguous data may operate most efficiently with large 4 kb sector sizes. Other applications that rely on a large number of relatively small transactions may operate more efficiently using smaller sector sizes. In some embodiments, the interface 138 provides mechanisms for specifying a desired sector size for particular storage and/or allocation operations. A file system storage client 2916 may, for example, specify that storage operations pertaining to a particular file 2929A be performed at a 2 k sector size. In response, the allocation module 3660 may allocate LIDs for the file 2919A within the region 3638B of the logical address space 136. Alternatively, or in addition, the file system 2916 (and/or other storage clients 116) may query the interface 138 for information pertaining to the available allocation regions 3638A-N and/or data sector sizes supported by the storage layer 130. The storage clients 116 may selectively allocate LIDs within the regions 3638A-N in accordance with a desired physical allocation granularity (sector size). The file system storage client 2916 may, therefore, be configured to allocate LIDs having different sector sizes for different files 2919A-N according to the access characteristics of the files 2929A-N. As such, the file system storage client 2916 may be capable of supporting files 2919A-N having different respective data sector sizes. In some embodiments, users may specify a desired file sector size through, inter alia, ioctrl parameters, an fadvise API, and/or the like.

Referring back to FIG. 36A, the log storage module 137 may be configured to provide for storing store data according to the sector size assigned to the data (corresponding to the LID associated with the data). The log storage module 137 may determine the sector size in reference to, inter alia, the storage metadata 135, index 2804, and/or allocation module 3660. The log storage module 137 may configure the storage device controller 126 (data write module 240) to packetize the data in accordance with the sector size for storage within the log on the storage device 120. The log storage module 137 may be further configured to provide for reading data of various, different data sector sizes. In response to a read request pertaining to a particular LID, the log storage module 137 may determine the sector size corresponding to the LID (as above), and may configure the data read module 241 to read the corresponding data packet size.

Figure 36C:
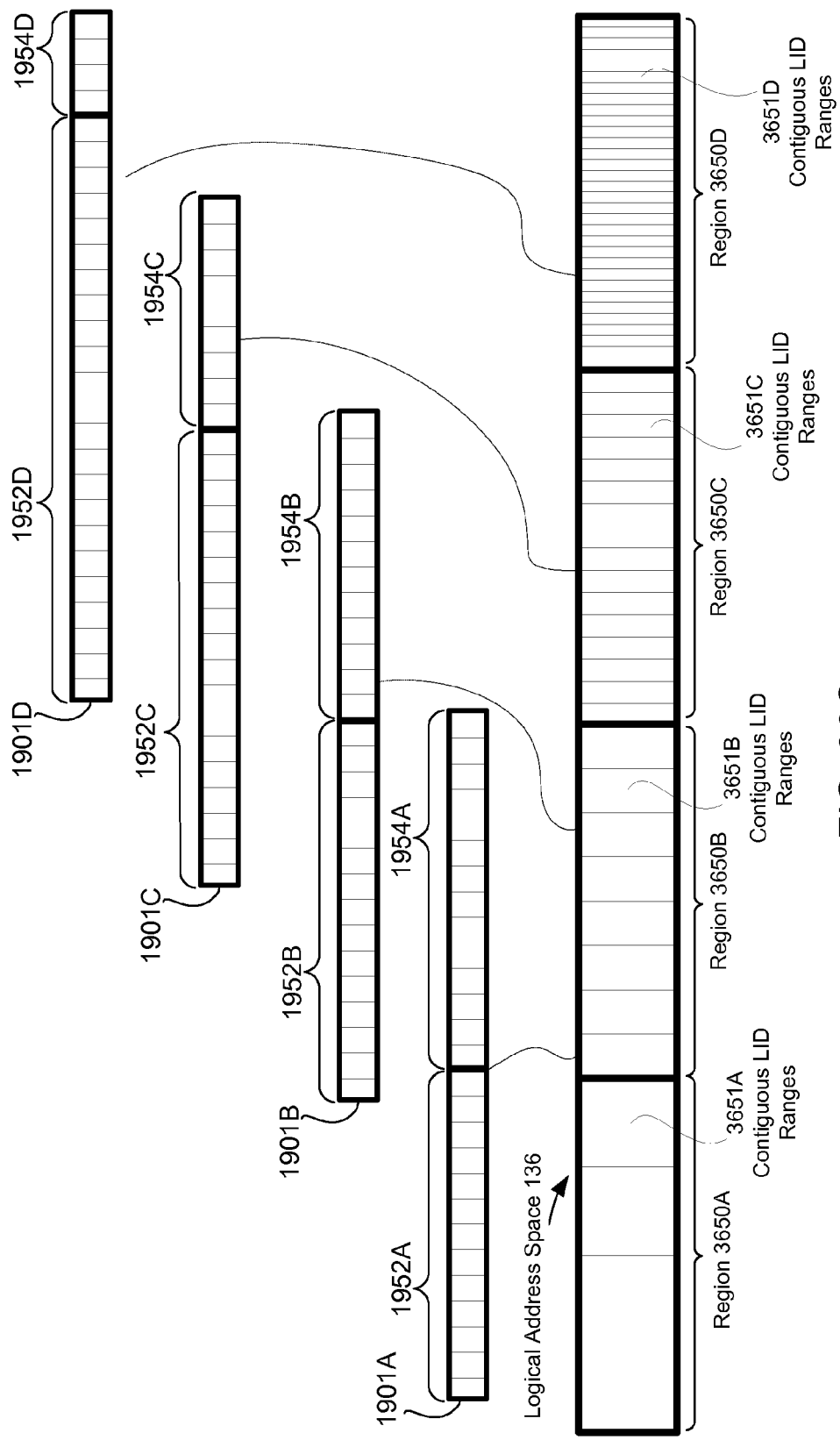
FIG. 36C depicts another embodiment of a logical address space comprising a plurality of allocation regions.

FIG. 36C illustrates another embodiment of a logical address space 136 that has been partitioned into a plurality of allocation regions. In the FIG. 36C embodiment, the partitioning module 3662 may be configured to partition the logical address space 136 into 4 regions: 3650A, 3650B, 3650C, and 3650D. Each region 3650A-D may correspond to a different, respective allocation granularity. In the FIG. 36C embodiment, allocation operations within the regions 3650A-D correspond to different logical allocation granularities; logical allocation operations within the regions 3650A-D correspond to differently sized LID extents (blocks of LIDs). Accordingly, allocations within each region 3650A-D may result in allocating a different number of contiguous LIDs (different range of contiguous LIDs). The region 3650A may comprise large contiguous LID ranges 3651A, such that allocation operations therein result in allocating a large number of contiguous LIDs (e.g., 2^34 LIDs). The region 3650A may, therefore, be suited for large storage entities (e.g., large files). By contrast, the region 3650D may correspond to relatively small contiguous LID ranges 3651D, such allocation operations therein result in allocating a smaller number of contiguous LIDs (e.g., 2^12 LIDs). As such, the region 3650D may be suited for use with smaller storage entities (e.g., small files, objects, database tables, or the like). The other regions 3650B and 3650C may comprise respective contiguous LID ranges 3651B and 3651C, each having a different respective allocation granularity.

Although FIG. 36C depicts regions 3650A-D as being of approximately the same size (e.g., the logical address space 136 is equally segmented into four regions 3650A-D), the disclosure is not limited in this regard. In some embodiments, partitioning module 3636 may be configured to segment the logical address space 136 into differently sized regions 3650A-D and/or into different numbers of regions 3650A-D. For example, the logical address space 136 may be segmented into two regions, a first region for large files and a second region for small files, and large file region may be allocated a larger proportion of the logical address space than the small file region, or vice versa.

Referring back to the FIG. 36C, each region 3650A-D may comprise and/or result in a different segmentation of the LIDs 1901A-D. The portion of a LID 1901A-D comprising the "identifier" portion of the LID 1952A-D versus the "offset" or "range" portion of the LID 1954A-D may vary depending on the size of the underlying contiguous LID range 3651A-D. For example, the LIDs 1901A of region 3650A comprise a larger proportion offset bits 1954A as compared to the LIDs 1901D of region 3650D. Conversely, the LIDs 1901D of region 3650D comprise a larger number of identifier bits 1952D as compared to the LIDs 1901A of region 3650A. Although not depicted in FIG. 36C, the LIDs 1901A-D may further comprise bits for specifying the region 3650A-D of the LID, specifying a logical storage unit of the LID, and so on. In some embodiments, in the four-way segmentation of FIG. 36C, each LID 1901A-D may comprise two bits for specifying one of the regions 3650A-D. Alternatively, or in addition, the storage layer 130 may track LID region relationships based upon pre-determined LID values or ranges (in the index 2804 and/or other metadata 135), such that no region-specifying overhead is needed.

In some embodiments, the storage layer 130 may provide access to allocation information through the interface 138. In some embodiments, the interface 138 may be configured to publish information pertaining to the allocation regions of the logical address space 136, indicate the remaining, unallocated and/or unbound resources within a particular region and/or LID block, and the like. The interface 138 may be further configured to allow storage clients 116 to specify a desired allocation granularity, physical sector size, and/or the like. In some embodiments, for example, an allocation request may specify the number of contiguous LIDs requested for allocation. In response, the allocation module 3660 may allocate the LIDs within the appropriate region. For example, the region 3650A may contiguous LID ranges 3561A comprising 65536 LIDs, region 3650B may comprise contiguous LID ranges 3651B comprising 16384 LIDs, region 3650C may comprise contiguous LID ranges 3651C comprising 4096 LIDs, and region 3650D may comprise contiguous LID ranges 3651D comprising 1024 LIDs. In response to a request to allocate 8024 LIDs, the storage layer 130 may allocate an available contiguous LID range 3651B within region 3650B. Alternatively, the storage layer 130 may allocate a contiguous LID range 3651B in region 3650B and a contiguous LID range 3651C in region 3650C.

In some embodiments, the allocation module 3660 comprises an allocation policy module 3664 that is configured to select a suitable allocation granularity (region 3650A-D and/or physical granularity region 3638A-3638N) based on one or more allocation policies, which may include, but are not limited to: availability of contiguous LID ranges in the regions 3650A-D, whether the LID range is expected to grow, information pertaining to the storage client 116 associated with the request, information pertaining to an application associated with the request, information pertaining to a storage entity associated with the request (e.g., file information), explicit requests, request parameters (ioctrl, fadvise, etc.), and/or the like. In some embodiments, LID allocation requests may specify a particular allocation region (e.g., LID region 3650A-D). For example, a storage client 116 may initially allocate a small LID range, but may know that the LID range may be required to grow over time (e.g., the storage client 116 may be receiving a stream of data over a network). Accordingly, the storage client 116 request an initially small LID allocation, but may specify that the LID allocation be serviced in the region 3650A. In some embodiments, the allocation module 3660 may initially allocate LIDs in the smallest granularity region 3650D, and may move storage entities to larger regions as needed. As such, even if a storage client requests a larger number of LIDs, the allocation module 3660 may defer allocation of additional LIDs until needed.

In some embodiments, the allocation module 3660 may comprise a reallocation module configured to, inter alia, relocate storage entities between different allocation regions (e.g., physical allocation regions 3638A-N and/or logical allocation regions 3650A-D). In one embodiment, a file storage entity may be initially managed using LIDs within the region 3650D. However, the file may grow to require more than a single, contiguous LID range 3651D. In response, the storage layer 130 may allocate additional contiguous LID ranges 3651D within the region 3650D. Alternatively, reallocation module 3666 may determine that the storage entity should be relocated, which may comprise a range move operation from the region 3650D to another region 3650A-C. As disclosed above in conjunction with FIG. 28A-33B, the range move operation may comprise a) modifying the logical interface of the data corresponding to the storage entity (in the index 2804 and/or other storage metadata 135), b) storing persistent note 2866 on the storage device 120 associating the data with the updated logical interface, c) and/or rewriting the data in the uploaded logical interface in one or more background operations. Alternatively, or in addition, the range move operation may comprise modifying a two-layer mapping between the logical identifiers one or more intermediate mapping layers as disclosed above in connection with FIGS. 28K-28L.

Figure 37A:
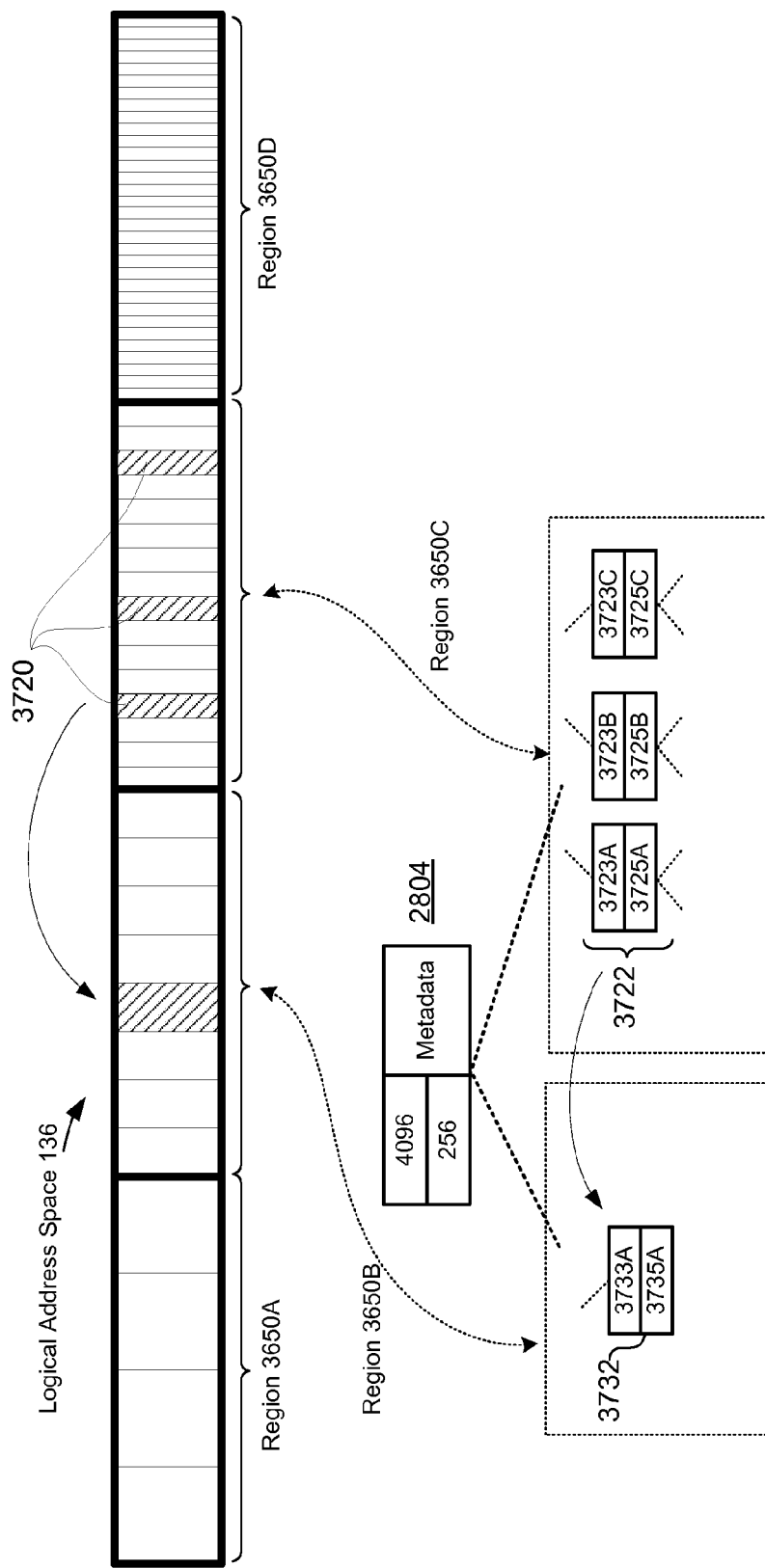
FIG. 37A depicts one example of a move operation within a segmented logical address space.

FIG. 37A illustrates on embodiment of an operation to move a storage entity (a file 3720) that occupies three contiguous LID ranges within region 3650C to region 3650B. The original allocations for the file 3720 are represented in the index 2804 in respective entries 3722, the entries 3722 may comprise a respective LID range 3723A-C and corresponding physical storage locations (media addresses) 3725A-C comprising data of the file one the storage device 120, as disclosed herein. Alternatively, the entries 3722 may be combined into a single entry (not shown). The entries 3722 may be maintained in the region 3650C of the logical address space 136 (range of LIDs corresponding to the region 3650C). Although not depicted in FIG. 37A to avoid obscuring the details of the illustrated embodiment, the index 2804 may comprise other entries corresponding to other storage entities (e.g., other files) within various regions 3650A-D of the logical address space 136.

The reallocation module 3666 determine that the file 3720 should be moved from region 3650C to region 3650D of the logical address space 136 by use of, inter alia, the policy module 3664. The policy module 3664 may identify files that should be reallocated (moved) based on one or more of: requests to allocate additional capacity for the file 3720, in response to a balancing operation within the logical address space 136, in response to availability issues (e.g., lack of availability in the region 3650C), in response to a move request from a storage client 116, and/or the like. In some embodiments, the reallocation module 3666 may be configured to periodically balance the logical address space 136, to move relatively large files (files comprising a number of contiguous LID ranges), into larger regions, so that the files may benefit from larger contiguous LID ranges. Similarly, files that have not used their allocated capacity for a predetermined time period, may be moved into smaller, granularity regions.

Moving the file 3720 may comprise allocating one or more contiguous LID ranges 3651B in the region 3650B. In the FIG. 37A embodiment, the reallocation module 3666 is configured to move the file 3720 from the region 3650C to the region 3650B. Moving the file 3720 may comprise allocating a contiguous LID range 3651D in region 3650B, and performing a move operation, as disclosed above (e.g., modifying the logical interface of the file data 3720, storing a persistent note 2866 on the storage device 120, and/or updating the contextual format of the data to be consistent with the logical interface). Moving the file 3720 may allow the file to be managed using contiguous LIDs of a single entry 3732 in the region 3650B of the index 3704, as opposed to multiple entries 3722.

Figure 37B:
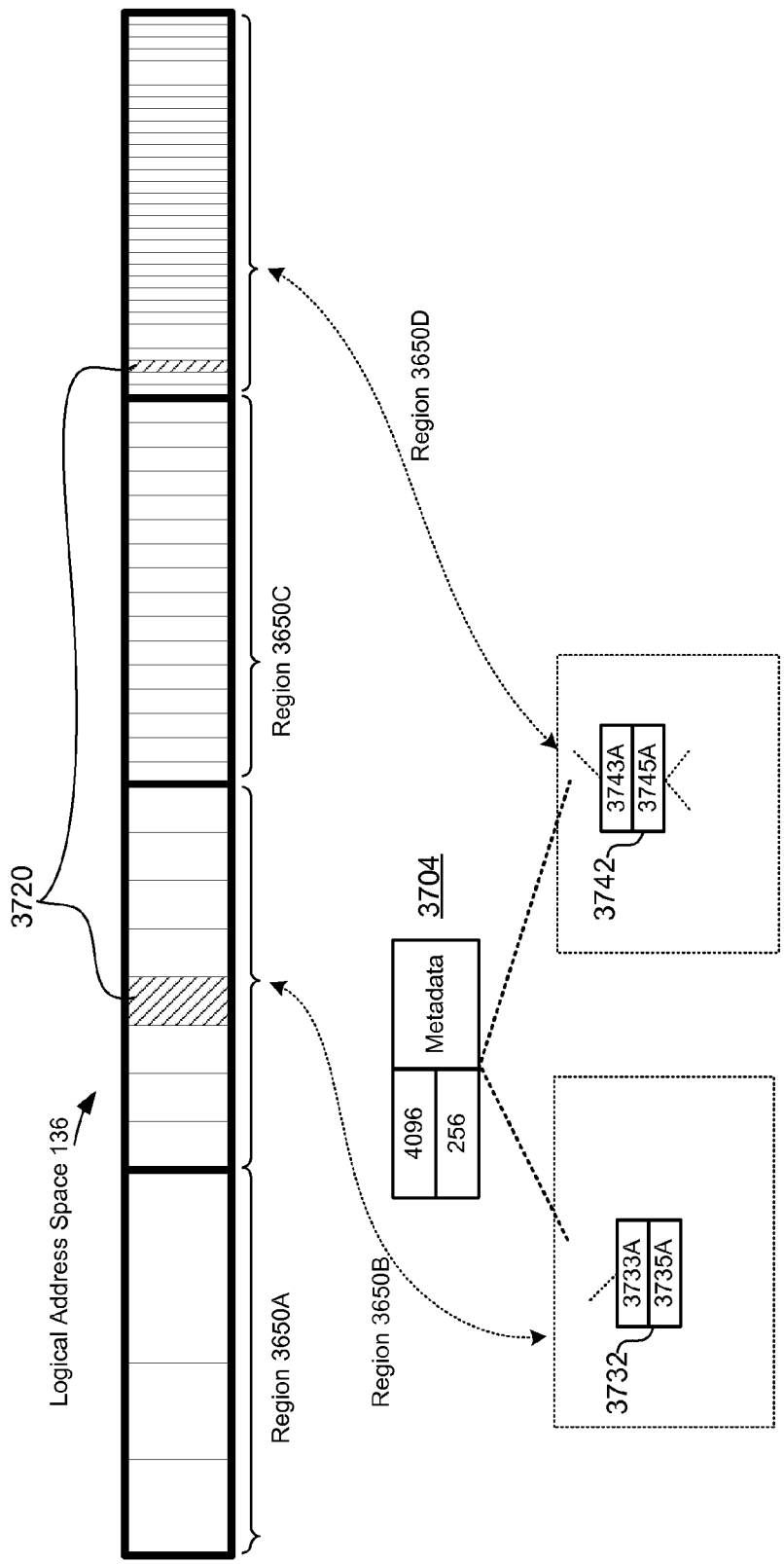
FIG. 37B depicts one example of an allocation operation within a segmented logical address space.

As illustrated in FIG. 37B, the file 3720 has been moved to region 3650B. Following the range move operation, the file 3720 may grow by a relatively small increment. The increment may require additional capacity beyond the contiguous LID region 3733A allocated to the file 3720 in region 3650B. In response, the storage layer 130 may allocate additional LIDs in the region 3650B (e.g., another contiguous LID range 3651B). However, if the increase to LID capacity is relatively small, allocating another, relatively large contiguous LID range 3651B may be inefficient (e.g., result in a large number of unused LIDs). As such, the allocation module 3660 may allocate LIDs in a different region. In the FIG. 37B embodiment, the storage layer 130 allocates the additional LIDs in the region 3650D, which comprises relatively small contiguous LID ranges 3651D. The LID allocation may be represented in an entry 3742 in the index 3704 (within a region 3650D of the index 3704). The entry 3742 may comprise a range of LIDs 3743A allocated to the file 3720, along with corresponding physical storage locations (e.g., physical addresses) 3745A, as described above. The file 3720 may, therefore, be managed using two noncontiguous sets of LIDs. In some embodiments, the entries 3732 and 3742 may be linked (through respective metadata, reference information, or the like), to indicate that the entries 3732 and 3742 correspond to the same file 3720. Alternatively, a file system (and/or the storage layer 130) may maintain references to the entries 3732 and 3742 (e.g., an i-node or other datastructure).

In another embodiment, allocating additional LIDs comprises moving the file 3720 into the region 3750A. Referring to FIG. 37C, the file 3720 may be moved in response to a request to expand the file 3720; in response, the reallocation module 3666 may be configured to move the file 3720 from the region 3650B to the region 3650A. The move operation may comprise a) allocating a contiguous range of LIDs 3651A in the region 3650A (represented by entry 3752) and b) performing a range move operation to modify the logical interface of the file data to the new LIDs 3615A, as disclosed herein.

Although FIGS. 37A-C depict range move operations to move data to different logical allocation regions within the logical address space 136, the disclosure is not limited in this regard; the same range move operations may be used to move data to/from different physical allocation regions 3638A-N of FIG. 36B. Referring to FIG. 36B, in some embodiments, data stored in a plurality of packets 3688A comprising a 512 byte data segments 3612A may be moved to a smaller number of packets 3688B comprising 2 k data segments 3612B within region 3638B in one or more range move operations, as disclosed herein. The range move operation may comprise maintaining the data in the smaller packets 3688A until the data is rewritten in a one or more background processes (e.g., grooming operations). Storage metadata 135 associated with the data (corresponding entries in the index 2804) may be configured to indicate that data of the LIDs in region 3638B are stored with smaller physical segment sizes until the data is rewritten in the updated packet format 3688B.

Referring back to FIG. 36A, the interface 138 of the storage layer 130 may be configured to provide logical and/or physical allocation information to storage clients 116 through the interface 138. In some embodiments, the file system 2916 may leverage such information to streamline file management operations. The file system 2916 may perform journaling operations to, inter alia, persist metadata pertaining to allocation operations performed for the files 2919A-N managed thereby. The journaling operations may comprise storing metadata pertaining to logical and/or physical storage allocation operations. In some embodiments, the file system 2916 may leverage allocation metadata to streamline such operations. The interface 138 may, for example, provide an indication of the remaining logical capacity of one or more of the files 2919A-N. For example, the file 2919A may be allocated within region 3650B of the logical address space 136 and, as such, may be allocated a particular range of LIDs. The file 2919A may only occupy a limited subset of the allocated LIDs. The file system 2916 may query the storage layer 130 (through the interface 138) to determine the remaining, allocated LID capacity for the file 2919A, such that subsequent file expansions can be performed without explicit allocation requests. The file system 2916 may be further configured to identify an appropriate allocation region 3650A-D in accordance with an expected file size.

In some embodiments, the reallocation module 3666 may be configured to move data to/from different regions 3638A-N of the logical address space 136. The reallocation module 3666 may move a storage entities (files) in response to determining that the storage entity is stored at an unsuitable physical granularity. For example, a storage client 116 may perform a large number of small write operations to data stored in a large granularity region 3638N. The small write operations may, for example, comprise modifying 256 bytes of data within large 4 kb data sectors. The reallocation module 3666 may be configured to move the data to the region 3638A that has a smaller 512 byte granularity to improve the performance of the small write operations. The move may comprise a range move operation as disclosed above. The range move may further comprise rewritten one or more data packets 3688N comprising 4 kb data segments 3612N as a plurality of data packets 3688A comprising smaller 512 byte data segments 3612A.

Figure 38:
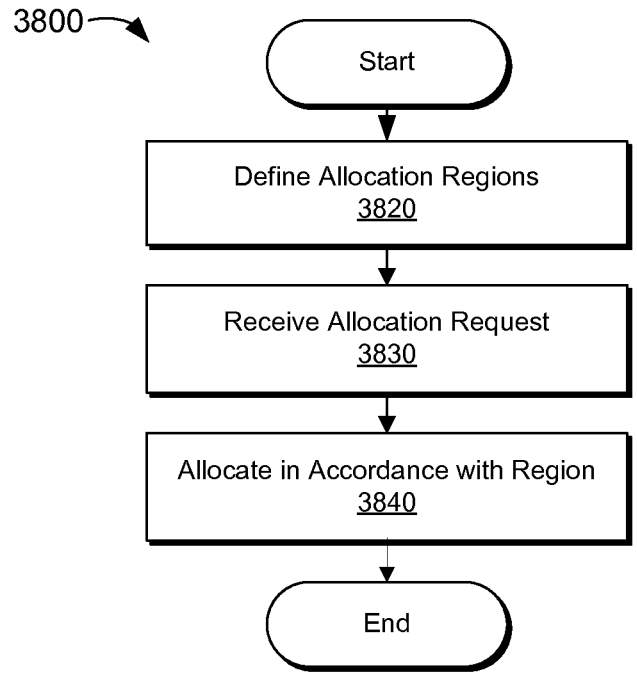
FIGS. 38-41 are flow diagrams of embodiments of methods for managing storage allocation.

FIG. 38 is a flow diagram of one embodiment of a method 3800 for managing storage allocation. Step 3820 may comprise defining a plurality of allocation regions within the logical address space 136. The allocation regions may correspond to a logical allocation granularity (e.g., LID block size) and/or a physical allocation granularity (e.g., data sector size). Step 3820 may comprise partitioning the logical address space 136 into different regions and/or sections, as disclosed above. Alternatively, step 3820 may comprise defining arbitrary ranges and/or sections of the logical address space to correspond to particular allocation regions.

Step 3830 may comprise receiving an allocation request. The allocation request may be received with the interface 138 of the storage layer 130. The allocation request may comprise a request to allocate one or more LIDs. Alternatively, the allocation request may comprise a request to perform a storage operation (e.g., write data the storage device 120 in a nameless write operation, or the like). Step 3830 may, therefore, comprise selecting an allocation region for the request by use of, inter alia, the policy module 3664. The policy module 3664 may be configured to select the allocation region based on one or more request parameters, file-level knowledge (e.g., information about the data to be stored in connection with the allocated LIDs), application-level knowledge (e.g., information about the storage client 116 associated with the request, data access characteristics, and the like), request parameters, and the like.

Step 3840 may comprise allocating storage resources within one of the defined allocation regions. Step 3840 may comprise allocating a contiguous range of LIDs within a particular LID allocation region 3650A-D. Alternatively, or in addition, step 3840 may comprise allocating LIDs and/or storing data at a particular physical granularity (e.g., having a particular data sector size in accordance a selected region 3636A-N).

Figure 39:
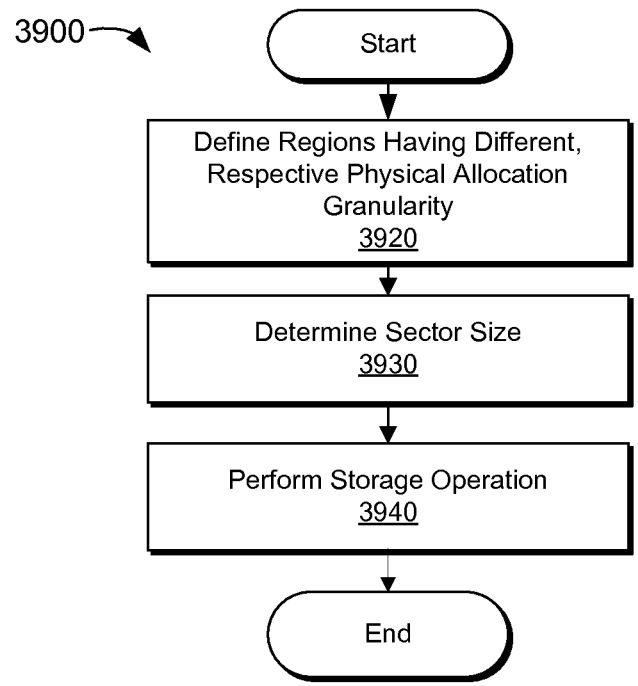

FIG. 39 is a flow diagram of another embodiment of a method 3900 for allocating storage resources. Step 3920 may comprise defining a plurality of regions 3638A-N within a logical address space 136. The regions defined at step 3920 may correspond to different, respective physical granularities. Accordingly, the LIDs of the defined regions 3638A-N may correspond to different physical sector sizes.

Step 3930 may comprise associating a LID with a particular data sector size based on, inter alia, the regions defined at step 3920. Step 3930 may be performed in response to receiving a storage request pertaining to the LID, such as request to write and/or modify data associated with the LID, a request to read data associated with the LID, and/or the like. The sector size may be determined in reference to storage metadata 135, the index 2804, the allocation module 3660, and/or the like.

Step 3940 may comprise performing one or more storage operations in accordance with the determined sector size. Step 3940 may comprise configuring the data write module 240 to store data packets in accordance with the identified sector data. Alternatively, or in addition, step 3940 may comprise configuring the data read module 241 to read one or more data packets of a particular size, as disclosed above.

Figure 40:
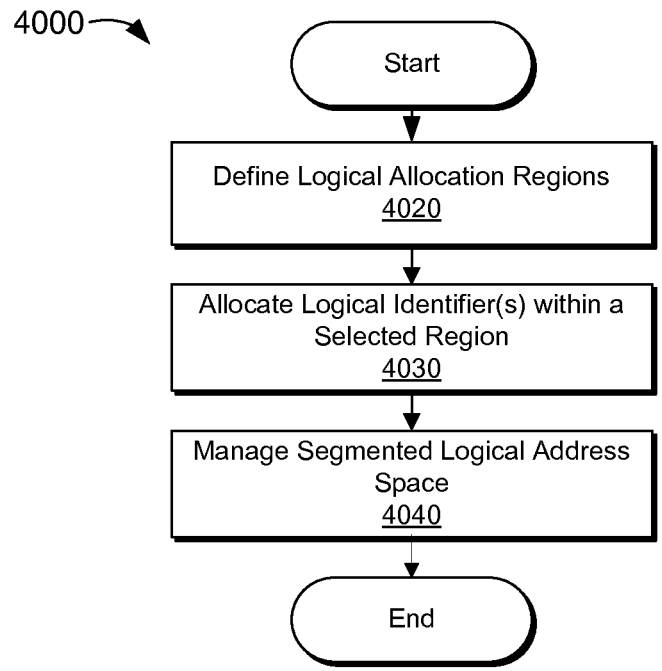

FIG. 40 is a flow diagram of another embodiment of a method 4000 for allocating storage resources. Step 4020 may comprise defining a plurality of regions 3650A-D within the logical address space. The regions 3650A-D may correspond to respective logical allocation granularities, as disclosed above. In some embodiments, step 4020 may comprise segmenting LIDs into respective identifier portions and/or offset or range portions. The segmentation of the LIDs may vary by region, as disclosed above. For example, regions comprising large contiguous LID ranges may use LIDs having a relatively large offset or range portion, and regions comprising relatively small contiguous LID ranges may use LIDs having a relatively small offset or range portion (and a larger identifier portion). The segmentation of step 3820 may comprise segmenting the logical address space 136 into equally sized regions. Alternatively, the regions may vary in size and/or extent.

Step 4030 may comprise allocating one or more LIDs to a storage client 116 within a selected region of the logical address space 136. Step 4030 may comprise selecting a region of the logical address space 136. Selection of the region may be based upon, inter alia, a size of the request, a request parameter (e.g., the storage client may request allocation within a particular region and/or allocation of a particular range of contiguous LIDs), configuration and/or preferences of the storage client, availability, request parameters (ioctrl, fadvise), and/or the like. Allocating the one or more LIDs may comprise allocating a contiguous range of LIDs in accordance with the allocation granularity of the selected region of the logical address space 136. The contiguous range of LIDs allocated at step 4030 may, therefore, comprise logical capacity that exceeds the number of LIDs requested by the storage client 116. In some embodiments, step 4030 may comprise allocating one or more noncontiguous LID ranges within one or more of the regions 3650A-D, as disclosed above.

Step 4040 comprises managing the segmented logical address space 136. Step 3840 may comprise moving one or more storage entities (e.g., files) in response to allocation changes and/or balancing operations, as disclosed above.

Figure 41:
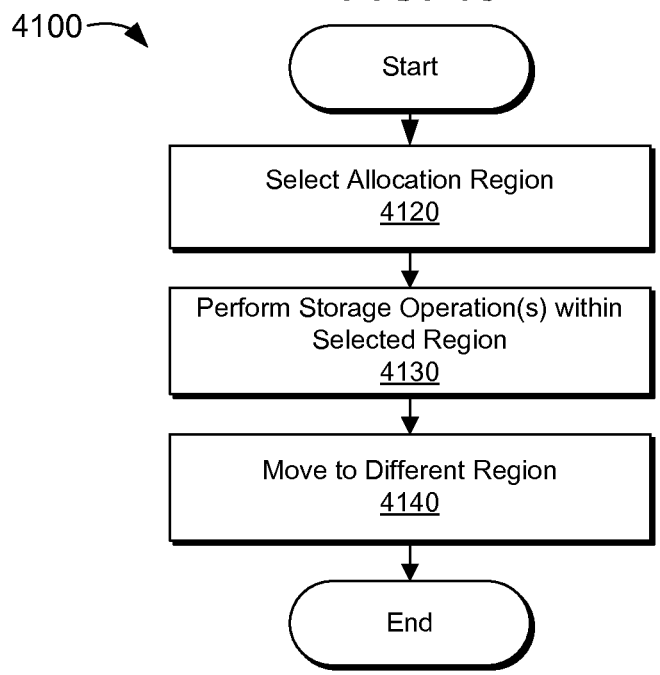

FIG. 41 is a flow diagram of another embodiment of a method 4100 for allocating storage resources. Step 4120 may comprise selecting an allocation region in response to a request. The request may comprise an allocation request, a storage request, and/or the like. As disclosed above, selection of the allocation region may be based on one or more of: size of data associated with the request, a size of a data structure associated with the request, a size of a storage entity associated with the request, a file associated with the request, an application associated with the request, a parameter of the request, a storage client associated with the request, ioctrl parameter, an fadvise parameter, and availability of storage resources, and/or the like. The region selected at step 4120 may comprise a logical allocation region 3650A-D, a physical allocation region 3638A-N, and/or a region comprising a combination of LID and data sector allocation granularity. Step 4120 may further comprise allocating storage resources within the selected region.

Step 4130 may comprise performing one or more storage operations within the selected region and/or in accordance with the allocation granularity of the selected region. Step 4130 may comprise allocating a particular range of LIDs in accordance with a particular logical allocation region 3650A-D, storing data within physical sectors of a predetermined size (in accordance with a particular physical allocation region 3638A-N), and/or the like.

Step 4140 may comprise moving data corresponding to the storage operations performed at step 4130 to a different allocation region. Step 4140 may comprise determining that the data should be moved. The determination may be based on receiving a request, through the interface 138, to move the data. Alternatively, or in addition, the determination may be based on profiling metadata pertaining to storage operation(s); such as access characteristics of the data, changes in requested allocation size, and/or the like. For example, a file may be moved from a relatively small logical allocation region to a larger logical allocation region in response to continued expansion of the file. In another embodiment, a file may be moved from a large logical allocation region to a smaller logical allocation region in response to a reduction in file size. In other embodiments, data may be moved in to regions 3638A-N having different data sector sizes, in accordance with observed data access characteristics. Step 4140 may further comprise performing one or more range move operations to move the data to/from different portions of the logical address space 136, as disclosed herein.

This disclosure has been made with reference to various exemplary embodiments. However, those skilled in the art will recognize that changes and modifications may be made to the exemplary embodiments without departing from the scope of the present disclosure. For example, various operational steps, as well as components for carrying out operational steps, may be implemented in alternate ways depending upon the particular application or in consideration of any number of cost functions associated with the operation of the system (e.g., one or more of the steps may be deleted, modified, or combined with other steps). Therefore, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, a required, or an essential feature or element. As used herein, the terms "comprises," "comprising," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Additionally, as will be appreciated by one of ordinary skill in the art, principles of the present disclosure may be reflected in a computer program product on a machine-readable storage medium having machine-readable program code means embodied in the storage medium. Any tangible, non-transitory machine-readable storage medium may be utilized, including magnetic storage devices (hard disks, floppy disks, and the like), optical storage devices (CD-ROMs, DVDs, Blu-Ray discs, and the like), flash memory, and/or the like. These computer program instructions may be loaded onto a general purpose computer, special purpose computer, or other programmable data processing apparatus to produce a machine, such that the instructions that execute on the computer or other programmable data processing apparatus create means for implementing the functions specified. These computer program instructions may also be stored in a machine-readable memory that can direct a computer or other programmable data processing apparatus to function in a particular manner, such that the instructions stored in the machine-readable memory produce an article of manufacture, including implementing means that implement the function specified. The computer program instructions may also be loaded onto a computer or other programmable data processing apparatus to cause a series of operational steps to be performed on the computer or other programmable apparatus to produce a computer-implemented process, such that the instructions that execute on the computer or other programmable apparatus provide steps for implementing the functions specified.

While the principles of this disclosure have been shown in various embodiments, many modifications of structure, arrangements, proportions, elements, materials, and components that are particularly adapted for a specific environment and operating requirements may be used without departing from the principles and scope of this disclosure. These and other changes or modifications are intended to be included within the scope of the present disclosure.

We claim:

1. An apparatus, comprising:
a storage controller configured to manage a logical address space of a storage device, and to translate logical identifiers of the logical address space to data stored on the storage device,
wherein the storage controller is configured to segment the logical address space into a plurality of different regions, the regions having different respective allocation granularities that determine a capacity of storage resource allocations within the respective regions, and
wherein the storage controller is further configured to allocate storage resources within the regions of the logical address space in accordance with the respective allocation granularities of the regions, such that the storage controller allocates resource units of a first capacity responsive to allocation operations within a first region of the logical address space and allocates resource units of a second, different capacity responsive to allocation operations within a second region of the logical address space.

2. The apparatus of claim 1, further comprising an interface of the storage controller configured to provide for specifying a region of the logical address space in which to perform one or more of an allocation operation and a storage operation.

3. The apparatus of claim 1, further comprising an interface of the storage controller configured to provide information pertaining to the allocation granularities of the regions of the logical address space to a storage client.

4. The apparatus of claim 1, wherein the different respective allocation granularities of the regions pertain to a data sector size associated with the logical identifiers of the respective regions.

5. The apparatus of claim 1, wherein the logical identifiers within the respective regions of the logical address space correspond to different respective amounts of physical storage capacity, such that a logical identifier within the first region corresponds to a first amount of physical storage capacity, and a logical identifier within the second region corresponds to a second, different amount of storage capacity.

6. The apparatus of claim 5, wherein the storage controller is configured to read a data segment associated with a logical identifier stored on the storage device, wherein a size of the data segment corresponds to an amount of physical storage capacity represented by the logical identifier.

7. The apparatus of claim 1, wherein the storage controller is configured to reallocate a set of logical identifiers corresponding to data stored on the storage device to a different set of logical identifiers.

8. The apparatus of claim 7, wherein the different set of logical identifiers are within a different region of the logical address space from the set of logical identifiers.

9. The apparatus of claim 7, wherein each region comprises one or more blocks of logical identifiers, and wherein the storage controller is configured to combine a plurality of blocks allocated within the first region of the logical address space into a single, larger block of logical identifiers within the second region of the logical address space.

10. The apparatus of claim 7, wherein each region comprises one or more blocks of logical identifiers within the logical address space, and wherein the storage controller is configured to reallocate a block of logical identifiers within a first region of the logical address space as one or more smaller blocks of logical identifiers within a different region of the logical address space.

11. The apparatus of claim 7, further comprising a log storage module configured to store data on the storage device in association with respective logical identifiers corresponding to the data.

12. The apparatus of claim 11, wherein the reallocation module is configured to modify the logical identifier associated with a data segment such that the logical identifier associated with the data segment on the storage device is inconsistent with the modified logical identifier, the apparatus further comprising a translation module configured to reference the data segment associated with the inconsistent logical identifier on the storage device by use of the modified logical identifier.

13. The apparatus of claim 12, wherein the log storage module is configured to store the data segment in association with the modified logical identifier on the storage device in response to grooming a storage division comprising the data segment.

14. A computer program product comprising a non-transitory computer readable storage medium storing computer usable program code executable to perform operations, the operations comprising:
   translating logical identifiers of a logical address space to storage addresses of data corresponding to the logical identifiers stored on a non-volatile storage device; and
   allocating storage resources within respective allocation regions of the logical address space, each allocation region having a respective granularity that determines a capacity for storage resource allocations within the region, such that
      allocating a storage resource within a first allocation region of the logical address space comprises allocating a first capacity of storage resources, and
      allocating a storage resource within a second allocation region of the logical address space comprises allocating a second capacity of storage resources, different from the first capacity of storage resources.

15. The computer program product of claim 14, the operations further comprising:
   in response to receiving a request to allocate a storage resource,
      selecting an allocation region for the received request, and
      allocating a capacity of storage resources corresponding to an allocation granularity of the selected allocation region,
      wherein selecting the allocation region comprises one or more of: selecting an allocation region specified in the received request, selecting an allocation region corresponding to an amount of storage resources requested by the received request, selecting an allocation region corresponding to a storage entity associated with the received request, and selecting an allocation region corresponding to a file associated with the received request.

16. The computer program product of claim 14, further comprising:
   allocating a first set of logical identifiers within the first logical allocation region for a storage entity;
   translating logical identifiers of the first set of logical identifiers to respective storage addresses of the non-volatile storage device in response to storing data of the storage entity on the non-volatile storage device, such that the first set of logical identifiers reference stored data of the storage entity on the non-volatile storage device; and
   moving the storage entity to the second allocation region, by
      allocating a second set of logical identifiers within the second allocation region, the second set of logical identifiers different from the first set of logical identifiers, and
      translating logical identifiers of the second set to storage addresses storing data of the storage entity on the non-volatile storage device, such that the second set of logical identifiers reference stored data of the storage entity on the non-volatile storage device.

17. The computer program product of claim 16, wherein the storage entity is moved to the second allocation region based on one or more of: an amount of valid data of the storage entity that is stored on the non-volatile storage device, and a number of logical identifiers allocated to reference stored data of the storage entity.

18. The computer program product of claim 16, wherein data of the storage entity is appended to a log on the non-volatile storage device, and wherein moving the storage entity to the second region further comprises appending a persistent note to the storage log to associate logical identifiers of the second set with the data of the storage entity appended to the log.

19. The computer program product of claim 18, wherein the data of the storage entity is appended to the log together with persistent translation metadata that associates the appended data with logical identifiers of the first set, and wherein the persistent note appended to the log is configured to replace the persistent translation metadata appended with the data of the storage entity.

20. The computer program product of claim 16, further comprising maintaining a forward map comprising translations between logical identifiers and data stored on the non-volatile storage device, wherein moving the storage entity to the second region comprises modifying the forward map to replace translations between storage addresses of the stored data of the storage entity and logical identifiers of the first set with translations to logical identifiers of the second set.

21. The computer program product of claim 16, the operations further comprising:
storing data on the non-volatile storage medium together with persistent metadata configured to associate the stored data with respective logical identifiers, wherein data of the storage entity is stored with persistent metadata configured to associate the stored data of the storage entity with logical identifiers of the first set;
writing a persistent metadata note on the non-volatile storage device in response to moving the storage entity to the second region, the persistent metadata note configured to associate the stored data of the storage entity with logical identifiers of the second set; and
rebuilding translations between logical identifiers and data stored on the non-volatile storage device by use of the persistent metadata stored with the data on the non-volatile storage device, wherein rebuilding the forward map comprises associating the stored data of the storage entity with logical identifiers of the second set based on the persistent metadata note written to the non-volatile storage medium.

22. A method, comprising:
translating logical identifiers of a logical address space to respective storage locations of a non-volatile storage device by use of a forward map, the respective storage locations being used to store data associated with the logical identifiers; and
allocating storage resources for objects to be stored on the non-volatile storage device, wherein allocating storage resources for an object comprises:
selecting one of a plurality of allocation regions within the logical address space for the object, each allocation region having a respective granularity, such that a capacity of a storage resource allocation within a first one of the plurality of allocation regions differs from a capacity of a storage resource allocation within a second one of the plurality of allocation regions, and
allocating storage resources for the object within the selected allocation region of the logical address space, wherein allocating the storage resources comprises allocating a first logical identifier within the selected allocation region of the logical address space, and translating the first logical identifier to a storage location of stored data of the object on the non-volatile storage device.

23. The method of claim 22, wherein the allocation region is selected based on one or more of: an allocation request pertaining to the object, a physical storage capacity required to store data of the object, a logical capacity required to reference data of the object, and a block size for the object.

24. The method of claim 22, wherein logical identifiers of the first allocation region correspond to a first amount of physical storage capacity on the non-volatile storage device, and wherein logical identifiers of the second allocation region correspond to a second amount of physical storage capacity on the non-volatile storage device, different from the first amount.

25. The method of claim 22, wherein data of the object is stored within a segment of a log on the non-volatile storage device, the segment comprising persistent metadata configured to associate the segment with the first logical identifier, the method further comprising moving the storage entity to the second allocation region of the logical address space, by
allocating a second logical identifier within the second region of the logical address space for the storage entity;
modifying the forward map to translate the second logical identifier to a storage location of the segment on the non-volatile storage device; and
appending a persistent note to the storage log to record the translation between the second logical identifier and the storage location of the storage segment.

* * * * *